United States Patent
Fujita et al.

(10) Patent No.: US 6,767,473 B2
(45) Date of Patent: Jul. 27, 2004

(54) METHOD FOR FINE PATTERN FORMATION

(75) Inventors: Hiroyuki Fujita, Tokyo-To (JP); Yoshio Mita, Tokyo-To (JP); Ryoichi Ohigashi, Tokyo-To (JP); Katsunori Tsuchiya, Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 162 days.

(21) Appl. No.: 10/088,685

(22) PCT Filed: Jul. 23, 2001

(86) PCT No.: PCT/JP01/06353

§ 371 (c)(1),
(2), (4) Date: Mar. 21, 2002

(87) PCT Pub. No.: WO02/11182

PCT Pub. Date: Feb. 7, 2002

(65) Prior Publication Data

US 2002/0166232 A1 Nov. 14, 2002

(30) Foreign Application Priority Data

Jul. 21, 2000 (JP) .................................. 2000-220410
Jul. 21, 2000 (JP) .................................. 2000-220420
Jul. 21, 2000 (JP) .................................. 2000-220421
Jan. 18, 2001 (JP) .................................. 2001-10188

(51) Int. Cl.⁷ ...................... G01D 15/00; G11B 5/127; H01L 21/00

(52) U.S. Cl. ......................................... 216/27; 438/21

(58) Field of Search .............................. 216/27; 438/21; 29/890.1; 347/20, 29, 40, 44, 47, 54

(56) References Cited

U.S. PATENT DOCUMENTS 4,047,184 A * 9/1977 Bassous et al. ................ 347/76
4,601,777 A * 7/1986 Hawkins et al. ............... 216/27

FOREIGN PATENT DOCUMENTS

| EP | 0 985 534 A1 | 3/2000 |
|---|---|---|
| JP | 8-071477 | 3/1996 |
| JP | 9-57981 | 3/1997 |
| JP | 11-239748 | 9/1999 |
| JP | 2000-167463 | 6/2000 |
| JP | 2000-189873 | 7/2000 |

* cited by examiner

Primary Examiner—P. Hassanzadeh
Assistant Examiner—Roberts P. Culbert
(74) Attorney, Agent, or Firm—Parkhurst & Wendel, L.L.P.

(57) ABSTRACT

There are provided an apparatus for fine pattern formation, which can form a fine pattern with high accuracy by direct writing with ink, a production process of fine nozzles provided in the apparatus for fine pattern formation, and a method for fine pattern formation. Fine pattern formation with high accuracy could have been realized by the apparatus for fine pattern formation, comprising: a silicon substrate; a plurality of fine holes which extend through the silicon substrate from the surface of the silicon substrate to the back surface of the silicon substrate and have a silicon oxide layer on the wall surface thereof; fine nozzles which are protruded, integrally with the silicon oxide layer, on the back surface side of the silicon substrate from each opening of the fine holes; a silicon nitride layer provided on the surface and side of the silicon substrate; a support member provided on the surface side of the silicon substrate; an ink passage for supplying ink to the opening of each fine hole on the surface side of the silicon substrate; and an ink supplying device connected to the ink passage.

7 Claims, 59 Drawing Sheets

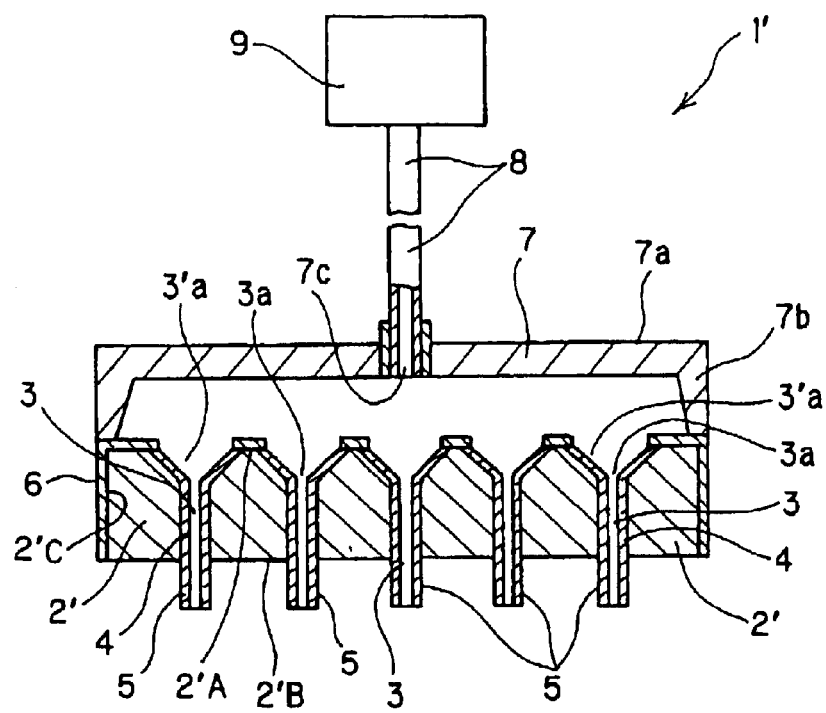
F I G. 3
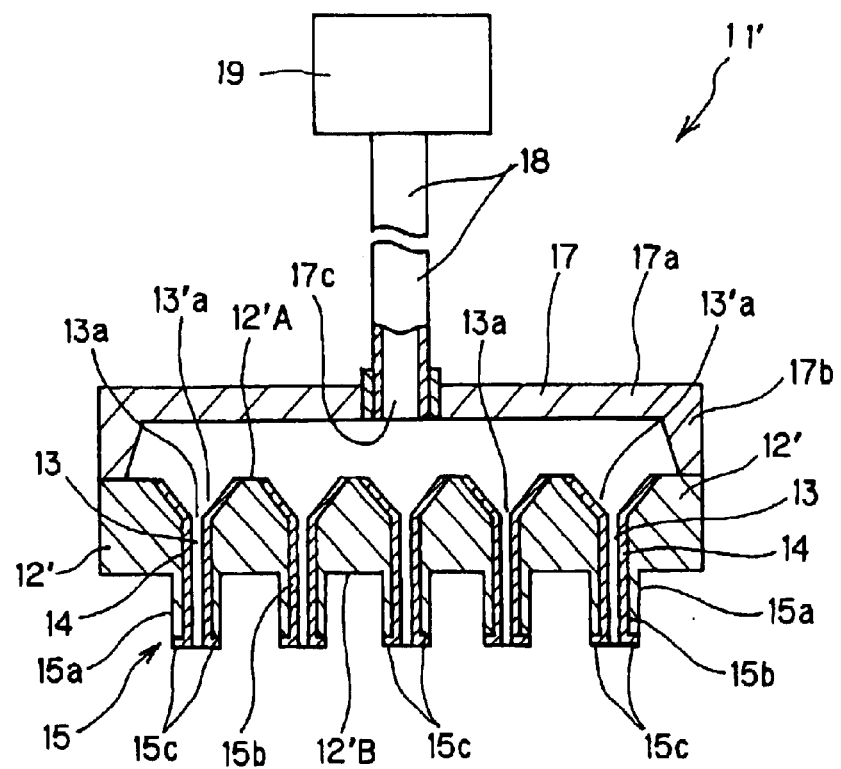
F I G. 4

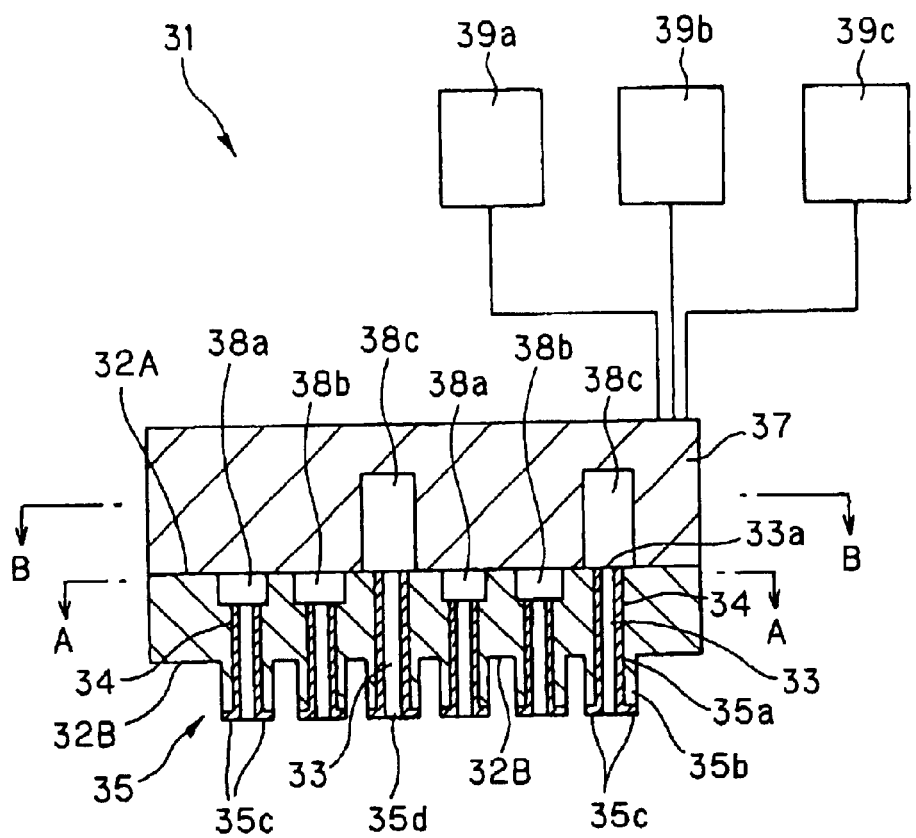
F I G. 9 (A)
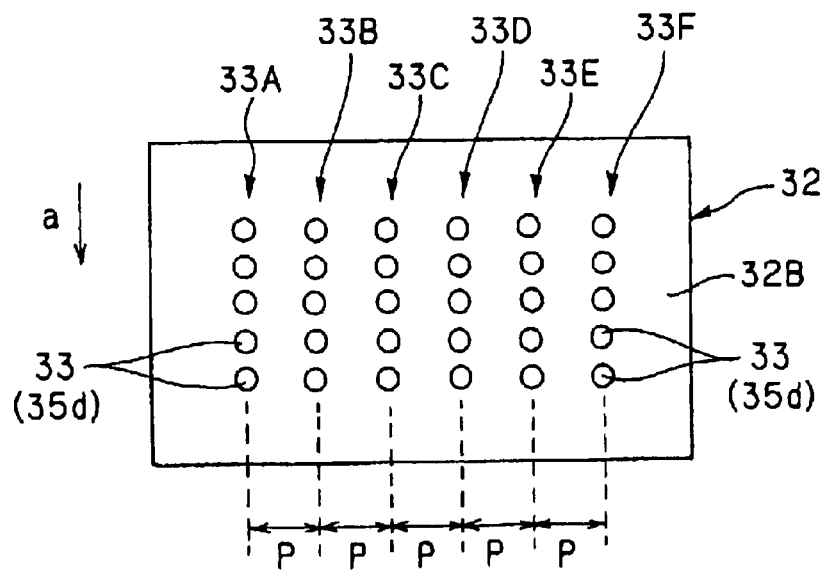
F I G. 9 (B)

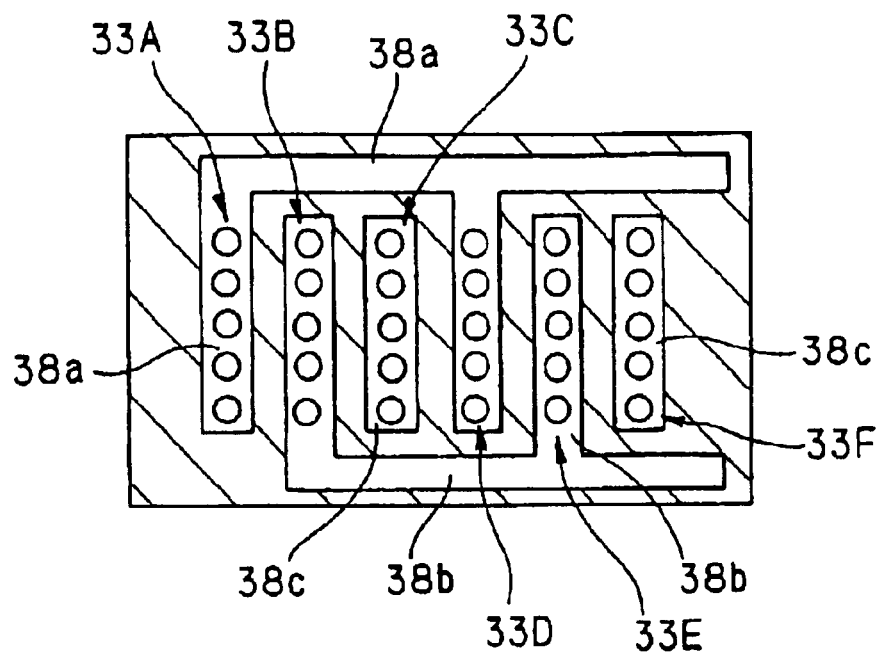
F I G. 10
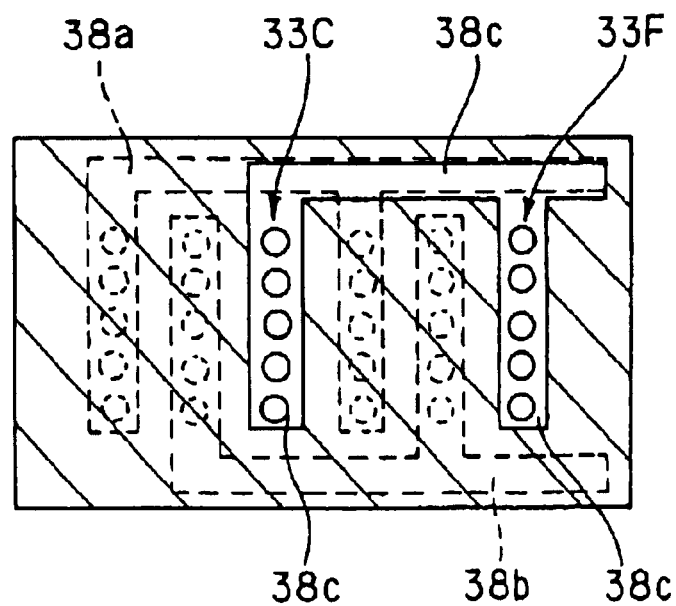
F I G. 11

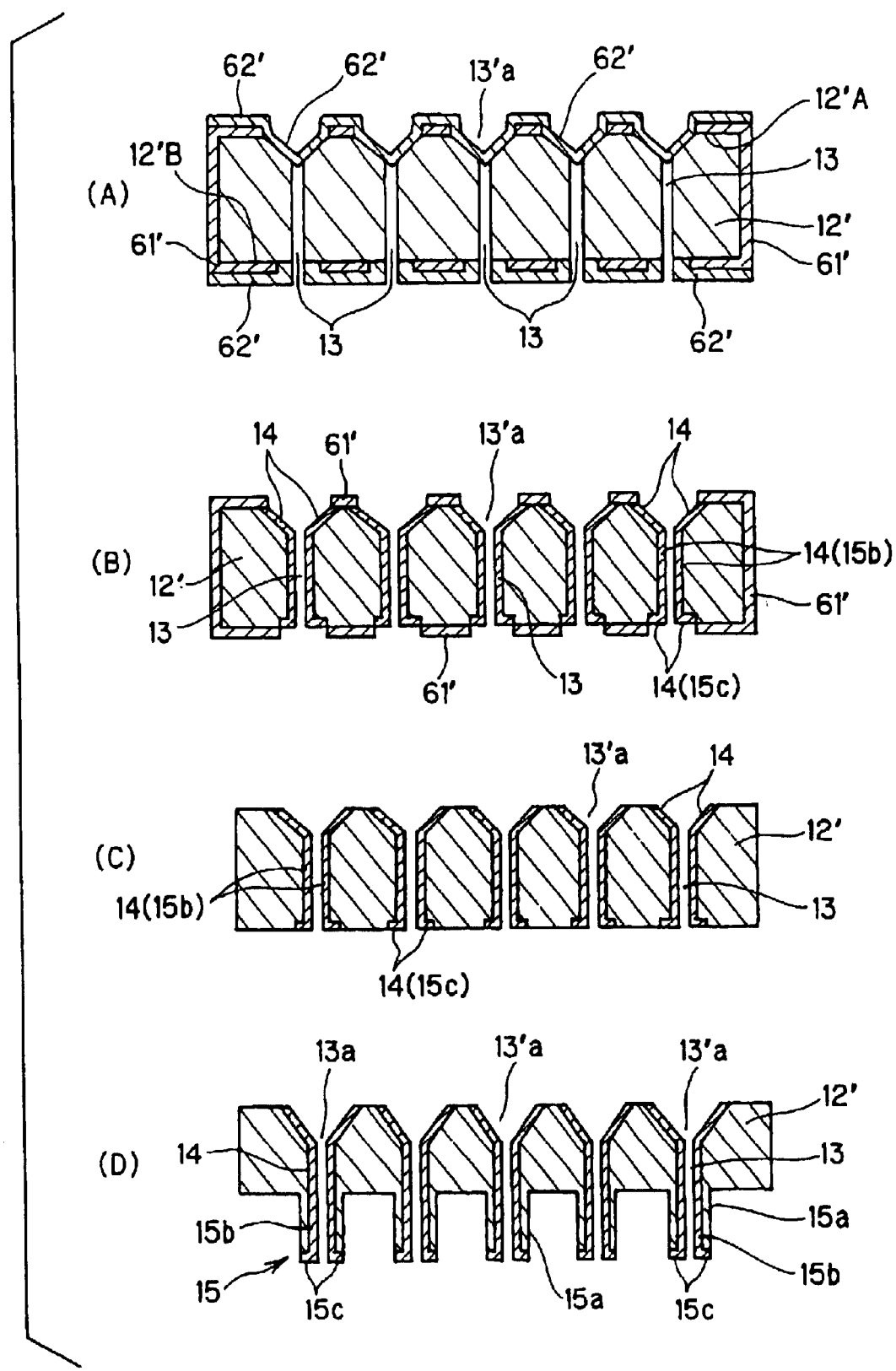
F I G. 22

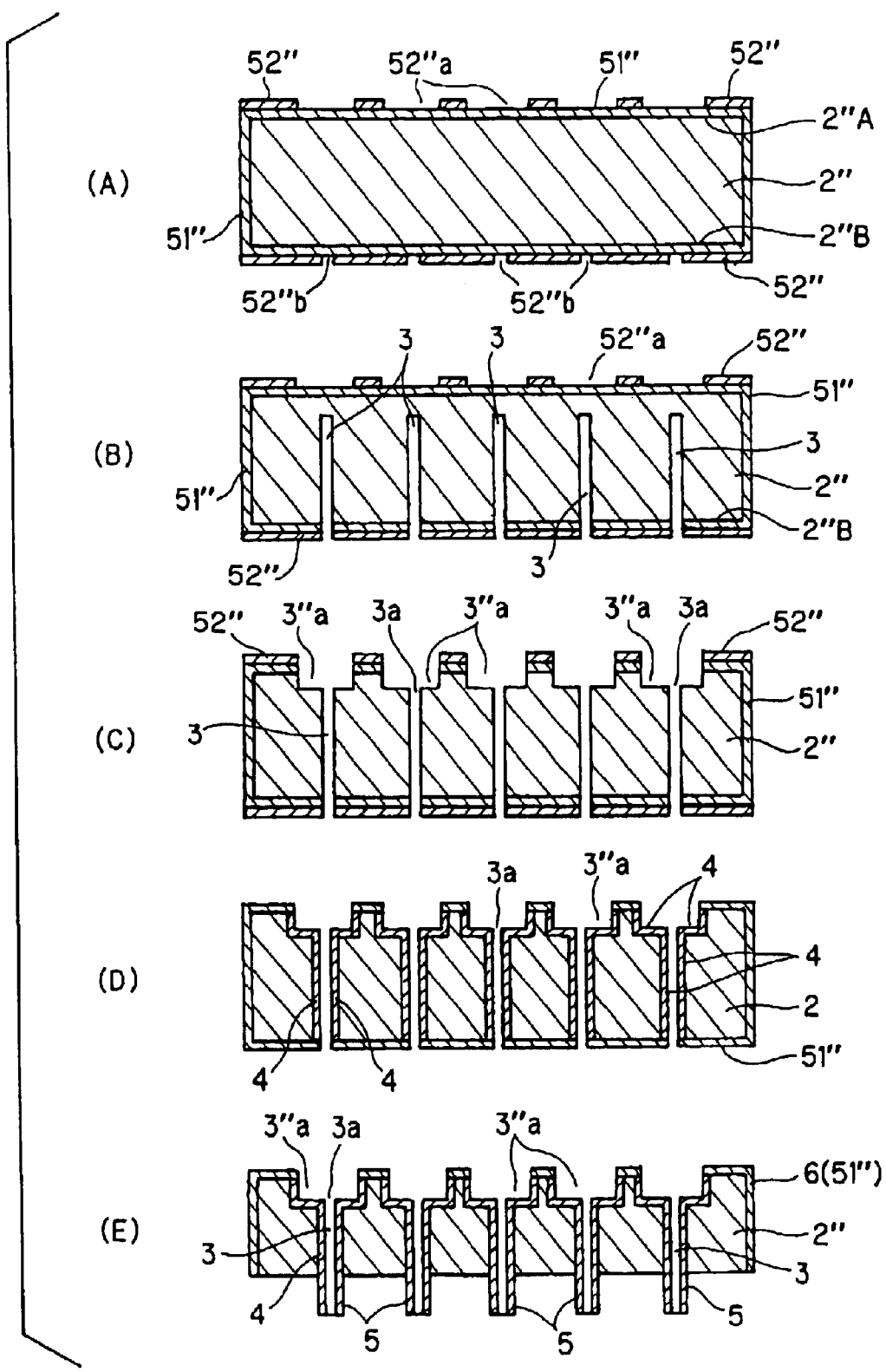
F I G. 23

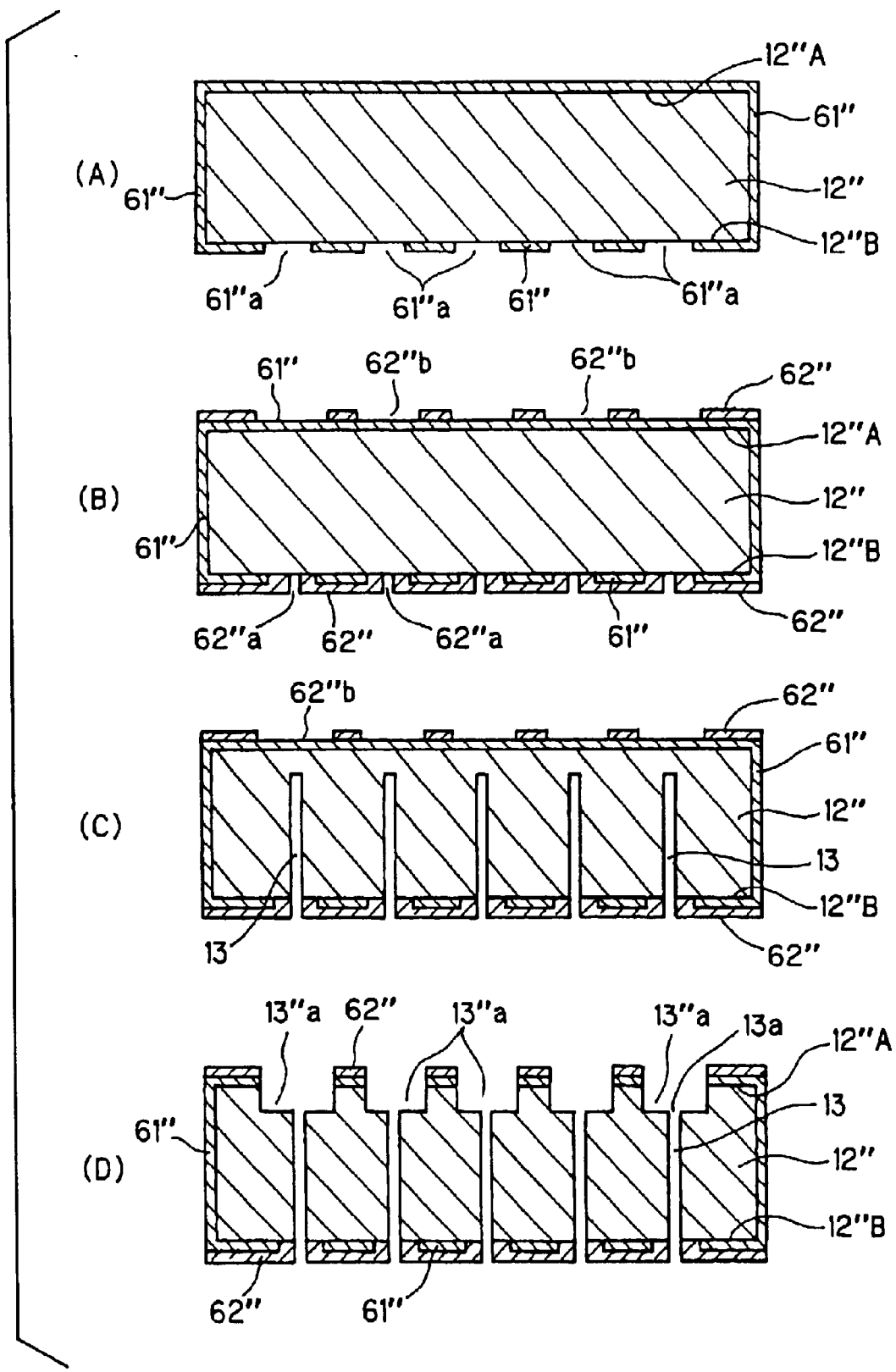
F I G. 24

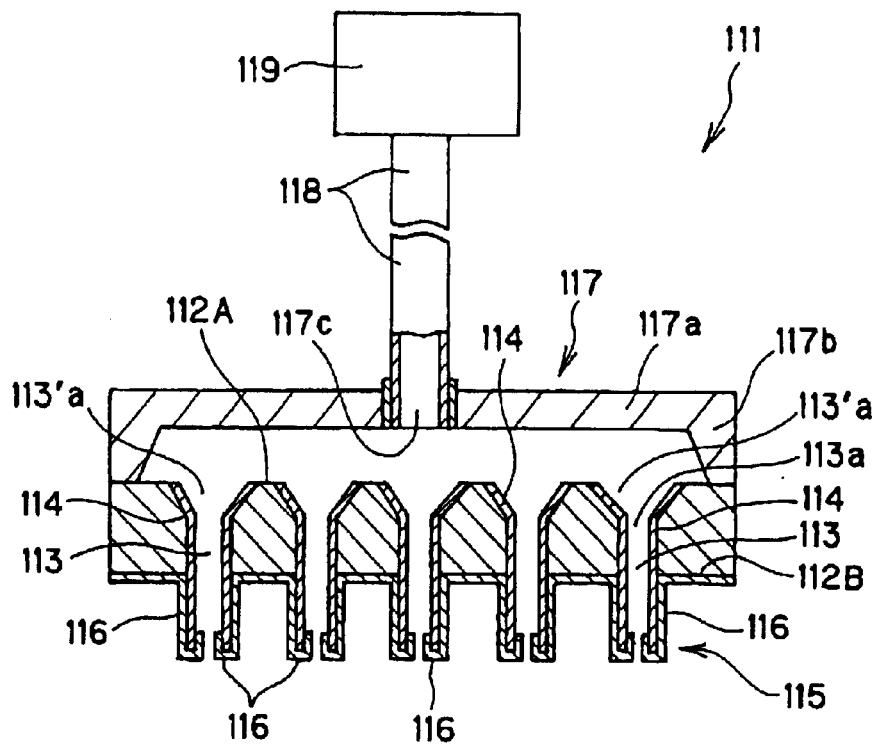
F I G. 28
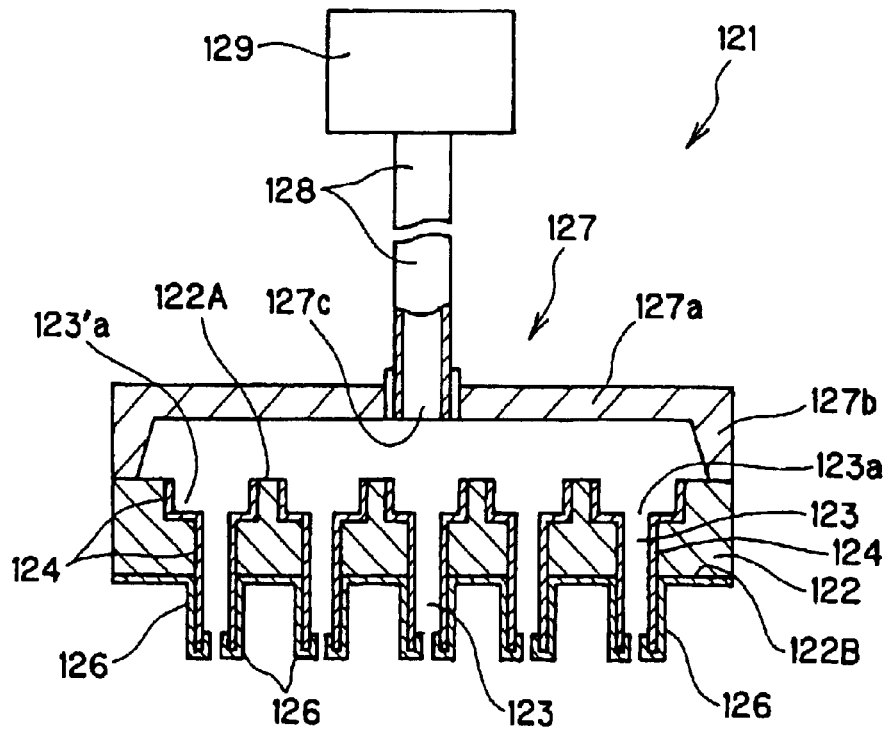
F I G. 29

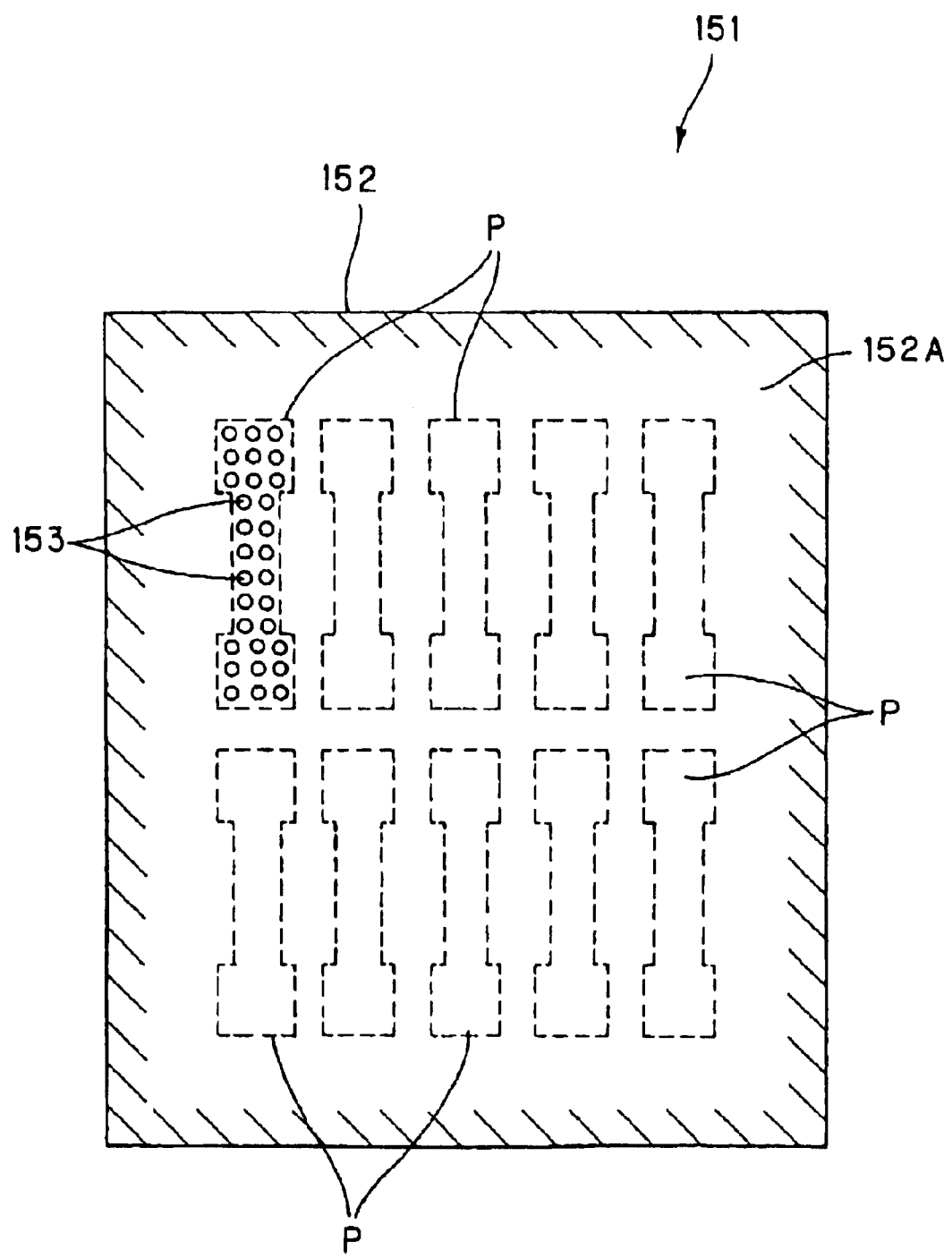
F I G. 36

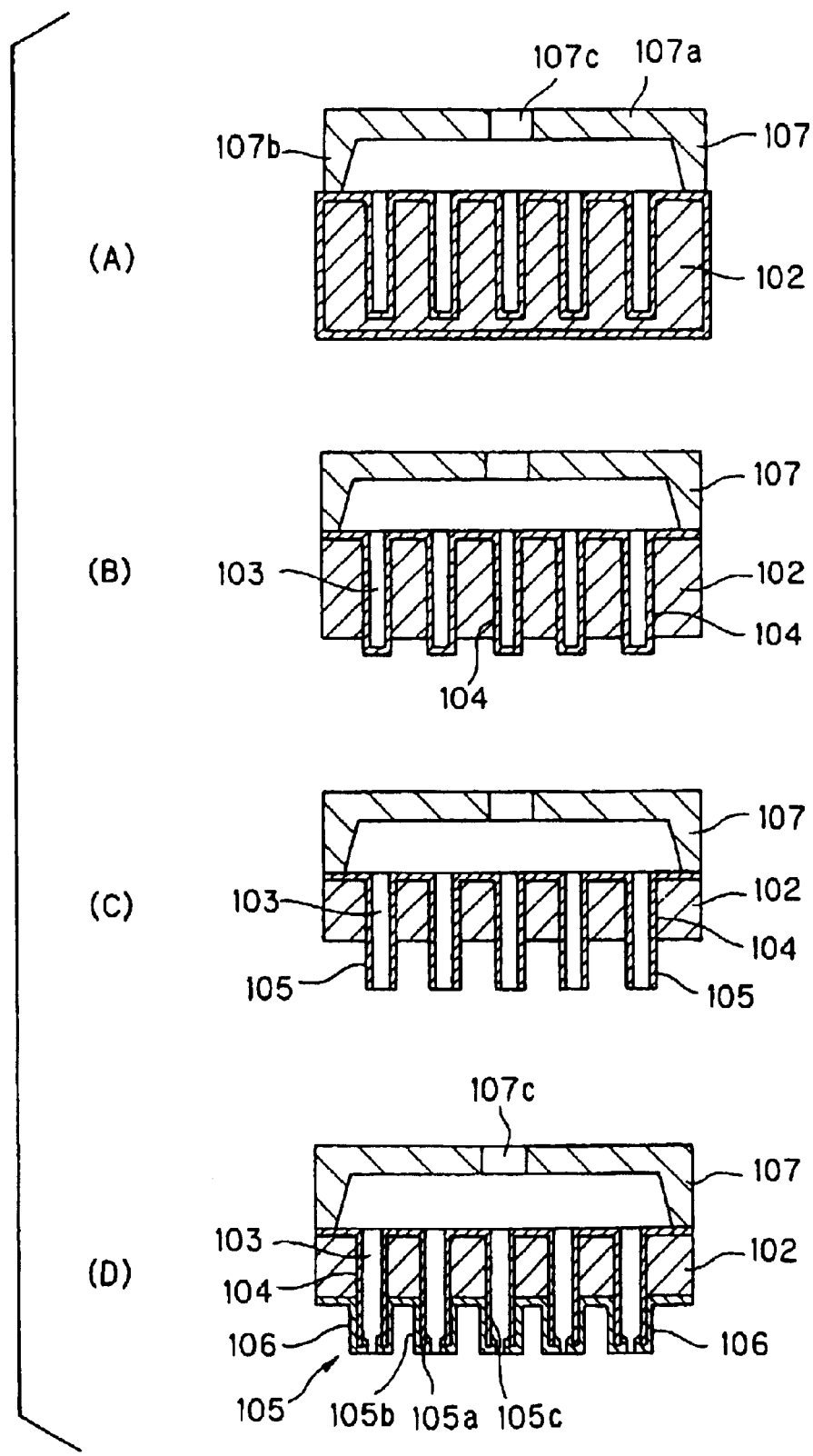
F I G. 38

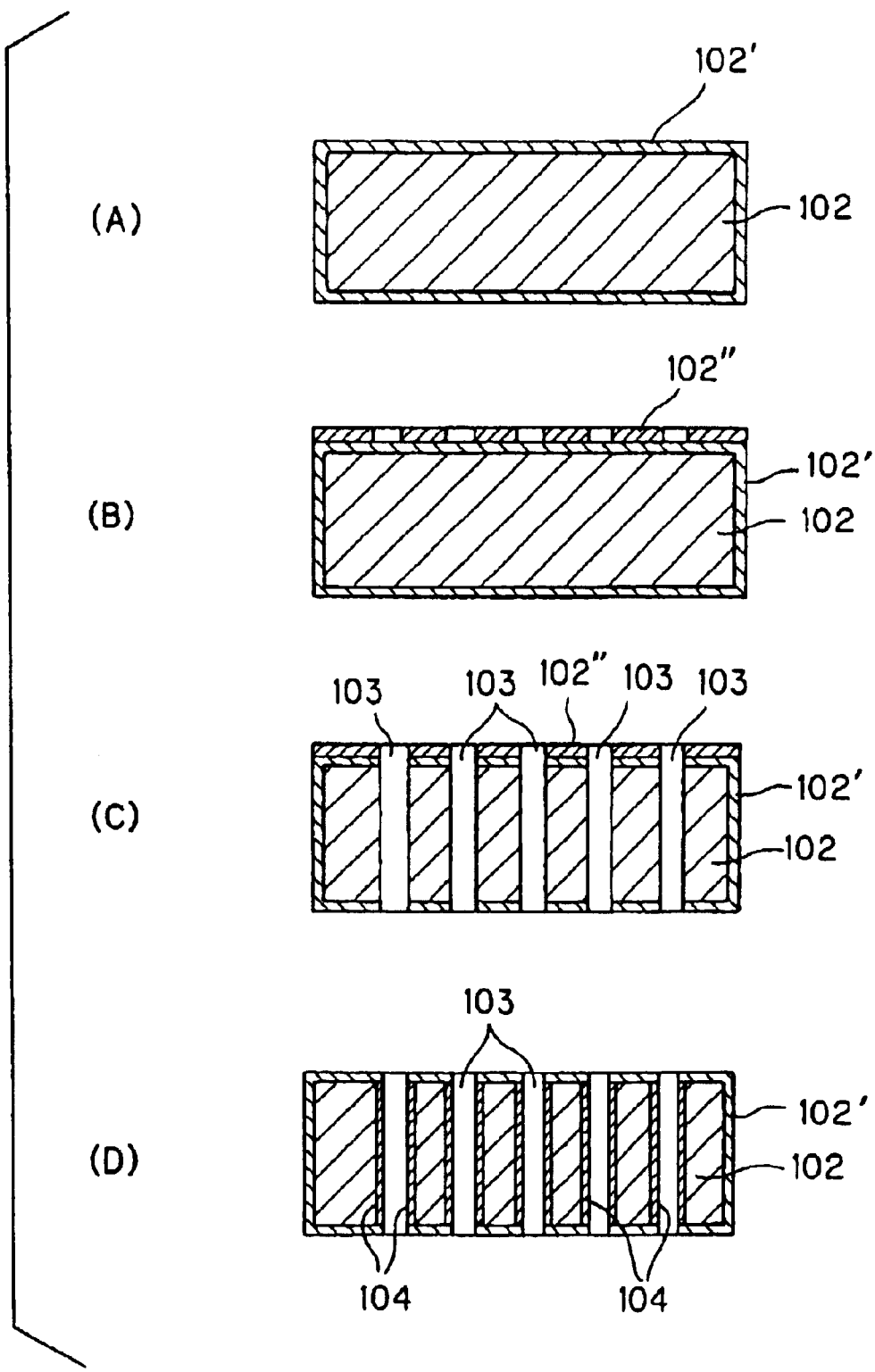
F I G. 39

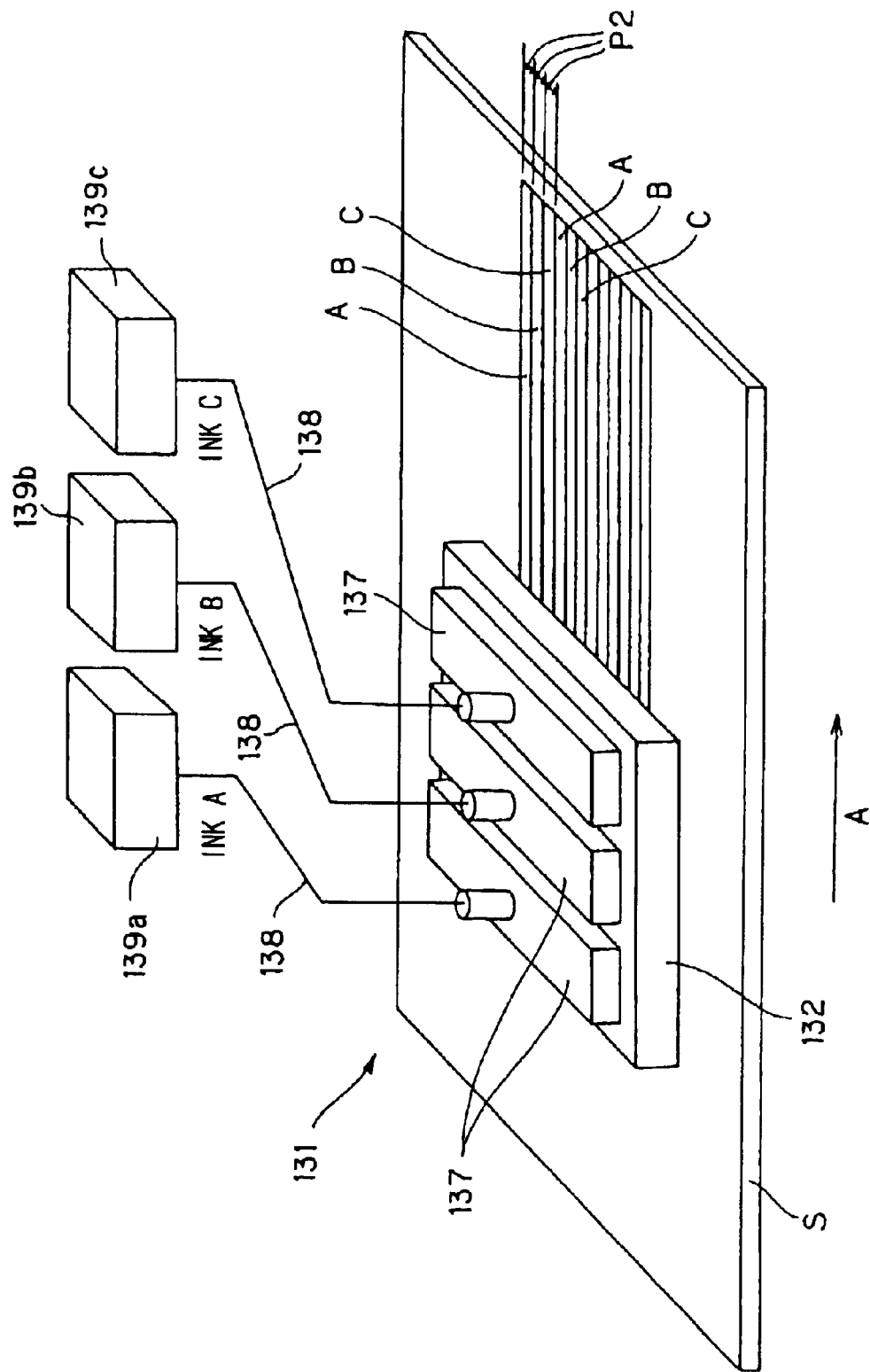
F I G. 46

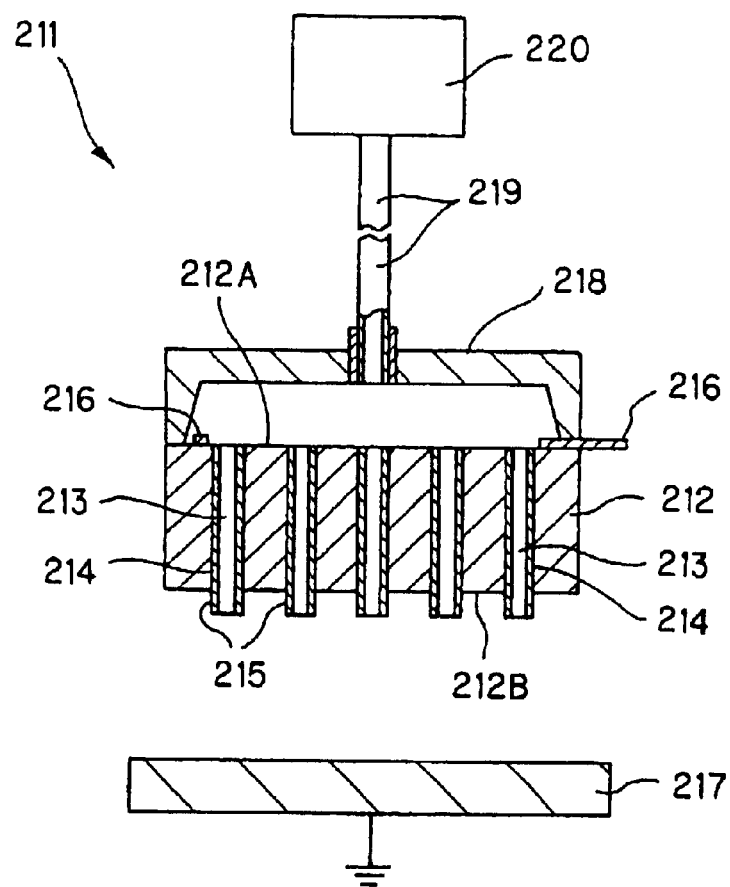
F I G. 50
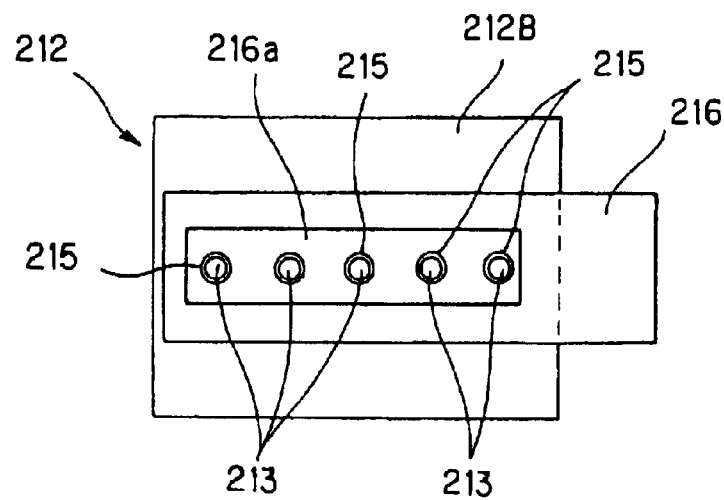
F I G. 51

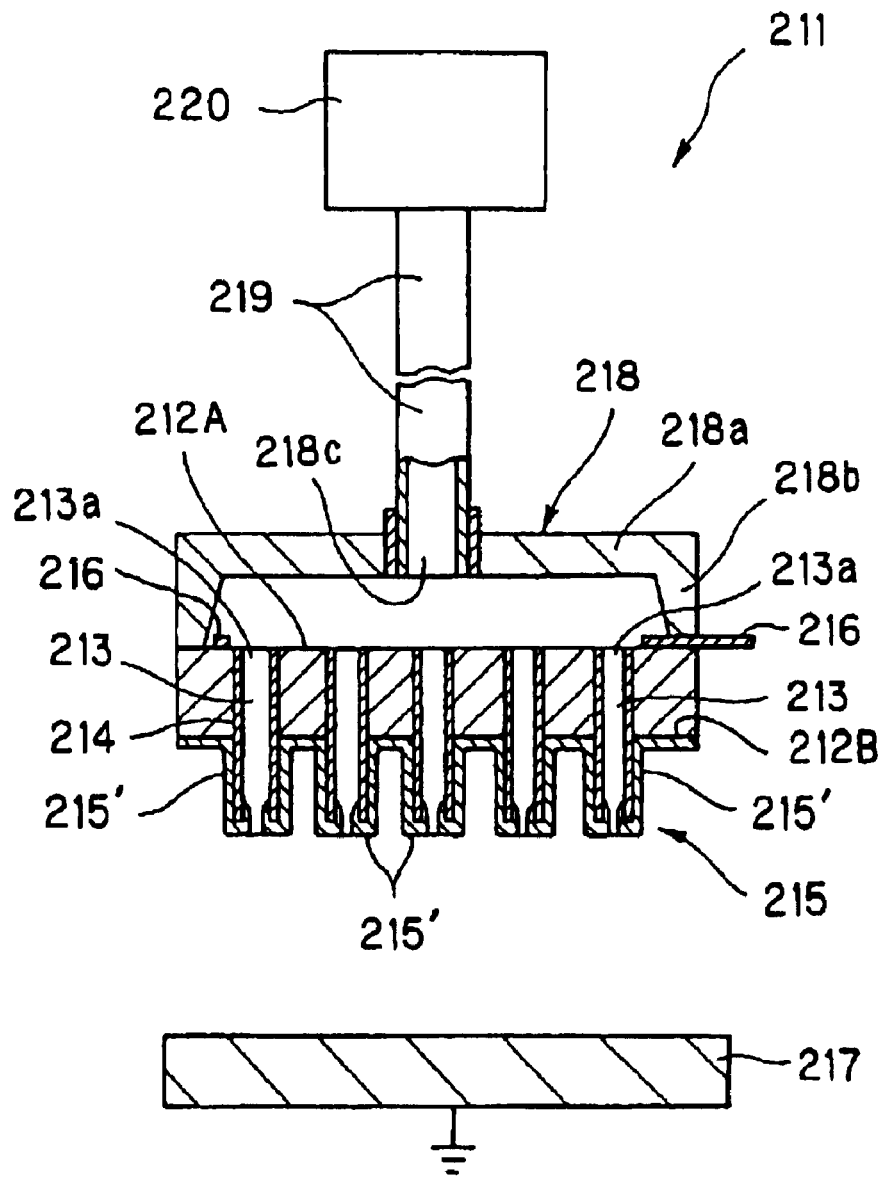
F I G. 52

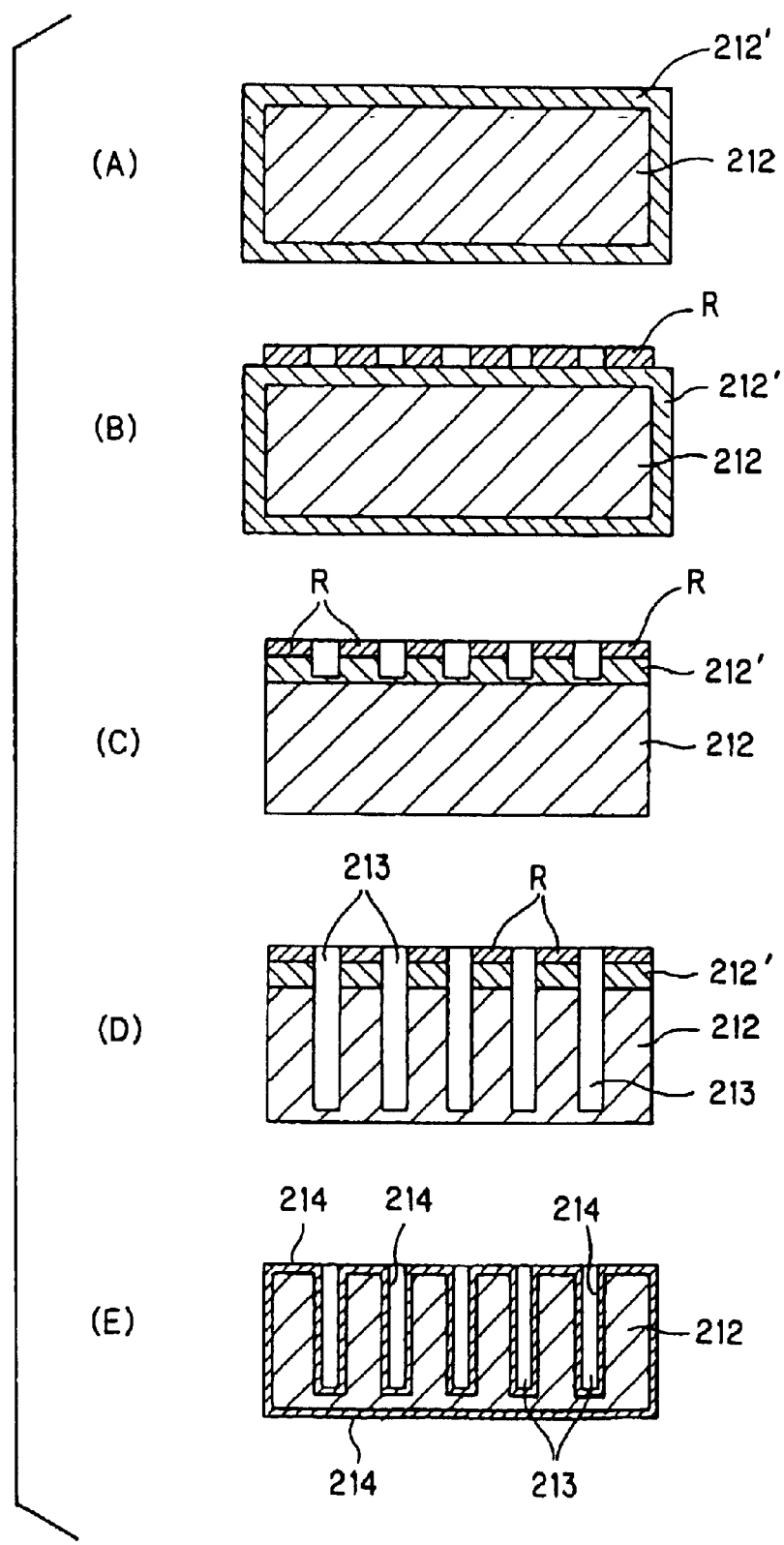
F I G. 62

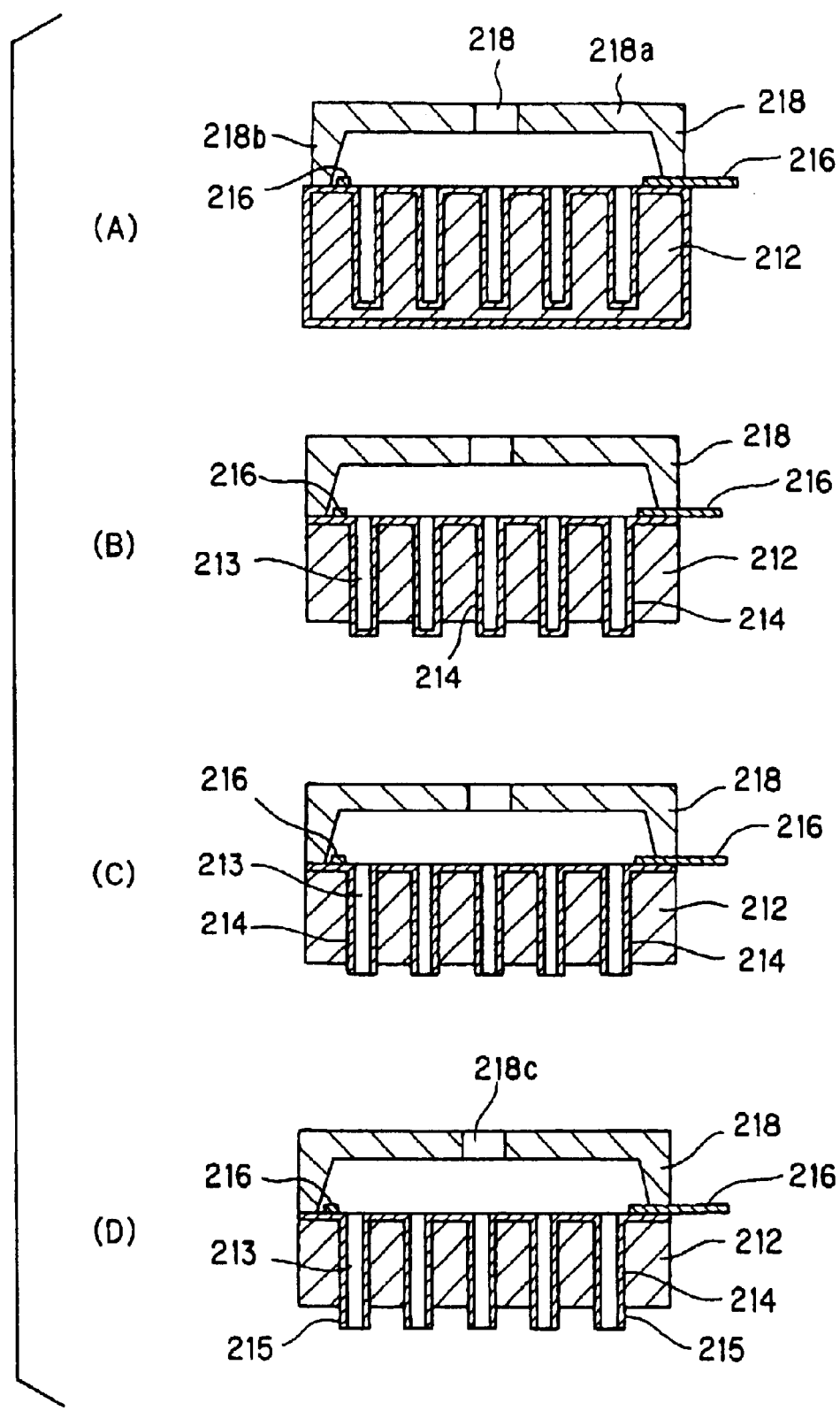
F I G. 63

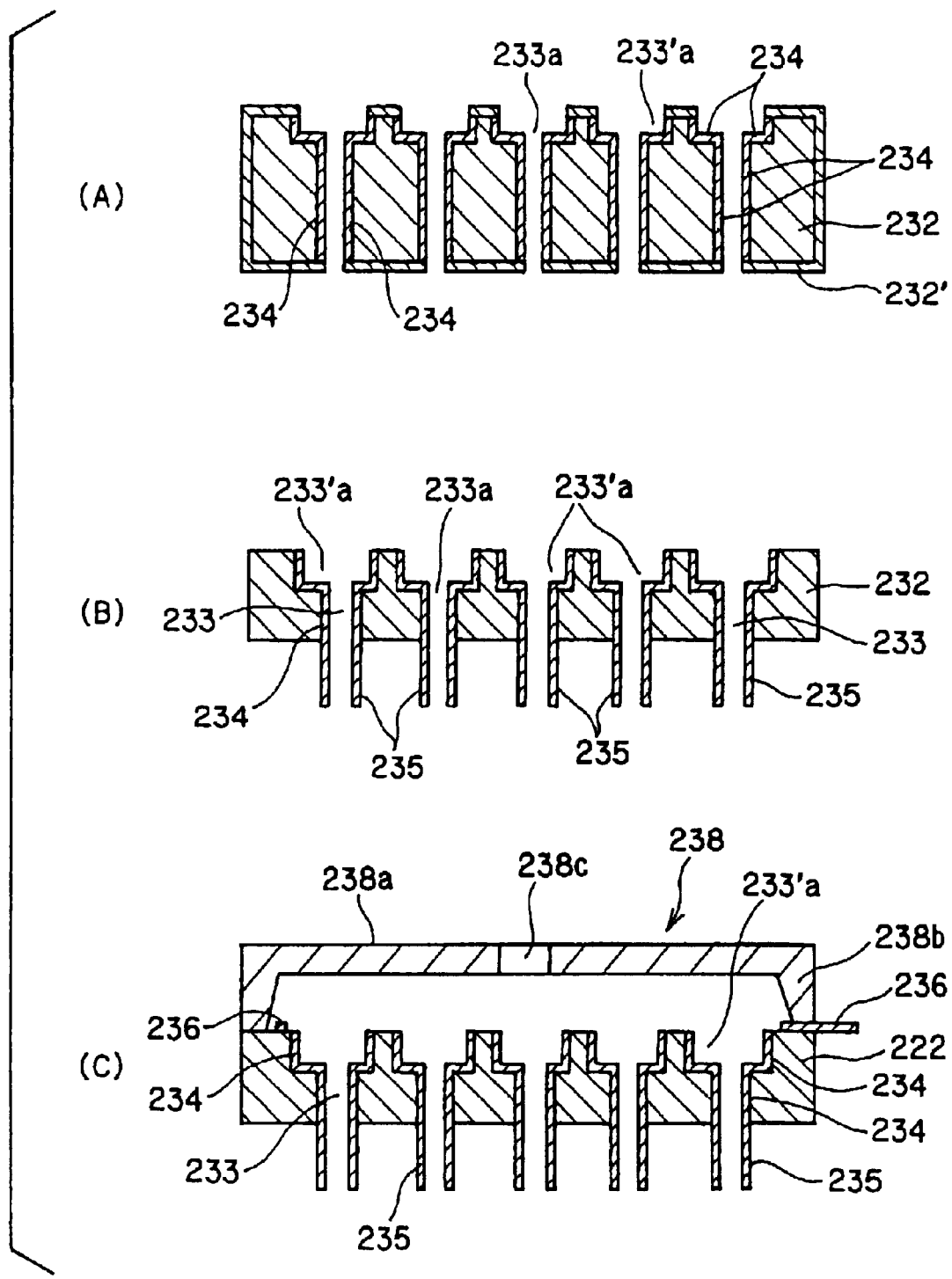
F I G. 67

METHOD FOR FINE PATTERN FORMATION

FIELD OF THE INVENTION

The present invention relates to an apparatus for fine pattern formation, a process for producing fine nozzles, and a method for fine pattern formation, and particularly to an apparatus for fine pattern formation, which can be applied, for example, to pattern formation for the production of liquid crystal displays, plasma displays, and flat displays of electroluminescence or the like, and conductor pattern formation and correction of conductor patterns of printed wiring boards, a process for producing fine nozzles used in the apparatus for fine pattern formation, and a method for the fine pattern formation.

BACKGROUND OF THE INVENTION

Fine patterns, for example, for color filters for liquid crystal displays have been formed by photolithography, printing, electrodeposition, or the like. Among these pattern formation methods, photolithography is advantageous in accuracy and quality of appearance. The photolithography, which can realize wiring of a pattern with high accuracy, is also used in the formation of conductor patterns in printed wiring boards.

In an example of the production of a color filter by photolithography, a photosensitive resist is coated on a thin film of a metal, such as chromium, formed, for example, by sputtering or vapor deposition, exposure through a photomask and development are carried out to prepare a resist pattern, and the thin metal film is patterned by etching using the resist pattern as a mask to form a black matrix. Next, a color pigment-containing photosensitive resist is coated, followed by exposure through a photomask and development to form a colored layer for a color filter. On the other hand, in the case of a printed wiring board, a photosensitive resist pattern is formed on a copper plating, and the copper plating is etched using the photosensitive resist pattern as a mask to produce a conductor pattern.

The above-described conventional fine pattern formation by photolithography, such as pattern formation for a color filter and conductor pattern formation, however, disadvantageously suffers from a complicated process, which is an obstacle to a reduction in production cost.

DISCLOSURE OF THE INVENTION

Under the above circumstances, the present invention has been made, and it is an object of the present invention to provide an apparatus for fine pattern formation, which can form a fine pattern with high accuracy by direct writing of a pattern with ink, a production process of fine nozzles provided in the apparatus for fine pattern formation, and a method for fine pattern formation.

In order to attain the above object, according to one aspect of the present invention, there is provided an apparatus for fine pattern formation comprising: a silicon substrate; a plurality of fine holes which extend through the silicon substrate from the surface of the silicon substrate to the back surface of the silicon substrate and have a silicon oxide layer on the wall surface thereof; fine nozzles which are protruded, integrally with the silicon oxide layer, on the back surface side of the silicon substrate from each opening of the fine holes; a silicon nitride layer provided on the surface and side of the silicon substrate; a support member provided on the surface side of the silicon substrate; an ink passage for supplying ink to the opening of each fine hole on the surface side of the silicon substrate; and an ink supplying device connected to the ink passage.

In this apparatus, preferably, the diameter of the openings in the fine nozzles is in the range of 1 to 100 $\mu$m in a variation within ±1 $\mu$m and the fine nozzles are provided at a pitch in the range of 2 to 1000 $\mu$m.

According to another aspect of the present invention, there is provided an apparatus for fine pattern formation, comprising: a silicon substrate; a plurality of fine nozzles protruded from the back surface of the silicon substrate; a plurality of fine holes which extend at fine nozzle formed sites through the silicon substrate from the surface of the silicon substrate to the back surface of the silicon substrate and have a silicon oxide layer on the wall surface thereof; a support member provided on the surface side of the silicon substrate; an ink passage for supplying ink to the opening of each fine hole on the surface side of the silicon substrate; and an ink supplying device connected to the ink passage, said fine nozzles each comprising a nozzle base provided integrally with the silicon substrate, an inner surface layer of silicon oxide provided on the inner wall surface of nozzle bases in communication with the fine holes, and an end face layer of silicon oxide provided integrally with the inner surface layer of silicon oxide so as to cover the front end face of the nozzle bases.

In this apparatus, preferably, the diameter of the openings in the fine nozzles is in the range of 1 to 100 $\mu$m in a variation within ±1 $\mu$m and the fine nozzles are provided at a pitch in the range of 4 to 1000 $\mu$m.

In the above apparatuses for fine pattern formation, preferably, the protrusion length of the fine nozzles is in the range of 1 to 150 $\mu$m.

In the above apparatuses for fine pattern formation, preferably, the fine holes in their openings on the surface side of the silicon substrate are in the form of tapered concaves which have been widened toward the surface side of the silicon substrate. Alternatively, in the above apparatuses for fine pattern formation, preferably, the fine holes in their openings on the surface side of the silicon substrate are in the form of multistaged concaves which have been widened toward the surface side of the silicon substrate.

In the above apparatuses for fine pattern formation, preferably, fine holes are divided into two or more groups and ink passages are provided separately from each other or one another for respective fine hole groups.

According to still another aspect of the present invention, there is provided a process for producing a plurality of fine nozzles, formed of silicon oxide, protruded from one surface of a silicon substrate and in communication with fine holes which extend through the silicon substrate and have a silicon oxide layer on the wall surface thereof, said process comprising: a first step of providing a silicon substrate having on its whole surface a silicon nitride layer and forming a mask pattern having a plurality of fine openings on the silicon nitride layer in its portion located on one surface of the silicon substrate; a second step of forming through fine holes in the silicon substrate by deep etching using the mask pattern as a mask; a third step of removing the mask pattern and oxidizing the inside of the through fine holes of the silicon substrate to form a silicon oxide layer; and a fourth step of removing a part of the silicon nitride layer and a part of the silicon substrate from one surface of the silicon substrate by dry etching to expose the silicon oxide layer by a predetermined length, thereby forming fine nozzles.

In the fourth step, preferably, etching is started with the surface from which the mask pattern has been removed.

According to a further aspect of the present invention, there is provided a process for producing a plurality of fine nozzles protruded from one surface of a silicon substrate, said fine nozzles comprising a nozzle base, provided integrally with the silicon substrate, and a silicon oxide end face layer covering the front end face of the nozzle base, said nozzle base being in communication with fine holes, which extend through the silicon substrate and have a silicon oxide layer on the wall surface thereof, and having a silicon oxide inner surface layer on its inner wall surface, said process comprising: a first step of providing a silicon substrate having on its whole surface a silicon nitride layer and patterning the silicon nitride layer in its portion located on one surface of the silicon substrate to form a pattern having a plurality of small openings; a second step of forming a mask thin film so as to cover the pattern of the silicon nitride layer and patterning the mask thin film to form a mask pattern having fine openings located within the small openings; a third step of forming through fine holes in the silicon substrate by deep etching using the mask pattern as a mask; a fourth step of removing the mask pattern and oxidizing sites within the through fine holes in the silicone substrate and sites exposed within the small openings to form a silicon oxide layer; a fifth step of removing the silicon nitride layer and removing a part of the silicon substrate by dry etching using the silicon oxide layer as a mask from the surface side, on which the silicon oxide layer has been formed, to form nozzle bases having a predetermined length, thereby forming fine nozzles.

According to a still further aspect of the present invention, there is provided a process for producing a plurality of fine nozzles, formed of silicon oxide, protruded from one surface of a silicon substrate and in communication with fine holes which extend through the silicon substrate and have a silicon oxide layer on the wall surface thereof, said process comprising: a first step of providing a silicon substrate of <100> surface crystal orientation having on its whole surface a silicon nitride layer and patterning the silicon nitride layer in its portion located on one surface side of the silicon substrate to form a pattern having a plurality of openings for taper; a second step of etching the surface of the silicon substrate by crystallographically anisotropic etching using the silicon nitride layer as a mask to form tapered concaves; a third step of forming a mask thin film on both surfaces of the silicon substrate and patterning the mask thin film in its portion located on the surface of the silicon substrate remote from the tapered concaves to form a mask pattern having fine openings such that the center of each opening substantially conforms to the center of each tapered concave through the silicon substrate; a fourth step of forming through fine holes in the silicon substrate by deep etching using, as a mask, the mask pattern and the mask thin film; a fifth step of removing the mask pattern and the mask thin film and oxidizing sites within the through fine holes in the silicone substrate and sites exposed within the tapered concaves to form a silicon oxide layer; and a sixth step of removing a part of the silicon nitride layer and a part of the silicon substrate by dry etching from the surface side of the silicon substrate remote from the tapered concaves to expose the silicon oxide layer by a predetermined length, thereby forming fine nozzles.

According to another aspect of the present invention, there is provided a process for producing a plurality of fine nozzles protruded from one surface of a silicon substrate, said fine nozzles comprising a nozzle base, provided integrally with the silicon substrate, and a silicon oxide end face layer covering the front end face of the nozzle base, said nozzle base being in communication with fine holes, which extend through the silicon substrate and have a silicon oxide layer on the wall surface thereof, and having a silicon oxide inner surface layer on its inner wall surface, said process comprising: a first step of providing a silicon substrate of <100> surface crystal orientation having on its whole surface a silicon nitride layer and patterning the silicon nitride layer in its portion located on one surface side of the silicon substrate to form a pattern having a plurality of openings for taper; a second step of etching the surface of the silicon substrate by crystallographically anisotropic etching using the silicon nitride layer as a mask to form tapered concaves; a third step of patterning the silicon nitride layer in its portion located on the surface side of the silicon substrate remote from the tapered concaves to form a pattern having small openings such that the center of each opening substantially conforms to the center of each tapered concave through the silicon substrate; a fourth step of forming a mask thin film on both surfaces of the silicon substrate and patterning the mask thin film in its portion located on the surface side of the silicon substrate remote from tapered concaves to form a mask pattern having fine openings located within the small openings; a fifth step of forming through fine holes in the silicon substrate by deep etching using, as a mask, the mask pattern and the mask thin film; a sixth step of removing the mask pattern and the mask thin film and oxidizing sites within the through fine holes in the silicone substrate, sites exposed within the small openings, and sites exposed within the tapered concaves to form a silicon oxide layer; and a seventh step of removing the silicon nitride layer and removing a part of the silicon substrate by dry etching using the silicon oxide layer as a mask from the surface side of the silicon substrate remote from the tapered concaves to form nozzle bases having a predetermined length, thereby forming fine nozzles.

According to still another aspect of the present invention, there is provided a process for producing a plurality of fine nozzles, formed of silicon oxide, protruded from one surface of a silicon substrate and in communication with fine holes which extend through the silicon substrate and have a silicon oxide layer on the wall surface thereof, said process comprising: a first step of providing a silicon substrate having on its whole surface a silicon nitride layer, forming a mask pattern having a plurality of fine openings on the silicon nitride layer in its portion located on one surface of the silicon substrate, and forming, on the silicon nitride layer on the other surface of the silicon substrate, a mask pattern having wide openings such that the center of each wide opening substantially conforms to the center of each fine opening through the silicon substrate; a second step of forming fine holes having predetermined depth in the silicon substrate by deep etching using the mask pattern having fine openings as a mask; a third step of forming wide concaves in the silicon substrate by deep etching using the mask pattern having wide openings as a mask in such a manner that the openings of the fine holes are exposed within the wide concaves, thereby forming multistaged concaves; a fourth step of removing the mask pattern and oxidizing sites within the fine holes of the silicon substrate and sites exposed within the wide concaves to form a silicon oxide layer; and a fifth step of removing a part of the silicon nitride layer and a part of the silicon substrate from the surface of the silicon substrate remote from the wide concaves by dry etching to expose the silicon oxide layer by a predetermined length, thereby forming fine nozzles.

According to a further aspect of the present invention, there is provided a process for producing a plurality of fine nozzles protruded from one surface of a silicon substrate, said fine nozzles comprising a nozzle base, provided integrally with the silicon substrate, and a silicon oxide end face layer covering the front end face of the nozzle base, said nozzle base being in communication with fine holes, which extend through the silicon substrate and have a silicon oxide layer on the wall surface thereof, and having a silicon oxide inner surface layer on its inner wall surface, said process comprising: a first step of providing a silicon substrate having on its whole surface a silicon nitride layer and patterning the silicon nitride layer in its portion located on one surface of the silicon substrate to form a pattern having a plurality of small openings; a second step of forming a mask thin film so as to cover the pattern of the silicon nitride layer and then patterning the mask thin film to form a mask pattern having fine openings located within the small openings, and, in addition, patterning the mask thin film on the other surface to form a mask pattern having wide openings such that the center of each wide opening substantially conforms to the center of each fine opening through the silicon substrate; a third step of forming fine holes having predetermined depth in the silicon substrate by deep etching using the mask pattern having fine openings as a mask; a fourth step of forming wide concaves in the silicon substrate by deep etching using the mask pattern having wide openings as a mask in such a manner that the openings of the fine holes are exposed within the wide concaves, thereby forming multistaged concaves; a fifth step of removing the mask pattern and oxidizing sites within the fine holes of the silicon substrate, sites exposed within the wide concaves, and sites exposed within the small openings to form a silicon oxide layer; and a sixth step of removing the silicon nitride layer and removing a part of the silicon substrate by dry etching using the silicon oxide layer as a mask from the surface of the silicon substrate remote from the wide concaves to form nozzle bases having a predetermined length, thereby forming fine nozzles.

According to the above invention, ink supplied to the fine holes in the silicon substrate can be ejected through the fine nozzles and deposited onto a pattern object to directly write a pattern on the pattern object, and the amount of ink deposited can be varied as desired by varying the amount of ink supplied.

Furthermore, in order to attain the above object, according to a further aspect of the present invention, there is provided an apparatus for fine pattern formation comprising: a silicon substrate; a plurality of fine holes which extend through the silicon substrate from the surface of the silicon substrate to the back surface of the silicon substrate and have a silicon oxide layer on the wall surface thereof; fine nozzles which are protruded, integrally with the silicon oxide layer, on the back surface side of the silicon substrate from each opening of the fine holes; a reinforcing layer provided at least on the front end face and outer face of the fine nozzles; a support member provided on the surface side of the silicon substrate; an ink passage for supplying ink to the opening of each fine hole on the surface side of the silicon substrate; and an ink supplying device connected to the ink passage.

In the above apparatus for fine pattern formation, preferably, the thickness of the reinforcing layer is at least twice the thickness of the fine nozzles.

In the above apparatus for fine pattern formation, preferably, the reinforcing layer is formed of any one of silicon oxide and phosphorus silicon glass.

In the above apparatus for fine pattern formation, preferably, the fine nozzles have an opening diameter in the range of 1 to 100 $\mu$m and are provided at a pitch in the range of 4 to 1000 $\mu$m. Alternatively, in the above apparatus for fine pattern formation, preferably, the fine nozzles have a projection length in the range of 1 to 400 $\mu$m.

In the above apparatus for fine pattern formation, preferably, the fine holes in their openings on the surface side of the silicon substrate are in the form of tapered concaves which have been widened toward the surface side of the silicon substrate. Alternatively, in the above apparatus for fine pattern formation, preferably, the fine holes in their openings on the surface side of the silicon substrate are in the form of multistaged concaves which have been widened toward the surface side of the silicon substrate.

In the above apparatus for fine pattern formation, preferably, the fine holes are divided into two or more groups and ink passages are provided separately from each other or one another for respective fine hole groups.

In the above apparatus for fine pattern formation, preferably, a water-repellent layer is provided at least on the reinforcing layer, which is provided on the outer face of the fine nozzles, and on the back surface side of the silicon substrate.

In the above apparatus for fine pattern formation, preferably, the water-repellent layer is formed of fluorocarbon.

According to the present invention, the provision of the reinforcing layer in the fine nozzles can enhance the mechanical strength of the fine nozzles, ink supplied to the fine holes in the silicon substrate can be ejected through the fine nozzles and deposited on the pattern object to directly write a pattern, and the amount of ink deposited can be varied as desired by varying the amount of ink supplied.

Further, in order to attain the above object, according to another aspect of the present invention, there is provided an apparatus for fine pattern formation, comprising: a silicon substrate; a plurality of fine holes provided so as to extend through the silicon substrate from the surface of the silicon substrate to the back surface of the silicon substrate; a main electrode provided on the surface side of the silicon substrate; a counter electrode provided on the back surface side of the silicon substrate while leaving a predetermined space between the main electrode and the counter electrode; a support member provided on the surface side of the silicon substrate; an ink passage for supplying ink to openings in the fine holes on the surface side of the silicon substrate; and an ink supplying device connected to the ink passage.

In the above apparatus for fine pattern formation, preferably, nozzles are protruded from the openings of the fine holes on the back surface side of the silicon substrate.

In the above apparatus for fine pattern formation, preferably, the wall surface of the fine holes has a silicon oxide layer and the nozzles are formed of silicon oxide.

In the above apparatus for fine pattern formation, preferably, the counter electrode is in a drum or flat plate form.

In the above apparatus for fine pattern formation, preferably, the fine holes have an opening diameter in the range of 1 to 100 $\mu$m and are provided at a pitch in the range of 2 to 1000 $\mu$m.

In the above apparatus for fine pattern formation, preferably, the nozzles have a protrusion length in the range of 10 to 400 $\mu$m.

In the above apparatus for fine pattern formation, preferably, the fine holes in their openings on the surface side of the silicon substrate are in the form of tapered concaves which have been widened toward the surface side of the silicon substrate. Alternatively, in the above apparatus for fine pattern formation, preferably, the fine holes in their openings on the surface side of the silicon substrate are in the form of multistaged concaves which have been widened toward the surface side of the silicon substrate.

In the above apparatus for fine pattern formation, preferably, the fine holes are divided into two or more groups and ink passages are provided separately from each other or one another for respective fine hole groups. Alternatively, in the above apparatus for fine pattern formation, preferably, main electrodes are separately provided for respective fine hole groups.

According to still another aspect of the present invention, there is provided a method for fine pattern formation, comprising the step of: while relatively scanning any one of the apparatuses for fine pattern formation and a pattern object in a predetermined direction, continuously or intermittently ejecting ink supplied at low pressure from the ink passage onto the pattern object through the fine holes in such a state that a voltage is applied to the main electrode in the apparatus for fine pattern formation, whereby a stripe pattern or a dot pattern is formed.

In the above method for fine pattern formation, preferably, stripes constituting the pattern are formed by supplying ink through a plurality of fine holes arranged on an identical line along the scanning direction.

According to a further aspect of the present invention, there is provided a method for fine pattern formation, comprising the steps of: disposing any one of the above apparatuses for fine pattern formation at a predetermined position of a pattern object; and ejecting a given amount of ink supplied at low pressure from the ink passage onto the pattern object through the fine holes in such a state that a voltage is applied to the main electrode of the apparatus for fine pattern formation, whereby a pattern is formed.

In the above method for fine pattern formation, preferably, the voltage applied to the main electrode is regulated to control ink ejection width and the amount of ink ejected.

According to the present invention, supplied ink can be ejected through the fine holes in the silicon substrate by an electric field formed between the main electrode and the counter electrode and a low pressure applied at the time of supply of the ink and can be deposited onto a pattern object to directly write a pattern, and the amount of ink deposited can be varied as desired by varying the field strength and the ink supply pressure to control ink ejection width and the amount of ink ejected. As used herein, the term "ink" generally refers to a liquid composition comprising a colorant, such as a dye or a pigment, and a binder or a vehicle. For example, in display members or circuit formation applications, however, the ink widely embraces pastes containing metallic or magnetic fine particles or ceramic or other fine particles, and liquid compositions containing a resin or a phosphor material or an organic EL material, and photoresists.

BRIEF DESCRIPTION OF THE DRAWINGS

FIG. 3 is a schematic cross-sectional view showing a still another embodiment of the apparatus for fine pattern formation according to the present invention;

FIG. 4 is a schematic cross-sectional view showing a further embodiment of the apparatus for fine pattern formation according to the present invention;

FIG. 9 is a diagram showing a further embodiment of the apparatus for fine pattern formation according to the present invention, wherein FIG. 9(A) is a schematic cross-sectional view and FIG. 9(B) a bottom view.

FIG. 10 is a transverse sectional view taken on line A—A of a support member in the apparatus for fine pattern formation shown in FIG. 9;

FIG. 11 is a transverse sectional view taken on line B—B of a support member in the apparatus for fine pattern formation shown in FIG. 9;

FIG. 22 is a process diagram illustrating still another embodiment of the production process of fine nozzles according to the present invention;

FIG. 23 is a process diagram illustrating a further embodiment of the production process of fine nozzles according to the present invention;

FIG. 24 is a process diagram illustrating a still further embodiment of the production process of fine nozzles according to the present invention;

FIG. 28 is a schematic cross-sectional view showing another embodiment of the apparatus for fine pattern formation according to the present invention;

FIG. 29 is a schematic cross-sectional view showing still another embodiment of the apparatus for fine pattern formation according to the present invention;

FIG. 32 is a diagram showing another embodiment of the apparatus for fine pattern formation according to the present invention, wherein

FIG. 36 is a plan view showing a further embodiment of the apparatus for fine pattern formation according to the present invention;

FIG. 38 is a process diagram illustrating one embodiment of the production of the apparatus for fine pattern formation according to the present invention;

FIG. 39 is a process diagram illustrating another embodiment of the production of the apparatus for fine pattern formation according to the present invention;

FIG. 46 is a perspective view showing one embodiment of fine pattern formation using the apparatus for fine pattern formation according to the present invention;

FIG. 50 is a schematic cross-sectional view showing another embodiment of the apparatus for fine pattern formation according to the present invention;

FIG. 51 is a rear view illustrating a main electrode in a frame form provided on the back surface side of a silicon substrate;

FIG. 52 is a schematic cross-sectional view showing still another embodiment of the apparatus for fine pattern formation according to the present invention;

FIG. 57 is a diagram showing a further embodiment of the apparatus for fine pattern formation according to the present invention, wherein

FIG. 62 is a process diagram showing one embodiment of the production of the apparatus for fine pattern formation according to the present invention;

FIG. 63 is a process diagram showing one embodiment of the production of the apparatus for fine pattern formation according to the present invention;

FIG. 67 is a process diagram showing still further embodiment of the production of the apparatus for fine pattern formation according to the present invention;

BEST MODE FOR CARRYING OUT THE INVENTION

Embodiment of the present invention will be described with reference to the accompanying drawings.

I-1 Apparatus for Fine Pattern Formation (First Embodiment)

Figure 1:
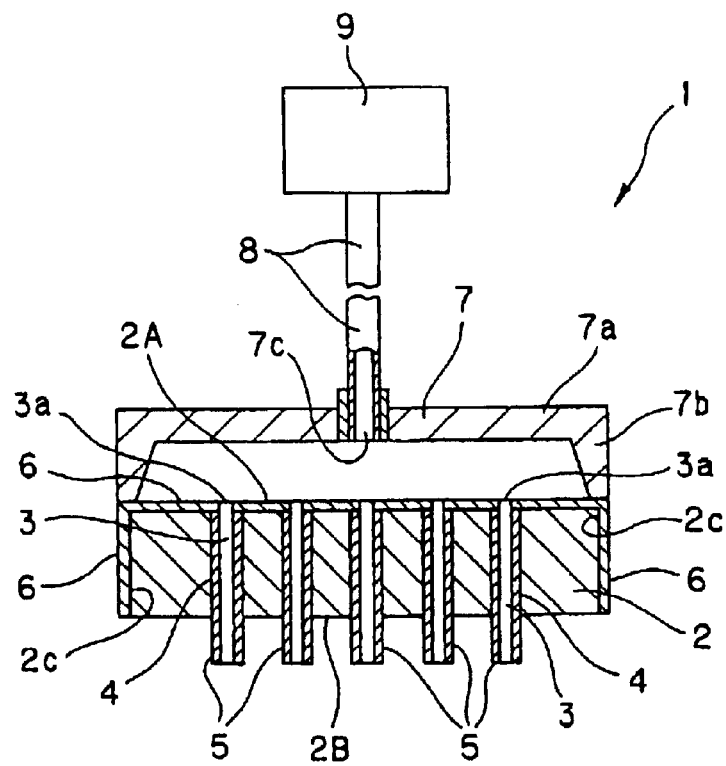
FIG. 1 is a schematic cross-sectional view showing one embodiment of the apparatus for fine pattern formation according to the present invention.

FIG. 1 is a schematic cross-sectional view showing an embodiment of the apparatus for fine pattern formation according to the present invention. In FIG. 1, an apparatus 1 for fine pattern formation comprises a silicon substrate 2, fine nozzles 5 protruded on the back surface 2B side of the silicon substrate 2, a silicon nitride layer 6 provided on a surface 2A and a side face 2C of the silicon substrate 2, a support member 7, an ink passage 8 for supplying ink to a space between the silicon substrate 2 and the support member 7, and an ink supplying device 9 connected to the ink passage 8.

The silicon substrate 2 has a plurality of fine holes 3 which extend through the silicon substrate 2 from the surface 2A side to the back surface 2B side. Openings 3a on the surface 2A side of the fine holes 3 are exposed to the space defined by the silicon substrate 2 and the support member 7. The silicon substrate 2 is preferably formed of a single crystal of silicon, and the thickness of the silicon substrate 2 is preferably about 200 to 500 μm. Since the silicon substrate 2 has a low coefficient of linear expansion of about $2.6 \times 10^{-6}$/K, a change in shape upon a temperature change is very small.

The fine holes 3 are cylindrical spaces which are circular in a transverse section perpendicular to the axial direction (a section parallel to the surface 2A of the silicon substrate 2) and are rectangular in a longitudinal section along the axial direction (a section perpendicular to the surface 2A of the silicon substrate 2) A silicon oxide layer 4 is provided on the wall surface of the fine holes 3. The thickness of the silicon oxide layer 4 is generally about 5000 to 10000 angstroms. In the embodiment shown in the drawing, the thickness of the silicon substrate 2, the inner diameter of the fine holes 3, the number of fine holes, the pitch of the fine holes and the like are simplified for the explanation of the construction of the apparatus. The inner diameter of the fine holes 3 may be properly set in the range of about 1 to 100 μm, and the aspect ratio of the fine holes 3 may be properly set in the range of about 1 to 100. The number of the fine holes 3 and the pitch of the fine holes 3 may be properly set according to the form of pattern formed by the apparatus 1 for fine pattern formation, the method for pattern formation and the like. The pitch of the fine holes 3 is preferably about 1 μm at the smallest.

The transverse sectional form of the fine holes 3 may be, in addition to the above-described circular form, for example, an elliptical or polygonal form or a special form. Further, the fine holes 3 may be a combination of two or more fine holes which are different from each other in transverse sectional form. When the fine holes 3 are elliptical or rectangular in transverse sectional form, the inner diameter in the longitudinal direction may be properly set in the range of 5 to 500 μm. The inner diameter of the fine holes 3 is substantially even in the axial direction, and the variation in the inner diameter is generally within ±1 μm.

The fine nozzles 5 are formed of silicon oxide, are provided integrally with the silicon oxide layer 4 provided on the wall surface of the fine holes 3, and are in communication with the fine holes 3. The thickness of the fine nozzles 5 may be properly set in the range of 5000 to 10000 angstroms, the opening diameter (inner diameter) may be properly set in the range of 1 to 100 μm, and the protrusion level may be properly set in the range of 1 to 150 μm. The opening diameter of the plurality of fine nozzles 5 is substantially even, and the variation in the opening diameter is generally within ±1 μm. The provision of such fine nozzles 5 can prevent ink, ejected from the fine holes 3, from being deposited on the back surface 2B side of the silicon substrate 2.

The silicon nitride layer 6 functions as a mask for selective oxidation (LOCOS) and to impart high electrical insulating properties to the silicon substrate 2, and the thickness of the silicon nitride layer 6 may be properly set in the range of 200 to 3000 angstroms.

The support member 7 is provided on the surface 2A side of the silicon substrate 2, for supporting the silicon substrate 2. In the embodiment shown in the drawing, the support member 7 comprises: a base 7a, which, as with the silicon substrate 2, is flat; a flange portion 7b provided on the periphery of the base 7a; and an opening 7c provided at the center of the base 7a. The support member 7 is fixed to the peripheral portion of the surface 2A side of the silicon substrate 2 by the flange portion 7b. This can provide a space for supplying ink to a portion between the silicon substrate 2 and the support member 7. The fixation of the support member 7 to the silicon substrate 2 through heat-resistant glass, such as Pyrex glass (tradename) (not shown), can improve the working efficiency of later steps in the production of the apparatus for fine pattern formation.

This support member 7 is preferably formed of a material having a coefficient of linear expansion in the range of one-tenth of the coefficient of linear expansion of the silicon substrate 2 to 10 times the coefficient of linear expansion of the silicon substrate 2, for example, Pyrex glass (tradename: Corning #7740, coefficient of linear expansion=$3.5 \times 10^{-6}$/K) or SUS 304 (coefficient of linear expansion=$17.3 \times 10^{-6}$/K). When these materials are used, the level of a distortion caused between the silicon substrate 2 and the support member 7 upon exposure to heat is very small. By virtue of this, the flatness of the silicon substrate 2 is maintained, and a pattern having high positional accuracy can be formed.

The ink passage 8 is connected to the opening 7c of the support member 7, and the other end of the ink passage 8 is connected to an ink supplying device 9. In the embodiment shown in the drawing, only one ink passage 8 in a pipe form is connected. In this case, a construction may also be adopted wherein a plurality of openings 7c are provided, the number of the openings being determined by taking into consideration, for example, the size of the apparatus 1 for fine pattern formation and the evenness of ink flow pressure, and the ink passage 8 is connected to each opening 7c. The support member 7 and the silicon substrate 2 may be fabricated so that the ink passage is provided within the support member 7 and/or the silicon substrate 2.

The ink supplying device 9 is not particularly limited, and any of a continuous supply pump, a constant rate supply pump and the like may be used as the ink supplying device 9 and may be properly selected according to the application of the apparatus 1 for fine pattern formation.

In this apparatus 1 for fine pattern formation according to the present invention, ink can be ejected through the plurality of fine nozzles 5 on the back surface of the silicon substrate 2 in a very small amount with high accuracy at substantially even ejection width, and, at the same time, the deposition of ink onto the back surface of the silicon substrate 2 can be prevented. The amount of ink ejected can be set as desired by varying the amount of ink supplied through the control of the ink supplying device 9. Therefore, a pattern can be stably formed by direct writing with high accuracy on a pattern object.

(Second Embodiment)

Figure 2:
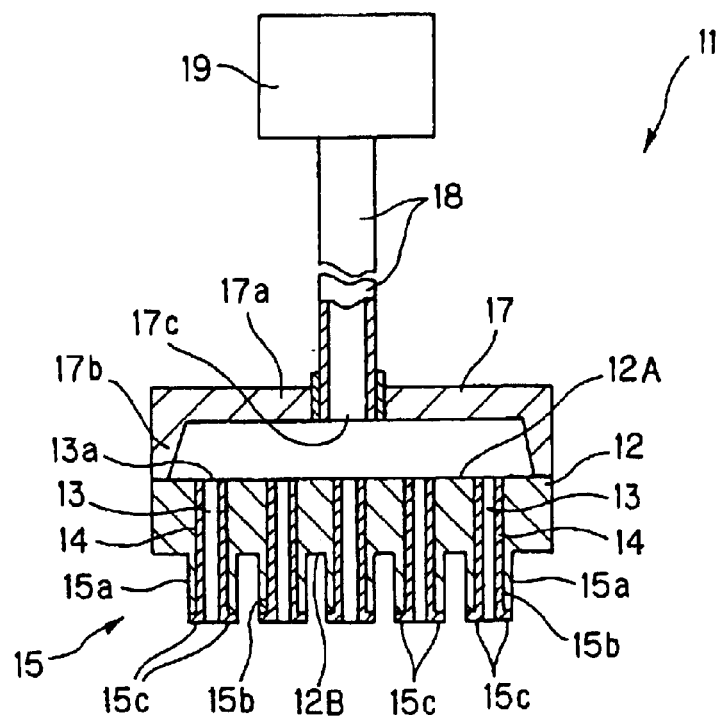
FIG. 2 is a schematic cross-sectional view showing another embodiment of the apparatus for fine pattern formation according to the present invention.

FIG. 2 is a schematic cross-sectional view showing another embodiment of the apparatus for fine pattern formation according to the present invention. As shown in FIG. 2, an apparatus 11 for fine pattern formation comprises a silicon substrate 12, fine nozzles 15 protruded on the back surface 2B side of the silicon substrate 12, a support member 17, an ink passage 18 for supplying ink to a space between the silicon substrate 12 and the support member 17, and an ink supplying device 19 connected to the ink passage 18.

The silicon substrate 12 has a plurality of fine holes 13 which extend through the silicon substrate 12 from the surface 12A side to the back surface 12B side. Openings 13a on the surface 12A side of the fine holes 13 are exposed to the space defined by the silicon substrate 12 and the support member 17. The silicon substrate 12 may be formed of the same material as in the silicon substrate 2, and the thickness of the silicon substrate 12 may also be set in the same range as in the silicon substrate 2.

The fine holes 13 are cylindrical spaces which are circular in a transverse section perpendicular to the axial direction (a section parallel to the surface 12A of the silicon substrate 12) and are rectangular in a longitudinal section along the axial direction (a section perpendicular to the surface 12A of the silicon substrate 12). A silicon oxide layer 14 is provided on the wall surface of the fine holes 13. The thickness of the silicon oxide layer 14 is generally about 5000 to 10000 angstroms. In the embodiment shown in the drawing, the thickness of the silicon substrate 12, the inner diameter of the fine holes 13, the number of fine holes 13, the pitch of the fine holes 13 and the like are simplified for the explanation of the construction of the apparatus. The inner diameter of the fine holes 13 may be properly set in the range of about 1 to 100 $\mu$m, and the aspect ratio of the fine holes 13 may be properly set in the range of about 1 to 100. The number of the fine holes 13 and the pitch of the fine holes 13 may be properly set according to the form of pattern formed by the apparatus 11 for fine pattern formation, the method for pattern formation and the like. The pitch of the fine holes 13 is preferably about 4 $\mu$m at the smallest.

The transverse sectional form of the fine holes 13 may be, in addition to the above-described circular form, for example, an elliptical or polygonal form or a special form. Further, the fine holes 13 may be a combination of two or more fine holes which are different from each other in transverse sectional form. When the fine holes are elliptical or rectangular in transverse sectional form, the inner diameter in the longitudinal direction may be properly set in the range of 5 to 500 $\mu$m. The inner diameter of the fine holes 13 is substantially even in the axial direction, and the variation in the inner diameter is generally within ±1 $\mu$m.

The fine nozzles 15 each comprise: a nozzle base 15a provided integrally with the silicon substrate 12; an inner surface layer 15b of silicon oxide provided on the inner wall surface of the nozzle base 15a in communication with the fine hole 13; and an end face layer 15c of silicon oxide provided so as to cover the front end face of the nozzle base 15a. The inner surface layer 15b of silicon oxide and the end face layer 15c of silicon oxide are provided integrally with the silicon oxide layer 14 provided on the wall surface of the fine hole 13. The outer diameter of the nozzle bases 15a may be properly set in the range of 3 to 150 $\mu$m, and the wall thickness of the nozzle bases 15a may be properly set in the range of 1 to 25 $\mu$m. The thickness of the inner surface layer 15b of silicon oxide and the thickness of the end face layer 15c of silicon oxide may be properly set in the range of 5000 to 10000 angstroms, the opening diameter of the fine nozzles 15 (the inner diameter of the inner surface layer 15b of silicon oxide) may be properly set in the range of 1 to 100 $\mu$m, and the protrusion level of the fine nozzles 15 (the height of the nozzle bases 15a) may be properly set in the range of 1 to 150 $\mu$m. The opening diameter of the plurality of fine nozzles 15 is substantially even, and the variation in the opening diameter is generally within ±1 $\mu$m. The provision of such fine nozzles 15 can prevent ink, ejected from the fine holes 13, from being deposited on the back surface 12B side of the silicon substrate 12.

The support member 17 is provided on the surface 12A side of the silicon substrate 12, for supporting the silicon substrate 12. In the embodiment shown in the drawing, as with the support member 7 described above, the support member 17 comprises: a base 17a, which, as with the silicon substrate 12, is flat; a flange portion 17b provided on the periphery of the base 17a; and an opening 17c provided at the center of the base 17a. The support member 17 is fixed to the peripheral portion of the surface 12A side of the silicon substrate 12 by the flange portion 17b. This can provide a space for supplying ink to a portion between the silicon substrate 12 and the support member 17. The fixation of the support member 17 to the silicon substrate 12 through heat-resistant glass, such as Pyrex glass (tradename) (not shown), can improve the working efficiency of later steps in the production of the apparatus for fine pattern formation.

As with the support member 7 described above, this support member 17 is preferably formed of a material having a coefficient of linear expansion in the range of one-tenth of the coefficient of linear expansion of the silicon substrate 12 to 10 times the coefficient of linear expansion of the silicon substrate 12.

The ink passage 18 is connected to the opening 17c of the support member 17, and the other end of the ink passage 18 is connected to an ink supplying device 19. In the embodiment shown in the drawing, only one ink passage 18 in a pipe form is connected. In this case, a construction may also be adopted wherein a plurality of openings 17c are provided, the number of the openings being determined by taking into consideration, for example, the size of the apparatus 11 for fine pattern formation and the evenness of ink flow pressure, and the ink passage 18 is connected to each opening 17c. The support member 17 and the silicon substrate 12 may be fabricated so that the ink passage is provided within the support member 17 and/or the silicon substrate 12.

The ink supplying device 19 is not particularly limited, and any of a continuous supply pump, a constant rate supply pump and the like may be used as the ink supplying device 19 and may be properly selected according to the application of the apparatus 11 for fine pattern formation.

In this apparatus 11 for fine pattern formation according to the present invention, ink can be ejected through the plurality of fine nozzles 15 on the back surface of the silicon substrate 12 in a very small amount with high accuracy at substantially even ejection width, and, at the same time, the deposition of ink onto the back surface of the silicon substrate 12 can be prevented. The amount of ink ejected can be set as desired by varying the amount of ink supplied through the control of the ink supplying device 19. Therefore, a pattern can be stably formed by direct writing with high accuracy on a pattern object. Further, since the fine nozzles 15 have nozzle bases 15a, the fine nozzles 15 have high mechanical strength and are highly durable against external impact and ink supply pressure.

(Third Embodiment)

FIG. 3 is a schematic cross-sectional view showing still another embodiment of the apparatus for fine pattern formation according to the present invention. As shown in FIG. 3, an apparatus 1' for fine pattern formation comprises a silicon substrate 2', tapered concaves 3'a provided on a surface 2'A of the silicon substrate 2', fine nozzles 5 protruded on the back surface 2'B side of the silicon substrate 2', a silicon nitride layer 6 provided on the surface 2'A and a side face 2'C of the silicon substrate 2', a support member 7, an ink passage 8 for supplying ink to a space between the silicon substrate 2' and the support member 7, and an ink supplying device 9 connected to the ink passage 8.

The silicon substrate 2' has fine holes 3 which extend through the silicon substrate 2' from the bottom of the plurality of tapered concaves 3'a on the surface 2'A side to the back surface 2'B side. Openings 3a on the surface 2'A side of the fine holes 3 are exposed to the tapered concaves 3'a, and the tapered concaves 3'a are exposed to the space defined by the silicon substrate 2' and the support member 7. Preferably, the silicon substrate 2' is formed of a single crystal of silicon, in which the crystallographic orientation of the surface 2'A and the back surface 2'B is <100> face, and has a thickness of about 200 to 500 µm. Since the silicon substrate 2' has a low coefficient of linear expansion of about $2.6 \times 10^{-6}$/K, a change in shape upon a temperature change is very small.

A silicon oxide layer 4 is provided on the wall surface of the tapered concaves 3'a, and the thickness of the silicon oxide layer 4 is generally about 5000 to 10000 angstroms. The taper in the concaves 3'a may be in the form of any of an inverted cone, an inverted quadrangular pyramid and the like, and the depth of the concaves 3'a may be set in the range of about 5 to 150 µm, and the maximum opening diameter may be set in the range of about 10 to 200 µm. For example, when the taper is in an inverted quadrangular pyramid form, the wall surface of the concaves 3'a may be formed so that the angle of the wall surface of the concaves 3'a to the surface 2'A of the silicon substrate 2' (<100> face) is 55 degrees. In the embodiment shown in the drawing, the thickness of the silicon substrate 2', the number of tapered concaves 3'a, the pitch of the tapered concaves 3'a and the like are simplified for the explanation of the construction of the apparatus. The number of the concaves 3'a and the pitch of the concaves 3'a, together with the fine holes 3, may be properly set according to the form of pattern formed by the apparatus 1' for fine pattern formation, the method for pattern formation and the like. The pitch of the concaves 3'a is preferably about 15 µm at the smallest.

The fine holes 3 are cylindrical spaces which are circular in a transverse section perpendicular to the axial direction (a section parallel to the surface 2'A of the silicon substrate 2') and are rectangular in a longitudinal section along the axial direction (a section perpendicular to the surface 2'A of the silicon substrate 2'). A silicon oxide layer 4 is provided on the wall surface of the fine holes 3 so as to be continued from the wall surface of the concaves 3'a. In the embodiment shown in the drawing, the inner diameter of the fine holes 3, the number of fine holes, the pitch of the fine holes and the like are simplified for the explanation of the construction of the apparatus. The inner diameter of the fine holes 3 may be properly set in the range of about 1 to 100 µm, and the aspect ratio of the fine holes 3 may be properly set in the range of about 1 to 100. The number of the fine holes 3 and the pitch of the fine holes 3 may be properly set according to the form of a pattern formed by the apparatus 1' for fine pattern formation, the method for pattern formation and the like. The pitch of the fine holes 3 is preferably about 15 µm at the smallest.

The transverse sectional form of the fine holes 3 may be, in addition to the above-described circular form, for example, an elliptical or polygonal form or a special form. Further, the fine holes 3 may be a combination of two or more fine holes which are different from each other in transverse sectional form. When the fine holes are elliptical or rectangular in transverse sectional form, the inner diameter in the longitudinal direction may be properly set in the range of 5 to 500 µm. The inner diameter of the fine holes 3 is substantially even in the axial direction, and the variation in the inner diameter is generally within ±1 µm.

The fine nozzles 5 are formed of silicon oxide, are provided integrally with the silicon oxide layer 4 provided on the wall surface of the fine holes 3, and are in communication with the fine holes 3. The thickness of the fine nozzles 5 may be properly set in the range of 5000 to 10000 angstroms, the opening diameter (inner diameter) may be properly set in the range of 1 to 100 µm, and the protrusion level may be properly set in the range of 1 to 150 µm. The opening diameter of the plurality of fine nozzles 5 is substantially even, and the variation in the opening diameter is generally within ±1 µm. The provision of such fine nozzles 5 can prevent ink, ejected from the fine holes 3, from being deposited on the back surface 2'B side of the silicon substrate 2'.

The silicon nitride layer 6, the support member 7, the ink passage 8, and the ink supplying device 9 are the same as those described above in connection with the apparatus 1 for fine pattern formation, and the explanation thereof will be omitted.

In this apparatus 1' for fine pattern formation according to the present invention, by virtue of the provision of tapered concaves 3'a, the passage resistance of ink can be reduced, and an ink having higher viscosity can be ejected through the plurality of fine nozzles 5 on the back surface of the silicon substrate 2' in a very small amount with high accuracy at substantially even ejection width, and, at the same time, the deposition of ink onto the back surface of the silicon substrate 2' can be prevented. The amount of ink ejected can be set as desired by varying the amount of ink supplied through the control of the ink supplying device 9. Therefore, a pattern can be stably formed by direct writing with high accuracy on a pattern object.

(Fourth embodiment)

FIG. 4 is a schematic cross-sectional view showing a further embodiment of the apparatus for fine pattern formation according to the present invention. As shown in FIG. 4, an apparatus 11' for fine pattern formation comprises a silicon substrate 12', tapered concaves 13'a provided on a surface 12'A of the silicon substrate 12', fine nozzles 15 protruded on the back surface 12'B side of the silicon substrate 12', a support member 17, an ink passage 18 for supplying ink to a space between the silicon substrate 12' and the support member 17, and an ink supplying device 19 connected to the ink passage 18.

The silicon substrate 12' has fine holes 13 which extend through the silicon substrate 12' from the bottom of the plurality of tapered concaves 13'a on the surface 12'A side to the back surface 12'B side. Openings 13a on the surface 12'A side of the fine holes 13 are exposed to the tapered concaves 13'a, and the tapered concaves 13'a are exposed to the space defined by the silicon substrate 12' and the support member 17. Preferably, the silicon substrate 12' is formed of a single crystal of silicon, in which the crystallographic orientation of the surface 12'A and the back surface 12'B is <100> face, and has a thickness of about 200 to 500 µm.

A silicon oxide layer 14 is provided on the wall surface of the tapered concaves 13'a, and the thickness of the silicon oxide layer 14 is generally about 5000 to 10000 angstroms.

The taper in the concaves 13'a may be in the form of any of an inverted cone, an inverted quadrangular pyramid and the like, and the depth of the concaves 13'a may be set in the range of about 5 to 150 μm, and the maximum opening diameter may be set in the range of about 10 to 200 μm. For example, when the taper is in an inverted quadrangular pyramid form, the wall surface of the concaves 13'a may be formed so that the angle of the wall surface of the concaves 13'a to the surface 12'A of the silicon substrate 12' (<100> face) is 55 degrees. In the embodiment shown in the drawing, the thickness of the silicon substrate 12', the number of tapered concaves 13'a, the pitch of the tapered concaves 13'a and the like are simplified for the explanation of the construction of the apparatus. The number of the concaves 13'a and the pitch of the concaves 13'a, together with the fine holes 13, may be properly set according to the form of pattern formed by the apparatus 11' for fine pattern formation, the method for pattern formation and the like. The pitch of the concaves 13'a is preferably about 15 μm at the smallest.

The fine holes 13 are cylindrical spaces which are circular in a transverse section perpendicular to the axial direction (a section parallel to the surface 12'A of the silicon substrate 12') and are rectangular in a longitudinal section along the axial direction (a section perpendicular to the surface 12'A of the silicon substrate 12'). A silicon oxide layer 14 is provided on the wall surface of the fine holes 13 so as to be continued from the wall surface of the concaves 13'a. In the embodiment shown in the drawing, the diameter of the fine holes 13, the number of fine holes 13, the pitch of the fine holes 13 and the like are simplified for the explanation of the construction of the apparatus. The diameter of the fine holes 13 may be properly set in the range of about 1 to 100 μm, and the aspect ratio of the fine holes 13 may be properly set in the range of about 1 to 100. The number of the fine holes 13 and the pitch of the fine holes 13 may be properly set according to the form of pattern formed by the apparatus 11' for fine pattern formation, the method for pattern formation and the like. The pitch of the fine holes 13 is preferably about 15 μm at the smallest.

The transverse sectional form of the fine holes 13 may be, in addition to the above-described circular form, for example, an elliptical or polygonal form or a special form. Further, the fine holes 13 may be a combination of two or more fine holes which are different from each other in transverse sectional form. When the fine holes are elliptical or rectangular in transverse sectional form, the diameter in the longitudinal direction may be properly set in the range of 5 to 500 μm. The diameter of the fine holes 13 is substantially even in the axial direction, and the variation in the diameter is generally within ±1 μm.

The fine nozzles 15 each comprise: a nozzle base 15a provided integrally with the silicon substrate 12'; an inner surface layer 15b of silicon oxide provided on the inner wall surface of the nozzle base 15a in communication with the fine hole 13; and an end face layer 15c of silicon oxide provided so as to cover the front end face of the nozzle base 15a. The inner surface layer 15b of silicon oxide and the end face layer 15c of silicon oxide are provided integrally with the silicon oxide layer 14 provided on the wall surface of the fine hole 13. The outer diameter of the nozzle bases 15a may be properly set in the range of 3 to 150 μm, and the wall thickness of the nozzle bases 15a may be properly set in the range of 1 to 25 μm. The thickness of the inner surface layer 15b of silicon oxide and the thickness of the end face layer 15c of silicon oxide may be properly set in the range of 5000 to 10000 angstroms, the opening diameter of the fine nozzles 15 (the inner diameter of the inner surface layer 15b of silicon oxide) may be properly set in the range of 1 to 100 μm, and the protrusion level of the fine nozzles 15 (the height of the nozzle bases 15a) may be properly set in the range of 1 to 150 μm. The opening diameter of the plurality of fine nozzles 15 is substantially even, and the variation in the opening diameter is generally within ±1 μm. The provision of such fine nozzles 15 can prevent ink, ejected from the fine holes 13, from being deposited on the back surface 12'B side of the silicon substrate 12'.

The support member 17, the ink passage 18, and the ink supplying device 19 are the same as those described above in connection with the apparatus 11 for fine pattern formation, and the explanation thereof will be omitted.

In this apparatus 11' for fine pattern formation according to the present invention, by virtue of the provision of tapered concaves 13'a, the passage resistance of ink can be reduced, and an ink having higher viscosity can be ejected through the plurality of fine nozzles 15 on the back surface of the silicon substrate 12' in a very small amount with high accuracy at substantially even ejection width, and, at the same time, the deposition of ink onto the back surface of the silicon substrate 12' can be prevented. The amount of ink ejected can be set as desired by varying the amount of ink supplied through the control of the ink supplying device 19. Therefore, a pattern can be stably formed by direct writing with high accuracy on a pattern object. Further, since the fine nozzles 15 have nozzle bases 15a, the fine nozzles 15 have high mechanical strength and are highly durable against external impact and ink supply pressure.

(Fifth Embodiment)

Figure 5:
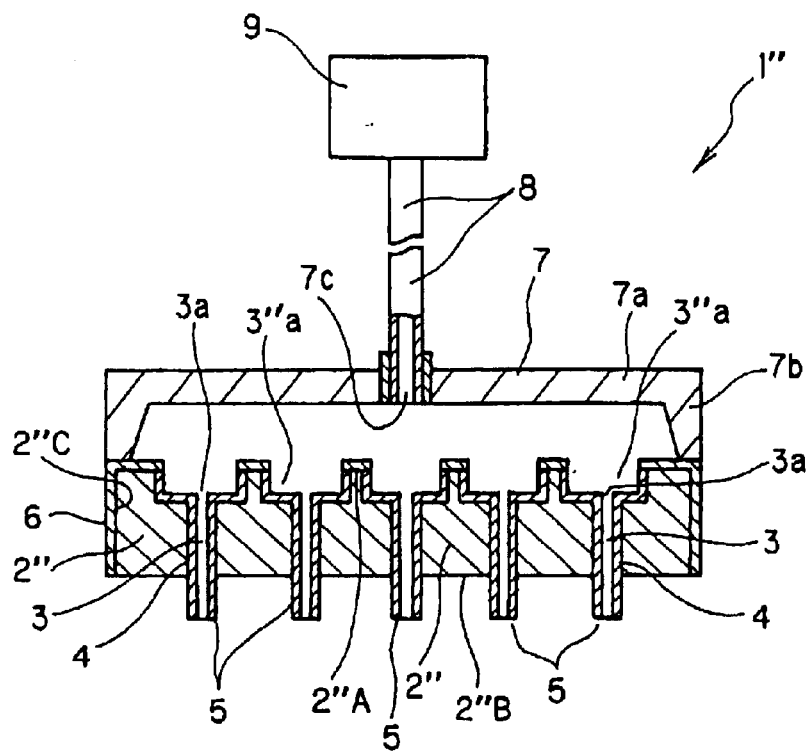
FIG. 5 is a schematic cross-sectional view showing a still further embodiment of the apparatus for fine pattern formation according to the present invention.

FIG. 5 is a schematic cross-sectional view showing a still further embodiment of the apparatus for fine pattern formation according to the present invention. As shown in FIG. 5, an apparatus 1" for fine pattern formation comprises a silicon substrate 2", multistaged concaves 3"a provided on a surface 2"A of the silicon substrate 2", fine nozzles 5 protruded on the back surface 2"B side of the silicon substrate 2", a silicon nitride layer 6 provided on the surface 2"A and a side face 2"C of the silicon substrate 2", a support member 7, an ink passage 8 for supplying ink to a space between the silicon substrate 2" and the support member 7, and an ink supplying device 9 connected to the ink passage 8.

The silicon substrate 2" has fine holes 3 which extend through the silicon substrate 2" from the bottom of the plurality of multistaged concaves 3"a on the surface 2"A side to the back surface 2"B side. Openings 3a on the surface 2"A side of the fine holes 3 are exposed to the concaves 3"a, and the concaves 3"a are exposed to the space defined by the silicon substrate 2" and the support member 7. According to this construction, the fine holes 3 each have a two-staged concave opening comprising the opening 3a as a fine opening and the concave 3"a as a wide opening.

The silicon substrate 2" may be formed of the same material as in the silicon substrate 2, and the thickness of the silicon substrate 2" also may be set in the same range as that of the silicon substrate 2. The silicon substrate 2" may be an SOI (silicon on insulator) wafer that has a thin film of silicon oxide, which is parallel to the surface of the substrate 2", at the boundary between the concaves 3"a and the fine holes 3.

A silicon oxide layer 4 is provided on the wall surface of the concaves 3"a, and the thickness of the silicon oxide layer 4 is generally about 5000 to 10000 angstroms. The concaves 3"a may be in a cylindrical, cubic, rectangular parallelopiped or other form, and the depth of the concaves 3"a may be set in the range of about 1 to 150 μm, and the opening diameter may be set in the range of about 5 to 200 µm. In the embodiment shown in the drawing, the thickness of the silicon substrate 2", the number of concaves 3"a, the pitch of the concaves 3"a and the like are simplified for the explanation of the construction of the apparatus. The number of the concaves 3"a and the pitch of the concaves 3"a, together with the fine holes 3, may be properly set according to the form of pattern formed by the apparatus 1" for fine pattern formation, the method for pattern formation and the like. The pitch of the concaves 3"a is preferably about 10 µm at the smallest. Further, in the embodiment shown in the drawing, as described above, two-staged openings of the opening 3a as the fine opening and the concave 3"a as the wide opening are adopted. Alternatively, three- or more staged openings may be adopted.

The fine holes 3 are cylindrical spaces which are circular in a transverse section perpendicular to the axial direction (a section parallel to the surface 2"A of the silicon substrate 2") and are rectangular in a longitudinal section along the axial direction (a section perpendicular to the surface 2"A of the silicon substrate 2"). A silicon oxide layer 4 is provided on the wall surface of the fine holes 3 so as to be continued from the wall surface of the concaves 3"a. In the embodiment shown in the drawing, the inner diameter of the fine holes 3, the number of fine holes 3, the pitch of the fine holes 3 and the like are simplified for the explanation of the construction of the apparatus. The inner diameter of the fine holes 3 may be properly set in the range of about 1 to 100 µm, and the aspect ratio of the fine holes 3 may be properly set in the range of about 1 to 100. The number of the fine holes 3 and the pitch of the fine holes 3 may be properly set according to the form of pattern formed by the apparatus 1" for fine pattern formation, the method for pattern formation and the like. The pitch of the fine holes 3 is preferably about 10 µm at the smallest.

The transverse sectional form of the fine holes 3 may be, in addition to the above-described circular form, for example, an elliptical or polygonal form or a special form. Further, the fine holes 3 may be a combination of two or more fine holes which are different from each other in transverse sectional form. When the fine holes are elliptical or rectangular in transverse sectional form, the inner diameter in the longitudinal direction may be properly set in the range of 5 to 500 µm. The inner diameter of the fine holes 3 is substantially even in the axial direction, and the variation in the inner diameter is generally within ±1 µm.

The fine nozzles 5 are formed of silicon oxide, are provided integrally with the silicon oxide layer 4 provided on the wall surface of the fine holes 3, and are in communication with the fine holes 3. The thickness of the fine nozzles 5 may be properly set in the range of 5000 to 10000 angstroms, the opening diameter (inner diameter) may be properly set in the range of 1 to 100 µm, and the protrusion level may be properly set in the range of 1 to 150 µm. The opening diameter of the plurality of fine nozzles 5 is substantially even, and the variation in the opening diameter is generally within ±1 µm. The provision of such fine nozzles 5 can prevent ink, ejected from the fine holes 3, from being deposited on the back surface 2"B side of the silicon substrate 2".

The silicon nitride layer 6, the support member 7, the ink passage 8, and the ink supplying device 9 are the same as those described above in connection with the apparatus 1 for fine pattern formation, and the explanation thereof will be omitted.

In this apparatus 1" for fine pattern formation according to the present invention, by virtue of the provision of multistaged concaves 3"a, the passage resistance of ink can be reduced, and an ink having higher viscosity can be ejected through the plurality of fine nozzles 5 on the back surface of the silicon substrate 2" in a very small amount with high accuracy at substantially even ejection width, and, at the same time, the deposition of ink onto the back surface of the silicon substrate 2" can be prevented. The amount of ink ejected can be set as desired by varying the amount of ink supplied through the control of the ink supplying device 9. Therefore, a pattern can be stably formed by direct writing with high accuracy on a pattern object.

(Sixth Embodiment)

Figure 6:
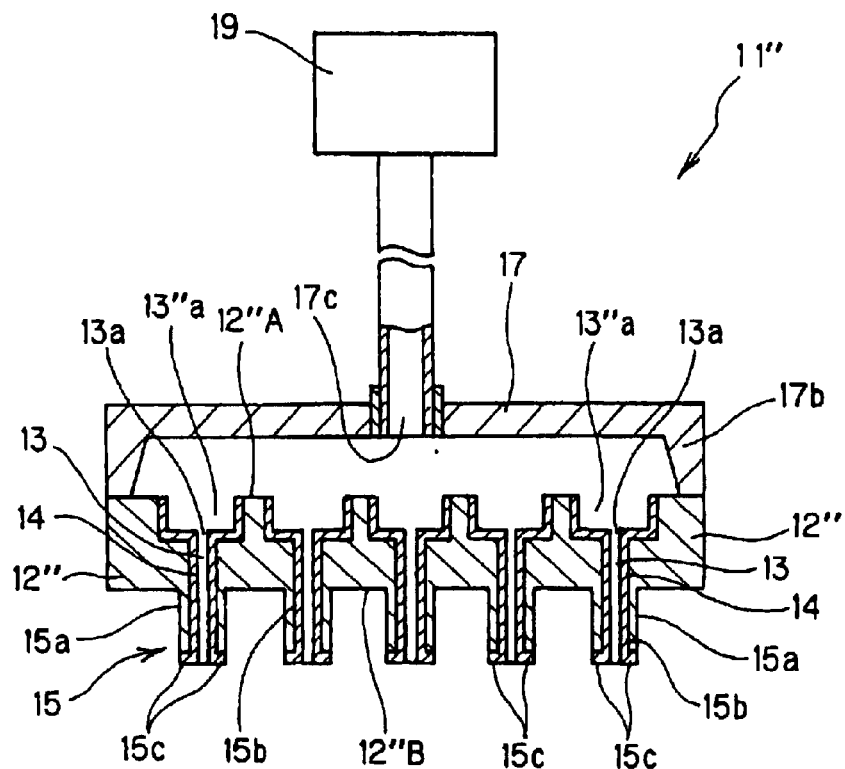
FIG. 6 is a schematic cross-sectional view showing another embodiment of the apparatus for fine pattern formation according to the present invention.

FIG. 6 is a schematic cross-sectional view showing another embodiment of the apparatus for fine pattern formation according to the present invention. As shown in FIG. 6, an apparatus 11" for fine pattern formation comprises a silicon substrate 12", multistaged concaves 13"a provided on a surface 12"A of the silicon substrate 12", fine nozzles 15 protruded on the back surface 12"B side of the silicon substrate 12", a support member 17, an ink passage 18 for supplying ink to a space between the silicon substrate 12" and the support member 17, and an ink supplying device 19 connected to the ink passage 18.

The silicon substrate 12" has fine holes 13 which extend through the silicon substrate 12" from the bottom of the plurality of multistaged concaves 13"a on the surface 12"A side to the back surface 12"B side. Openings 13a on the surface 12"A side of the fine holes 13 are exposed within the concaves 13"a, and the concaves 13"a are exposed to the space defined by the silicon substrate 12" and the support member 17. According to this construction, the fine holes 13 each have a two-staged opening comprising the opening 13a as a fine opening and the concave 13"a as a wide opening.

The silicon substrate 12" may be formed of the same material as in the silicon substrate 2, and the thickness of the silicon substrate 12" also may be set in the same range as that of the silicon substrate 2. The silicon substrate 12" may be an SOI (silicon on insulator) wafer that has a thin film of silicon oxide, which is parallel to the surface of the substrate 12", at the boundary between the concaves 13"a and the fine holes 13.

A silicon oxide layer 14 is provided on the wall surface of the concaves 13"a, and the thickness of the silicon oxide layer 14 is generally about 5000 to 10000 angstroms. The concaves 13"a may be in a cylindrical, cubic, rectangular parallelopiped or other form, and the depth of the concaves 13"a may be set in the range of about 1 to 150 µm, and the opening diameter may be set in the range of about 5 to 200 µm. In the embodiment shown in the drawing, the thickness of the silicon substrate 12", the number of concaves 13"a, the pitch of the concaves 13"a and the like are simplified for the explanation of the construction of the apparatus. The number of the concaves 13"a and the pitch of the concaves 13"a, together with the fine holes 13, may be properly set according to the form of pattern formed by the apparatus 11" for fine pattern formation, the method for pattern formation and the like. The pitch of the concaves 13"a is preferably about 10 µm at the smallest. Further, in the embodiment shown in the drawing, as described above, two-staged openings of the opening 13a as the fine opening and the concave 13"a as the wide opening are adopted. Alternatively, three- or more staged openings may be adopted.

The fine holes 13 are cylindrical spaces which are circular in a transverse section perpendicular to the axial direction (a section parallel to the surface 12"A of the silicon substrate 12") and are rectangular in a longitudinal section along the axial direction (a section perpendicular to the surface 12"A of the silicon substrate 12"). A silicon oxide layer 14 is provided on the wall surface of the fine holes 13 so as to be continued from the wall surface of the concaves 13"a. In the embodiment shown in the drawing, the diameter of the fine holes 13, the number of fine holes 13, the pitch of the fine holes 13 and the like are simplified for the explanation of the construction of the apparatus. The diameter of the fine holes 13 may be properly set in the range of about 1 to 100 μm, and the aspect ratio of the fine holes 13 may be properly set in the range of about 1 to 100. The number of the fine holes 13 and the pitch of the fine holes 13 may be properly set according to the form of pattern formed by the apparatus 11" for fine pattern formation, the method for pattern formation and the like. The pitch of the fine holes 13 is preferably about 10 μm at the smallest.

The transverse sectional form of the fine holes 13 may be, in addition to the above-described circular form, for example, an elliptical or polygonal form or a special form. Further, the fine holes 13 may be a combination of two or more fine holes which are different from each other in transverse sectional form. When the fine holes are elliptical or rectangular in transverse sectional form, the diameter in the longitudinal direction may be properly set in the range of 5 to 500 μm. The diameter of the fine holes 13 is substantially even in the axial direction, and the variation in the diameter is generally within ±1 μm.

The fine nozzles 15 each comprise: a nozzle base 15a provided integrally with the silicon substrate 12"; an inner surface layer 15b of silicon oxide provided on the inner wall surface of the nozzle base 15a in communication with the fine hole 13; and an end face layer 15c of silicon oxide provided so as to cover the front end face of the nozzle base 15a. The inner surface layer 15b of silicon oxide and the end face layer 15c of silicon oxide are provided integrally with the silicon oxide layer 14 provided on the wall surface of the fine hole 13. The outer diameter of the nozzle bases 15a may be properly set in the range of 3 to 150 μm, and the wall thickness of the nozzle bases 15a may be properly set in the range of 1 to 25 μm. The thickness of the inner surface layer 15b of silicon oxide and the thickness of the end face layer 15c of silicon oxide may be properly set in the range of 5000 to 10000 angstroms, the opening diameter of the fine nozzles 15 (the inner diameter of the inner surface layer 15b of silicon oxide) may be properly set in the range of 1 to 100 μm, and the protrusion level of the fine nozzles 15 (the height of the nozzle bases 15a) may be properly set in the range of 1 to 150 μm. The opening diameter of the plurality of fine nozzles 15 is substantially even, and the variation in the opening diameter is generally within ±1 μm. The provision of such fine nozzles 15 can prevent ink, ejected from the fine holes 13, from being deposited on the back surface 12"B side of the silicon substrate 12".

The support member 17, the ink passage 18, and the ink supplying device 19 are the same as those described above in connection with the apparatus 11 for fine pattern formation, and the explanation thereof will be omitted.

In this apparatus 11" for fine pattern formation according to the present invention, by virtue of the provision of multistaged concaves 13"a, the passage resistance of ink can be reduced, and an ink having higher viscosity can be ejected through the plurality of fine nozzles 15 on the back surface of the silicon substrate 12" in a very small amount with high accuracy at substantially even ejection width, and, at the same time, the deposition of ink onto the back surface of the silicon substrate 12" can be prevented. The amount of ink ejected can be set as desired by varying the amount of ink supplied through the control of the ink supplying device 19. Therefore, a pattern can be stably formed by direct writing with high accuracy on a pattern object. Further, since the fine nozzles 15 have nozzle bases 15a, the fine nozzles 15 have high mechanical strength and are highly durable against external impact and ink supply pressure.

(Seventh Embodiment)

Figure 7:
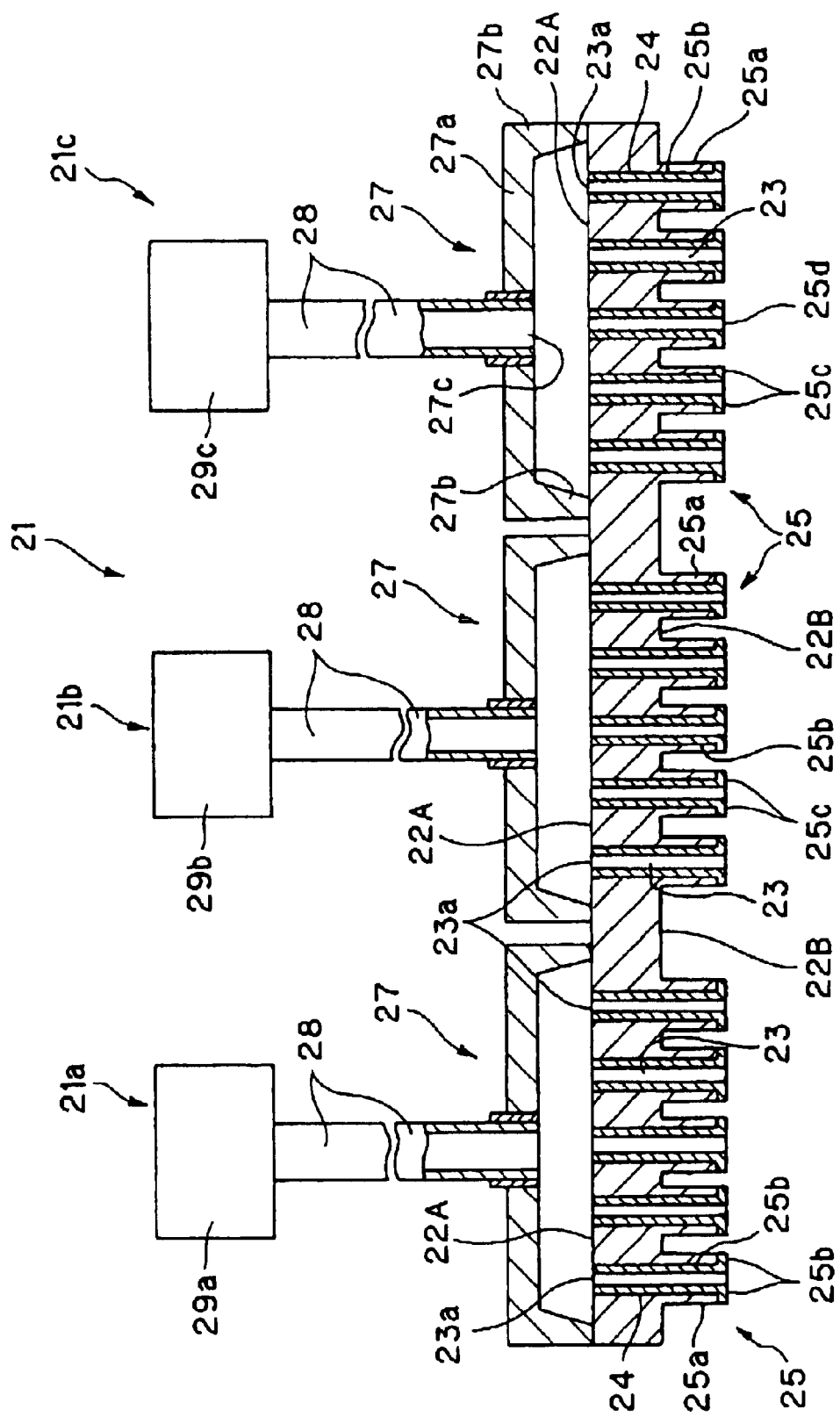
FIG. 7 is a schematic cross-sectional view showing still another embodiment of the apparatus for fine pattern formation according to the present invention.
Figure 8:
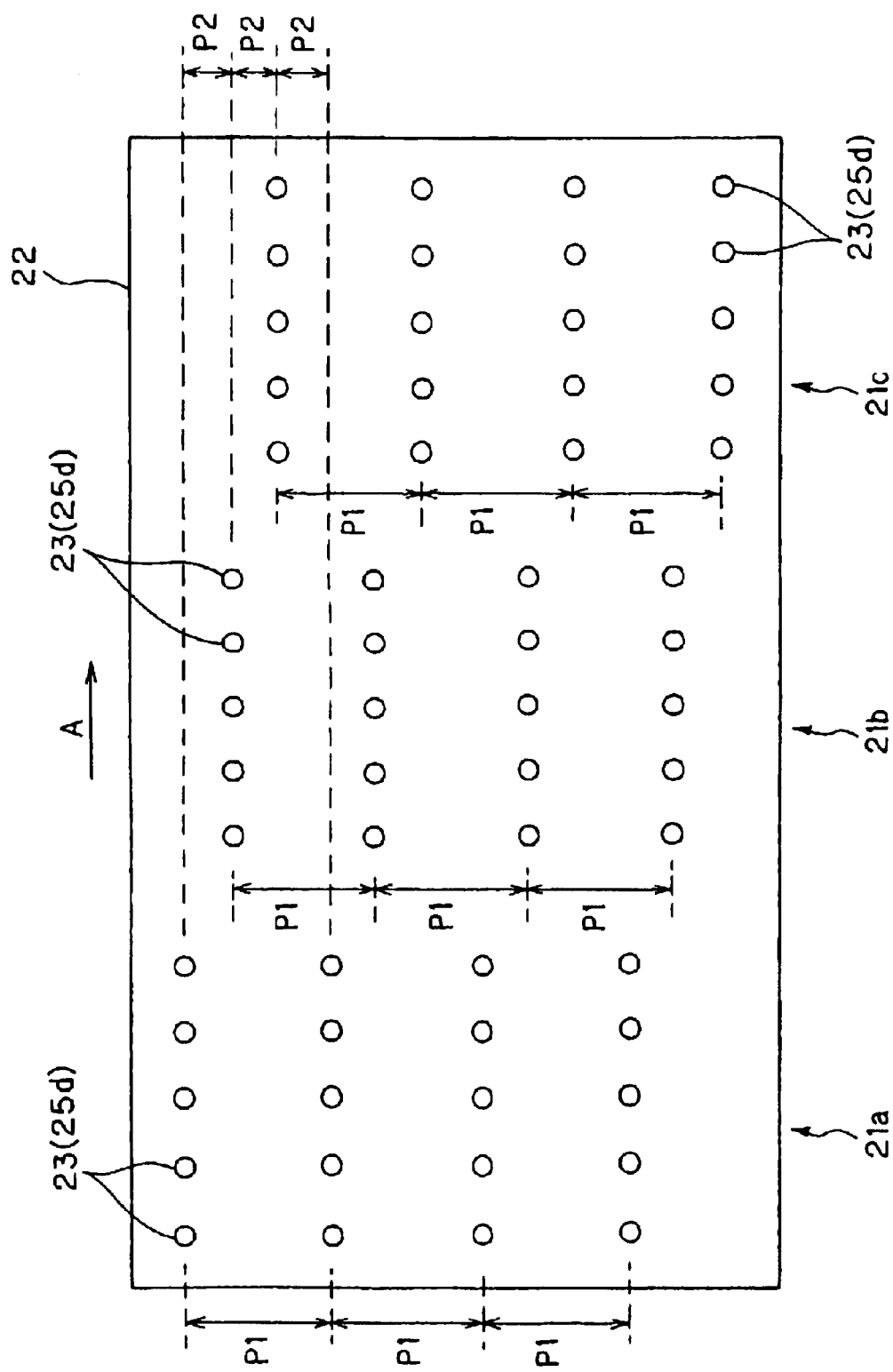
FIG. 8 is a bottom view of the apparatus for fine pattern formation shown in FIG. 7.

FIG. 7 is a schematic cross-sectional view showing still another embodiment of the apparatus for fine pattern formation according to the present invention, and FIG. 8 is a bottom view of an apparatus for fine pattern formation shown in FIG. 7. In FIGS. 7 and 8, the apparatus 21 for fine pattern formation comprises three continuous apparatus units 21a, 21b, 21c, that is, comprises a common silicon substrate 22, a plurality of fine nozzles 25 protruded from the back surface of the silicon substrate 22, three support members 27 provide on the surface 22A side of the silicon substrate 22, three ink passages 28 for supplying ink to spaces between the silicon substrate 22 and each of the support members 27, and ink supplying devices 29a, 29b, 29c connected to these respective ink passages 28.

For each of the apparatus units 21a, 21b, 21c, the silicon substrate 22 has a plurality of fine holes 23 extending through the silicon substrate 22 from the surface 22A side of the silicon substrate 22 to the back surface 22B side of the silicon substrate 22, and the openings 23a on the surface 22A side of the fine holes 23 are exposed to the spaces defined by the silicon substrate 22 and the support members 27. The silicon substrate 22 may be formed of the same material as the above-described silicon substrate 2, and the thickness of the silicon substrate 22 also may be set in the same range as in the silicon substrate 2.

For each of the apparatus units 21a, 21b, 21c, the fine holes 23 are provided in a pattern such that a plurality of fine holes are arranged along a predetermined direction (in a direction indicated by an arrow A in FIG. 8) in an identical line. Openings 25d in the fine nozzles 25, which will be described later, are also arranged in the same manner as adopted in the fine holes 23. Specifically, in the apparatus unit 21a, a plurality of lines of fine holes 23 arranged along the direction indicated by the arrow A are provided at pitch P1. Likewise, also in the apparatus unit 21b, the apparatus unit 21c, a plurality of lines of fine holes 23 are provided at pitch P1. The lines of the fine holes 23 in the apparatus units 21a, the lines of the fine holes 23 in the apparatus units 21b, and the lines of the fine holes 23 in the apparatus units 21c are deviated from one another at pitch P2 (P1=3×P2). Therefore, in the whole apparatus 21 for fine pattern formation, lines of fine holes in the apparatus units 21a, 21b, 21c are repeatedly arranged at pitch P2. The transverse sectional form, the longitudinal sectional form, the inner diameter, and the pitch of the fine holes 23 may be properly set in the same manner as in the fine holes 13. The silicon oxide layer 24 provided on the wall surface of the fine holes 23 may also be the same as the silicon oxide layer 14. In the embodiment shown in the drawing, for example, the inner diameter, the number, and the pitch of the fine holes 23 provided with the silicon oxide layer 24 have been simplified for facilitating the explanation of the construction of the apparatus.

The fine nozzles 25 have the same construction as the fine nozzles 15 and each comprise: a nozzle base 25a provided integrally with the silicon substrate 22; an inner surface layer 25b of silicon oxide provided on the inner wall surface of the nozzle base 25a in communication with the fine hole 23; and an end face layer 25c of silicon oxide provided so as to cover the front end face of the nozzle base 25a. The inner surface layer 25b of silicon oxide and the end face layer 25c of silicon oxide are provided integrally with the silicon oxide layer 24 provided on the wall surface of the fine hole 23. In this fine nozzles 25, the outer diameter and wall thickness of the nozzle bases 25a, the thickness of the inner surface layer 25b of silicon oxide and the end face layer 25c of silicon oxide, the inner diameter of the openings 25d in the fine nozzles 25 (the inner diameter of the inner surface layer 25b of silicon oxide), and the protrusion level of the fine nozzles 25 (the height of the nozzle bases 25a) may be set in the same respective ranges as described above in connection with the fine nozzles 15. The opening diameter of the plurality of fine nozzles 25 is substantially even, and the variation in the opening diameter is generally within ±1 μm. The provision of such fine nozzles 25 can prevent ink, ejected from the fine holes 23, from being deposited on the back surface 22B side of the silicon substrate 22.

The support member 27 is provided on the surface 22A side of the silicon substrate 22, for supporting the silicon substrate 22. In the embodiment shown in the drawing, as with the support member 7 described above, the support member 27 comprises: a base 27a, which, as with the silicon substrate 22, is flat; a flange portion 27b provided on the periphery of the base 27a; and an opening 27c provided at the center of the base 27a. The support member 27 is fixed to the surface 22A side of the silicon substrate 22 by the flange portion 27b. This can provide a space for supplying ink to a portion between the silicon substrate 22 and the support member 27. The fixation of the support member 27 to the silicon substrate 22 through heat-resistant glass, such as Pyrex glass (tradename) (not shown), can improve the working efficiency of later steps in the production of the apparatus for fine pattern formation. As with the support member 7 described above, this support member 27 is preferably formed of a material having a coefficient of linear expansion in the range of one-tenth of the coefficient of linear expansion of the silicon substrate 22 to 10 times the coefficient of linear expansion of the silicon substrate 22.

The ink passages 28 are connected to the openings 27c of the respective support members 27, and the other ends of the ink passages 28 are connected respectively to ink supplying devices 29a, 29b, 29c. The ink supplying devices 29a, 29b, 29c may be properly selected from a continuous supply pump, a constant rate supply pump and the like according to applications of the apparatus 11 for fine pattern formation. In the embodiment shown in the drawing, only one ink passage 28 is provided in each support member 27. In this case, a construction may also be adopted wherein a plurality of openings 27c, the number of which is determined by taking into consideration, for example, the evenness of ink flow pressure, are provided for one support member 27, and the ink passage 28 is connected to each opening 27c. The ink passage may be provided within the support member 27.

In this apparatus 21 for fine pattern formation according to the present invention, ink can be ejected through the plurality of fine nozzles 25 on the back surface of the silicon substrate 22 in a very small amount with high accuracy at substantially even ejection width, and, at the same time, the deposition of ink onto the back surface of the silicon substrate 22 can be prevented. Different inks may be supplied respectively from the ink supplying devices 29a, 29b, 29c to directly write a pattern with a desired ink for each of the apparatus units 21a, 21b, 21c. Further, the amount of ink ejected may be set as desired by regulating the ink supplying devices 29a, 29b, 29c to vary the amount of ink supplied. Furthermore, in the apparatus 21 for fine pattern formation, since the apparatus units 21a, 21b, 21c are provided integrally with one another, there is no need to join a plurality of apparatuses to one another and, in addition, the positional accuracy of the apparatuses is very high. Furthermore, since the fine nozzles 25 have nozzle bases 25a, the fine nozzles 25 have high mechanical strength and are highly durable against external impact and ink supply pressure.

In the apparatus 21 for fine pattern formation, the fine nozzles 5 as shown in FIG. 1 may be provided on the back surface 22B side of the silicon substrate 22.

Also in the apparatus 21 for fine pattern formation, the openings 23a on the surface 22A side of the fine holes 23 may be in a tapered concave form or a multistaged concave form as described above. This can reduce passage resistance and can realize the ejection of a very small amount of a higher-viscosity ink through the plurality of fine nozzles 25 at substantially even ejection width with high accuracy.

(Eighth Embodiment)

FIG. 9 is a diagram showing a further embodiment of the apparatus for fine pattern formation according to the present invention, wherein FIG. 9(A) is a schematic cross-sectional view and FIG. 9(B) a bottom view. In FIG. 9, an apparatus 31 for fine pattern formation comprises: a silicon substrate 32; a plurality of fine nozzles 35 protruded from the back surface 32B of the silicon substrate 32; a support member 37 provided on the surface 32A side of the silicon substrate 32; three ink passages 38a, 38b, 38c provided within the silicon substrate 32 and within the support member 37; and ink supplying devices 39a, 39b, 39c connected respectively to the ink passages.

The silicon substrate 32 is provided with a plurality of fine holes 33 which extend through the silicon substrate 32 from the surface 32A side of the silicon substrate 32 to the back surface 32B side of the silicon substrate 32, and openings 33a on the surface 32A side of the fine holes 33 each are exposed within any one of the three ink passages 38a, 38b, 38c provided in a groove form on the surface 32A side. The silicon substrate 32 may be formed of the same material as the silicon substrate 2, and the thickness of the silicon substrate 32 may also be set in the same range as the silicon substrate 2.

A plurality of fine holes 33 (openings 35d in fine nozzles 35 described later) are arranged on an identical line along a predetermined direction (direction indicated by an arrow a in FIG. 9(B)). A plurality of these lines are provided at pitch P. In the embodiment shown in the drawing, six fine hole lines 33A, 33B, 33C, 33D, 33E, 33F, in each of which a plurality of fine holes are arranged along a direction indicated by the arrow a, are provided at pitch P. The transverse sectional form, the longitudinal sectional form, the inner diameter, and the pitch of the fine holes 33 may be properly set in the same manner as in the fine holes 3. The silicon oxide layer 34 provided on the wall surface of the fine holes 33 may also be the same as the silicon oxide layer 14. In the embodiment shown in the drawing, for example, the inner diameter, the number, and the pitch of the fine holes 33 provided with the silicon oxide layer 34 have been simplified for facilitating the explanation of the construction of the apparatus.

The fine nozzles 35 have the same construction as the fine nozzles 15 and each comprise: a nozzle base 35a provided integrally with the silicon substrate 32; an inner surface layer 35b of silicon oxide provided on the inner wall surface of the nozzle base 35a in communication with the fine hole 33; and an end face layer 35c of silicon oxide provided so as to cover the front end face of the nozzle base 35a. The inner surface layer 35b of silicon oxide and the end face layer 35c of silicon oxide are provided integrally with the silicon oxide layer 34 provided on the wall surface of the fine hole 33. In this fine nozzles 35, the outer diameter and wall thickness of the nozzle bases 35a, the thickness of the inner surface layer 35b of silicon oxide and the end face layer 35c of silicon oxide, the inner diameter of the openings 35d in the fine nozzles 35 (the inner diameter of the inner surface layer 35b of silicon oxide), and the protrusion level of the fine nozzles 35 (the height of the nozzle bases 35a) may be set in the same respective ranges as described above in connection with the fine nozzles 15. The opening diameter of the plurality of fine nozzles 35 is substantially even, and the variation in the opening diameter is generally within ±1 μm. The provision of such fine nozzles 35 can prevent ink, ejected from the fine holes 33, from being deposited on the back surface 32B side of the silicon substrate 32.

The support member 37 is a plate member which is provided on the surface 32A side of the silicon substrate 32 to hold the silicon substrate 32, and ink passages 38c are provided in a groove form in the support member 37 on its silicon substrate 32 side.

FIG. 10 is a transverse sectional view taken on line A—A of the silicon substrate 32 shown in FIG. 9(A), and FIG. 11 a transverse sectional view taken on line B—B of the support member 37 shown in FIG. 9(A).

As shown in FIG. 9(A) and FIG. 10, in the silicon substrate 32, an ink passage 38a in a groove form is provided so as to connect each of openings in fine hole lines 33A, 33D to the ink supplying device 39a, and an ink passage 38b in a groove form is provided so as to connect each of the openings in fine hole lines 33B, 33E to the ink supplying device 39b. Further, an ink passage 38c in a groove form is provided on each of the openings in fine hole lines 33C, 33F. Further, as shown in FIG. 9(A) and FIG. 11, in the support member 37, the ink passage 38c in a groove form is provided so as to connect each of the openings in the fine hole lines 33C, 33F to the ink supplying device 39c.

Figure 12:
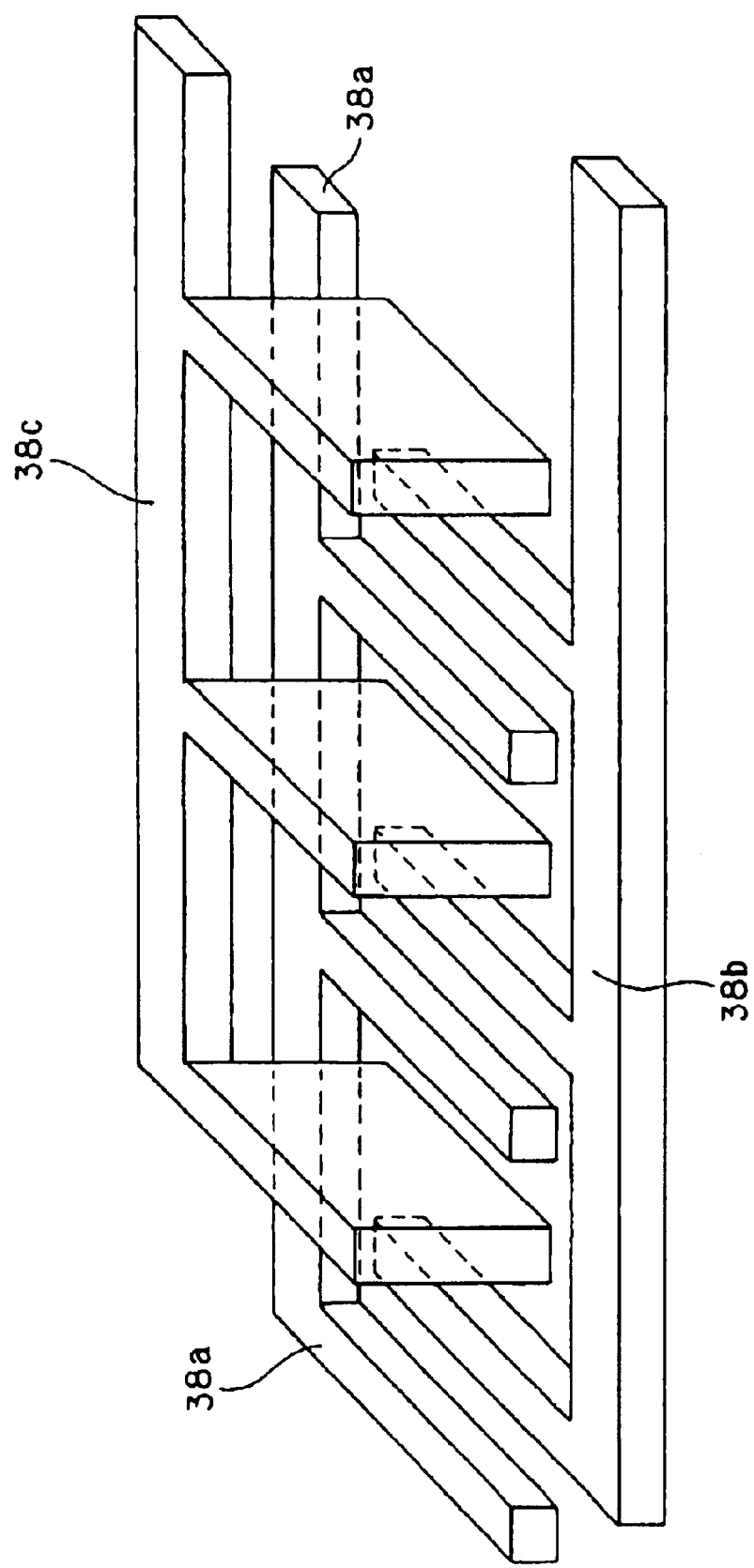
FIG. 12 is a perspective view showing ink passages in the apparatus for fine pattern formation shown in FIG. 9.

As shown in FIG. 12, three ink passages 38a, 38b, 38c provided between the support member 37 and the silicon substrate 32 are independent of one another. As with the support member 7, the support member 37 is preferably formed of a material having a coefficient of linear expansion in the range of one-tenth of the coefficient of linear expansion of the silicon substrate 32 to 10 times the coefficient of linear expansion of the silicon substrate 32.

The ends of the ink passages 38a, 38b, 38c are connected respectively to the ink supplying devices 39a, 39b, 39c. The ink supplying devices 39a, 39b, 39c are not particularly limited, and any of a continuous supply pump, a constant rate supply pump and the like may be used as the ink supplying device and may be properly selected according to the application of the apparatus 31 for fine pattern formation.

The apparatus 31 for fine pattern formation according to the present invention can eject ink through the plurality of fine nozzles 35 provided on the back surface of the silicon substrate 32 in a substantially even ejection width in a very small amount with high accuracy and, at the same time, can prevent the deposition of ink onto the back surface of the silicon substrate 32. The supply of different inks respectively from the ink supplying devices 39a, 39b, 39c permits a pattern to be formed by direct writing with a desired ink for each fine hole line grouped according to the ink passages 38a, 38b, 38c (a group consisting of fine hole lines 33A and 33D, a group consisting of fine hole lines 33B and 33E, and a group consisting of fine hole lines 33C and 33F), and is particularly advantageous for the formation of a stripe pattern which will be described later. Further, since the apparatus 31 for fine pattern formation does not comprise a plurality of mutually connected apparatus units for respective inks, the positional accuracy of each fine hole line is very high. Further, the amount of ink ejected can be set as desired by regulating the ink supplying devices 39a, 39b, 39c to vary the amount of ink supplied. Further, since the fine nozzles 35 have nozzle bases 35a, the fine nozzles 35 have high mechanical strength and are highly durable against external impact and ink supply pressure.

In the apparatus 31 for fine pattern formation, fine nozzles 5 as shown in FIG. 1 may be provided on the back surface 32B side of the silicon substrate 32.

Also in the apparatus 31 for fine pattern formation, the openings on the ink passage side of the fine holes 33 may be the above-described tapered or multistaged concaves. This construction can reduce passage resistance and thus eject an ink having higher viscosity through the plurality of fine nozzles 35 in a substantially even ejection width in a very small amount with high accuracy.

(Ninth Embodiment)

Figure 13:
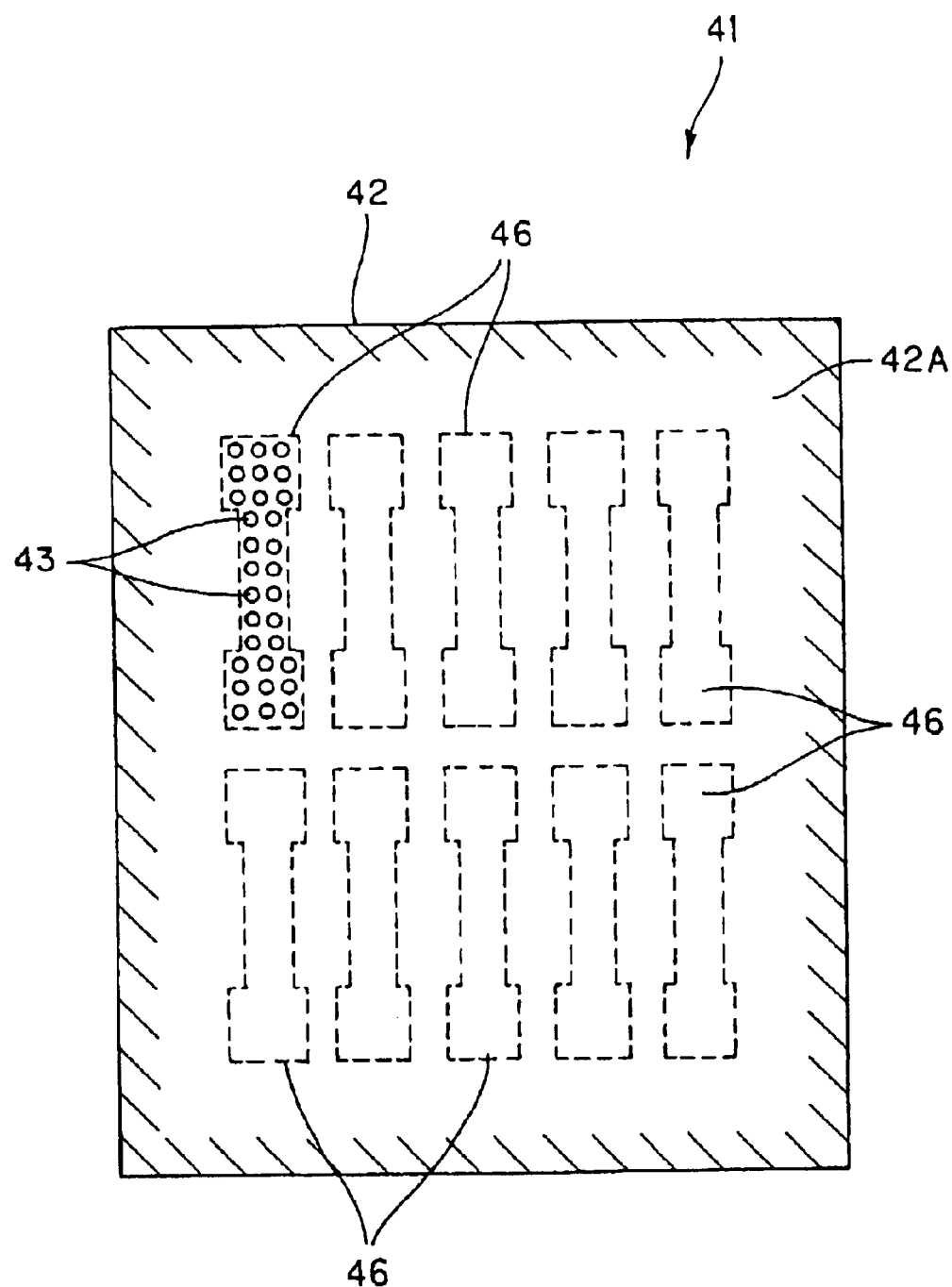
FIG. 13 is a plan view showing a still further embodiment of the apparatus for fine pattern formation according to the present invention.

FIG. 13 is a plan view showing a further embodiment of the apparatus for fine pattern formation according to the present invention. In FIG. 13, an apparatus 41 for fine pattern formation comprises a silicon substrate 42, a plurality of fine nozzles protruded from the back surface of the silicon substrate 42, an ink passage for supplying ink to a space between the silicon substrate 42 and the support member, and an ink supplying device connected to the ink passage. In FIG. 13, however, only the silicon substrate 42 is shown, and the fine nozzles, the support member, the ink passage, and the ink supplying device are not shown.

The silicon substrate 42 has a plurality of fine holes 43 which extend through the silicon substrate 42 from the surface 42A side of the silicon substrate 42 to the back surface side of the silicon substrate 42. The fine holes 43 are provided at positions such that the fine holes 43 constitute one pattern 46, and a plurality of patterns 46 (10 patterns in the embodiment shown in the drawing) are provided on the silicon substrate 42. In the drawing, the fine holes 43 are shown in only one pattern 46, and, for the other patterns 46, only the outline is indicated by a chain line.

The silicon substrate 42 may be formed of the same material as used in the silicon substrate 2, and the thickness of the silicon substrate 42 also may be set in the same range as in the silicon substrate 2. The transverse sectional form, the longitudinal sectional form, the inner diameter, and the pitch of the fine holes 43 may be properly set in the same manner as in the fine holes 3. The fine holes 43 have a silicon oxide layer on their wall surface, and this silicon oxide layer also may be the same as the silicon oxide layer 4.

A plurality of fine nozzles are protruded on the back surface 42B side of the silicon substrate 42 so as to communicate with the fine holes 43. The fine nozzles may be the same as the fine nozzles 5 or the fine nozzles 15.

Further, in the silicon substrate 42, a support member having, on its periphery, a flange portion as described above in connection with the support member 7 may be provided, and the flange portion in the support member may be fixed to the peripheral portion (a shaded region in FIG. 13). The ink supply passage may be connected to the opening of the support member, and the ink supplying device may be connected to the other end of the ink supply passage.

The apparatus 41 for fine pattern formation can eject ink through the fine holes 43 (fine nozzles) of the silicon substrate 42 in a substantially even ejection width in a very small amount with high accuracy. A pattern in a form corresponding to the pattern 46 can be stably formed on a pattern object with high accuracy by ejecting ink from the fine nozzles in the silicon substrate 42 in a suitable amount such that inks ejected from mutually adjacent fine nozzles come into contact with each other on the pattern object. The amount of the ink ejected can be regulated by controlling the ink supplying device.

In the above embodiment, all the plurality of patterns 46 are in an identical form. However, the present invention is not limited to this only. For example, the pattern may be in a desired form, such as a conductor pattern for a printed wiring board.

Also in the apparatus 41 for fine pattern formation, the openings of the fine holes 43 may be the above-described tapered or multistaged concaves. This can reduce the passage resistance, and an ink having higher viscosity can be ejected through the plurality of fine nozzles in a substantially even ejection width in a very small amount with high accuracy.

The above-described apparatus for fine pattern formation according to the present invention can be applied, for example, to the formation of a black matrix pattern or a color pattern for liquid crystal displays, the formation of a phosphor layer for plasma displays, and the formation of a pattern in electroluminescence, as well as to conductor pattern formation and correction of conductor patterns of printed wiring boards.

I-2 Formation of Fine Pattern

Next, the formation of a fine pattern using the apparatus for fine pattern formation according to the present invention will be described.

Figure 14:
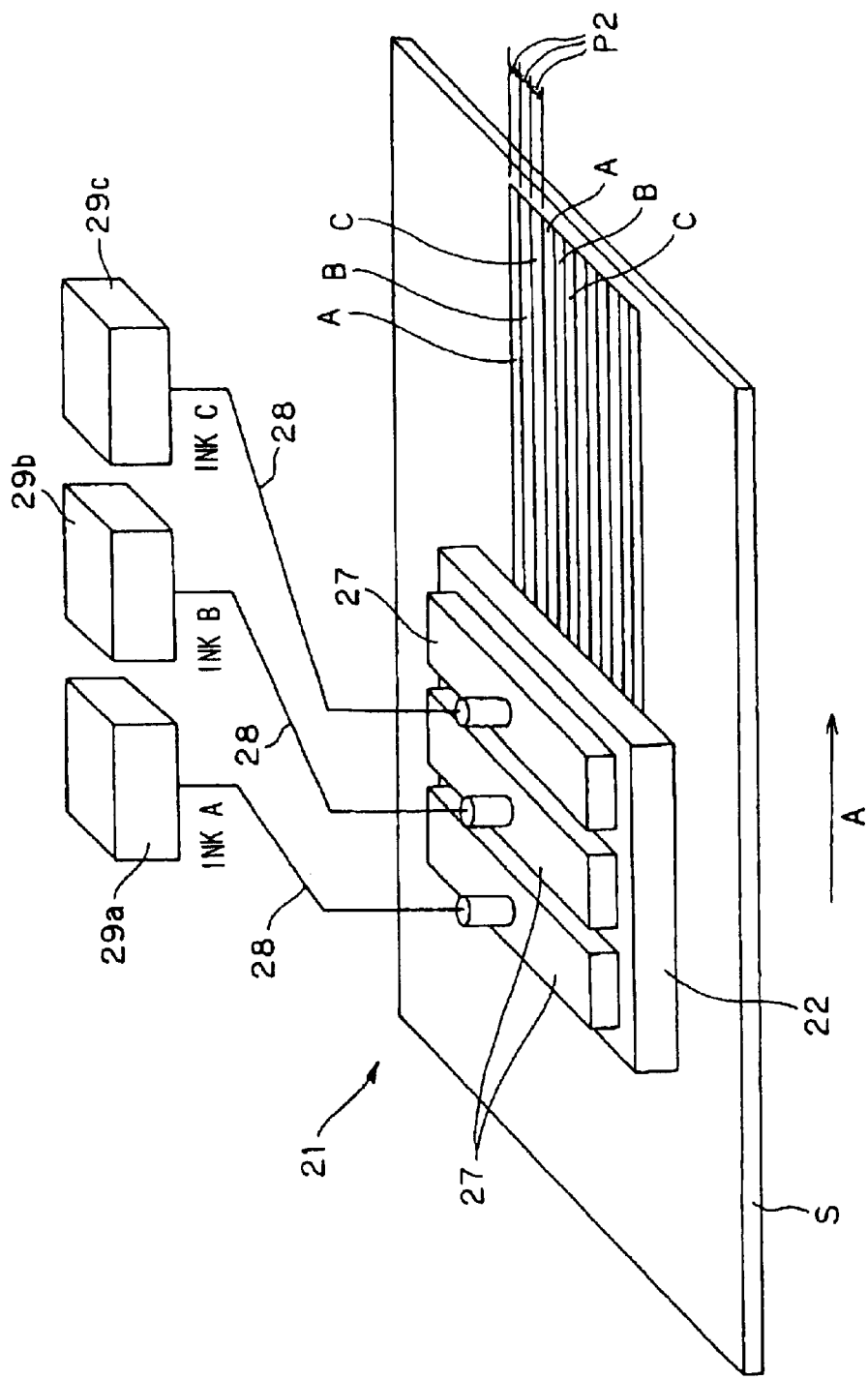
FIG. 14 is a perspective view showing one embodiment of fine pattern formation using the apparatus for fine pattern formation according to the present invention.

FIG. 14 is a diagram illustrating one embodiment of fine pattern formation using the apparatus 21 for fine pattern formation according to the present invention. In FIG. 14, while supplying ink A, ink B, and ink C respectively from the ink supplying devices 29a, 29b, 29c in the apparatus 21 for fine pattern formation according to the present invention through the ink passages 28, a pattern object S is scanned relative to the apparatus 21 for fine pattern formation in a predetermined direction (a direction indicated by an arrow A). The scanning direction A is identical to the arrangement direction A (see FIG. 8) of the fine holes in the apparatus 21 for fine pattern formation. In this case, the space between the silicon substrate 22 in the apparatus 21 for fine pattern formation and the pattern object S may be set in the range of about 0.1 to 5 mm.

According to this construction, inks ejected from the fine nozzles 25 in the silicon substrate 22 form, by direct writing, a stripe pattern comprising ink A, ink B, and ink C which have been repeatedly sequenced in that order on the pattern object S. In this case, the pitch of the stripes is P2. In this stripe pattern, since one stripe is formed of ink ejected from the plurality of fine nozzles on an identical line, even when the amount of ink ejected from the individual fine nozzles is small, the scanning speed of the pattern object S can be increased to increase the pattern formation speed. This stripe pattern is formed with very high accuracy by varying the diameter of the fine holes 23 or the fine nozzles 25 to control the ejection width of ink, and the process is simpler than the conventional photolithography.

When the pattern object S is flexible, preferably, a back-up roller is disposed on the back surface of the pattern object S so as to face the apparatus 21 for fine pattern formation. In this case, the pattern object S is carried while applying tension to the pattern object S by the back-up roller to directly write a pattern on the pattern object S.

Figure 15:
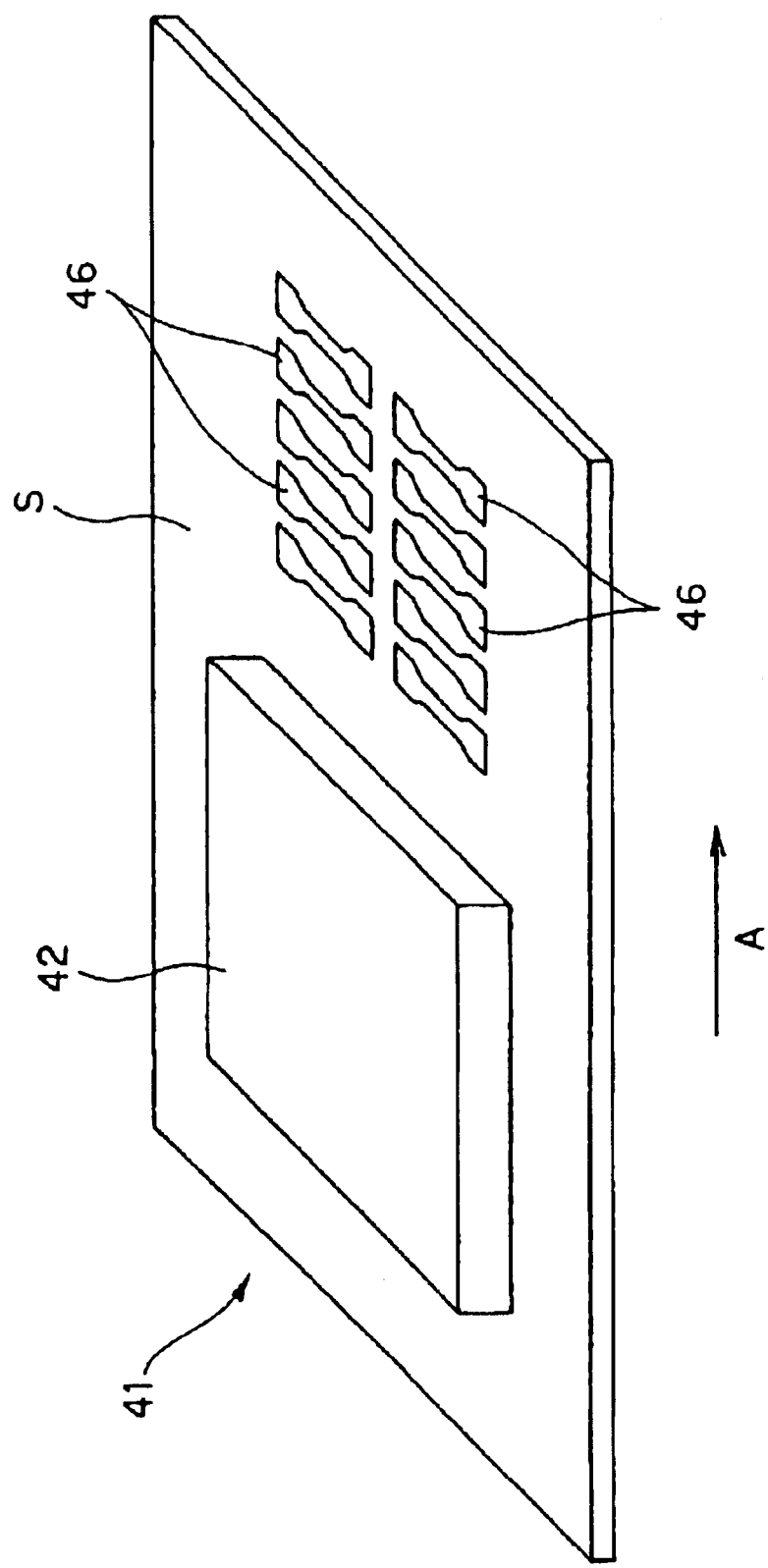
FIG. 15 is a perspective view showing another embodiment of fine pattern formation using the apparatus for fine pattern formation according to the present invention.

Next, FIG. 15 is a diagram showing one embodiment of fine pattern formation using the apparatus 41 for fine pattern formation according to the present invention. In FIG. 15, the apparatus 41 for fine pattern formation (only the silicon substrate 42 is shown in the embodiment in the drawing) is disposed at a predetermined position of the pattern object S, a given amount of ink supplied from the ink passage is ejected through the fine holes 43 (fine nozzles) onto the pattern object to form a pattern.

Thereafter, the pattern object S is carried by a predetermined distance in a direction indicated by an arrow A, and the same pattern formation as described above is carried out. A desired pattern 46 can be formed on the pattern object S by repeating the above procedure. The space between the silicon substrate 42 in the apparatus 41 for fine pattern formation and the pattern object S may be set in the range of about 0.1 to 5 mm.

Further, a printed wiring board can be simply produced without replying on photolithography, for example, by forming the pattern 46, formed of the plurality of fine holes 43 (fine nozzles) in the apparatus 41 for fine pattern formation, as a conductor pattern of a printed wiring board, and using a conductor paste as ink.

I-3 Production Process of Fine Nozzles

Next, the production process of fine nozzles according to the present invention will be described.

(First Embodiment)

Figure 16:
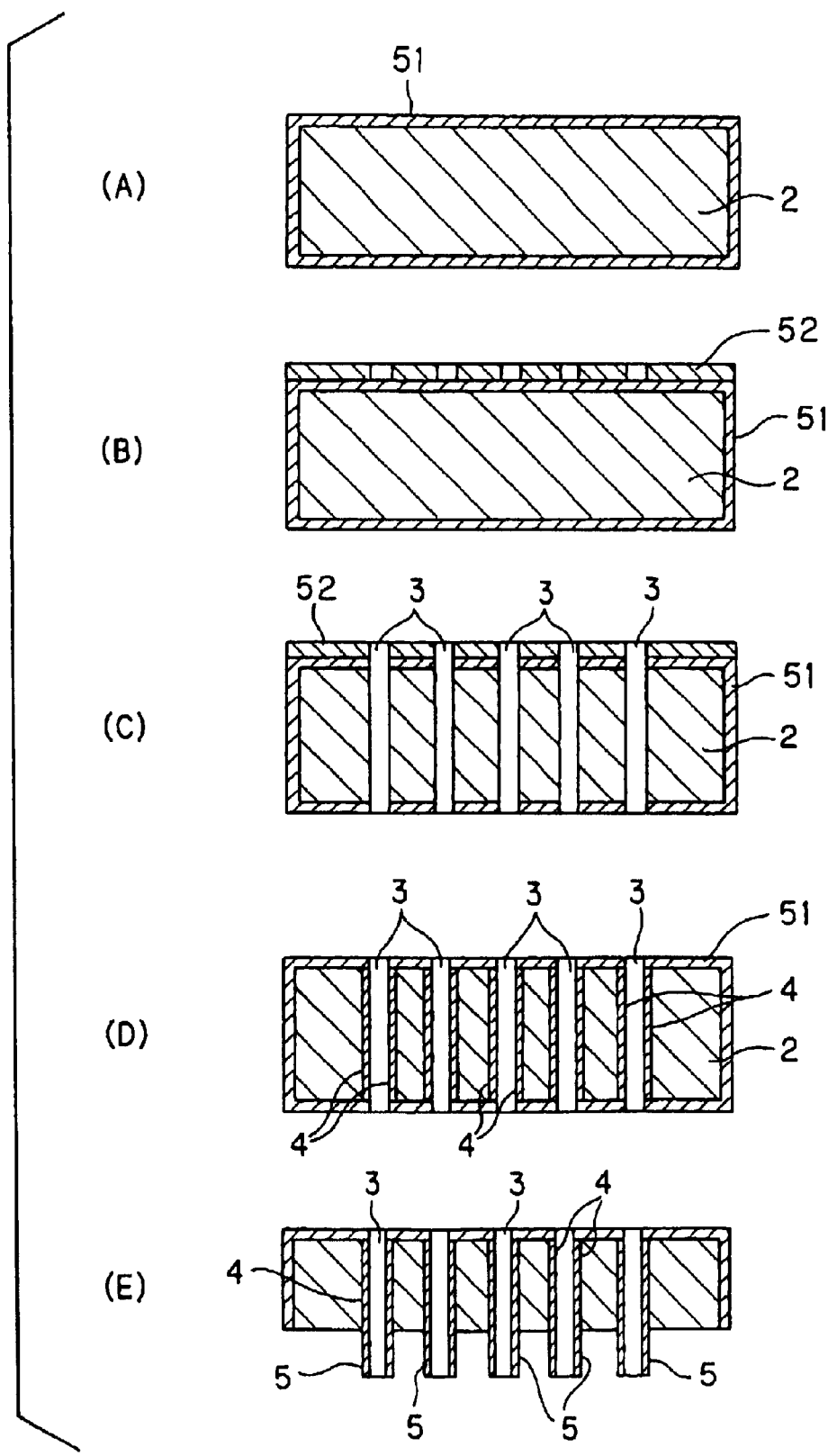
FIG. 16 is a process diagram illustrating one embodiment of the production process of fine nozzles according to the present invention.

The production process of fine nozzles according to the present invention will be described by taking the fine nozzles 5 in the apparatus 1 for fine pattern formation shown in FIG. 1 as an example with reference to FIG. 16.

As the first step, an about 200 to 3000 angstrom-thick silicon nitride ($Si_3N_4$) layer 51 is formed on the whole area of the silicon substrate 2 having a cleaned surface (FIG. 16(A)). The formation of the silicon nitride layer 51 may be carried out, for example, by low pressure CVD.

Next, a thin film as a mask is formed on the silicon nitride layer 51 in its portion located on one surface of the silicon substrate. A photosensitive resist is coated on the thin film as the mask, and exposure through a predetermined photomask and development are carried out to form a resist pattern. Subsequently, the mask thin film is etched using the resist pattern as a mask. Thereafter, the resist pattern is removed to form a mask pattern 52 having fine openings (FIG. 16(B)). The diameter of openings in fine holes 3 and fine nozzles 5, which will be described later, is determined by the size of the fine openings in the mask pattern 52. In general, the size of the fine openings is preferably set in the range of 1 to 100 $\mu$m.

In addition to a metallic thin film, a resist, a thin film of silicon oxide or a combination of both the materials (resist/ thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Next, as the second step, through fine holes 3 are formed in the silicon substrate 2 by a high aspect etching technique, such as deep etching, using the mask pattern 52 as a mask, (FIG. 16(C)). The formation of the through fine holes 3 may be carried out, for example, by a high aspect etching technique, such as a Bosch process using an ICP-RIE (inductive coupled plasma-reactive ion etching) device. According to the present invention, since there is no need to regulate the depth of the fine holes 3, the process is simple.

This means that a variation in depth of the fine holes derived from a difference in etching rate in a singe wafer or between wafers does not substantially occur. Therefore, the present invention is useful for an improvement in yield and for the production of an apparatus for writing a pattern on a large area. Further, in particular, dry etching by ICP-RIE can significantly shorten the time necessary for the formation of the through fine holes 3.

Next, as the third step, the mask pattern 52 is removed, and oxidation is carried out in a thermal oxidation furnace to form an about 5000 to 10000 angstrom-thick silicon oxide layer 4 on the wall surface of the through fine holes 3 (FIG. 16(D)).

Next, as the fourth step, dry etching is carried out from one surface of the silicon substrate 2. In this dry etching, after the removal of the silicon nitride layer 51, a part of the silicon substrate 2 is etched to expose the silicon oxide layer 4 formed on the inner wall of the through fine holes 3. When this silicon oxide layer 4 has been exposed by a desired length, the dry etching is stopped to prepare fine nozzles 5 formed of silicon oxide protruded on the etching side of the silicon substrate 2.

Although the Bosch process utilizing an ICP-RIE device has been used in the above high aspect etching, the present invention is not limited to this only.

In the dry etching in the fourth step, preferably, only the surface of the silicon substrate 2, on which the mask pattern 52 has been formed, is selectively etched. The reason for this is as follows. Although the deep etching in the second step is likely to cause some variation in shape of the etching end (lower side in the drawing), the accuracy of etching of the silicon substrate on its surface side, where the mask pattern 52 has been formed, is very high. When this site is used as the front end side of the fine nozzles 5, a plurality of fine nozzles 5 having an even opening diameter can be more easily prepared.

(Second Embodiment)

Figure 17:
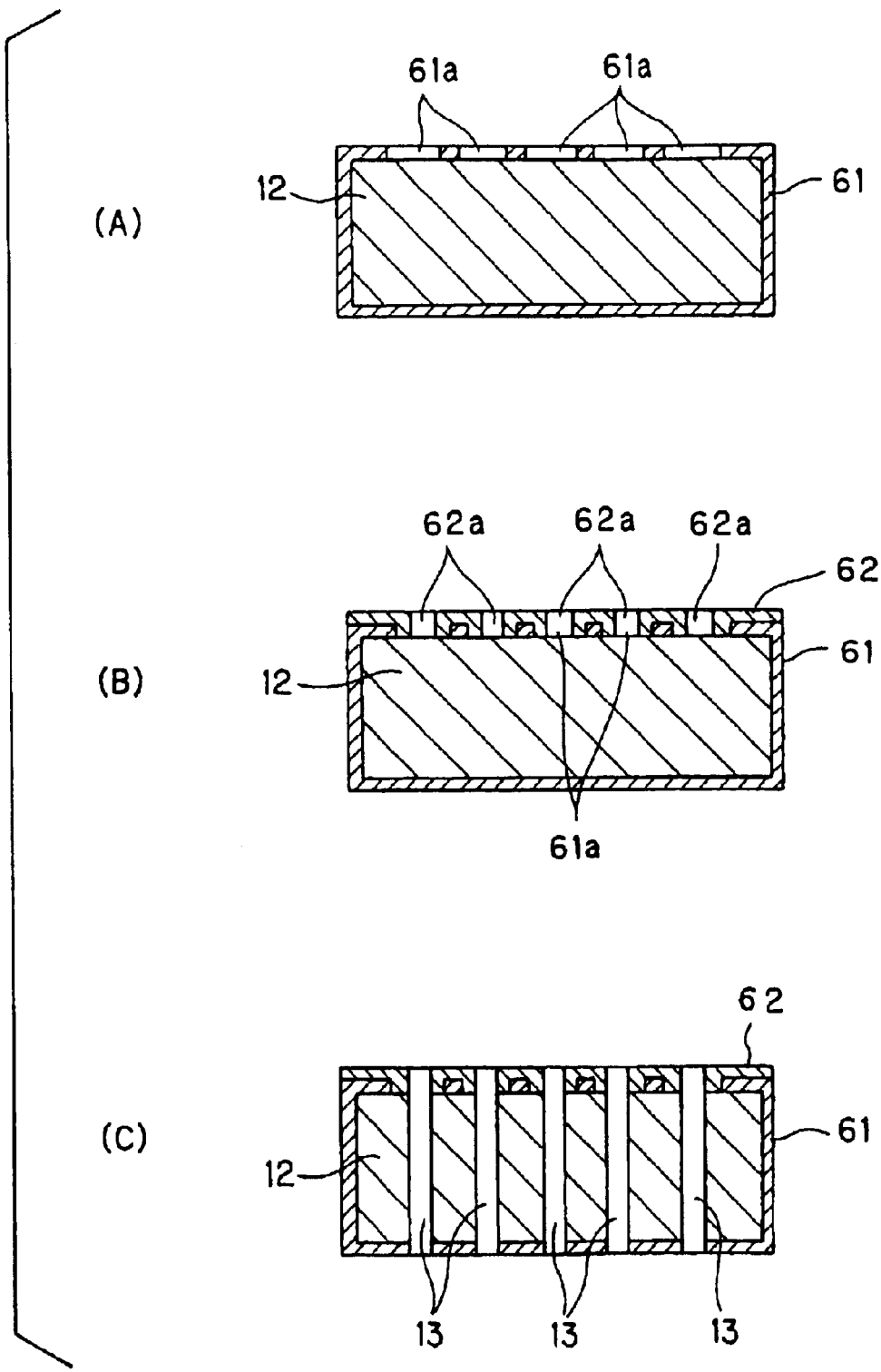
FIG. 17 is a process diagram illustrating another embodiment of the production process of fine nozzles according to the present invention.
Figure 18:
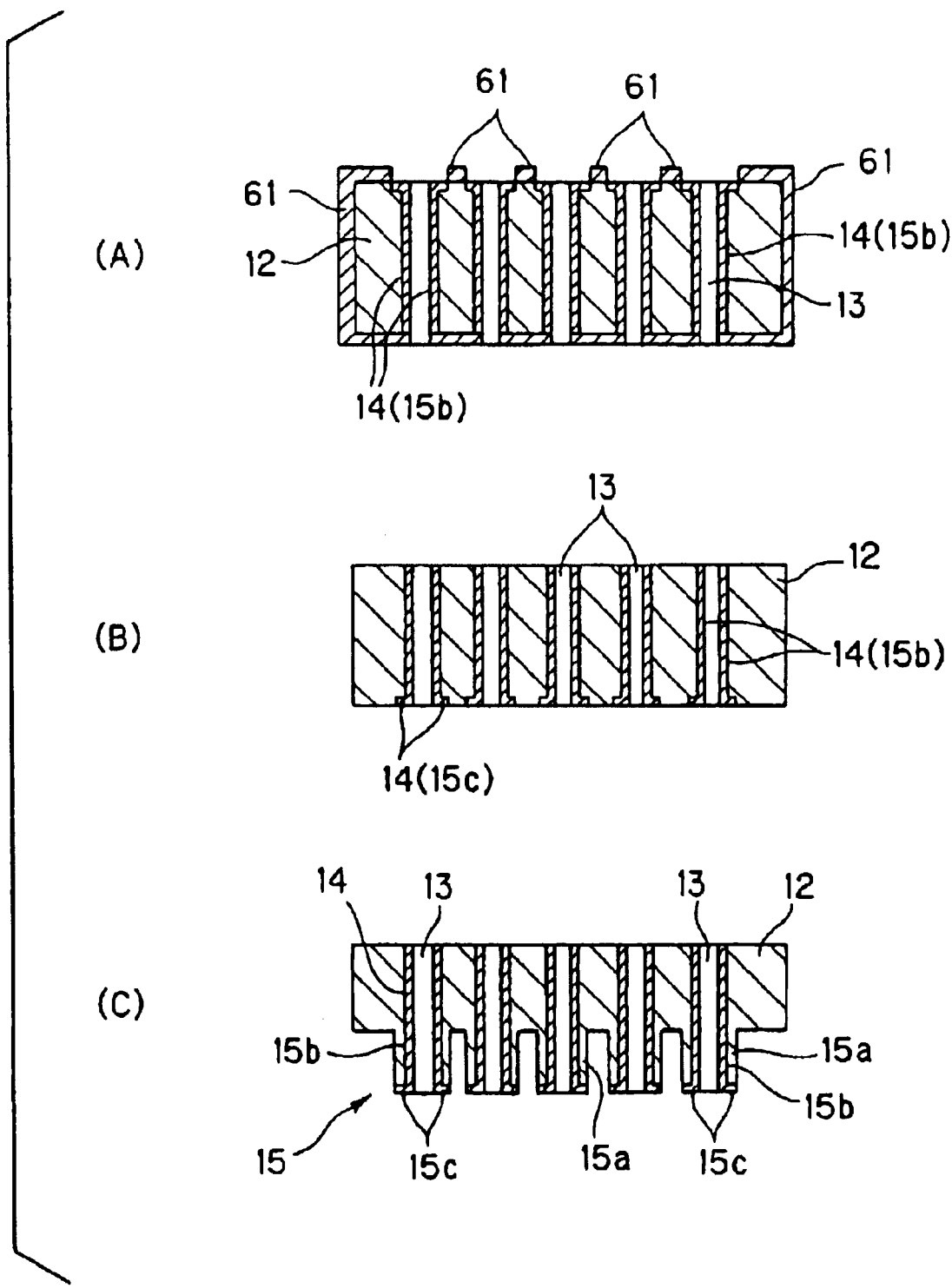
FIG. 18 is a process diagram illustrating still another embodiment of the production process of fine nozzles according to the present invention.

The production process of fine nozzles according to the present invention will be described by taking the fine nozzles 15 in the apparatus 11 for fine pattern formation shown in FIG. 2 as an example with reference to FIGS. 17 and 18.

As the first step, an about 200 to 3000 angstrom-thick silicon nitride (Si$_3$N$_4$) layer 61 is formed on the whole area of the silicon substrate 12 having a cleaned surface. A photosensitive resist is then coated on the silicon nitride layer 61, and exposure through a predetermined photomask and development are carried out to form a resist pattern. Subsequently, the silicon nitride layer 61 is etched by RIE (reactive ion etching (process gas: CF$_4$ or SF$_6$)) using the resist pattern as a mask. Thereafter, the resist pattern is removed to form a pattern having small openings 61a (FIG. 17(A)). The silicon nitride layer 61 may be formed in the same manner as used in the formation of the silicon nitride layer 51. The size (outer diameter) of nozzle bases, which will be described later, is determined by the size of the small openings 61a. In general, the opening diameter may be set in the range of 3 to 120 μm.

Next, as the second step, a mask thin film is formed on the pattern of the silicon nitride layer 61, a photosensitive resist is coated on the mask thin film, and exposure through a predetermined photomask and development are carried out to form a resist pattern. Subsequently, the mask thin film is etched using the resist pattern as a mask. Thereafter, the resist pattern is removed to form a mask pattern 62 having fine openings 62a (FIG. 17(B)). The fine opening 62a is located within the small opening 61a of the pattern of the silicon nitride layer 61, preferably in the center portion of the small opening 61a. The size of fine holes 13 and fine nozzles, which will be described later, is determined by the size of the fine openings 62a. In general, the opening diameter may be set in the range of 1 to 100 μm.

In addition to a metallic thin film, a resist, a thin film of silicon oxide or a combination of both the materials (resist/thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Next, as the third step, through fine holes 13 are formed in the silicon substrate 12 by a high aspect etching technique, such as deep etching, using the mask pattern 62 as a mask (FIG. 17(C)). The formation of the through fine holes 13 may be carried out, for example, by a high aspect etching technique, such as a Bosch process using an ICP-RIE (inductively coupled plasma-reactive ion etching) device. According to the present invention, since there is no need to regulate the depth of the fine holes 13, the process is simple. Further, in particular, dry etching by ICP-RIE can significantly shorten the time necessary for the formation of the through fine holes 13.

Next, as the fourth step, the mask pattern 62 is removed, and oxidation is carried out in a thermal oxidation furnace, whereby an about 5000 to 10000 angstrom-thick silicon oxide layer 14 (an inner surface layer 15b of silicon oxide) is formed on the wall surface of the through fine holes 13 and an about 5000 to 10000 angstrom-thick silicon oxide layer 14 (an end face layer 15c of silicon oxide) is formed on the silicon substrate 12 in its portion exposed within the small openings 61a of the silicon nitride layer 61 (FIG. 18(A)).

Next, as the fifth step, the silicon nitride layer 61 is removed (FIG. 18(B)), and dry etching is carried out from the silicon substrate 12 on its surface where the small openings 61a of the silicon nitride layer 61 have been formerly formed. In this dry etching, a part of the silicon substrate 12 is etched using the silicon oxide layer 14 (the end face layer 15c of silicon oxide) functions as a mask, whereby nozzle bases 15a are formed integrally with the silicon substrate 12. The dry etching is stopped when the nozzle bases 15a have been formed by a desired length. Thus, fine nozzles 15 protruded on the etching side of the silicon substrate 12 are prepared (FIG. 18(C)). The wall thickness of the nozzle bases 15a is a difference in radius between the small openings 61a and the fine openings 62a and can be easily changed by the design of the mask. In this connection, it should be noted that the dry etching in the fifth step may be carried out without removing the silicon nitride layer 61.

Although the Bosch process utilizing an ICP-RIE device has been used in the above high aspect etching, the present invention is not limited to this only.

Further, in the production process of the fine nozzles, since sites on the surface side, in which the mask pattern 62 has been formed, for example, by the deep etching in the third step (the etching accuracy is very high), are utilized on the front end side of the fine nozzles 15, a plurality of fine nozzles 15 having an even opening diameter can be formed.

(Third Embodiment)

Figure 19:
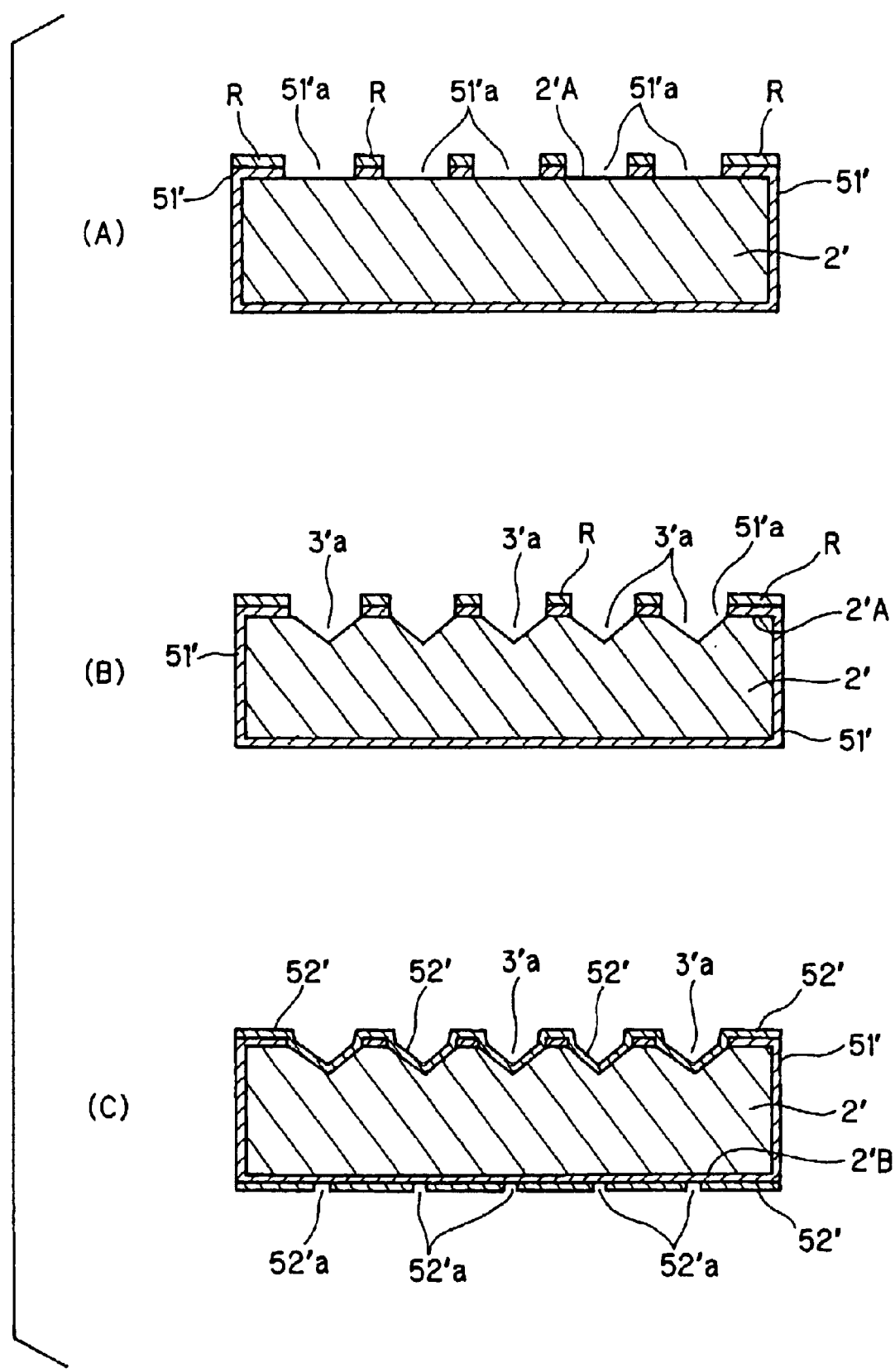
FIG. 19 is a process diagram illustrating a further embodiment of the production process of fine nozzles according to the present invention.
Figure 20:
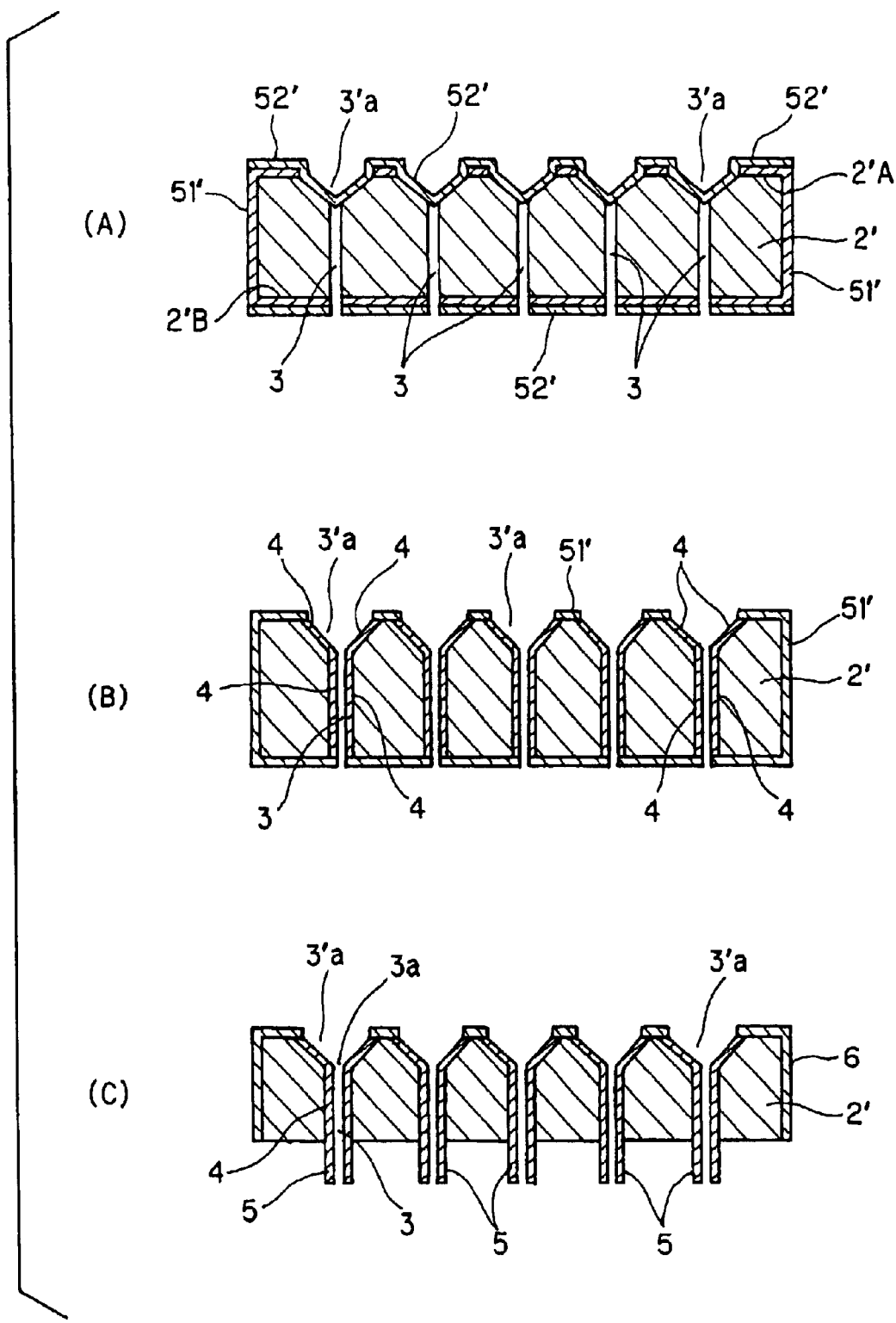
FIG. 20 is a process diagram illustrating a still further embodiment of the production process of fine nozzles according to the present invention.

The production process of fine nozzles according to the present invention will be described by taking the fine nozzles 5, in the apparatus 1' for fine pattern formation shown in FIG. 3, as an example with reference to FIGS. 19 and 20.

At the outset, as the first step, the surface of a silicon substrate 2' having <100> crystallographic orientation is cleaned, and an about 200 to 3000 angstrom-thick silicon nitride ($Si_3N_4$) layer 51' is formed on the whole area of the silicon substrate 2'.

A photosensitive resist is then coated on the silicon nitride layer 51' in its portion located on the surface 2'A side of the silicon substrate 2', and exposure through a predetermined photomask and development are carried out to form a resist pattern R. Subsequently, the silicon nitride layer 51' is etched by RIE (reactive ion etching (process gas: $CF_4$ or $SF_6$)) using the resist pattern R as a mask to form a pattern having openings 51'a for taper (FIG. 19(A)). The silicon nitride layer 51' may be formed in the same manner as used in the formation of the silicon nitride layer 51. The depth, opening diameter, and shape of tapered concaves 3'a, which will be described later, are determined by the size and shape of the openings 51'a for taper in the silicon nitride layer 51'. In general, the size of the opening for taper is preferably set in the range of 10 to 200 $\mu$m. The shape of the opening for taper may be properly selected from square, circle and the like.

Next, as the second step, the silicon substrate 2' is subjected to crystallographically anisotropic etching with an aqueous potassium hydroxide solution using the silicon nitride layer 51' as a mask. In this etching, the silicon substrate 2' in its portions exposed to the openings 51a' for taper is etched in the direction of depth so that <111> crystallographic orientation appears. This etching is preferably carried out, for example, until the apex of inverted quadrangular pyramid tapered openings is closed (i.e., until inverted quadrangular pyramid concaves are completely formed). As a result, tapered concaves 3'a are formed on the surface 2'A side of the silicon substrate 2' (FIG. 19(B)).

Next, as the third step, the resist pattern R is removed, and a mask thin film 52' is formed on the surface 2'A side and the back surface 2'B side of the silicon substrate 2'. The mask thin film 52' on the back surface 2'B side of the silicon substrate 2' remote from the tapered concaves 3'a is then patterned to form fine openings 52'a (FIG. 19(C)). This fine opening 52'a is formed so that the center of the opening substantially conforms to the center (apex) of the tapered concave 3'a through the silicon substrate 2'. The diameter of openings in fine holes 3 and fine nozzles 5, which will be described later, is determined by the size of the fine openings 52'a. In general, the size of the fine openings 52'a is preferably set in the range of 1 to 100 $\mu$m.

In addition to a metallic thin film, a resist, a thin film of silicon oxide or a combination of both the materials (resist/thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Next, as the fourth step, through fine holes 3 are formed from the back surface 12'B side of the silicon substrate 2' by a high aspect etching technique, such as deep etching, using the mask thin film 52' as a mask (FIG. 20(A)). The formation of the through fine holes 3 may be carried out, for example, by a high aspect etching technique, such as dry etching or deep etching, for example, by an ICP-RIE (inductively coupled plasma-reactive ion etching). In this deep etching, as soon as the through fine holes 3 extended to the interior of the tapered concaves 3'a, the mask thin film 52' (mask thin film 52' within the tapered concaves 3'a) formed on the surface 2'A side of the silicon substrate 2' functions as a stopping layer. This can eliminate the need to control the depth of the fine holes 3 formed and can render the process simple. Further, in particular, dry etching by ICP-RIE can significantly shorten the time necessary for the formation of the through fine holes 3.

Next, as the fifth step, the mask thin film 52' is removed, and oxidation is carried out in a thermal oxidation furnace to form an about 5000 to 10000 angstrom-thick silicon oxide layer 4 on the wall surface of the through fine holes 3 and on the wall surface of the tapered concaves 3'a (FIG. 20(B)).

Next, as the sixth step, dry etching is carried out from the back surface 2'B side of the silicon substrate 2' remote from the tapered concaves 3'a. In this dry etching, after the removal of the silicon nitride layer 51', a part of the silicon substrate 2' is etched to expose the silicon oxide layer 4 formed on the inner wall of the through fine holes 3. When this silicon oxide layer 4 has been exposed by a desired length, the dry etching is stopped to prepare fine nozzles 5 formed of silicon oxide protruded on the etching side of the silicon substrate 2' (FIG. 20(C)).

Although the Bosch process utilizing an ICP-RIE device has been used in the above high aspect etching, the present invention is not limited to this only.

(Fourth Embodiment)

Figure 21:
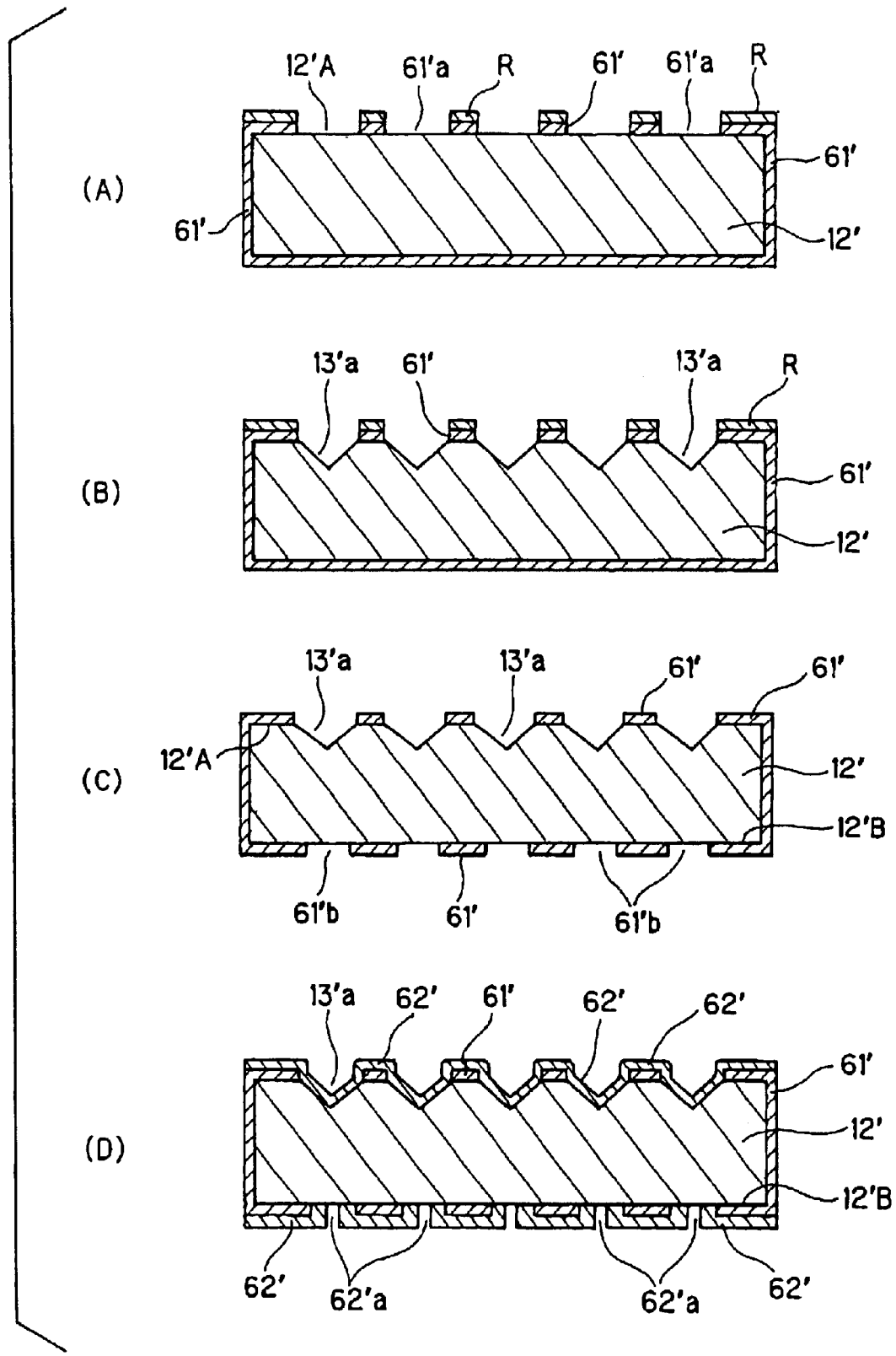
FIG. 21 is a process diagram illustrating another embodiment of the production process of fine nozzles according to the present invention.

The production process of fine nozzles according to the present invention will be described by taking the fine nozzles 15, in the apparatus 11' for fine pattern formation shown in FIG. 4, as an example with reference to FIGS. 21 and 22.

At the outset, as the first step, the surface of a silicon substrate 12' having <100> crystallographic orientation is cleaned, and an about 200 to 3000 angstrom-thick silicon nitride ($Si_3N_4$) layer 61' is formed on the whole area of the silicon substrate 12'.

A photosensitive resist is then coated on the silicon nitride layer 61' in its portion located on the surface 12"A side of the silicon substrate 12', and exposure through a predetermined photomask and development are carried out to form a resist pattern R. Subsequently, the silicon nitride layer 61' is etched by RIE (reactive ion etching (process gas: $CF_4$ or $SF_6$)) using the resist pattern R as a mask to form a pattern having openings 61'a for taper (FIG. 21(A)). The silicon nitride layer 61' may be formed in the same manner as used in the formation of the silicon nitride layer 51. The depth, opening diameter, and shape of tapered concaves 13'a, which will be described later, are determined by the size and shape of the openings 61'a for taper in the silicon nitride layer 61'. In general, the size of the opening for taper is preferably set in the range of 10 to 200 $\mu$m. The shape of the opening for taper may be properly selected from square, circle and the like.

Next, as the second step, the silicon substrate 12' is subjected to crystallographically anisotropic etching with an aqueous potassium hydroxide solution using the silicon nitride layer 61' as a mask. In this etching, the silicon substrate 12' in its portions exposed to the openings 61a' for taper is etched in the direction of depth so that <111> crystallographic orientation appears. This etching is preferably carried out, for example, until the apex of inverted quadrangular pyramid tapered openings is closed (i.e., until inverted quadrangular pyramid concaves are completely formed). As a result, tapered concaves 13'a are formed on the surface 12'A side of the silicon substrate 12' (FIG. 21(B)).

Next, as the third step, a photosensitive resist is coated on the silicon nitride layer 61' on the back surface 12'B side of the silicon substrate 12' remote from the tapered concaves 13'a, and exposure through a predetermined photomask and development are carried out to form a resist pattern. Subsequently, the silicon nitride layer 61' is etched by RIE (reactive ion etching (process gas: $CF_4$ or $SF_6$)) using the resist pattern as a mask. Thereafter, the resist pattern is removed to form a pattern having small openings 61'b (FIG. 21(C)). This small opening 61'b is formed so that the center of the opening substantially conforms to the center (apex) of the tapered concave 13'a through the silicon substrate 12'. The size (outer diameter) of nozzle bases, which will be described later, is determined by the size of the small openings 61'b. In general, the opening diameter may be set in the range of 3 to 120 $\mu$m.

Next, as the fourth step, a mask thin film 62' is formed on the surface 12'A side and the back surface 12'B side of the silicon substrate 12'. The mask thin film 62' on the back surface 12'B side of the silicon substrate 12' remote from the tapered concaves 13'a is then patterned to form fine openings 62'a (FIG. 20(D)). This fine opening 62'a is located within the small opening 61'b of the pattern of the silicon nitride layer 61', preferably located in the center portion of the small opening 61'b. The size of openings in fine holes 13 and fine nozzles, which will be described later, is determined by the size of the fine openings 62'a. In general, the diameter of the openings may be set in the range of 1 to 100 $\mu$m.

In addition to a metallic thin film, a resist, a thin film of silicon oxide or a combination of both the materials (resist/thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Next, as the fifth step, through fine holes 13 are formed in the silicon substrate 12', for example, by deep etching using the mask thin film 62' as a mask from the back surface 12'B side of the silicon substrate 12' (FIG. 22(A)). The formation of the through fine holes 13 may be carried out, for example, by a high aspect etching technique, such as dry etching or deep etching, for example, by an ICP-RIE (inductively coupled plasma-reactive ion etching). In this deep etching, as soon as the through fine holes 13 extended to the interior of the tapered concaves 13'a, the mask thin film 62' (mask thin film 62' within the tapered concaves 13'a) formed on the surface 12'A side of the silicon substrate 12' functions as a stopping layer. This can eliminate the need to control the depth of the fine holes 13 formed and can render the process simple. Further, in particular, dry etching by ICP-RIE can significantly shorten the time necessary for the formation of the through fine holes 13.

Next, as the sixth step, the mask pattern 62' is removed, and oxidation is carried out in a thermal oxidation furnace, whereby an about 5000 to 10000 angstrom-thick silicon oxide layer 14 is formed on the wall surface of the tapered concaves 13', an about 5000 to 10000 angstrom-thick silicon oxide layer 14 (an inner surface layer 15b of silicon oxide) is formed on the wall surface of the through fine holes 13, and an about 5000 to 10000 angstrom-thick silicon oxide layer 14 (an end face layer 15c of silicon oxide) is formed on the silicon substrate 12 in its portion exposed within the small openings 61a of the silicon nitride layer 61 (FIG. 22(B)).

Next, as the seventh step, the silicon nitride layer 61' is removed (FIG. 22(C)), and dry etching is carried out from the back surface 12'B side of the silicon substrate 12' remote from the tapered concaves 13'a. In this dry etching, a part of the silicon substrate 12' is etched using the silicon oxide layer 14 (the end face layer 15c of silicon oxide) functions as a mask, whereby nozzle bases 15a are formed integrally with the silicon substrate 12'. The dry etching is stopped when the nozzle bases 15a have been formed by a desired length. Thus, fine nozzles 15 protruded on the etching side of the silicon substrate 12' are prepared (FIG. 22(D)). The wall thickness of the nozzle bases 15a is a difference in radius between the small openings 61'a and the fine openings 62'a and can be easily changed by the design of the mask. In this connection, it should be noted that the dry etching in the seventh step may be carried out without removing the silicon nitride layer 61'.

Although the Bosch process utilizing an ICP-RIE device has been used in the above high aspect etching, the present invention is not limited to this only.

(Fifth Embodiment)

The production process of fine nozzles according to the present invention will be described by taking the fine nozzles 5 in the apparatus 1" for fine pattern formation shown in FIG. 5 as an example with reference to FIG. 23.

As the first step, an about 200 to 3000 angstrom-thick silicon nitride ($Si_3N_4$) layer 51" is formed on the whole area of the silicon substrate 2 having a cleaned surface. Next, a mask thin film 51" is formed on both surfaces of the silicon nitride layer 51", and the mask thin film 51" in its portion located on the surface 2"A side of the silicon substrate 2" is patterned to form a mask pattern having wide openings 51"a. The mask thin film 51" in its portion located on the back surface 2"B side of the silicon substrate 2" is patterned to form a mask pattern having fine openings 51"b (FIG. 23 (A)). The center of the wide opening 51"a is set so as to substantially conform to the center of the fine hole 51"b through the silicon substrate 2".

The opening diameter of multistaged wide concaves 3"a, which will be described later, is determined by the size and shape of the wide opening 51"a. In general, the size of the wide opening is preferably set in the range of 5 to 200 $\mu$m. Further, the diameter of openings in fine holes 3 and fine nozzles 5, which will be described later, is determined by the size of the fine openings 51"b. In general, the size of the fine openings is preferably set in the range of 1 to 100 $\mu$m.

The silicon nitride layer 51" may be formed in the same manner as used in the silicon nitride layer 51.

In addition to a metallic thin film, a resist, a thin film of silicon oxide or a combination of both the materials (resist/thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Fine holes 3 are formed by deep etching from the back surface 2"B side of the silicon substrate 2" (FIG. 23(B)). The fine holes 3 may be formed, for example, by a high aspect etching technique, such as dry etching or deep etching, for example, by ICP-RIE (inductively coupled plasma-reactive ion etching). The formation of the fine holes 3 is continued until the depth reaches a predetermined level such that the fine holes do not yet completely pass through the silicon substrate 2". In the present invention, in order to facilitate the regulation of the depth of the fine holes 3, an SOI (silicon on insulator) wafer may be used as the silicon substrate 2". The SOI wafer has a multilayer structure comprising a silicon oxide thin film sandwiched between single crystal silicons. The silicon oxide thin film functions as a stopping layer in the deep etching. This can eliminate the need to control the depth in the formation of the fine holes 3. When an SOI wafer having a multilayer structure, in which two silicon oxide thin films are sandwiched between single crystal silicons, is used, multistaged openings, of which the number of stages is larger, can be formed.

Next, as the third step, wide concaves 3"a are formed from the surface 2" side of the silicon substrate 2" by deep etching using the mask pattern having wide openings 51"a as a mask (FIG. 23(C)). The wide concaves 3"a can be formed, for example, by high aspect etching, such as dry etching or deep etching, for example, by ICP-RIE (inductively coupled plasma-reactive ion etching). The formation of the wide concaves 3"a is continued until the openings of the fine holes 3 appear within the wide concaves 3"a.

Next, as the fourth step, the mask thin film 51" is removed, and oxidation is carried out in a thermal oxidation furnace to form an about 5000 to 10000 angstrom-thick silicon oxide layer 4 on the wall surface of the fine holes 3 and on the wall surface of the wide concaves 3"a (FIG. 23(D)).

Next, as the fifth step, dry etching is carried out from the back surface 2"B side of the silicon substrate 2" remote from the wide concaves 3"a. In this dry etching, after the removal of the silicon nitride layer 51", a part of the silicon substrate 2" is etched to expose the silicon oxide layer 4 formed on the inner wall of the through fine holes 3. When this silicon oxide layer 4 has been exposed by a desired length, the dry etching is stopped to prepare fine nozzles 5 formed of silicon oxide protruded on the etching side of the silicon substrate 2" (FIG. 23(E)).

Although the Bosch process utilizing an ICP-RIE device has been used in the above high aspect etching, the present invention is not limited to this only.

(Sixth Embodiment)

Figure 25:
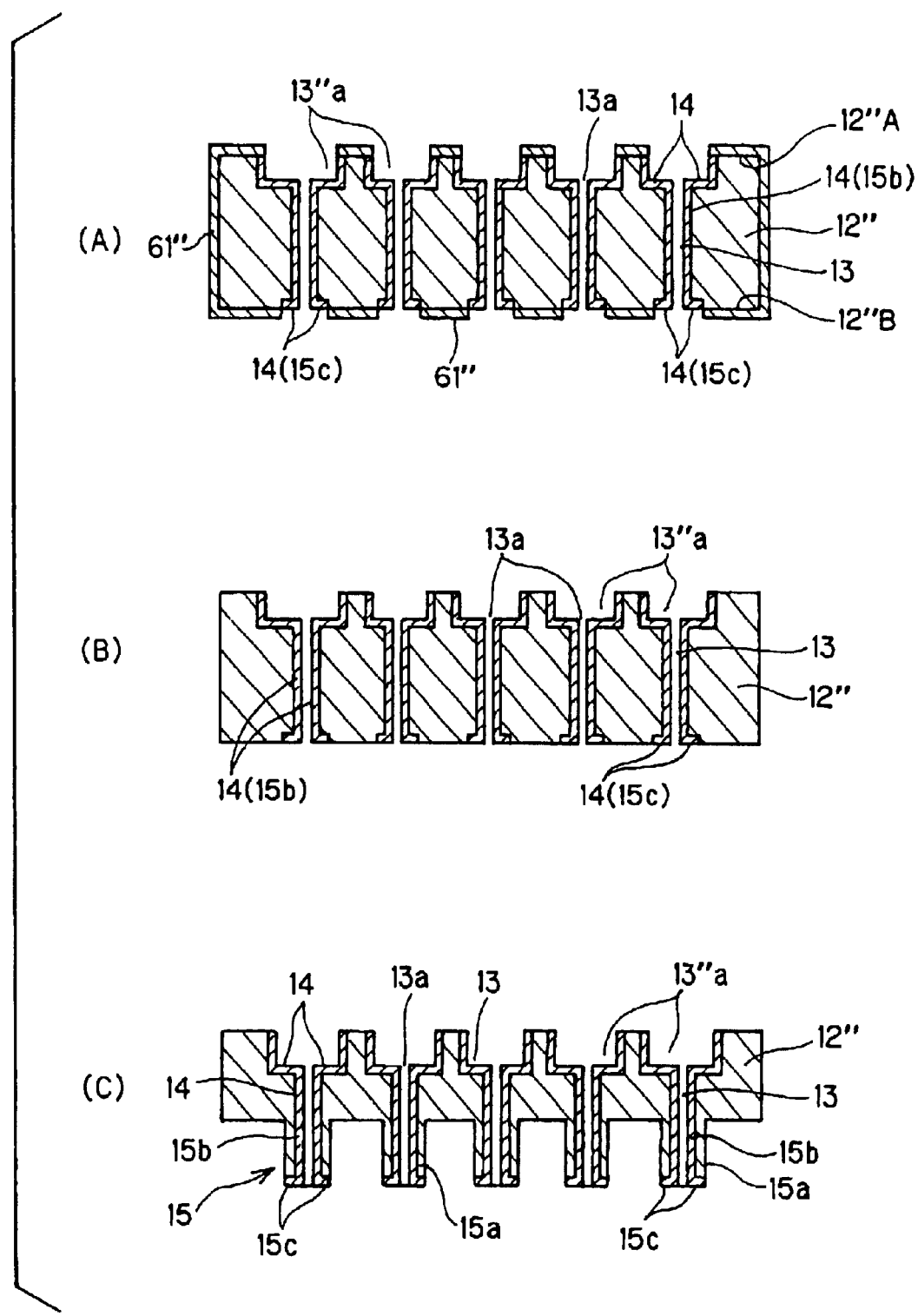
FIG. 25 is a process diagram illustrating another embodiment of the production process of fine nozzles according to the present invention.

The production process of fine nozzles according to the present invention will be described by taking the fine nozzles 15 in the apparatus 11" for fine pattern formation shown in FIG. 6 as an example with reference to FIGS. 24 and 25.

As the first step, an about 200 to 3000 angstrom-thick silicon nitride ($Si_3N_4$) layer 61" is formed on the whole area of the silicon substrate 12" having a cleaned surface. A photosensitive resist is then coated on the silicon nitride layer 61" in its portion located on the back surface 12"B side of the silicon substrate 12", and exposure through a predetermined photomask and development are carried out to form a resist pattern. Subsequently, the silicon nitride layer 61" is etched by RIE (reactive ion etching (process gas: $CF_4$ or $SF_6$)) using the resist pattern as a mask. Thereafter, the resist pattern is removed to form a pattern having small openings 61"a (FIG. 24(A)). The silicon nitride layer 61" may be formed in the same manner as used in the formation of the silicon nitride layer 51. The size (outer diameter) of nozzle bases, which will be described later, is determined by the size of the small openings 61"a. In general, the opening diameter may be set in the range of 3 to 120 μm.

Next, as the second step, a mask thin film 62" is formed on both surfaces so as to cover the silicon nitride layer 61". Next, the mask thin film 62" in its portion located on the back surface 12"B side of the silicon substrate 12" is patterned by etching to form a mask pattern having fine openings 62"a. Further, the mask thin film 62" in its portion located on the surface 12"A side of the silicon substrate 12" is patterned by etching to form a mask pattern having wide openings 62"b (FIG. 24(B)). The fine openings 62"a are set so as to locate within the small openings 61"a of the pattern of the silicon nitride layer 61", preferably are located in the center portion of the small openings 61". The center of the wide opening 62"b is set so as to substantially conform to the center of the fine opening 62"a through the silicon substrate 12".

The opening diameter of fine holes 13 and fine nozzles 15, which will be described later, is determined by the size of the fine openings 62"a. In general, the size of the fine openings is preferably set in the range of 1 to 100 μm. Further, the opening diameter of multistaged wide concaves 13"a, which will be described later, is determined by the size and shape of the wide openings 61"b. In general, the size of the wide openings is preferably set in the range of 5 to 200 μm. The metallic thin film maybe formed of aluminum, nickel, chromium or the like and is preferably formed to a thickness of about 1000 to 2000 angstroms, for example, by sputtering or vacuum vapor deposition. For example, when aluminum is used as the metallic thin film, an aluminum etchant (mixed acid aluminum) may be used for etching.

Next, as the third step, fine holes 13 are formed from the back surface 12"B side of the silicon substrate 12" by deep etching using the mask pattern having fine openings 62"a as a mask (FIG. 24(C)). The fine holes 13 may be formed, for example, by a high aspect etching technique, such as dry etching or deep etching, for example, by ICP-RIE (inductively coupled plasma-reactive ion etching). The formation of the fine holes 13 is continued until the depth reaches a predetermined level such that the fine holes 13 do not yet completely pass through the silicon substrate 12". In the present invention, in order to facilitate the regulation of the depth of the fine holes 13, an SOI (silicon on insulator) wafer may be used as the silicon substrate 12". The SOI wafer has a multilayer structure comprising a silicon oxide thin film sandwiched between single crystal silicons. The silicon oxide thin film functions as a stopping layer in the etching. When an SOI wafer having a multilayer structure, in which two silicon oxide thin films are sandwiched between single crystal silicons, is used, multistaged openings, of which the number of stages is larger, can be formed.

Next, as the fourth step, wide concaves 13"a are formed from the surface 12"A side of the silicon substrate 12" by deep etching using the mask pattern having wide openings 62"b as a mask (FIG. 24(D)). The wide concaves 13"a can be formed, for example, by high aspect etching technique, such as dry etching or deep etching, for example, by ICP-RIE (inductively coupled plasma-reactive ion etching). The formation of the wide concaves 13"a is continued until the openings of the fine holes 13 appear within the wide concaves 13"a.

Next, as the fifth step, the mask thin film 62" is removed, and oxidation is carried out in a thermal oxidation furnace, whereby an about 5000 to 10000 angstrom-thick silicon oxide layer 14 is formed on the wall surface of the wide concaves 13"a, an about 5000 to 10000 angstrom-thick silicon oxide layer 14 (an inner surface layer 15b of silicon oxide) is formed on the wall surface of the fine holes 13, and an about 5000 to 10000 angstrom-thick silicon oxide layer 14 (an end face layer 15c of silicon oxide) is formed on the silicon substrate 12" in its portion exposed within the small openings 61"a of the silicon nitride layer 61" (FIG. 25(A)).

Next, as the sixth step, the silicon nitride layer 61" is removed (FIG. 25(B)), and dry etching is carried out from the surface of the silicon substrate 12" in which the small openings 61"a in the silicon nitride layer 61" has been formerly formed. In this dry etching, a part of the silicon substrate 12" is etched using the silicon oxide layer 14 (the end face layer 15c of silicon oxide) functions as a mask, whereby nozzle bases 15a are formed integrally with the silicon substrate 12". The dry etching is stopped when the nozzle bases 15a have been formed by a desired length. Thus, fine nozzles 15 protruded on the etching side of the silicon substrate 12" are prepared (FIG. 25(C)). The wall thickness of the nozzle bases 15a is a difference in radius between the small openings 61"a and the fine openings 62"a and can be easily changed by the design of the mask. In this connection, it should be noted that the dry etching in the sixth step may be carried out without removing the silicon nitride layer 61.

Although the Bosch process utilizing an ICP-RIE device has been used in the above high aspect etching, the present invention is not limited to this only.

II-1 Apparatus for Fine Pattern Formation
(First Embodiment)

Figure 26:
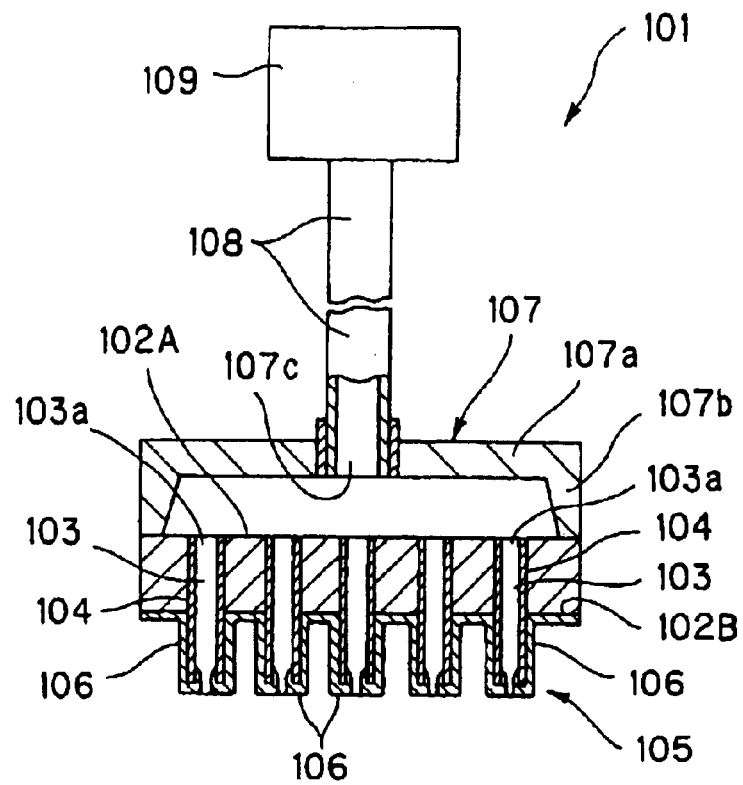
FIG. 26 is a schematic cross-sectional view showing one embodiment of the apparatus for fine pattern formation according to the present invention.
Figure 27:
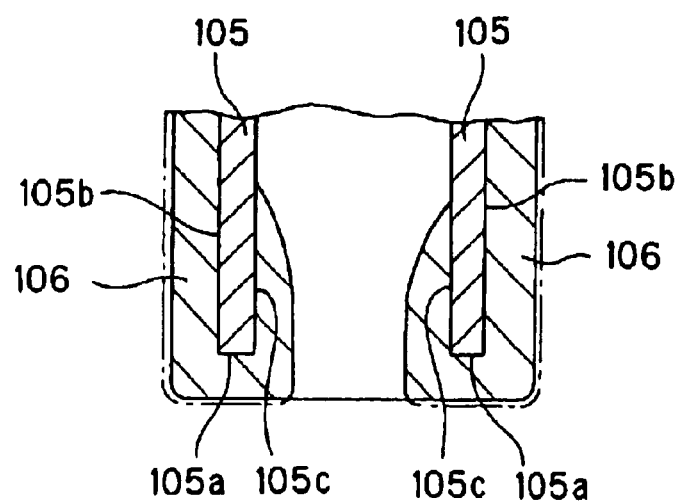
FIG. 27 is a partially enlarged cross-sectional view of a portion around the front end of fine nozzles in the apparatus for fine pattern formation shown in FIG. 26.

FIG. 26 is a schematic cross-sectional view showing one embodiment of the apparatus for fine pattern formation according to the present invention, and FIG. 27 is a partially enlarged cross-sectional view of a portion around the front end of fine nozzles in the apparatus for fine pattern formation shown in FIG. 26. In FIGS. 26 and 27, an apparatus 101 for fine pattern formation comprises: a silicon substrate 102; fine nozzles 105 protruded on the back surface 102B side of the silicon substrate 102; a reinforcing layer 106 which covers at least the front end face 105a and the outer face 105b of the fine nozzles 105 and is further provided on the back surface 102B of the silicon substrate 102; a support member 107; an ink passage 108 for supplying ink to a space between the silicon substrate 102 and the support member 107; and an ink supplying device 109 connected to the ink passage 108.

The silicon substrate 102 has a plurality of fine holes 103 which extend through the silicon substrate 102 from the surface 102A side to the back surface 102B side. Openings 103a on the surface 102A side of the fine holes 103 are exposed to the space defined by the silicon substrate 102 and the support member 107. The silicon substrate 102 is preferably formed of a single crystal of silicon, and the thickness of the silicon substrate 102 is preferably about 200 to 500 $\mu$m. Since the silicon substrate 102 has a low coefficient of linear expansion of about $2.6 \times 10^{-6}$/K, a change in shape upon a temperature change is very small.

The fine holes 103 are cylindrical spaces which are circular in a transverse section perpendicular to the axial direction (a section parallel to the surface 102A of the silicon substrate 102) and are rectangular in a longitudinal section along the axial direction (a section perpendicular to the surface 102A of the silicon substrate 102). A silicon oxide layer 104 is provided on the wall surface of the fine holes 103. The thickness of the silicon oxide layer 104 is generally about 5000 to 10000 angstroms. In the embodiment shown in the drawing, the thickness of the silicon substrate 102, the opening diameter of the fine holes 103, the number of fine holes 103, the pitch of the fine holes 103 and the like are simplified for the explanation of the construction of the apparatus. The opening diameter of the fine holes 103 may be properly set in the range of about 1 to 100 $\mu$m, and the aspect ratio of the fine holes 103 may be properly set in the range of about 1 to 100. The number of the fine holes 103 and the pitch of the fine holes 103 may be properly set according to the form of pattern formed by the apparatus 101 for fine pattern formation, the method for pattern formation and the like. The pitch of the fine holes 103 is preferably about 4 $\mu$m at the smallest.

The transverse sectional form of the fine holes 103 may be, in addition to the above-described circular form, for example, an elliptical or polygonal form or a special form. Further, the fine holes 103 may be a combination of two or more fine holes which are different from each other in transverse sectional form. When the fine holes 103 are elliptical or rectangular in transverse sectional form, the opening diameter in the longitudinal direction may be properly set in the range of 5 to 500 $\mu$m. Further, regarding the longitudinal sectional form of the fine holes 103, in addition to the above-described rectangle, a trapezoid, wherein the back surface 102B side of the silicon substrate 102 is narrowed (tapered), may be adopted.

The fine nozzles 105 are formed of silicon oxide, are provided integrally with the silicon oxide layer 104 provided on the wall surface of the fine holes 103, and are in communication with the fine holes 103. The thickness of the fine nozzles 105 may be properly set in the range of 5000 to 10000 angstroms, the opening diameter may be properly set in the range of 1 to 100 $\mu$m, and the protrusion level from the back surface 102B of the silicon substrate 102B may be properly set in the range of 1 to 150 $\mu$m. The provision of the fine nozzles 105 can prevent ink, ejected from the fine holes 103, from being deposited on the back surface 102B side of the silicon substrate 102.

The reinforcing layer 106 reinforces the fine nozzles 105 to improve the mechanical strength. The reinforcing layer 106 may be formed of a material, such as silicon oxide or phosphorus silicon glass. In the embodiment shown in the drawing, the reinforcing layer 106 covers the front end face 105a and outer face 105b of the fine nozzles 105 and, in addition, is formed on a portion around the front end face of the inner face 105c and on the back surface 102B of the silicon substrate 102. The thickness of the reinforcing layer 106 may be at least twice, preferably 5 times that of the fine nozzles 105. In general, the thickness may be properly set in the range of 1 to 5 $\mu$m.

The opening diameter of the fine nozzles 105 can be substantially regulated by varying the thickness of the reinforcing layer 106 provided on the inner face 105c of the fine nozzles 105. To this end, a method may be used wherein fine nozzles 105 having a predetermined opening diameter are formed and the thickness of the reinforcing layer 106 formed on the inner face of 105c of the fine nozzles 105 is regulated according to applications of the apparatus for fine pattern formation, properties of ink used and the like to form fine nozzles 105 having a desired opening diameter.

The reinforcing layer 106 may be formed, for example, by plasma CVD, ion plating, or low pressure CVD. These film formation methods can realize a high sneak level and thus are advantageous for the formation of the reinforcing layer 106 on the inner face 105*c* of the fine nozzles 105 having a three-dimensional structure.

In the embodiment shown in the drawing, the reinforcing layer 106 is also formed on the back surface 102B of the silicon substrate 102. In the apparatus for fine pattern formation according to the present invention, the reinforcing layer 106 may not be provided in this site.

The support member 107 is provided on the surface 102A side of the silicon substrate 102, for supporting the silicon substrate 102. In the embodiment shown in the drawing, the support member 107 comprises: a base 107*a*, which, as with the silicon substrate 102, is flat; a flange portion 107*b* provided on the periphery of the base 107*a*; and an opening 107*c* provided at the center of the base 107*a*. The support member 107 is fixed to the peripheral portion of the surface 102A side of the silicon substrate 102 by the flange portion 107*b*. This can provide a space for supplying ink to a portion between the silicon substrate 102 and the support member 107. The fixation of the support member 107 to the silicon substrate 102 through heat-resistant glass (not shown) can improve the working efficiency of later steps in the production of the apparatus for fine pattern formation.

This support member 107 is preferably formed of a material having a coefficient of linear expansion in the range of one-tenth of the coefficient of linear expansion of the silicon substrate 102 to 10 times the coefficient of linear expansion of the silicon substrate 102, for example, Pyrex glass (tradename: Corning #7740, coefficient of linear expansion=$3.5 \times 10^{-6}$/K) or SUS 304 (coefficient of linear expansion=$17.3 \times 10^{-6}$/K). When these materials are used, the level of a distortion caused between the silicon substrate 102 and the support member 107 upon exposure to heat is very small. By virtue of this, the flatness of the silicon substrate 102 is maintained, and a pattern having high positional accuracy can be formed.

The ink passage 108 is connected to the opening 107*c* of the support member 107, and the other end of the ink passage 108 is connected to an ink supplying device 109. In the embodiment shown in the drawing, only one ink passage 108 in a pipe form is connected. In this case, a construction may also be adopted wherein a plurality of openings 107*c*, the number of which has been determined by taking into consideration, for example, the size of the apparatus 101 for fine pattern formation and the evenness of ink flow pressure, are provided, and the ink passage 108 is connected to each opening 107*c*. The support member 107 and the silicon substrate 102 may be fabricated so that the ink passage is provided within the support member 107 and/or the silicon substrate 102.

The ink supplying device 109 is not particularly limited, and any of a continuous supply pump, a constant rate supply pump and the like may be used as the ink supplying device 109 and may be properly selected according to the application of the apparatus 101 for fine pattern formation.

In the above-described apparatus 101 for fine pattern formation according to the present invention, a plurality of fine nozzles 105, which have improved mechanical strength by virtue of the provision of the reinforcing layer 106 and thus are satisfactorily durable against external impact and ink supply pressure, are provided on the back surface of the silicon substrate 102, and ink can be ejected in a very small amount through these fine nozzles 105 with high accuracy. At the same time, the deposition of ink onto the back surface of the silicon substrate 102 can be prevented. Further, the amount of ink ejected may be set as desired by controlling the ink supplying device 109 to vary the amount of ink supplied. Therefore, a pattern can be stably written directly on a pattern object with high accuracy.

The reinforcing layer 106, when formed of some material, has improved wettability by ink and sometime prevents stable ejection of ink due to spreading of ink flowed from the fine nozzles 105 onto the back surface 102B of the silicon substrate 102. To overcome this problem, in the apparatus for fine pattern formation according to the present invention, a water-repellent layer may be provided at least on the reinforcing layer 106 provided on the outer face 105*b* of the fine nozzles 105 and on the back surface 102B of the silicon substrate 102. In FIG. 27, the water-repellent layer is indicated by an alternate long and short dash line. The water-repellent layer may be formed of flurocarbon. The fluorocarbon is preferably such that the ratio of the number of the carbon elements to the number of fluorine elements is in the range of 1:1 to 1:2. This water-repellent layer may be formed, for example, by plasma CVD, ion plating, or (thermal) CVD, and the thickness of the water-repellent layer may be about 200 to 500 angstroms.

(Second Embodiment)

FIG. 28 is a schematic cross-sectional view showing another embodiment of the apparatus for fine pattern formation according to the present invention. In FIG. 28, an apparatus 111 for fine pattern formation comprises: a silicon substrate 112, tapered concaves 113'*a* provided on a surface 112A of the silicon substrate 112; fine nozzles 115 protruded on the back surface 112B side of the silicon substrate 112; a reinforcing layer 116 which covers at least the front end face 115*a* and outer face 115*b* of the fine nozzles 115 and is further provided on the back surface 112B of the silicon substrate 112; a support member 117; an ink passage 118 for supplying ink to a space between the silicon substrate 112 and the support member 117; and an ink supplying device 119 connected to the ink passage 118.

The silicon substrate 112 has fine holes 113 which extend through the silicon substrate 112 from the bottom of the plurality of tapered concaves 113'*a* on the surface 112A side to the back surface 112B side. Openings 113*a* on the surface 112A side of the fine holes 113 are exposed to the tapered concaves 113'*a*, and the tapered concaves 113'*a* are exposed to the space defined by silicon substrate 112 and the support member 117. Preferably, the silicon substrate 112 is formed of a single crystal of silicon, in which the crystallographic orientation of the surface 112A and the back surface 112B is <100> face, and has a thickness of about 200 to 500 μm. Since the silicon substrate 112 has a low coefficient of linear expansion of about $2.6 \times 10^{-6}$/K, a change in shape upon a temperature change is very small.

A silicon oxide layer 114 is provided on the wall surface of the tapered concaves 113'*a*, and the thickness of the silicon oxide layer 114 is generally about 5000 to 10000 angstroms. The taper in the concaves 113'*a* may be in the form of any of an inverted cone, an inverted quadrangular pyramid and the like, and the depth of the concaves 113'*a* may be set in the range of about 5 to 150 μm, and the maximum opening diameter may be set in the range of about 10 to 200 μm. For example, when the taper is in an inverted quadrangular pyramid form, the wall surface of the concaves 113'*a* may be formed so that the angle of the wall surface of the concaves 113'*a* to the surface 112A of the silicon substrate 112 (<100> face) is 55 degrees. In the embodiment shown in the drawing, the thickness of the silicon substrate 112, the number of tapered concaves 113'*a*, the pitch of the tapered concaves 113'*a* and the like are simplified for the explanation of the construction of the apparatus. The number of the concaves 113'a and the pitch of the concaves 113'a, together with the fine holes 113, may be properly set according to the form of pattern formed by the apparatus 111 for fine pattern formation, the method for pattern formation and the like. The pitch of the concaves 113'a is preferably about 10 μm at the smallest.

The fine holes 113 are cylindrical spaces which are circular in a transverse section perpendicular to the axial direction (a section parallel to the surface 112A of the silicon substrate 112) and are rectangular in a longitudinal section along the axial direction (a section perpendicular to the surface 112A of the silicon substrate 112). A silicon oxide layer 114 is provided on the wall surface of the fine holes 113 so as to be continued from the wall surface of the concaves 113'a. In the embodiment shown in the drawing, the opening diameter of the fine holes 113, the number of fine holes 113, the pitch of the fine holes 113 and the like are simplified for the explanation of the construction of the apparatus. The opening diameter of the fine holes 113 may be properly set in the range of about 1 to 100 μm, and the aspect ratio of the fine holes 113 may be properly set in the range of about 1 to 100. The number of the fine holes 113 and the pitch of the fine holes 113 may be properly set according to the form of pattern formed by the apparatus 111 for fine pattern formation, the method for pattern formation and the like. The pitch of the fine holes 113 is preferably about 10 μm at the smallest.

The transverse sectional form of the fine holes 113 may be, in addition to the above-described circular form, for example, an elliptical or polygonal form or a special form. Further, the fine holes 113 may be a combination of two or more fine holes which are different from each other in transverse sectional form. When the fine holes are elliptical or rectangular in transverse sectional form, the opening diameter in the longitudinal direction may be properly set in the range of 5 to 500 μm. Regarding the longitudinal sectional form of the fine holes 113, in addition to the above-described rectangle, a trapezoid, wherein the back surface 112B side of the silicon substrate 112 is narrowed (for example, tapered at a smaller taper angle than that of the tapered concaves 113'a), may be adopted.

The fine nozzles 115 are formed of silicon oxide, are provided integrally with the silicon oxide layer 114 provided on the wall surface of the fine holes 113, and are in communication with the fine holes 113. The thickness of the fine nozzles 115 may be properly set in the range of 5000 to 10000 angstroms, the opening diameter may be properly set in the range of 1 to 100 μm, and the protrusion level from the back surface 112B of the silicon substrate 112 may be properly set in the range of 1 to 150 μm. The provision of such fine nozzles 115 can prevent ink, ejected from the fine holes 113, from being deposited on the back surface 112B side of the silicon substrate 112.

The reinforcing layer 116 has the same construction as the reinforcing layer 106 and functions to reinforce the fine nozzles 115 to improve the mechanical strength. Therefore, this reinforcing layer 116 also may be formed using a material such as silicon oxide or phosphorus silicon glass, for example, by plasma CVD, ion plating, or low pressure CVD. In the embodiment shown in the drawing, the reinforcing layer 116 covers the front end face 115a and outer face 115b of the fine nozzles 115, is further provided on a portion around the front end face of the inner face 115c and on the back surface 112B of the silicon substrate 112. The thickness of the reinforcing layer 116 may be the same as that of the reinforcing layer 106. Although the reinforcing layer 116 is also provided on the back surface 112B of the silicon substrate 112, in the apparatus for fine pattern formation according to the present invention, the reinforcing layer 116 may not be provided in this site.

The support member 117, the ink passage 118, and the ink supplying device 119 are the same as the support member 107, the ink passage 108, and the ink supplying device 109 in the apparatus 101 for fine pattern formation, and the explanation thereof will be omitted.

In the above-described apparatus 111 for fine pattern formation according to the present invention, by virtue of the provision of tapered concaves 113'a, the passage resistance of ink is reduced. Consequently, an ink having higher viscosity can be ejected in a very small amount with high accuracy through the plurality of fine nozzles 115 provided on the back surface of the silicon substrate 112, and, at the same time, the deposition of ink onto the back surface of the silicon substrate 112 can be prevented. Further, the reinforcing layer 116 improves the mechanical strength of the fine nozzles 115 and are satisfactorily durable against external impact and ink supply pressure. Further, the amount of ink ejected may be set as desired by controlling the ink supplying device 119 to vary the amount of ink supplied. Therefore, a pattern can be stably written directly on a pattern object with high accuracy.

Also in the apparatus 111 for fine pattern formation, as with the above embodiment, the water-repellent layer may be provided at least on the reinforcing layer 116 provided on the outer face 115b of the fine nozzles 115 and on the back surface 112B of the silicon substrate 112. As described above, the water-repellent layer may be formed of fluorocarbon or the like.

(Third Embodiment)

FIG. 29 is a schematic cross-sectional view showing a still further embodiment of the apparatus for fine pattern formation according to the present invention. In FIG. 29, an apparatus 121 for fine pattern formation comprises: a silicon substrate 122; multistaged concaves 123'a provided on a surface 122A of the silicon substrate 122; fine nozzles 125 protruded on the back surface 122B side of the silicon substrate 122; a reinforcing layer 126 which covers at least the front end face 125a and outer face 125b of the fine nozzles 125 and is further provided on the back surface 122B of the silicon substrate 122; a support member 127; an ink passage 128 for supplying ink to a space between the silicon substrate 122 and the support member 127; and an ink supplying device 129 connected to the ink passage 128.

The silicon substrate 122 has fine holes 123 which extend through the silicon substrate 122 from the bottom of the plurality of multistaged concaves 123'a on the surface 122A side to the back surface 122B side. Openings 123a on the surface 122A side of the fine holes 123 are exposed to the concaves 123'a, and the concaves 123'a are exposed to the space defined by the silicon substrate 122 and the support member 127. According to this construction, the fine holes 123 each have a two-staged concave opening comprising the opening 123a as a fine opening and the concave 123'a as a wide opening.

The silicon substrate 122 may be formed of the same material as in the silicon substrate 102, and the thickness of the silicon substrate 122 also may be set in the same range as that of the silicon substrate 102. The silicon substrate 122 may be an SOI (silicon on insulator) wafer that has a thin film of silicon oxide, which is parallel to the surface of the silicon substrate 122, at the boundary between the concaves 123'a and the fine holes 123.

A silicon oxide layer 124 is provided on the wall surface of the concaves 123'a, and the thickness of the silicon oxide layer 124 is generally about 5000 to 10000 angstroms. The concaves 123'a maybe in a cylindrical, cubic, rectangular parallelopiped or other form, and the depth of the concaves 123'a may be set in the range of about 1 to 150 μm, and the opening diameter may be set in the range of about 5 to 200 μm. In the embodiment shown in the drawing, the thickness of the silicon substrate 122, the number of concaves 123'a, the pitch of the concaves 123'a and the like are simplified for the explanation of the construction of the apparatus. The number of the concaves 123'a and the pitch of the concaves 123'a, together with the fine holes 123, may be properly set according to the form of pattern formed by the apparatus 121 for fine pattern formation, the method for pattern formation and the like. The pitch of the concaves 123'a is preferably about 10 μm at the smallest. Further, in the embodiment shown in the drawing, as described above, two-staged openings of the opening 123a as the fine opening and the concave 123'a as the wide opening are adopted. Alternatively, three- or more staged openings may be adopted.

The fine holes 123 are cylindrical spaces which are circular in a transverse section perpendicular to the axial direction (a section parallel to the surface 122A of the silicon substrate 122) and are rectangular in a longitudinal section along the axial direction (a section perpendicular to the surface 122A of the silicon substrate 122). A silicon oxide layer 124 is provided on the wall surface of the fine holes 123 so as to be continued from the wall surface of the concaves 123'a. In the embodiment shown in the drawing, the opening diameter of the fine holes 123, the number of fine holes 123, the pitch of the fine holes 123 and the like are simplified for the explanation of the construction of the apparatus. The opening diameter of the fine holes 123 may be properly set in the range of about 1 to 100 μm, and the aspect ratio of the fine holes 123 may be properly set in the range of about 1 to 100. The number of the fine holes 123 and the pitch of the fine holes 123 may be properly set according to the form of pattern formed by the apparatus 121 for fine pattern formation, the method for pattern formation and the like. The pitch of the fine holes 123 is preferably about 10 μm at the smallest.

The transverse sectional form of the fine holes 123 may be, in addition to the above-described circular form, for example, an elliptical or polygonal form or a special form. Further, the fine holes 123 may be a combination of two or more fine holes which are different from each other in transverse sectional form. When the fine holes are elliptical or rectangular in transverse sectional form, the opening diameter in the longitudinal direction may be properly set in the range of 5 to 500 μm. Regarding the longitudinal sectional form of the fine holes 123, in addition to the above-described rectangle, a trapezoid, wherein the back surface 122B side of the silicon substrate 122 is narrowed (tapered), may be adopted.

The fine nozzles 125 are formed of silicon oxide, are provided integrally with the silicon oxide layer 124 provided on the wall surface of the fine holes 123, and are in communication with the fine holes 123. The thickness of the fine nozzles 125 may be properly set in the range of 5000 to 10000 angstroms, the opening diameter may be properly set in the range of 1 to 100 μm, and the protrusion level from the back surface 122B of the silicon substrate 122 may be properly set in the range of 1 to 150 μm. The provision of such fine nozzles 125 can prevent ink, ejected from the fine holes 123, from being deposited on the back surface 122B side of the silicon substrate 122.

The reinforcing layer 126 has the same construction as the reinforcing layer 106 and functions to reinforce the fine nozzles 125 to improve the mechanical strength. Therefore, this reinforcing layer 126 also may be formed using a material such as silicon oxide or phosphorus silicon glass, for example, by plasma CVD, ion plating, or low pressure CVD. In the embodiment shown in the drawing, the reinforcing layer 126 covers the front end face 125a and outer face 125b of the fine nozzles 125, is further provided on a portion around the front end face of the inner face 125c and on the back surface 122B of the silicon substrate 122. The thickness of the reinforcing layer 126 may be the same as that of the reinforcing layer 106. Although the reinforcing layer 126 is also provided on the back surface 122B of the silicon substrate 122, in the apparatus for fine pattern formation according to the present invention, the reinforcing layer 126 may not be provided in this site.

The support member 127, the ink passage 128, and the ink supplying device 129 are the same as the support member 107, the ink passage 108, and the ink supplying device 109 in the apparatus 101 for fine pattern formation, and the explanation thereof will be omitted.

In the above-described apparatus 121 for fine pattern formation according to the present invention, by virtue of the provision of multistaged concaves 123'a, the passage resistance of ink is reduced. Consequently, an ink having higher viscosity can be ejected in a very small amount with high accuracy through the plurality of fine nozzles 125 provided on the back surface of the silicon substrate 122, and, at the same time, the deposition of ink onto the back surface of the silicon substrate 122 can be prevented. Further, the reinforcing layer 126 improves the mechanical strength of the fine nozzles 125 and are satisfactorily durable against external impact and ink supply pressure. Further, the amount of ink ejected may be set as desired by controlling the ink supplying device 129 to vary the amount of ink supplied. Therefore, a pattern can be stably written directly on a pattern object with high accuracy.

Also in the apparatus 121 for fine pattern formation, as with the above embodiment, the water-repellent layer may be provided at least on the reinforcing layer 126 provided on the outer face 125b of the fine nozzles 125 and on the back surface 122B of the silicon substrate 122. As described above, the water-repellent layer may be formed of fluorocarbon or the like.

(Fourth Embodiment)

Figure 30:
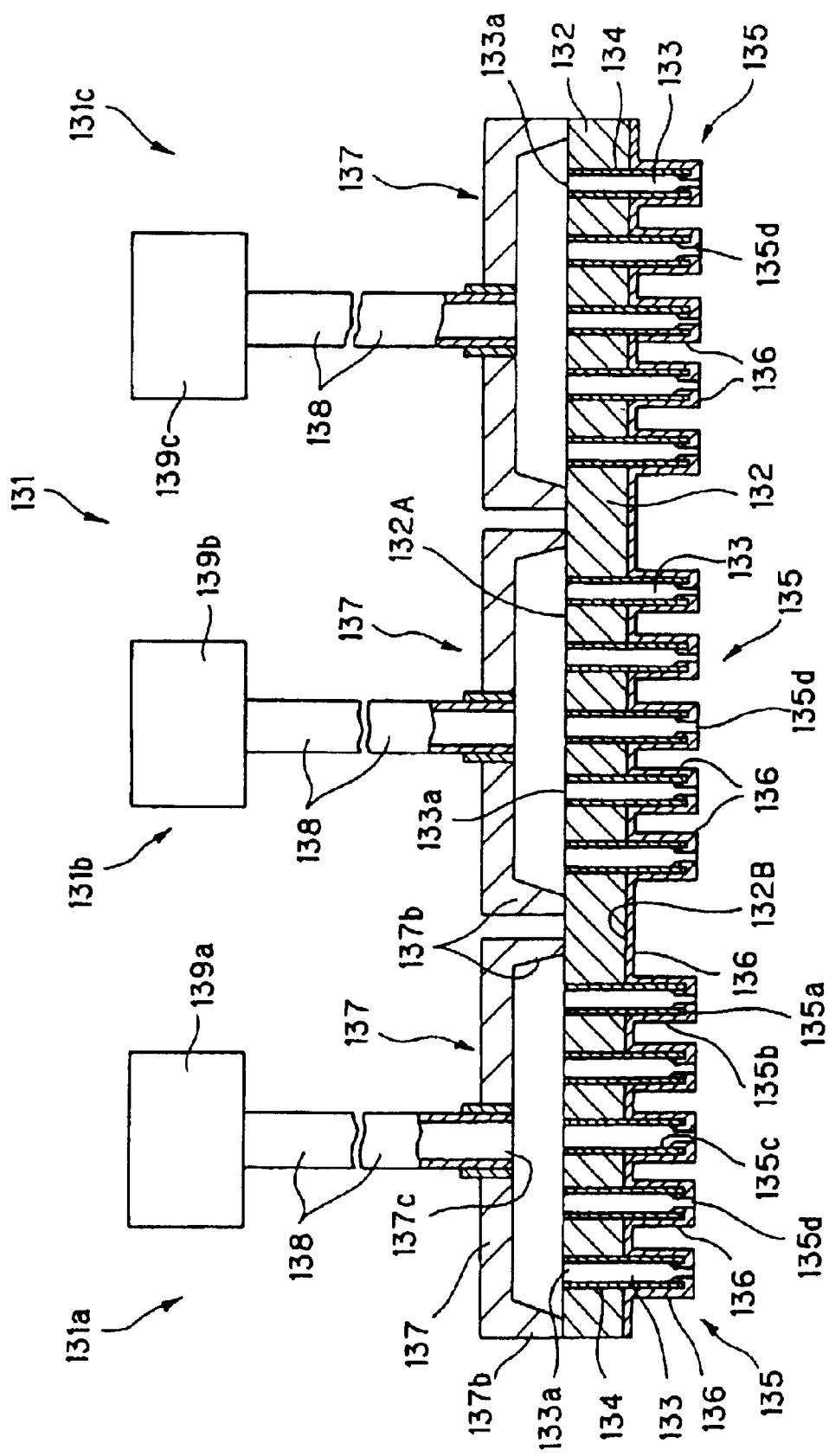
FIG. 30 is a schematic cross-sectional view showing a further embodiment of the apparatus for fine pattern formation according to the present invention.
Figure 31:
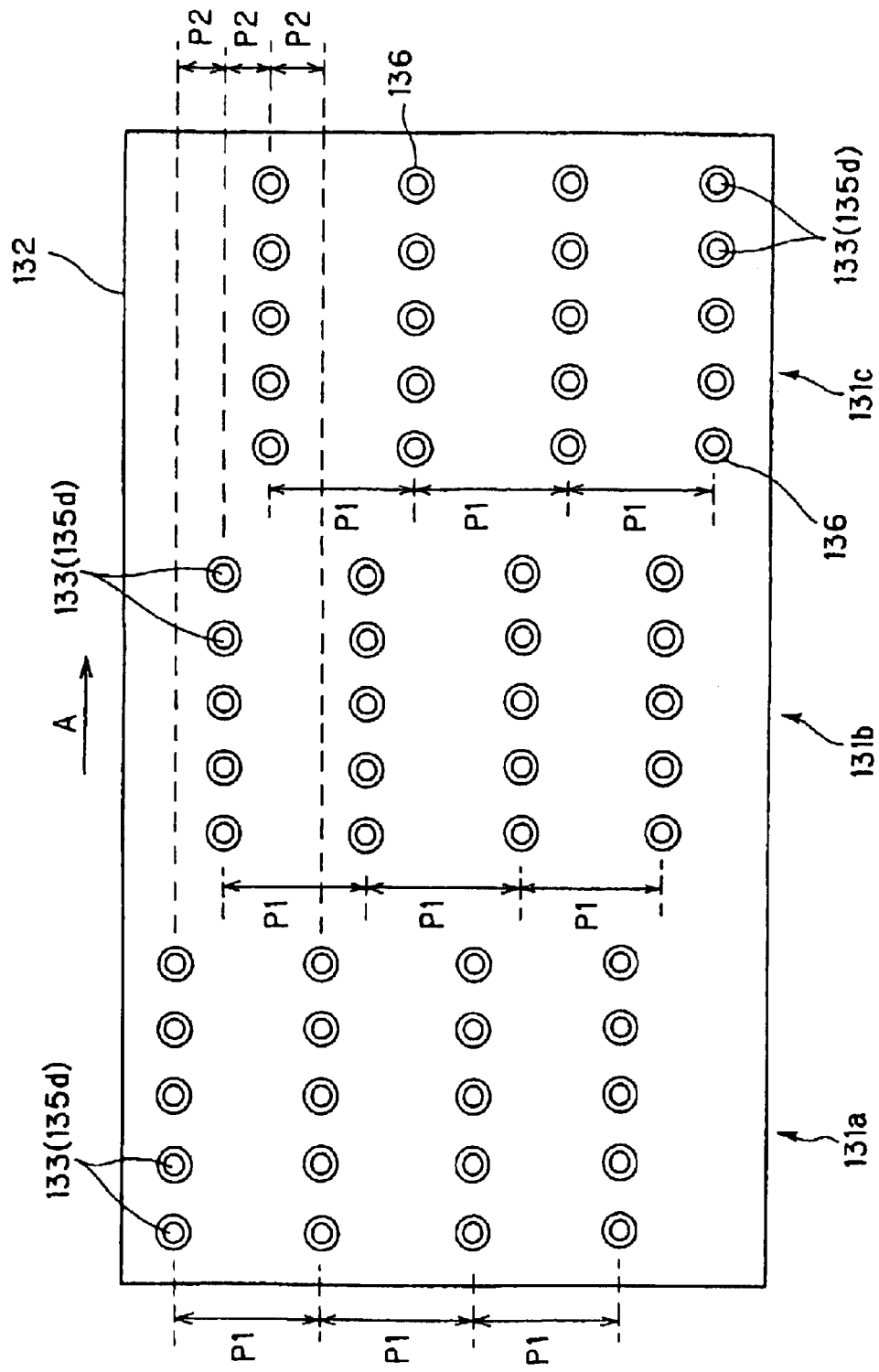
FIG. 31 is a bottom view of the apparatus for fine pattern formation shown in FIG. 5.

FIG. 30 is a schematic cross-sectional view showing another embodiment of the apparatus for fine pattern formation according to the present invention, and FIG. 31 is a bottom view of an apparatus for fine pattern formation shown in FIG. 30. In FIGS. 30 and 31, the apparatus 131 for fine pattern formation comprises: three continuous apparatus units 131a, 131b, 131c, that is, comprises a common silicon substrate 132; a plurality of fine nozzles 135 protruded from the back surface 132B of the silicon substrate 132; a reinforcing layer 136 which covers at least the front end face 135a and outer face 135b of the fine nozzles 135 and is further provided on the back surface 132B of the silicon substrate 132; three support members 137 provide on the surface 132A side of the silicon substrate 132; three ink passages 138 for supplying ink to spaces between the silicon substrate 132 and each of the support members 137; and ink supplying devices 139a, 139b, 139c connected to these respective ink passages 138.

For each of the apparatus units 131a, 131b, 131c, the silicon substrate 132 has a plurality of fine holes 133 extending through the silicon substrate 132 from the surface 132A side of the silicon substrate 132 to the back surface 132B side of the silicon substrate 132, and the openings 133a on the surface 132A side of the fine holes 133 are exposed to the spaces defined by the silicon substrate 132 and the support members 137. The silicon substrate 132 may be formed of the same material as the above-described silicon substrate 102, and the thickness of the silicon substrate 132 also may be set in the same range as in the silicon substrate 102.

For each of the apparatus units 131a, 131b, 131c, the fine holes 133 are provided in a pattern such that a plurality of fine holes are arranged along a predetermined direction (in a direction indicated by an arrow A in FIG. 31) on an identical line. Openings 135d in the fine nozzles 135, which will be described later, are also arranged in the same manner as adopted in the fine holes 133. Specifically, in the apparatus unit 131a, a plurality of lines of fine holes 133 arranged along the direction indicated by the arrow A are provided at pitch P1. Likewise, also in the apparatus unit 131b, the apparatus unit 131c, a plurality of lines of fine holes 133 are provided at pitch P1. The lines of the fine holes 133 in the apparatus unit 131a, the lines of the fine holes 133 in the apparatus unit 131b, and the lines of the fine holes 133 in the apparatus unit 131c are deviated from one another at pitch P2 (P1=3×P2). Therefore, in the whole apparatus 131 for fine pattern formation, lines of fine holes in the apparatus units 131a, 131b, 131c are repeatedly arranged at pitch P2. The transverse sectional form, the longitudinal sectional form, the opening diameter, and the pitch of the fine holes 133 may be properly set in the same manner as in the fine holes 133. The silicon oxide layer 134 provided on the wall surface of the fine holes 133 may also be the same as the silicon oxide layer 104. In the embodiment shown in the drawing, for example, the thickness of the silicon substrate 132, the opening diameter, the number, and the pitch of the fine holes 133 provided with the silicon oxide layer 134 have been simplified for facilitating the explanation of the construction of the apparatus.

The fine nozzles 135 have the same construction as the fine nozzles 105, are formed integrally with the silicon oxide layer 134 provided on the wall surface of the fine holes 133, and are in communication with the fine holes 133. In the fine nozzles 135, the thickness, the opening diameter, and the protrusion level may be set in the same respective ranges as those of the fine nozzles 105. The provision of such fine nozzles 135 can prevent ink, ejected from the fine holes 133, from being deposited on the back surface 132B side of the silicon substrate 132.

The reinforcing layer 136 has the same construction as the reinforcing layer 106 and functions to reinforce the fine nozzles 135 to improve the mechanical strength. Therefore, this reinforcing layer 136 also may be formed using a material such as silicon oxide or phosphorus silicon glass, for example, by plasma CVD, ion plating, or low pressure CVD. In the embodiment shown in the drawing, the reinforcing layer 136 covers the front end face 135a and outer face 135b of the fine nozzles 135, is further provided on a portion around the front end face of the inner face 135c and on the back surface 132B of the silicon substrate 132. The thickness of the reinforcing layer 136 may be the same as that of the reinforcing layer 106. Although the reinforcing layer 136 is also provided on the back surface 132B of the silicon substrate 132, in the apparatus for fine pattern formation according to the present invention, the reinforcing layer 136 may not be provided in this site.

The support member 137 is provided on the surface 132A side of the silicon substrate 132, for supporting the silicon substrate 132. In the embodiment shown in the drawing, as with the support member 107 described above, the support member 137 comprises: a base 137a, which, as with the silicon substrate 132, is flat; a flange portion 137b provided on the periphery of the base 137a; and an opening 137c provided at the center of the base 137a. The support member 137 is fixed to the surface 132A side of the silicon substrate 132 by the flange portion 137b. This can provide a space for supplying ink to a portion between the silicon substrate 132 and each of the support members 137. The fixation of the support member 137 to the silicon substrate 132 through heat-resistant glass (not shown) can improve the working efficiency of later steps in the production of the apparatus for fine pattern formation. As with the support member 107 described above, this support member 137 is preferably formed of a material having a coefficient of linear expansion in the range of one-tenth of the coefficient of linear expansion of the silicon substrate 132 to 10 times the coefficient of linear expansion of the silicon substrate 132.

The ink passages 138 are connected to the openings 137c of the respective support members 137, and the other ends of the ink passages 138 are connected respectively to ink supplying devices 139a, 139b, 139c. The ink supplying devices 139a, 139b, 139c may be properly selected from a continuous supply pump, a constant rate supply pump and the like according to applications of the apparatus 131 for fine pattern formation. In the embodiment shown in the drawing, only one ink passage 138 is provided in each support member 137. In this case, a construction may also be adopted wherein a plurality of openings 137c, the number of which is determined by taking into consideration, for example, the evenness of ink flow pressure, are provided in a single support member 137, and the ink passage 138 is connected to each opening 137c. The ink passage may be provided within the support member 137.

In this apparatus 131 for fine pattern formation according to the present invention, the fine nozzles 135 have high mechanical strength by virtue of the provision of the reinforcing layer 136 and thus are satisfactorily durable against external impact and ink supply pressure, and ink can be ejected through the plurality of fine nozzles 135 in a very small amount with high accuracy, and, at the same time, the deposition of ink onto the back surface of the silicon substrate 132 can be prevented. Different inks may be supplied respectively from the ink supplying devices 139a, 139b, 139c to directly write a pattern with a desired ink for each of the apparatus units 131a, 131b, 131c. Further, the amount of ink ejected may be set as desired by regulating the ink supplying devices 139a, 139b, 139c to vary the amount of ink supplied. Furthermore, in the apparatus 131 for fine pattern formation, since the apparatus units 131a, 131b, 131c are provided integrally with one another, there is no need to join a plurality of apparatuses to one another and, in addition, the positional accuracy of the apparatuses is very high.

Also in the apparatus 131 for fine pattern formation, as with the above embodiments, a water-repellent layer may be provided at least on the reinforcing layer 136 provided on the outer face 135b of the fine nozzles 135 and on the back surface 132B of the silicon substrate 132. As described above, the water-repellent layer maybe formed of, for example, fluorocarbon.

Also in the apparatus 131 for fine pattern formation, the openings 133a on the surface 132A side of the fine holes 133 may be in a tapered concave form or a multistaged concave form as described above. This can reduce the passage resistance of ink and can realize the ejection of a very small amount of a higher-viscosity ink through the plurality of fine nozzles 135 with high accuracy.

(Fifth Embodiment)

Figure 32A:
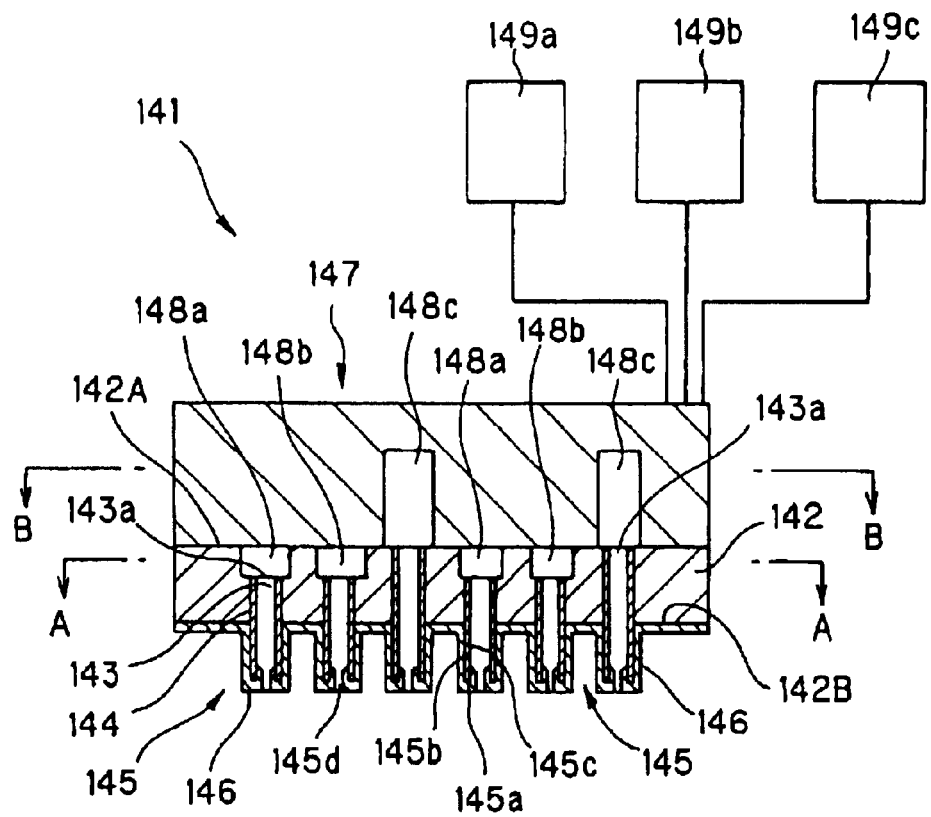
FIG. 32(A) is a schematic cross-sectional view and FIG. 32(B) a bottom view.
Figure 32B:
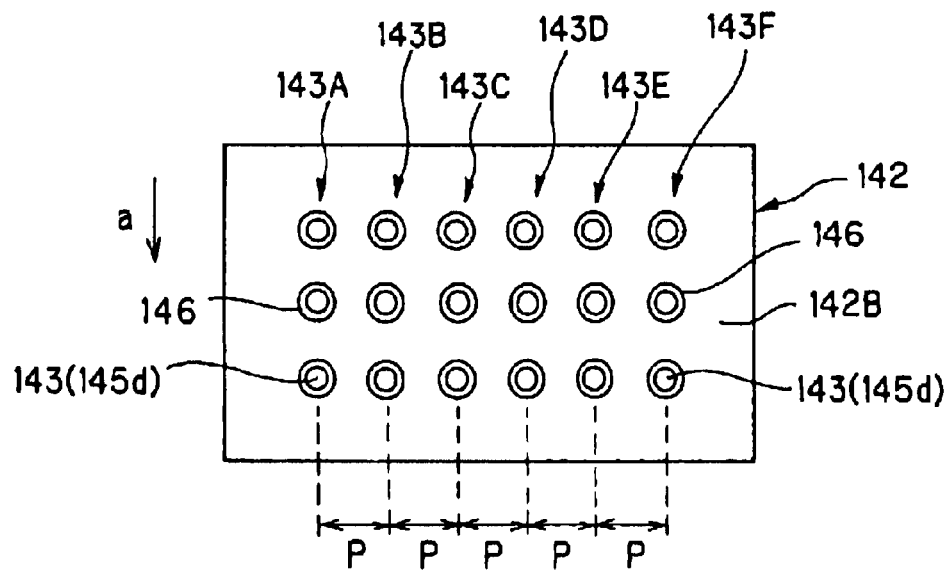

FIG. 32 is a diagram showing still another embodiment of the apparatus for fine pattern formation according to the present invention, wherein FIG. 32(A) is a schematic cross-sectional view and FIG. 32(B) a bottom view. In FIG. 32, an apparatus 141 for fine pattern formation comprises: a silicon substrate 142; a plurality of fine nozzles 145 protruded from the back surface 142B of the silicon substrate 142; a reinforcing layer 146 which covers at least the front end face 145a and outer face 145b of the fine nozzles 145 and is further provided on the back surface 142B of the silicon substrate 142; a support member 147 provided on the surface 142A side of the silicon substrate 142; three ink passages 148a, 148b, 148c provided within the silicon substrate 142 and within the support member 147; and ink supplying devices 149a, 149b, 149c connected respectively to the ink passages.

The silicon substrate 142 is provided with a plurality of fine holes 143 which extend through the silicon substrate 142 from the surface 142A side of the silicon substrate 142 to the back surface 142B side of the silicon substrate 142, and openings 143a on the surface 142A side of the fine holes 143 each are exposed within any one of the three ink passages 148a, 148b, 148c provided in a groove form on the surface 142A side. The silicon substrate 142 may be formed of the same material as the silicon substrate 102, and the thickness of the silicon substrate 142 may also be set in the same range as the silicon substrate 102.

A plurality of fine holes 143 (openings 145d in fine nozzles 145 described later) are arranged on an identical line along a predetermined direction (direction indicated by an arrow a in FIG. 32(B)). A plurality of these lines are provided at pitch P. In the embodiment shown in the drawing, six fine hole lines 143A, 143B, 143C, 143D, 143E, 143F, in each of which a plurality of fine holes are arranged along a direction indicated by the arrow a, are provided at pitch P. The transverse sectional form, the longitudinal sectional form, the opening diameter, and the pitch of the fine holes 143 may be properly set in the same manner as in the fine holes 103. The silicon oxide layer 144 provided on the wall surface of the fine holes 143 may also be the same as the silicon oxide layer 104. In the embodiment shown in the drawing, for example, the opening diameter, the number, and the pitch of the fine holes 143 provided with the silicon oxide layer 144 have been simplified for facilitating the explanation of the construction of the apparatus.

The fine nozzles 145 have the same construction as the fine nozzles 105, are formed integrally with the silicon oxide layer 144 provided on the wall surface of the fine holes 143, and are in communication with the fine holes 143. In the fine nozzles 145, the thickness, the opening diameter, and the protrusion level may be set in the same respective ranges as those of the fine nozzles 105. The provision of such fine nozzles 145 can prevent ink, ejected from the fine holes 143, from being deposited on the back surface 142B side of the silicon substrate 142.

The reinforcing layer 146 has the same construction as the reinforcing layer 106 and functions to reinforce the fine nozzles 145 to improve the mechanical strength. Therefore, this reinforcing layer 146 also may be formed of a material such as silicon oxide or phosphorus silicon glass. In the embodiment shown in the drawing, the reinforcing layer 146 covers the front end face 145a and outer face 145b of the fine nozzles 145, is further provided on a portion around the front end face of the inner face 145c. Further, the reinforcing layer 146 is provided on the back surface 142B of the silicon substrate 142. The thickness of the reinforcing layer 146 may be the same as that of the reinforcing layer 106. The reinforcing layer 146 may be formed, for example, by plasma CVD, ion plating, or low pressure CVD. Although the reinforcing layer 146 is also provided on the back surface 142B of the silicon substrate 142, in the apparatus for fine pattern formation according to the present invention, the reinforcing layer 146 may not be provided in this site.

The support member 147 is a plate member which is provided on the surface 142A side of the silicon substrate 142 to hold the silicon substrate 142, and ink passages 148c are provided in a groove form in the support member 147 on its silicon substrate 142 side.

Figure 33:
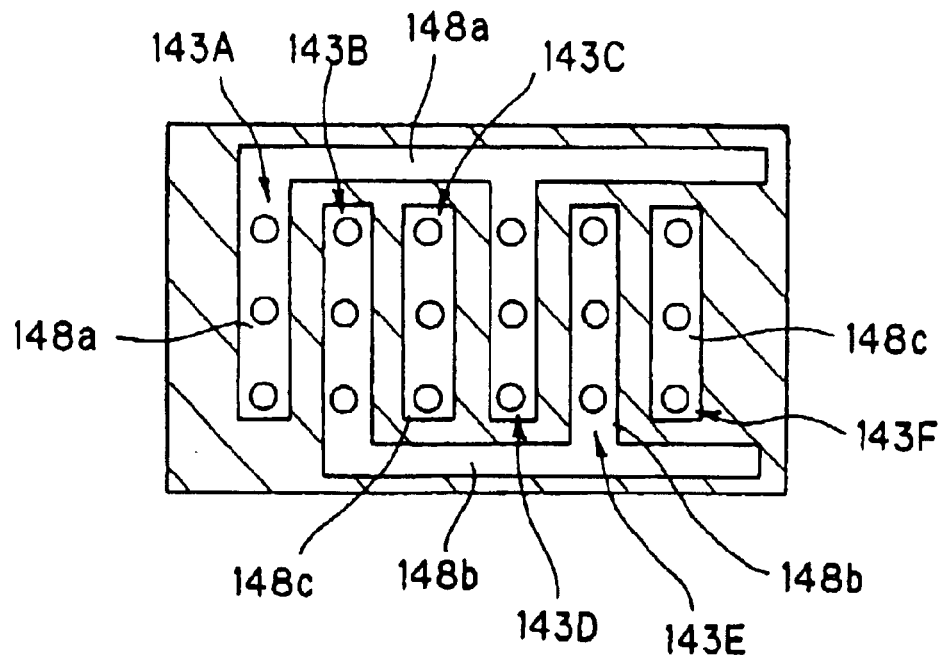
FIG. 33 is a transverse sectional view taken on line A—A of a support member in the apparatus for fine pattern formation shown in FIG. 32.
Figure 34:
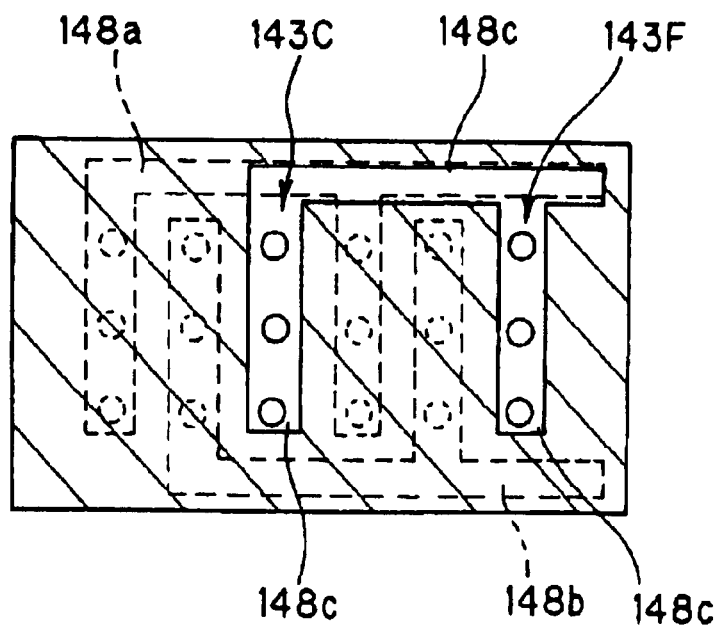
FIG. 34 is a transverse sectional view taken on line B—B of a support member in the apparatus for fine pattern formation shown in FIG. 32.

FIG. 33 is a transverse sectional view taken on line A—A of the silicon substrate 142 shown in FIG. 32(A), and FIG. 34 a transverse sectional view taken on line B—B of the support member 147 shown in FIG. 32(A).

As shown in FIG. 32(A) and FIG. 33, in the silicon substrate 142, an ink passage 148a in a groove form is provided so as to connect each of openings in fine hole lines 143A, 143D to the ink supplying device 149a, and an ink passage 148b in a groove form is provided so as to connect each of the openings in fine hole lines 143B, 143E to the ink supplying device 149b. Further, an ink passage 148c in a groove form is provided on each of the openings in fine hole lines 143C, 143F. Further, as shown in FIG. 32(A) and FIG. 34, in the support member 147, the ink passage 148c in a groove form is provided so as to connect each of the openings in the fine hole lines 143C, 143F to the ink supplying device 149c.

Figure 35:
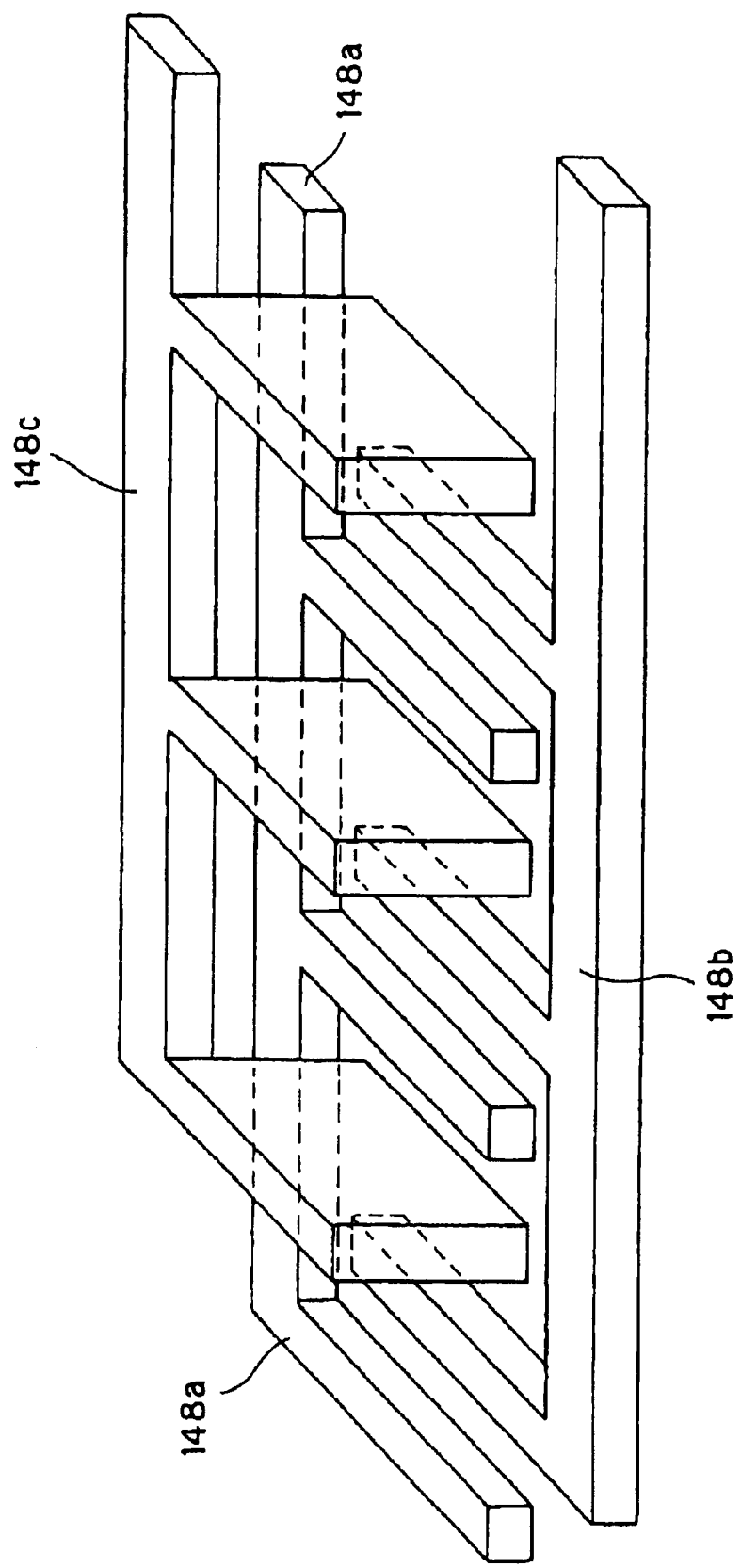
FIG. 35 is a perspective view showing ink passages in the apparatus for fine pattern formation shown in FIG. 32.

As shown in FIG. 35, three ink passages 148a, 148b, 148c provided between the support member 147 and the silicon substrate 142 are independent of one another. As with the support member 107, the support member 147 is preferably formed of a material having a coefficient of linear expansion in the range of one-tenth of the coefficient of linear expansion of the silicon substrate 142 to 10 times the coefficient of linear expansion of the silicon substrate 142.

The ends of the ink passages 148a, 148b, 148c are connected respectively to the ink supplying devices 149a, 149b, 149c. The ink supplying devices 149a, 149b, 149c are not particularly limited, and any of a continuous supply pump, a constant rate supply pump and the like may be used as the ink supplying device and may be properly selected according to the application of the apparatus 141 for fine pattern formation.

In the above-described apparatus 141 for fine pattern formation according to the present invention, a plurality of fine nozzles 145, which have improved mechanical strength by virtue of the provision of the reinforcing layer 146 and thus are satisfactorily durable against external impact and ink supply pressure, are provided on the back surface of the silicon substrate 142, and ink can be ejected in a very small amount through these fine nozzles 145 with high accuracy. At the same time, the deposition of ink onto the back surface of the silicon substrate 142 can be prevented. The supply of different inks respectively from the ink supplying devices 149a, 149b, 149c permits a pattern to be formed by direct writing with a desired ink for each fine hole line grouped according to the ink passages 148a, 148b, 148c (a group consisting of fine hole lines 143A and 143D, a group consisting of fine hole lines 143B and 143E, and a group consisting of fine hole lines 143C and 143F), and is particularly advantageous for the formation of a stripe pattern which will be described later. Further, since the apparatus 141 for fine pattern formation does not comprise a plurality of mutually connected apparatus units for respective inks, the positional accuracy of each fine hole line is very high.

Further, the amount of ink ejected can be set as desired by regulating the ink supplying devices 149a, 149b, 149c to vary the amount of ink supplied.

Also in the apparatus 141 for fine pattern formation, as with the above embodiments, a water-repellent layer may be provided at least on the reinforcing layer 146 provided on the outer face 145b of the fine nozzles 145 and on the back surface 142B of the silicon substrate 142. As described above, the water-repellent layer may be formed of, for example, fluorocarbon.

Also in the apparatus 141 for fine pattern formation, the openings 143a on the surface 142A side of the fine holes 143 may be in a tapered concave form or a multistaged concave form as described above. This can reduce the passage resistance of ink and can realize the ejection of a very small amount of a higher-viscosity ink through the plurality of fine nozzles 145 with high accuracy.

(Sixth Embodiment)

FIG. 36 is a plan view showing a further embodiment of the apparatus for fine pattern formation according to the present invention. In FIG. 36, an apparatus 151 for fine pattern formation comprises: a silicon substrate 152; a plurality of fine nozzles protruded from the back surface of the silicon substrate 152; a reinforcing layer which covers at least the front end face and outer face of the fine nozzles and is further provided on the back surface of the silicon substrate 152; an ink passage for supplying ink to a space between the silicon substrate 152 and the support member; and an ink supplying device connected to the ink passage. In FIG. 36, however, only the silicon substrate 152 is shown, and the fine nozzles, the reinforcing layer, the support member, the ink passage, and the ink supplying device are not shown.

The silicon substrate 152 has a plurality of fine holes 153 which extend through the silicon substrate 152 from the surface 152A side of the silicon substrate 152 to the back surface side of the silicon substrate 152. The fine holes 153 are provided at positions such that the fine holes 153 constitute one pattern P, and a plurality of patterns P (10 patterns in the embodiment shown in the drawing) are provided on the silicon substrate 152. In the drawing, the fine holes 153 are shown in only one pattern P, and, for the other patterns P, only the outline is indicated by a chain line.

The silicon substrate 152 may be formed of the same material as used in the silicon substrate 102, and the thickness of the silicon substrate 152 also may be set in the same range as in the silicon substrate 102. The transverse sectional form, the longitudinal sectional form, the opening diameter, and the pitch of the fine holes 153 may be properly set in the same manner as in the fine holes 103. The fine holes 153 have a silicon oxide layer on their wall surface, and this silicon oxide layer also may be the same as the silicon oxide layer 104.

A plurality of fine nozzles are protruded on the back surface side of the silicon substrate 152 so as to communicate with the fine holes 153. The fine nozzles may be the same as the fine nozzles 105.

The reinforcing layer may be formed so as to cover at least the front end face and outer face of the fine nozzles and may be further provided on the back surface of the silicon substrate 152. This reinforcing layer has the same construction as the reinforcing layer 106 and functions to reinforce the fine nozzles and to improve the mechanical strength. Therefore, this reinforcing layer also may be formed of, for example, a material such as silicon oxide or phosphorus silicon glass. The thickness of the reinforcing layer may be the same as that of the reinforcing layer 106. The reinforcing layer may be formed, for example, by plasma CVD, ion plating, or low pressure CVD.

Further, in the silicon substrate 152, a support member having, on its periphery, a flange portion as described above in connection with the support member 107 may be provided, and the flange portion in the support member may be fixed to the peripheral portion (a shaded region in FIG. 36). The ink supply passage may be connected to the opening of the support member, and the ink supplying device may be connected to the other end of the ink supply passage.

In the above apparatus 151 for fine pattern formation, the fine nozzles have high mechanical strength by virtue of the provision of the reinforcing layer thereon and thus are satisfactorily durable against external impact and ink supply pressure, and ink can be ejected in a very small amount with high accuracy through the fine holes 153 (fine nozzles) of the silicon substrate 152. A pattern in a form corresponding to the pattern P can be stably formed on a pattern object with high accuracy by ejecting ink from the fine nozzles in the silicon substrate 152 in a suitable amount such that inks ejected from mutually adjacent fine nozzles come into contact with each other on the pattern object, to directly write a pattern. The amount of the ink ejected can be regulated by controlling the ink supplying device.

Also in the above embodiment, all the plurality of patterns P are in an identical form. However, the present invention is not limited to this only. For example, the pattern may be in a desired form, such as a conductor pattern for a printed wiring board.

In the apparatus 151 for fine pattern formation, as with the above embodiments, a water-repellent layer may be provided at least on the reinforcing layer provided on the outer face of the fine nozzles and on the back surface of the silicon substrate 152.

Also in the apparatus 151 for fine pattern formation, the openings of the fine holes 153 on the surface side of the silicon substrate may be in a tapered concave form or a multistaged concave form as described in the above embodiments. This can reduce the passage resistance of ink and can realize the ejection of a very small amount of a higher-viscosity ink through the plurality of fine nozzles with high accuracy.

The above-described apparatus for fine pattern formation according to the present invention can be applied, for example, to the formation of a black matrix pattern or a color pattern for liquid crystal displays, the formation of a phosphor layer for plasma displays, and the formation of a pattern in electroluminescence, as well as to conductor pattern formation for printed wiring boards.

II-2 Embodiments of Production of Apparatus for Fine Pattern Formation

Next, an embodiment of the production of the apparatus for fine pattern formation according to the present invention will be described by taking the apparatus 101 for fine pattern formation shown in FIG. 26 as an example with reference to FIGS. 37 and 38.

At the outset, a silicon substrate 102 having a cleaned surface is oxidized in a thermal oxidation furnace to form an about 1 to 2 $\mu$m-thick silicon oxide film 102' on the whole area of the silicon substrate 102 (FIG. 37(A)). The silicon oxide film 102' may be formed by wet oxidation.

Next, a photosensitive resist is coated on one surface of the silicon substrate 102, and exposure through a predetermined photomask and development are carried out to form a resist pattern R (FIG. 37(B)). Next, the silicon oxide film 102' is patterned, for example, with BHF 16 (a 22% aqueous ammonium monohydrodifluoride solution) using this resist pattern R as a mask (FIG. 37(C)). This patterning may also be carried out by dry etching using RIE (reactive ion etching) (process gas: $CHF_3$). In this patterning, the silicon oxide film 102' in its site, on which the resist pattern R has not been provided, is removed.

Figure 37:
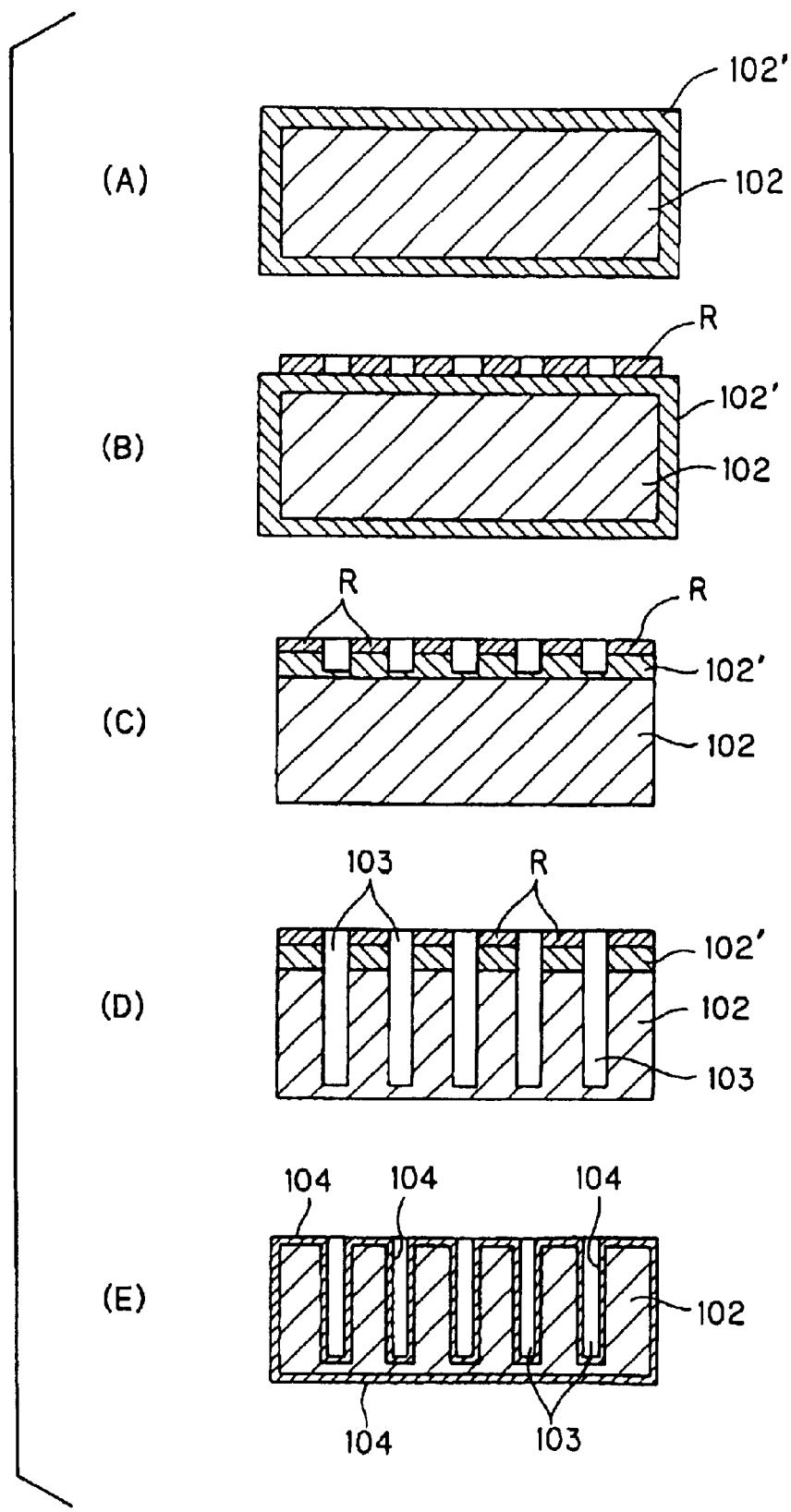
FIG. 37 is a process diagram illustrating one embodiment of the production of the apparatus for fine pattern formation according to the present invention.

Next, fine holes 103 are formed in the silicon substrate 102 to a desired depth using the patterned silicon oxide film 102' as a mask (FIG. 37 (D)). The fine holes 103 may be formed, for example, by high aspect etching such as ICP-RIE (inductively coupled plasma-reactive ion etching), wet etching, or deep RIE etching. The fine holes 103 are formed to a predetermined depth such that the holes do not yet completely pass through the silicon substrate 102.

Next, the resist pattern R and the silicon oxide film 102' are removed, and oxidation is again carried out in a thermal oxidation furnace to form an about 5000 to 10000 angstrom-thick silicon oxide layer 104 on the whole area of the silicon substrate 102 (FIG. 37(E)).

Next, the support member 7 in its flange portion 107b is fixed onto the peripheral portion on the surface side (on the fine hole formed side) of the silicon substrate 102 (FIG. 38(A)). This fixation may be carried out, for example, by anodic bonding or epoxy adhesive. Prior to the fixation of the support member 107, only the surface 102A of the silicon substrate 102 may be immersed in BHF 16 to remove the silicon oxide layer 104. In this case, what is important is to avoid the removal of the silicon oxide layer 104 within the fine holes 103.

Next, only the outer surface side of the silicon substrate 102 is immersed in BHF 16 to remove the silicon oxide layer 104 in this site and thus to expose the back surface of the silicon substrate 102. Thereafter, etching is carried out with TMAH (tetramethylammonium hydroxide) from the back surface side of the silicon substrate 102 (FIG. 38 (B)). In this etching, since the silicon oxide layer 104 provided on the inner wall of the fine holes 103 is resistant to TMAH, fine tubes formed of the silicon oxide layer 104 are protruded on the silicon substrate 102 side.

Next, the front end of the fine tubes formed of the silicon oxide layer 104 is dissolved and removed with BHF 16 to form openings. Thereafter, the back surface side of the silicon substrate 102 is again etched with TMAH. When fine nozzles 105 formed of the silicon oxide layer 104 having a predetermined length have been formed, etching with TMAH is completed (FIG. 38(C)).

Next, at least the front end face 105a and outer face 105b of the fine nozzles 105 are covered with a reinforcing layer 106, and the reinforcing layer 106 is further formed on the back surface 102B of the silicon substrate 102 (FIG. 38(D)). The reinforcing layer 106 may be formed, for example, by plasma CVD, ion plating, or low pressure CVD. In particular, the plasma CVD can realize a high sneak level and thus is advantageous in the formation of the reinforcing layer 106 on the inner face 105c of the fine nozzles 105. An ink supplying device is then connected to the opening 107c of the support member 107 through the ink passage. Thus, the apparatus 101 for fine pattern formation according to the present invention as shown in FIG. 26 can be prepared.

Besides etching with TMAH, dry process by RIE (reactive ion etching) may also be used for the etching of the back surface side of the silicon substrate 102.

Further, in the above embodiment, a silicon oxide film 102' is formed. Instead of the silicon oxide film, a thin film of aluminum may be formed by sputtering or the like for the preparation of the apparatus for fine pattern formation. In this case, in the above step of patterning (FIG. 37(C)), an aluminum etchant (mixed acid aluminum) may be used.

Figure 40:
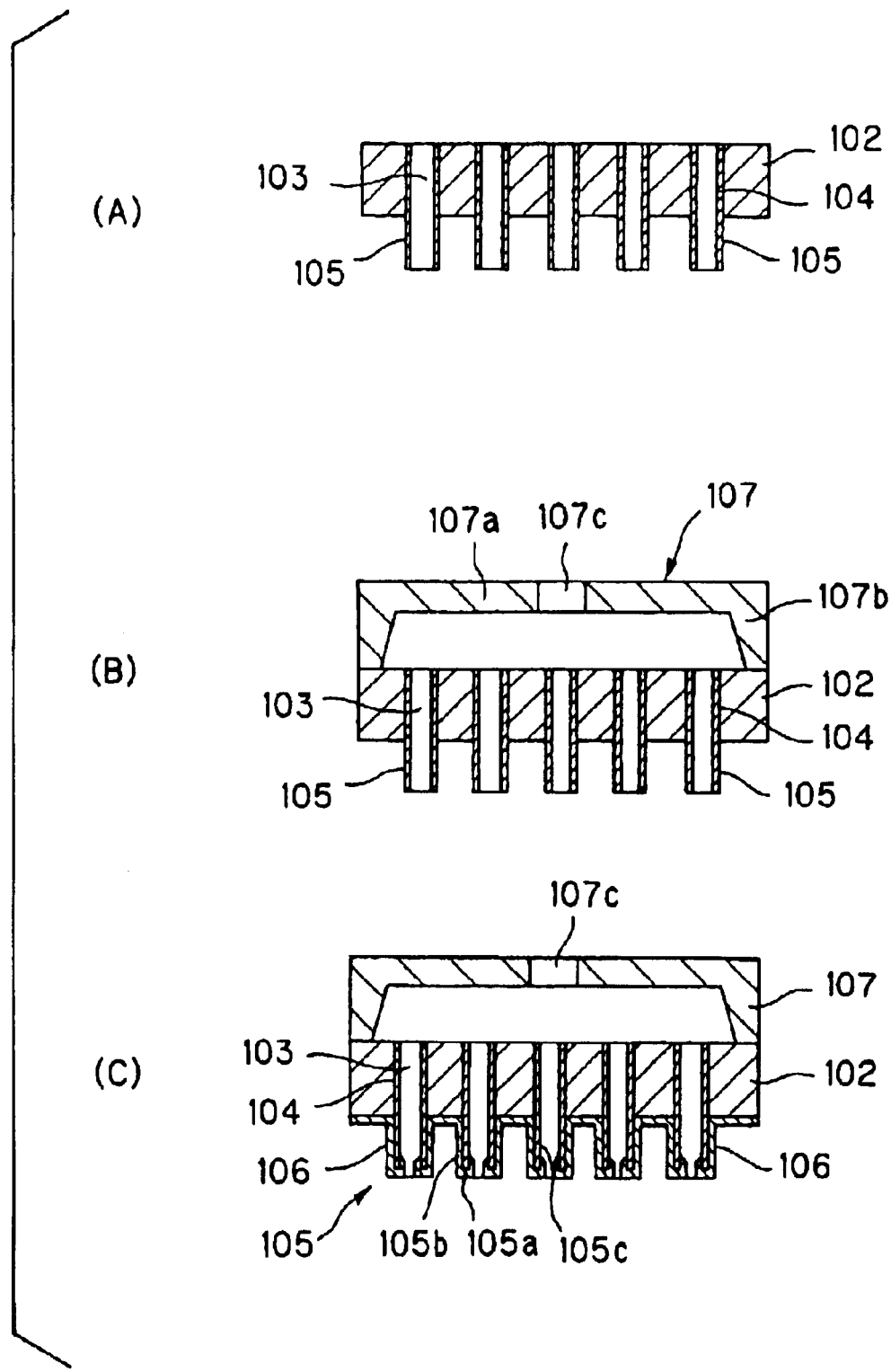
FIG. 40 is a process diagram illustrating still another embodiment of the production of the apparatus for fine pattern formation according to the present invention.

Another embodiment of the production of the apparatus for fine pattern formation according to the present invention will be described by taking the apparatus 101 for fine pattern formation shown in FIG. 26 as an example with reference to FIGS. 39 and 40.

An about 200 to 3000 angstrom-thick silicon nitride ($Si_3N_4$) layer 102' is first formed on the whole area of the silicon substrate 102 having a cleaned surface (FIG. 39(A)). The formation of the silicon nitride layer 102' may be carried out, for example, by low pressure CVD.

Next, a mask thin film is formed on the silicon nitride layer 102' in its portion located on one surface of the silicon substrate 102. A photosensitive resist is coated on the mask thin film, and exposure through a predetermined photomask and development are carried out to form a resist pattern. Subsequently, the mask thin film is etched using the resist pattern as a mask. Thereafter, the resist pattern is removed to form a mask pattern 102" having fine openings (FIG. 39 (B)). The diameter of openings in fine holes 103 and fine nozzles 105 is determined by the size of the fine openings in the mask pattern 102". In general, the size of the fine openings is preferably set in the range of 1 to 100 μm. Metallic thin films usable herein include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching.

Next, through fine holes 103 are formed in the silicon substrate 102 by deep etching using the mask pattern 102" as a mask (FIG. 39(C)). The formation of the through fine holes 103 may be carried out, for example, by a high aspect etching technique, such as dry etching or deep etching, for example, by ICP-RIE (inductively coupled plasma-reactive ion etching). According to this method, since there is no need to regulate the depth of the fine holes 103, the process is simple. In particular, dry etching by ICP-RIE can significantly shorten the time necessary for the formation of the through fine holes 103.

Next, the mask pattern 102" is removed, and oxidation is carried out in a thermal oxidation furnace to form an about 5000 to 10000 angstrom-thick silicon oxide layer 104 on the wall surface of the through fine holes 103 (FIG. 39(D)).

Next, the silicon nitride layer 102' is removed, and dry etching is then carried out from one surface of the silicon substrate 102. In this dry etching, a part of the silicon substrate 102 is etched to expose the silicon oxide layer 104 formed on the inner wall of the through fine holes 103. When this silicon oxide layer 104 has been exposed by a desired length, the dry etching is stopped to prepare fine nozzles 105 formed of silicon oxide protruded on the etching side of the silicon substrate 102 (FIG. 40(A)).

The dry etching is preferably carried out by ICP-RIE (inductively coupled plasma-reactive ion etching). However, the dry etching method is not limited to ICP-RIE only.

In the dry etching, preferably, the surface of the silicon substrate 102, on which the mask pattern 102" has been formerly formed, is selectively etched. The reason for this is as follows. Although the deep etching is likely to cause some variation in shape of the etching end (lower side in the drawing), the accuracy of etching of the silicon substrate 102 on its surface side, where the mask pattern 102" has been formed, is very high. When this site is used as the front end side of the fine nozzles 105, a plurality of fine nozzles 105 having an even opening diameter can be more easily prepared.

Next, the support member 107 in its flange portion 107b is fixed onto the peripheral portion on the surface side (on the fine hole formed side) of the silicon substrate 102 (FIG. 40(B)). This fixation may be carried out, for example, by anodic bonding or epoxy adhesive.

Next, at least the front end face 105a and outer face 105b of the fine nozzles 105 are covered with a reinforcing layer 106, and the reinforcing layer 106 is further formed on the back surface 102B of the silicon substrate 102 (FIG. 40(C)). The reinforcing layer 106 maybe formed, for example, by plasma CVD, ion plating, or low pressure CVD. These film formation methods can realize a high sneak level and thus are advantageous in the formation of the reinforcing layer 106 on the inner face 105c of the fine nozzles 105. Thereafter, an ink supplying device is connected to the opening 107c of the support member 107 through the ink passage. Thus, the apparatus 101 for fine pattern formation according to the present invention as shown in FIG. 26 can be prepared.

Figure 41:
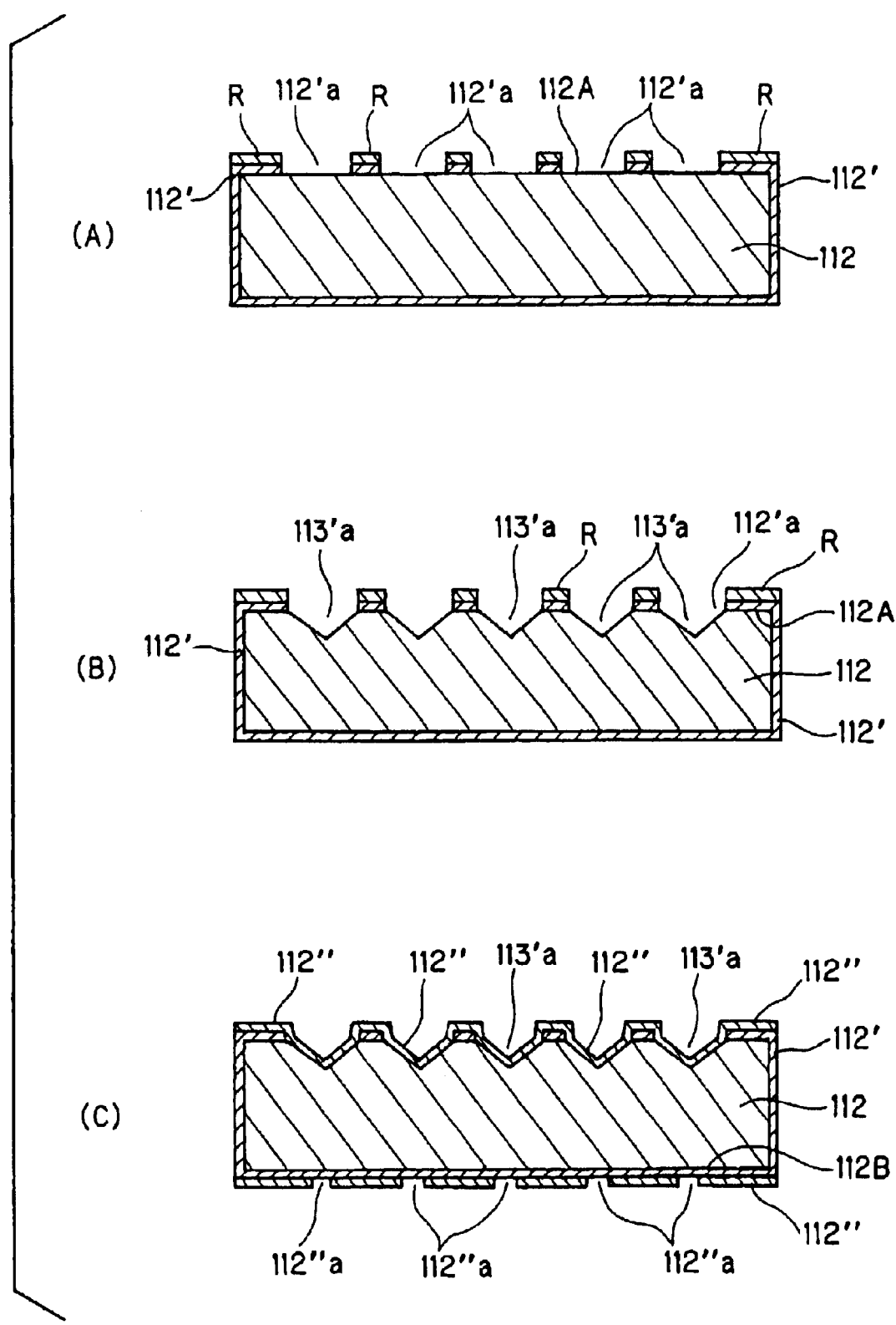
FIG. 41 is a process diagram illustrating a further embodiment of the production of the apparatus for fine pattern formation according to the present invention.
Figure 42:
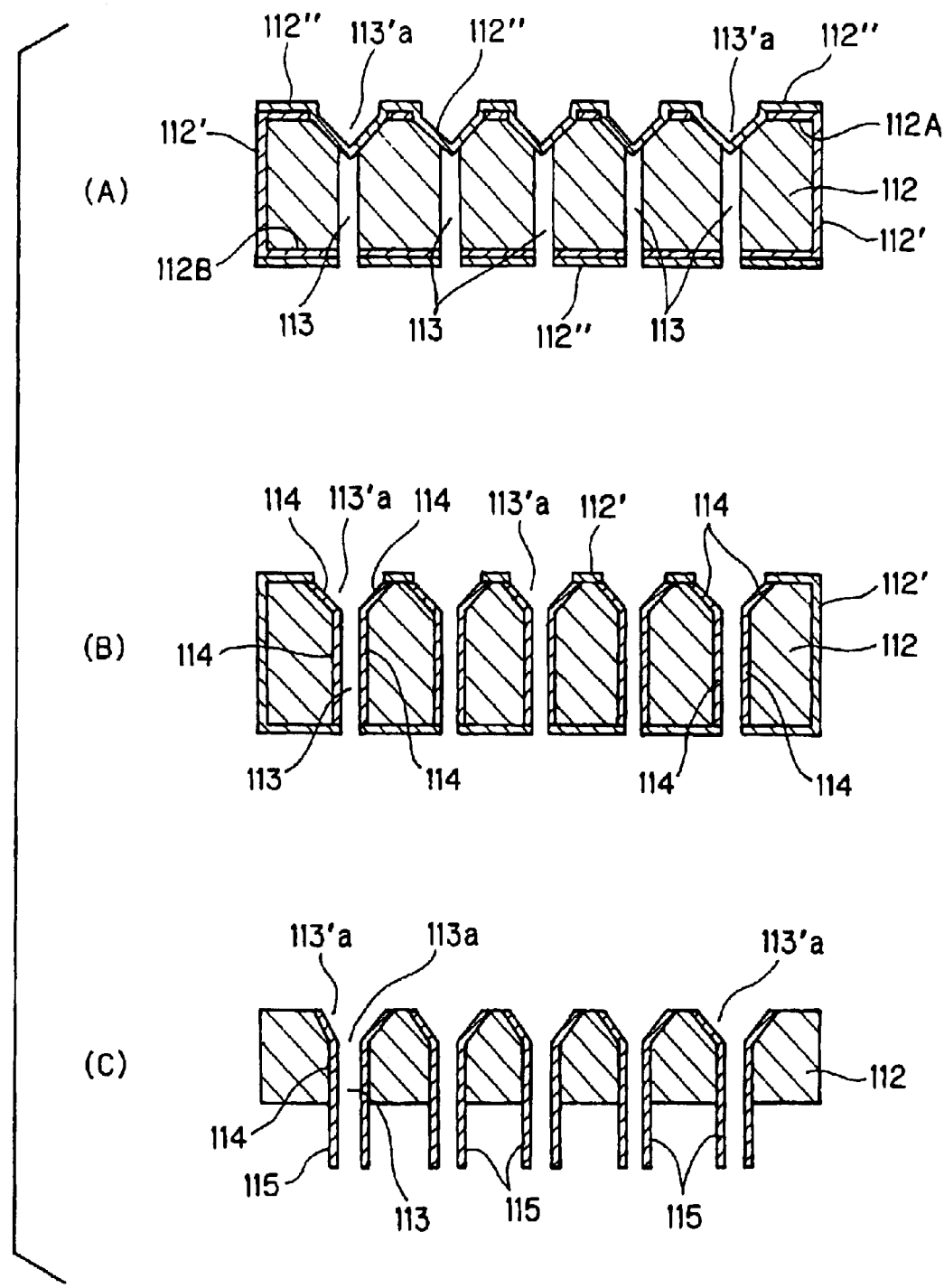
FIG. 42 is a process diagram illustrating a still further embodiment of the production of the apparatus for fine pattern formation according to the present invention.
Figure 43:
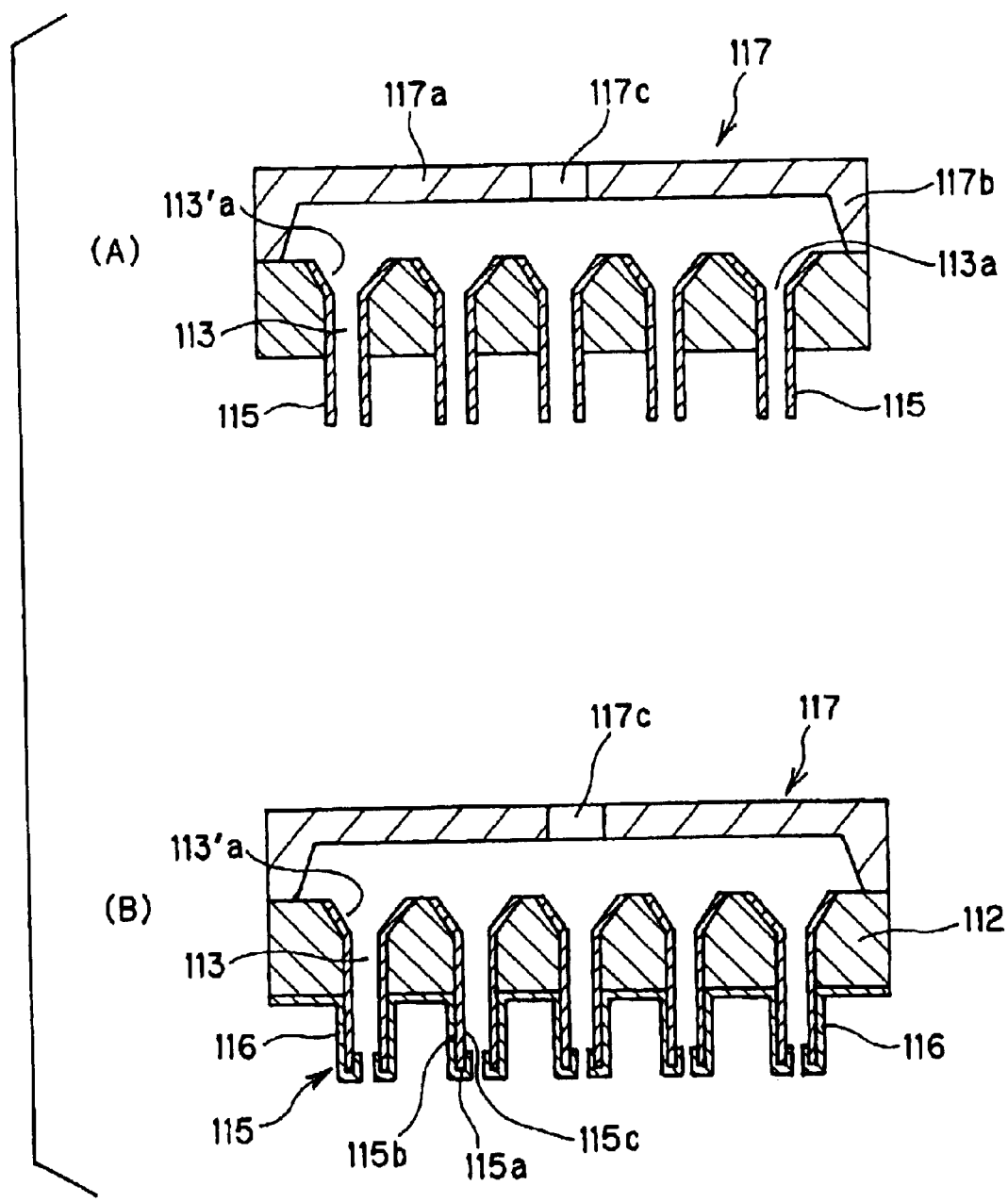
FIG. 43 is a process diagram illustrating another embodiment of the production of the apparatus for fine pattern formation according to the present invention.

Another embodiment of the production of the apparatus for fine pattern formation according to the present invention will be described by taking the apparatus 111 for fine pattern formation shown in FIG. 28 as an example with reference to FIGS. 41 to 43.

At the outset, the surface of a silicon substrate 112 having <100> crystallographic orientation is cleaned, and an about 200 to 3000 angstrom-thick silicon nitride ($Si_3N_4$) layer 112' is formed on the whole area of the silicon substrate 112.

A photosensitive resist is then coated on the silicon nitride layer 112' in its portion located on the surface 112A side of the silicon substrate 112, and exposure through a predetermined photomask and development are carried out to form a resist pattern R. Subsequently, the silicon nitride layer 112' is etched by RIE (reactive ion etching (process gas: $CF_4$ or $SF_6$)) using the resist pattern R as a mask to form a pattern having openings 112'a for taper (FIG. 41(A)). The silicon nitride layer 112' may be formed, for example, by low pressure CVD. The depth, opening diameter, and shape of tapered concaves 113'a, which will be described later, are determined by the size and shape of the openings 112'a for taper in the silicon nitride layer 112'. In general, the size of the opening for taper is preferably set in the range of 10 to 200 μm. The shape of the opening for taper may be properly selected from square, circle and the like.

Next, the silicon substrate 112 is subjected to crystallographically anisotropic etching with an aqueous potassium hydroxide solution using the silicon nitride layer 112' as a mask. In this etching, the silicon substrate 112 in its portions exposed to the openings 112' for taper is etched in the direction of depth so that <111> crystallographic orientation appears. This etching is preferably carried out, for example, until the apex of inverted quadrangular pyramid tapered openings is closed (i.e., until inverted quadrangular pyramid concaves are completely formed). As a result, tapered concaves 113'a are formed on the surface 112A side of the silicon substrate 112 (FIG. 41(B)).

Next, the resist pattern R is removed, and a mask thin film 112" is formed on the surface 112A side and the back surface 112B side of the silicon substrate 112. The mask thin film 112" on the back surface 112B side of the silicon substrate 112 remote from the tapered concaves 113'a is then patterned to form fine openings 112"a (FIG. 41(C)). This fine opening 112"a is formed so that the center of the opening substantially conforms to the center (apex) of the tapered concave 113'a through the silicon substrate 112. The diameter of openings in fine holes 113 and fine nozzles 115, which will be described later, is determined by the size of the fine openings 112"a. In general, the size of the fine openings 112"a is preferably set in the range of 1 to 100 μm. Metallic thin films usable herein include thin films of aluminum, nickel and chromium. The metallic thin film is preferably formed to a thickness of about 1000 to 2000 angstroms, for example, by sputtering or vacuum vapor deposition. For example, when aluminum is used as the metallic thin film, an aluminum etchant (mixed acid aluminum) may be used in the etching.

Next, through fine holes 113 are formed in the silicon substrate 112 by deep etching using the mask thin film 112" as a mask from the back surface 112B side of the silicon substrate 112 (FIG. 42(A)). The formation of the through fine holes 113 may be carried out, for example, by a high aspect etching technique, such as dry etching or deep etching, for example, by an ICP-RIE (inductively coupled plasma-reactive ion etching). In this deep etching, as soon as the through fine holes 113 extended to the interior of the tapered concaves 113'a, the mask thin film 112" (mask thin film 112" within the tapered concaves 113'a) formed on the surface 112A side of the silicon substrate 112 functions as a stopping layer. This can eliminate the need to control the depth of the fine holes 113 formed and can render the process simple. Further, in particular, dry etching by ICP-RIE can significantly shorten the time necessary for the formation of the through fine holes 113.

Next, the mask thin film 112" is removed, and oxidation is carried out in a thermal oxidation furnace to form an about 5000 to 10000 angstrom-thick silicon oxide layer 114 on the wall surface of the through fine holes 113 and on the wall surface of the tapered concaves 113'a (FIG. 42(B)).

Next, the silicon nitride layer 112' is removed, and dry etching is carried out from the back surface 112B side of the silicon substrate 112 remote from the tapered concaves 113'a. In this dry etching, a part of the silicon substrate 112 is etched to expose the silicon oxide layer 114 formed on the inner wall of the through fine holes 113. When this silicon oxide layer 114 has been exposed by a desired length, the dry etching is stopped to prepare fine nozzles 115 formed of silicon oxide protruded on the etching side of the silicon substrate 112 (FIG. 42(C)).

Although the Bosch process utilizing an ICP-RIE device has been used in the above high aspect etching, the etching method is not limited to this only.

Next, the support member 117 in its flange portion 117b is fixed onto the peripheral portion on the surface side (on the tapered concave formed side) of the silicon substrate 112 (FIG. 43(A)). This fixation may be carried out, for example, by anodic bonding or epoxy adhesive.

Next, at least the front end face 115a and outer face 115b of the fine nozzles 115 are covered with a reinforcing layer 116, and the reinforcing layer 116 is further formed on the back surface 112B of the silicon substrate 112 (FIG. 43(B)). The reinforcing layer 116 may be formed, for example, by plasma CVD, ion plating, or low pressure CVD. These film formation methods can realize a high sneak level and thus are advantageous in the formation of the reinforcing layer 116 on the inner face 115c of the fine nozzles 115. Thereafter, an ink supplying device is connected to the opening 117c of the support member 117 through the ink passage. Thus, the apparatus 111 for fine pattern formation according to the present invention as shown in FIG. 28 can be prepared.

Figure 44:
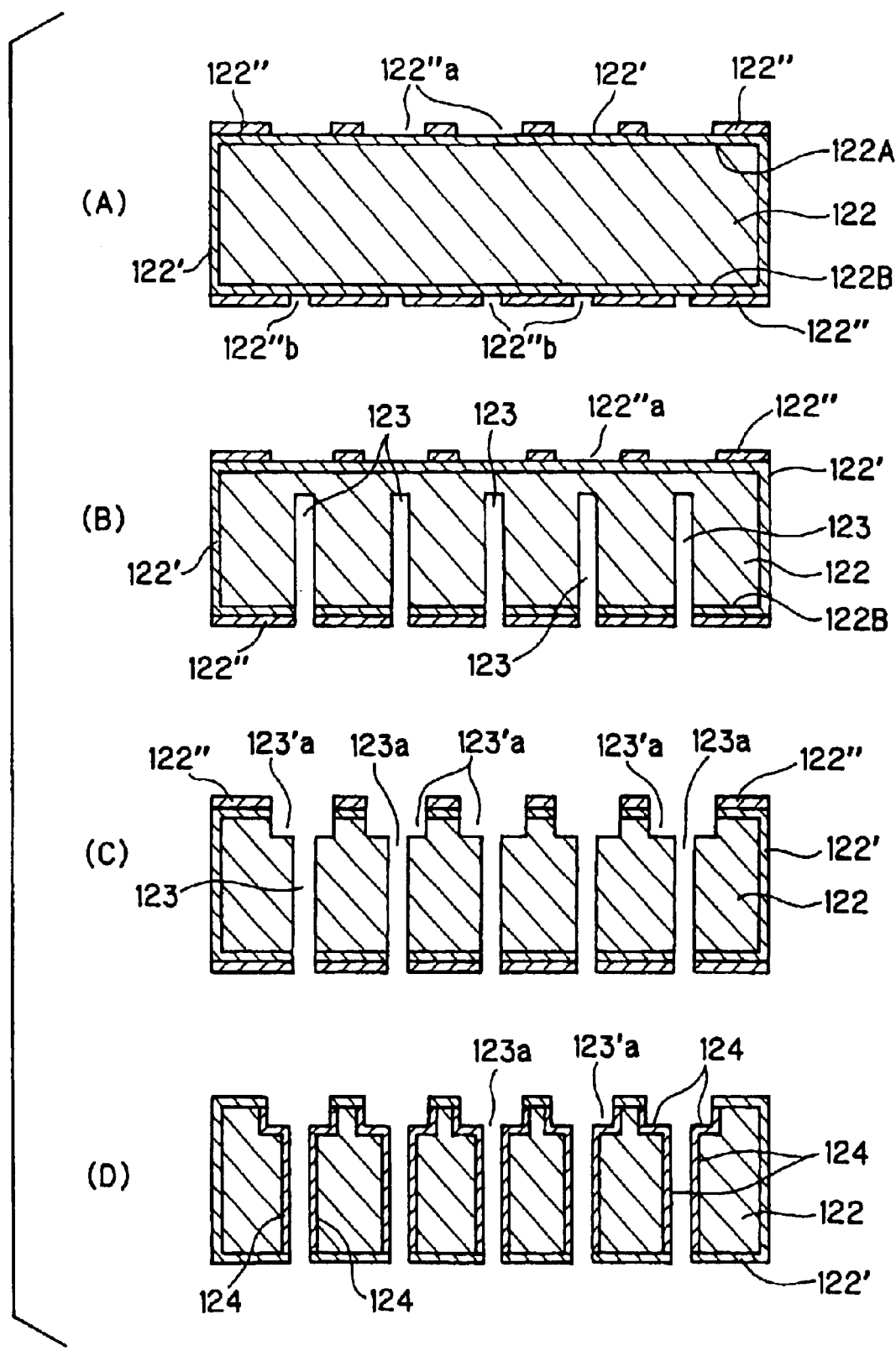
FIG. 44 is a process diagram illustrating still another embodiment of the production of the apparatus for fine pattern formation according to the present invention.
Figure 45:
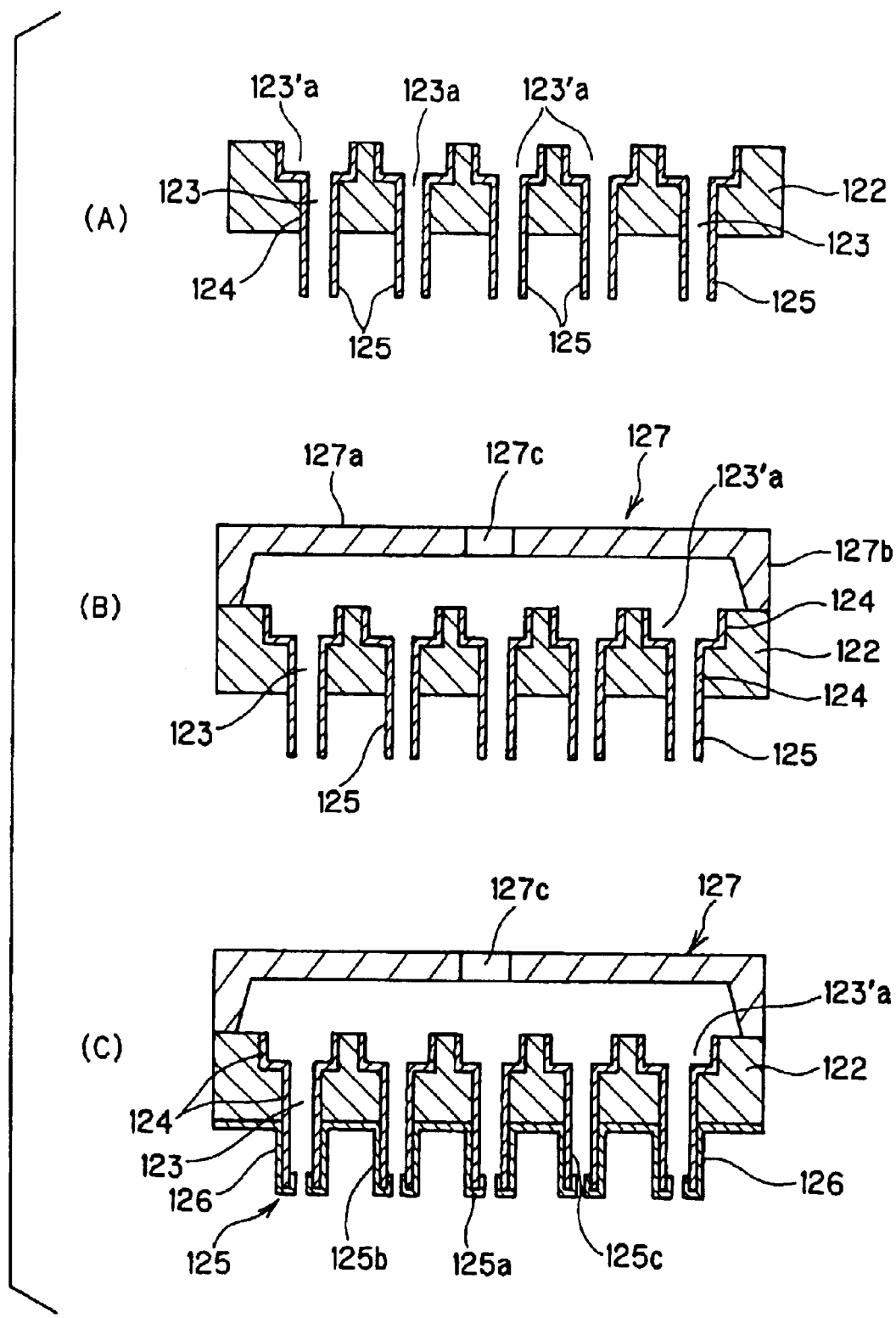
FIG. 45 is a process diagram illustrating a further embodiment of the production of the apparatus for fine pattern formation according to the present invention.

A further embodiment of the production of the apparatus for fine pattern formation according to the present invention will be described by taking the apparatus 121 for fine pattern formation shown in FIG. 29 as an example with reference to FIGS. 44 and 45.

At the outset, an about 200 to 3000 angstrom-thick silicon nitride ($Si_3N_4$) layer 122' is formed on the whole area of the silicon substrate 122 having a cleaned surface. Next, a mask thin film 122" is formed on both surfaces of the silicon nitride layer 122', and the mask thin film 122" in its portion located on the surface 122A side of the silicon substrate 122 is patterned to form a mask pattern having wide openings 122"*a*. The mask thin film 122" in its portion located on the back surface 122B side of the silicon substrate 122 is patterned to form a mask pattern having fine openings 122"*b* (FIG. 44(A)). The center of the wide opening 122"*a* is set so as to substantially conform to the center of the fine opening 122"*b* through the silicon substrate 122.

The opening diameter of multistaged wide concaves 123'*a*, which will be described later, is determined by the size and shape of the wide opening 122"*a*. In general, the size of the wide opening is preferably set in the range of 5 to 200 μm. Further, the diameter of openings in fine holes 123 and fine nozzles 125, which will be described later, is determined by the size of the fine openings 122"*b*. In general, the size of the fine openings is preferably set in the range of 1 to 100 μm.

The silicon nitride layer 122' may be formed in the same manner as used in the formation of the silicon nitride layer 112'. In addition to a metallic thin film, a resist, a thin film of silicon oxide or a combination of both the materials (resist/thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Fine holes 123 are then formed by deep etching using the mask pattern having the fine openings 122"*b* as a mask from the back surface 122B side of the silicon substrate 122 (FIG. 44(B)). The fine holes 123 may be formed, for example, by a high aspect etching technique, such as dry etching or deep etching, for example, by ICP-RIE (inductively coupled plasma-reactive ion etching). The formation of the fine holes 123 is continued until the depth reaches a predetermined level such that the fine holes 123 do not yet completely pass through the silicon substrate 122. In the present invention, in order to facilitate the regulation of the depth of the fine holes 123, an SOI (silicon on insulator) wafer may be used as the silicon substrate 122. The SOI wafer has a multilayer structure comprising a silicon oxide thin film sandwiched between single crystal silicons. The silicon oxide thin film functions as a stopping layer in the deep etching. This can eliminate the need to control the depth in the formation of the fine holes 123. When an SOI wafer having a multilayer structure, in which two silicon oxide thin films are sandwiched between single crystal silicons, is used, multistaged openings, of which the number of stages is larger, can be formed.

Next, wide concaves 123'*a* are formed from the surface 122A side of the silicon substrate 122 by deep etching using the mask pattern having wide openings 122"*a* as a mask (FIG. 44(C)). The wide concaves 123'*a* can be formed, for example, by a high aspect etching technique, such as a Bosch process using an ICP-RIE (inductively coupled plasma-reactive ion etching) device. The formation of the wide concaves 123'*a* is continued until the openings of the fine holes 123 appear within the wide concaves 123'*a*.

Next, the mask thin film 122" is removed, and oxidation is carried out in a thermal oxidation furnace to form an about 5000 to 10000 angstrom-thick silicon oxide layer 124 on the wall surface of the fine holes 123 and on the wall surface of the wide concaves 123'*a* (FIG. 44(D)).

Next, the silicon nitride layer 122' is removed, and dry etching is carried out from the back surface 122B side of the silicon substrate 122 remote from the wide concaves 123'. In this dry etching, a part of the silicon substrate 122 is etched to expose the silicon oxide layer 124 formed on the inner wall of the through fine holes 123. When this silicon oxide layer 124 has been exposed by a desired length, the dry etching is stopped to prepare fine nozzles 125 formed of silicon oxide protruded on the etching side of the silicon substrate 122 (FIG. 45(A)).

Although the Bosch process utilizing an ICP-RIE device has been used in the above high aspect etching, the etching method is not limited to this only.

Next, the support member 127 in its flange portion 127*b* is fixed onto the peripheral portion on the surface side (on the multistaged concave formed side) of the silicon substrate 122 (FIG. 45(B)). This fixation may be carried out, for example, by anodic bonding or epoxy adhesive.

Next, at least the front end face 125*a* and outer face 125*b* of the fine nozzles 125 are covered with a reinforcing layer 126, and the reinforcing layer 126 is further formed on the back surface 122B of the silicon substrate 122 (FIG. 45(C)). The reinforcing layer 126 may be formed, for example, by plasma CVD, ion plating, or low pressure CVD. These film formation methods can realize a high sneak level and thus are advantageous in the formation of the reinforcing layer 126 on the inner face 125*c* of the fine nozzles 125. Thereafter, an ink supplying device is connected to the opening 127*c* of the support member 127 through the ink passage. Thus, the apparatus 121 for fine pattern formation according to the present invention as shown in FIG. 29 can be prepared.

II-3 Formation of Fine Pattern

Next, the formation of a fine pattern using the apparatus for fine pattern formation according to the present invention will be described.

FIG. 46 is a diagram illustrating one embodiment of fine pattern formation using the apparatus 131 for fine pattern formation according to the present invention. In FIG. 46, while supplying ink A, ink B, and ink C respectively from the ink supplying devices 139*a*, 139*b*, 139*c* in the apparatus 131 for fine pattern formation according to the present invention through the ink passages 138, a pattern object S is scanned relative to the apparatus 131 for fine pattern formation in a predetermined direction (a direction indicated by an arrow A). The scanning direction A is identical to the arrangement direction A (see FIG. 31) of the fine holes in the apparatus 131 for fine pattern formation. In this case, the space between the silicon substrate 132 in the apparatus 131 for fine pattern formation and the pattern object S may be set in the range of about 0.1 to 5 mm.

According to this construction, inks ejected from the fine nozzles 135 in the silicon substrate 132 form, by direct writing, a stripe pattern comprising ink A, ink B, and ink C which have been repeatedly sequenced in that order on the pattern object S. In this case, the pitch of the stripes is P2. In this stripe pattern, since one stripe is formed of ink ejected from the plurality of fine nozzles on an identical line, even when the amount of ink ejected from the individual fine nozzles is small, the scanning speed of the pattern object S can be increased to increase the pattern formation speed. This stripe pattern is formed with very high accuracy by varying the diameter of the fine holes 133 or the fine nozzles 135 (including the case where the thickness of the reinforcing layer 136 provided on the inner face of the fine nozzles is changed) to control the ejection width of ink, and the process is simpler than the conventional photolithography.

When the pattern object S is flexible, preferably, a back-up roller is disposed on the back surface of the pattern object S so as to face the apparatus 131 for fine pattern formation. In this case, the pattern object S is carried while applying tension to the pattern object S by the back-up roller to directly write a pattern on the pattern object S.

Figure 47:
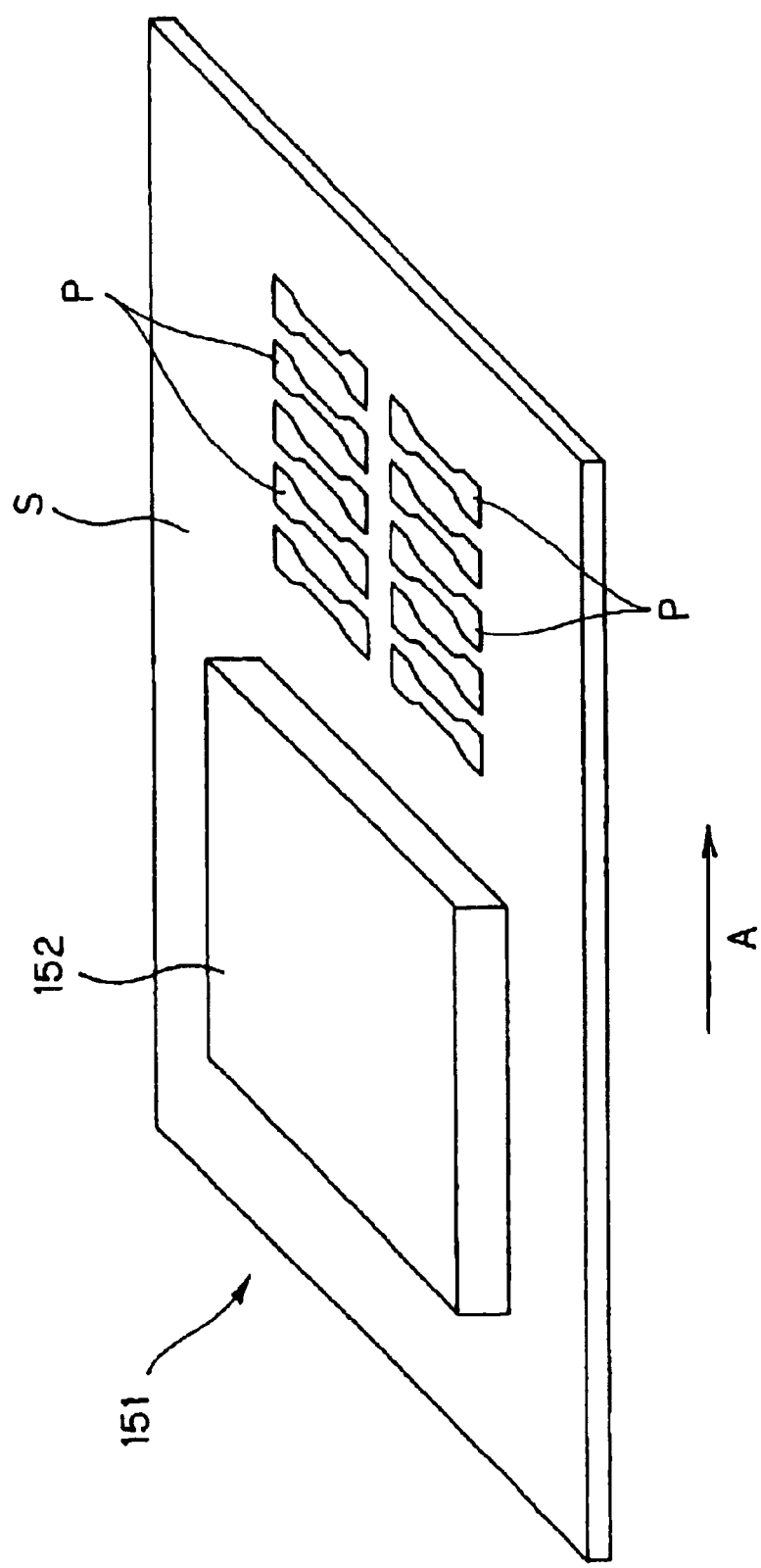
FIG. 47 is a perspective view showing another embodiment of fine pattern formation using the apparatus for fine pattern formation according to the present invention.

Next, FIG. 47 is a diagram showing one embodiment of fine pattern formation using the apparatus 151 for fine pattern formation according to the present invention. In FIG. 47, the apparatus 151 for fine pattern formation (only the silicon substrate 152 is shown in the embodiment in the drawing) is disposed at a predetermined position of the pattern object S, a given amount of ink supplied from the ink passage is ejected through the fine holes (fine nozzles) onto the pattern object to form a pattern.

Thereafter, the pattern object S is carried by a predetermined distance in a direction indicated by an arrow A, and the same pattern formation as described above is carried out. A desired pattern P can be formed on the pattern object S by repeating the above procedure. The space between the silicon substrate 152 in the apparatus 151 for fine pattern formation and the pattern object S may be set in the range of about 0.1 to 5 mm.

Further, a printed wiring board can be simply produced without replying on photolithography, for example, by forming the pattern P, formed of the plurality of fine holes (fine nozzles) in the apparatus 151 for fine pattern formation, as a conductor pattern of a printed wiring board, and using a conductor paste as ink.

III-1 Apparatus for Fine Pattern Formation
(First Embodiment)

Figure 48:
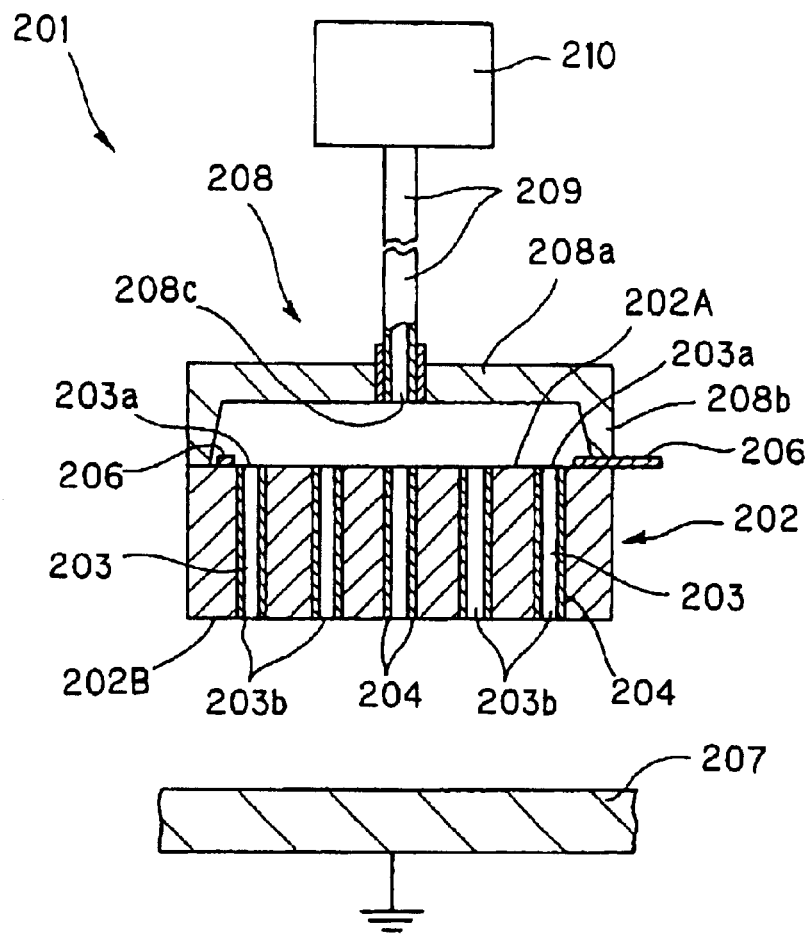
FIG. 48 is a schematic cross-sectional view showing one embodiment of the apparatus for fine pattern formation according to the present invention.

FIG. 48 is a schematic cross-sectional view showing one embodiment of the apparatus for fine pattern formation according to the present invention. In FIG. 48, the apparatus 201 for fine pattern formation comprises: a silicon substrate 202; a main electrode 206 provided on the surface 202A side of the silicon substrate 202; a support member 208; a counter electrode 207 provided on the back surface 202B side of the silicon substrate 202 while leaving a predetermined space between the main electrode 206 and the counter electrode 207; an ink passage 209 for supplying ink to a space between the silicon substrate 202 and the support member 208; and an ink supplying device 210 connected to the ink passage 209.

The silicon substrate 202 has a plurality of fine holes 203 which extend through the silicon substrate 202 from the surface 202A side to the back surface 202B side. Openings 203a on the surface 202A side of the fine holes 203 are exposed to the space defined by the silicon substrate 202 and the support member 208. The silicon substrate 202 is preferably formed of a single crystal of silicon, and the thickness of the silicon substrate 202 is preferably about 200 to 500 µm. Since the silicon substrate 202 has a low coefficient of linear expansion of about $2.6 \times 10^{-6}$/K, a change in shape upon a temperature change is very small.

The fine holes 203 are cylindrical spaces which are circular in a transverse section perpendicular to the axial direction (a section parallel to the surface 202A of the silicon substrate 202) and are rectangular in a longitudinal section along the axial direction (a section perpendicular to the surface 202A of the silicon substrate 202). A silicon oxide layer 204 is provided on the wall surface of the fine holes 203. The thickness of the silicon oxide layer 204 is generally about 5000 to 10000 angstroms. In the embodiment shown in the drawing, the thickness of the silicon substrate 202, the opening diameter of the fine holes 203 provided with the silicon oxide layer 204, the number of fine holes 203, the pitch of the fine holes 203 and the like are simplified for the explanation of the construction of the apparatus. The opening diameter of the fine holes 203 may be properly set in the range of about 1 to 100 µm, and the aspect ratio of the fine holes 203 may be properly set in the range of about 1 to 100. The number of the fine holes 203 and the pitch of the fine holes 203 may be properly set according to the form of pattern formed by the apparatus 201 for fine pattern formation, the method for pattern formation and the like. The pitch of the fine holes 203 is preferably about 2 µm at the smallest.

The transverse sectional form of the fine holes 203 may be, in addition to the above-described circular form, for example, an elliptical or polygonal form or a special form. Further, the fine holes 203 may be a combination of two or more fine holes which are different from each other or one another in transverse sectional form. When the fine holes 203 are elliptical or rectangular in transverse sectional form, the opening diameter in the longitudinal direction may be properly set in the range of 5 to 500 µm. Further, regarding the longitudinal sectional form of the fine holes 203, in addition to the above-described rectangle, a trapezoid, wherein the back surface 202B side of the silicon substrate 202 is narrowed (tapered), may be adopted.

Figure 49:
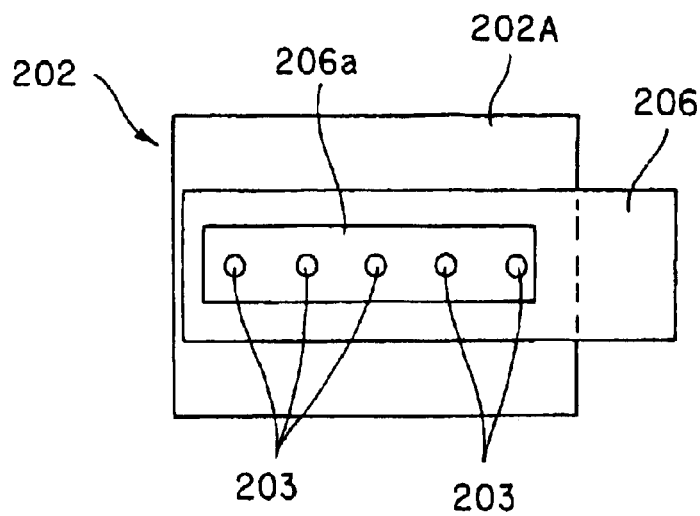
FIG. 49 is a plan view illustrating a main electrode provided on the surface side of a silicon substrate, in such a state that a support member has been removed.

FIG. 49 is a plan view illustrating a main electrode 206 provided on the surface 202A side of a silicon substrate 202, in such a state that a support member 208 has been removed. As shown in FIG. 49, the main electrode 206 has an opening 206a and is provided so as to surround a plurality of fine holes 203 (5 fine holes in the embodiment shown in the drawing). The main electrode 206 is formed of a conductive thin film of aluminum, copper, chromium, gold, silver, silicon or the like and may generally be provided on the silicon substrate 202 side through an electrically insulating thin film of polyimide or the like.

The counter electrode 207 may be in an electrically grounded or floating state. In order to write finer lines, the grounded state is preferred. In the embodiment shown in the drawing, the counter electrode 207 is in an electrically grounded state and, when a predetermined voltage has been applied to the main electrode 206, functions to cause an electric field between the counter electrode 207 and the main electrode 206. This counter electrode 207 may be, for example, in a drum or flat plate form. In this case, a pattern object is disposed in a space between the silicon substrate 202 and the counter electrode 207, or disposed on the counter electrode 207, and, as described later, a pattern can be formed by direct writing. When the pattern object is electrically conductive, the pattern object may serve also as the counter electrode. When writing of finer lines is desired, the counter electrode 207 is preferably in a grounded state. The distance between the pattern object and the silicon substrate 202 may be set in the range of about 50 to 500 µm.

The counter electrode 207 may be formed of a conductive material, such as SUS 304, copper, or aluminum. Alternatively, the counter electrode 207 may have a construction such that a conductive thin film has been formed on a nonconductive material such as glass or a resin material.

The support member 208 is provided on the surface 202A side of the silicon substrate 202, for supporting the silicon substrate 202. In the embodiment shown in the drawing, the support member 208 comprises: a base 208a, which, as with the silicon substrate 202, is flat; a flange portion 208b provided on the periphery of the base 208a; and an opening 208c provided at the center of the base 208a. The support member 208 is fixed to the peripheral portion of the surface 202A side of the silicon substrate 202 by the flange portion 208b. This can provide a space for supplying ink to a portion between the silicon substrate 202 and the support member 208 (ink supply space). The fixation of the support member 208 to the silicon substrate 202 through heat-resistant glass (not shown) can improve the working efficiency of later steps in the production of the apparatus for fine pattern formation.

This support member 208 is preferably formed of a material having a coefficient of linear expansion in the range of one-tenth of the coefficient of linear expansion of the silicon substrate 202 to 10 times the coefficient of linear expansion of the silicon substrate 202, for example, Pyrex glass (tradename: Corning #7740, coefficient of linear expansion=$3.5 \times 10^{-6}$/K) or SUS 304 (coefficient of linear expansion=$17.3 \times 10^{-6}$/K). When these materials are used, the level of a distortion caused between the silicon substrate 202 and the support member 208 upon exposure to heat is very small. By virtue of this, the flatness of the silicon substrate 202 is maintained, and a pattern having high positional accuracy can be formed.

The ink passage 209 is connected to the opening 208c of the support member 208, and the other end of the ink passage 209 is connected to an ink supplying device 210. In the embodiment shown in the drawing, only one ink passage 209 in a pipe form is connected. In this case, a construction may also be adopted wherein a plurality of openings 208c, the number of which has been determined by taking into consideration, for example, the size of the apparatus 201 for fine pattern formation and the evenness of ink flow pressure, are provided, and the ink passage 209 is connected to each opening 208c. The support member 208 and the silicon substrate 202 may be fabricated so that the ink passage is provided within the support member 208 and/or the silicon substrate 202.

The ink supplying device 210 is not particularly limited, and any of a continuous supply pump, a constant rate supply pump and the like may be used as the ink supplying device 210 and may be properly selected according to the application of the apparatus 201 for fine pattern formation.

In the above apparatus 201 for fine pattern formation according to the present invention, since a combination of an electric field, formed between the main electrode 206 and the counter electrode 207, with an ink supply pressure from the ink supplying device 210 is used as ink ejection means, ink can be ejected in a very small amount with high accuracy at a low ink supply pressure through the fine holes 203 in the silicon substrate 202. When ink is present in the ink supply space, the formation of the electric field suffices for the ejection of the ink and, in this case, ink supply pressure is not required. Here low pressure refers to a pressure of not more than 5 psi. This is true of the following description of the present invention.

Further, the width and amount of ink ejected from the fine holes 203 can be regulated by varying the strength of field formed between the main electrode 206 and the counter electrode 207. Therefore, ink can be ejected through the fine holes 203 having a predetermined opening diameter in desired ejection width and ejection amount. Further, the amount of ink ejected can be set as desired by varying the amount of ink supplied. The width and amount of ink ejected through the fine holes 203 can be regulated by varying both the field strength and the ink supply pressure. Therefore, a pattern can be stably directly written on a pattern object with high accuracy.

(Second Embodiment)

FIG. 50 is a schematic cross-sectional view showing another embodiment of the apparatus for fine pattern formation according to the present invention. As shown in FIG. 50, the basic structure of the apparatus 211 for fine pattern formation has the same as that of the apparatus 201 for fine pattern formation, and nozzles 215 are formed in openings 213b in fine holes 213 on the back surface 212B side of the silicon substrate 212. The nozzles 215 are formed of silicon oxide and are formed integrally with the silicon oxide layer 214, and the protrusion level may be properly set in the range of 10 to 400 μm. The provision of this type of nozzles 215 can prevent the deposition of ink ejected through the fine holes 213 onto the back surface 212B side of the silicon substrate 212.

The main electrode 216 may also be provided on the back surface 212B side of the silicon substrate 212. FIG. 51 is a rear view illustrating a main electrode in a frame form provided on the back surface 212B side of the silicon substrate 212. As shown in FIG. 51, The main electrode 216 has an opening 216a provided so as to surround the plurality of nozzles 215. The space between the main electrode 216 and the counter electrode 217 may be set in the range of about 50 to 500 μm.

In the apparatus 211 for fine pattern formation according to the present invention, when a combination of an electric field formed between the main electrode 216 and the counter electrode 217 with the supply pressure of ink from the ink supplying device 220 is used as ink ejection means, ink can be ejected in a very small amount with high accuracy without increasing the ink supply pressure. Thus, the damage of the nozzles 215 can be prevented.

Further, in the apparatus 211 for fine pattern formation, a reinforcing layer may be provided for improving the mechanical strength of the nozzles 215. FIG. 52 is a schematic cross-sectional view showing an embodiment wherein the apparatus 211 for fine pattern formation has a reinforcing layer. As shown in FIG. 52, the reinforcing layer 215' covers the front end face and outer face of the nozzles 215 and is further provided on the inner face on a portion around the front end face.

Further, the reinforcing layer 215' is formed on the back surface 212B of the silicon substrate 212. The thickness of the reinforcing layer 215' may be at least twice, preferably at least five times, that of the nozzles 215. In general, the thickness of the reinforcing layer 215' may be properly set in the range of 1 to 5 μm. The reinforcing layer 215' may be formed of, for example, a material such as silicon oxide or phosphorus silicon glass.

The opening diameter of the nozzles 215 may be substantially regulated by varying the thickness of the reinforcing layer 215' provided on the inner face of the nozzles 215. Therefore, a method may be adopted wherein nozzles 215 having a predetermined opening diameter is formed and the thickness of the reinforcing layer 215' provided on the inner face of the nozzles 215 is regulated, for example, according to applications of the apparatus for fine pattern formation and the properties of ink used to form nozzles 215 having a desired opening diameter.

The reinforcing layer 215' may be formed, for example, by plasma CVD, ion plating, or low pressure CVD. These film formation methods can realize a high sneak level and thus are advantageous for the formation of the reinforcing layer on the inner face of the nozzles 215 having a three-dimensional structure.

In the embodiment shown in the drawing, the reinforcing layer 215' is also formed on the back surface 212B of the silicon substrate 212. In the apparatus for fine pattern formation according to the present invention, however, the reinforcing layer 215' may not be provided in this site.

(Third Embodiment)

Figure 53:
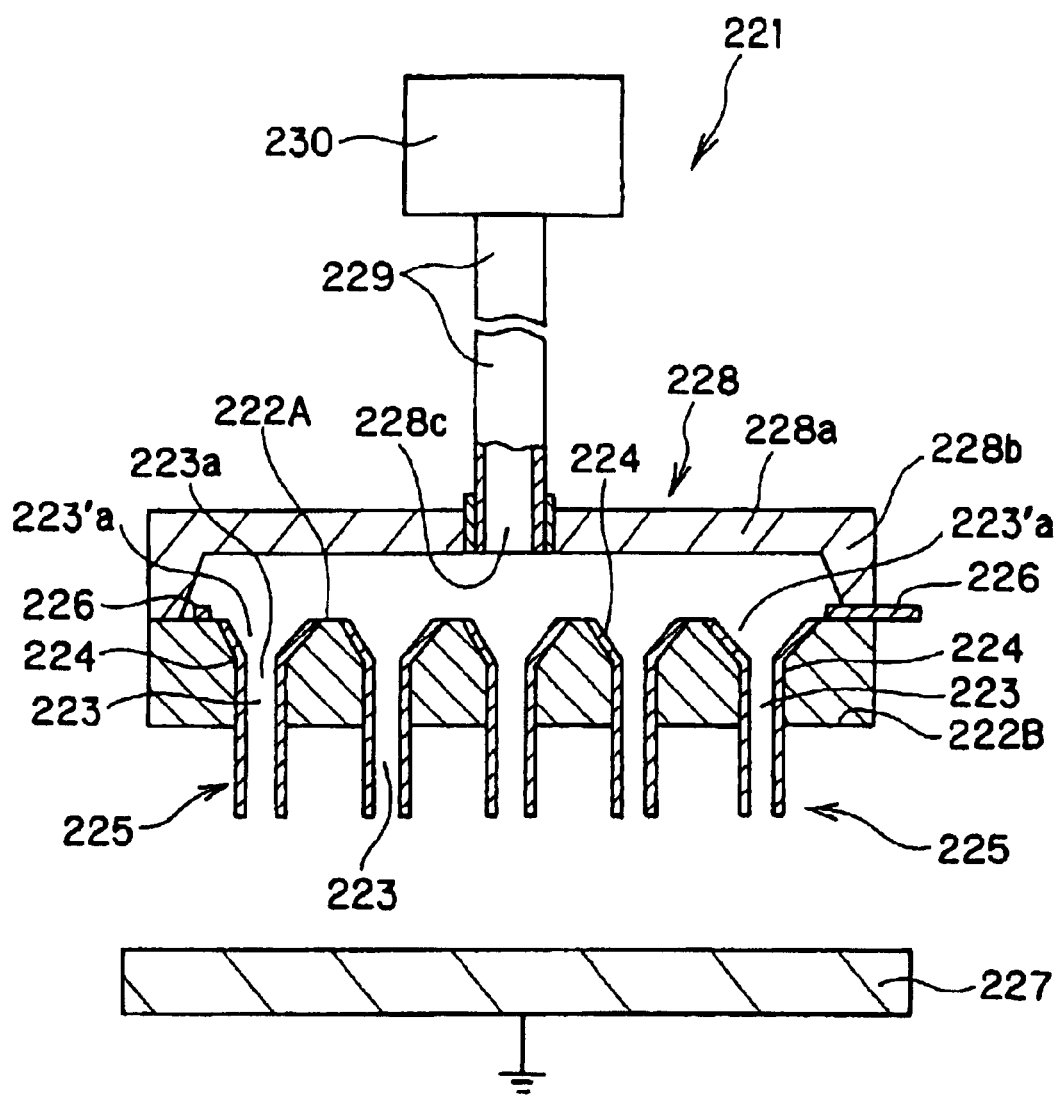
FIG. 53 is a schematic cross-sectional view showing a further embodiment of the apparatus for fine pattern formation according to the present invention.

FIG. 53 is a schematic cross-sectional view showing still another embodiment of the apparatus for fine pattern formation according to the present invention. In FIG. 53, an apparatus 221 for fine pattern formation comprises: a silicon substrate 222; tapered concaves 223'a provided on the surface 222A of the silicon substrate 222; nozzles 225 protruded on the back surface 222B side of the silicon substrate 222; a main electrode 226 provided on the surface 222A side of the silicon substrate 222; a counter electrode 227 provided at predetermined intervals on the back surface 222B side of the silicon substrate 222; a support member 228; an ink passage 229 for supplying ink to a space between the silicon substrate 222 and a support member 228; and an ink supplying device 230 connected to the ink passage 229.

The silicon substrate 222 has fine holes 223 which extend through the silicon substrate 222 from the bottom of the plurality of tapered concaves 223'a on the surface 222A side to the back surface 222B side. The openings 223a on the surface 222A side of the fine holes 223 are exposed to the tapered concaves 223'a. The tapered concaves 223'a are exposed to a space defined by the silicon substrate 222 and the support member 228. The silicon substrate 222 is preferably a single crystal of silicon such that the surface 222A and the back surface 222B have <100> crystallographic orientation. The thickness of the silicon substrate 222 is preferably about 200 to 500 $\mu$m. The silicon substrate 222 has a low coefficient of linear expansion of about $2.6 \times 10^{-6}$/K and thus is less likely to undergo a change in shape upon a change in temperature.

A silicon oxide layer 224 is provided on the wall surface of the tapered concaves 223'a, and the thickness of the silicon oxide layer 224 is generally about 5000 to 10000 angstroms. The taper in the concaves 223'a may be in the form of any of an inverted cone, an inverted quadrangular pyramid and the like, and the depth of the concaves 223'a may be set in the range of about 5 to 150 $\mu$m, and the maximum opening diameter may be set in the range of about 10 to 200 $\mu$m. For example, when the taper is in an inverted quadrangular pyramid form, the wall surface of the concaves 223'a may be formed so that the angle of the wall surface of the concaves 223'a to the surface 222A of the silicon substrate 222 (<100> face) is 55 degrees. In the embodiment shown in the drawing, the thickness of the silicon substrate 222, the number of tapered concaves 223'a, the pitch of the tapered concaves 223'a and the like are simplified for the explanation of the construction of the apparatus. The number of the concaves 223'a and the pitch of the concaves 223'a, together with the fine holes 223, may be properly set according to the form of pattern formed by the apparatus 221 for fine pattern formation, the method for pattern formation and the like. The pitch of the concaves 223'a is preferably about 15 $\mu$m at the smallest.

The fine holes 223 are cylindrical spaces which are circular in a transverse section perpendicular to the axial direction (a section parallel to the surface 222A of the silicon substrate 222) and are rectangular in a longitudinal section along the axial direction (a section perpendicular to the surface 222A of the silicon substrate 222). A silicon oxide layer 224 is provided on the wall surface of the fine holes 223 so as to be continued from the wall surface of the concaves 223'a. In the embodiment shown in the drawing, the opening diameter of the fine holes 223, the number of fine holes 223, the pitch of the fine holes 223 and the like are simplified for the explanation of the construction of the apparatus. The opening diameter of the fine holes 223 may be properly set in the range of about 1 to 100 $\mu$m, and the aspect ratio of the fine holes 223 may be properly set in the range of about 1 to 100. The number of the fine holes 223 and the pitch of the fine holes 223 may be properly set according to the form of pattern formed by the apparatus 221 for fine pattern formation, the method for pattern formation and the like. The pitch of the fine holes 223 is preferably about 15 $\mu$m at the smallest.

The transverse sectional form of the fine holes 223 may be, in addition to the above-described circular form, for example, an elliptical or polygonal form or a special form. Further, the fine holes 223 may be a combination of two or more fine holes which are different from each other in transverse sectional form. When the fine holes are elliptical or rectangular in transverse sectional form, the opening diameter in the longitudinal direction may be properly set in the range of 5 to 500 $\mu$m. Regarding the longitudinal sectional form of the fine holes 223, in addition to the above-described rectangle, a trapezoid, wherein the back surface 222B side of the silicon substrate 222 is narrowed (for example, tapered at a smaller taper angle than that of the tapered concaves 223'a), may be adopted.

The nozzles 225 are formed of silicon oxide, are provided integrally with the silicon oxide layer 224 provided on the wall surface of the fine holes 223, and are in communication with the fine holes 223. The thickness of the nozzles 225 may be properly set in the range of 5000 to 10000 angstroms, the opening diameter may be properly set in the range of 1 to 100 $\mu$m, and the protrusion level from the back surface 222B of the silicon substrate 222 may be properly set in the range of 1 to 150 $\mu$m. The provision of such nozzles 225 can prevent ink, ejected from the fine holes 223, from being deposited on the back surface 222B side of the silicon substrate 222.

The main electrode 226 has an opening and is provided so as to surround a plurality of tapered concaves 223'a (five tapered concaves in the embodiment shown in the drawing). The main electrode 226 is formed of a conductive thin film of aluminum, copper, chromium, gold, silver, silicon or the like and may generally be provided on the silicon substrate 222 side through an electrically insulating thin film of polyimide or the like.

The counter electrode 227 may be in an electrically grounded or floating state. The distance between the counter electrode 227 and the silicon substrate 222 may be set in the range of about 50 to 500 $\mu$m. The counter electrode 227 may be formed of a conductive material, such as SUS 304, copper, or aluminum. Alternatively, the counter electrode may have a construction such that a conductive thin film has been formed on a nonconductive material such as glass or a resin material.

The main electrode 226 may also be provided on the back surface 222B side of the silicon substrate 222. In this case, the distance between the main electrode 226 and the counter electrode 227 may be set in the range of about 50 to 500 $\mu$m.

The support member 228, the ink passage 229, and the ink supplying device 230 are the same as the support member 208, the ink passage 209, and the ink supplying device 210 in the apparatus 201 for fine pattern formation, and the explanation thereof will be omitted.

In this apparatus 221 for fine pattern formation according to the present invention, by virtue of the provision of tapered concaves 223'a, the passage resistance of ink can be reduced, and an ink having higher viscosity can be ejected through the plurality of nozzles 225 on the back surface of the silicon substrate 222 in a very small amount with high accuracy, and, at the same time, the deposition of ink onto the back surface of the silicon substrate 222 can be prevented. Further, when a combination of an electric field formed between the main electrode 226 and the counter electrode 227 with the supply pressure of ink from the ink supplying device 230 is used as ink ejection means, ink can be ejected in a very small amount with high accuracy without increasing the ink supply pressure. This can prevent the damage of the nozzles 225.

Also in the apparatus 221 for fine pattern formation, a reinforcing layer may be provided on the nozzles 225. Further, as with the apparatus 201 for fine pattern formation, the nozzles may not be in a protruded form.

(Fourth Embodiment)

Figure 54:
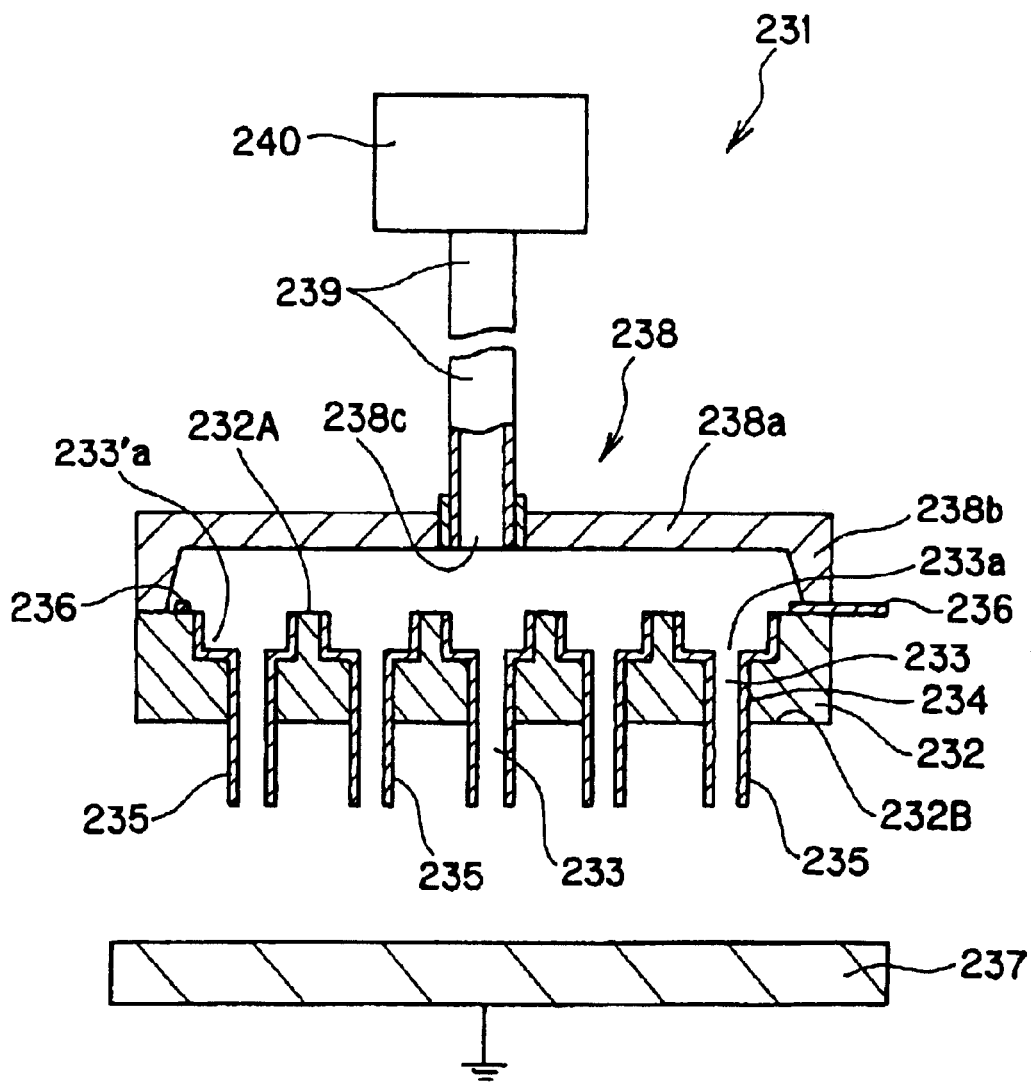
FIG. 54 is a schematic cross-sectional view showing a still further embodiment of the apparatus for fine pattern formation according to the present invention.

FIG. 54 is a schematic cross-sectional view showing a still further embodiment of the apparatus for fine pattern formation according to the present invention. In FIG. 54, an apparatus 231 for fine pattern formation comprises: a silicon substrate 232; multistaged concaves 233'a provided on a surface 232A of the silicon substrate 232; nozzles 235 protruded on the back surface 232B side of the silicon substrate 232; a main electrode 236 provided on the surface 232A side of the silicon substrate 232; a counter electrode 237 provided on the back surface 232B side of the silicon substrate 232 while leaving a predetermined space between the main electrode 236 and the counter electrode 237; a support member 238; an ink passage 239 for supplying ink to a space between the silicon substrate 232 and a support member 238; and an ink supplying device 240 connected to the ink passage 239.

The silicon substrate 232 has fine holes 233 which extend through the silicon substrate 232 from the bottom of the plurality of multistaged concaves 233'a on the surface 232A side to the back surface 232B side. Openings 233a on the surface 232A side of the fine holes 233 are exposed to the concaves 233'a, and the concaves 233'a are exposed to the space defined by the silicon substrate 232 and the support member 238. According to this construction, the fine holes 233 each have a two-staged concave opening comprising the opening 233a as a fine opening and the concave 233'a as a wide opening.

The silicon substrate 232 may be formed of the same material as in the silicon substrate 202, and the thickness of the silicon substrate 232 also may be set in the same range as that of the silicon substrate 202. The silicon substrate 232 may be an SOI (silicon on insulator) wafer that has a thin film of silicon oxide, which is parallel to the surface of the silicon substrate 232, at the boundary between the concaves 233'a and the fine holes 233.

A silicon oxide layer 234 is provided on the wall surface of the concaves 233'a, and the thickness of the silicon oxide layer 234 is generally about 5000 to 10000 angstroms. The concaves 233'a may be in a cylindrical, cubic, rectangular parallelopiped or other form, and the depth of the concaves 233'a may be set in the range of about 1 to 150 μm, and the opening diameter may be set in the range of about 5 to 200 μm. In the embodiment shown in the drawing, the thickness of the silicon substrate 232, the number of concaves 233'a, the pitch of the concaves 233'a and the like are simplified for the explanation of the construction of the apparatus. The number of the concaves 233'a and the pitch of the concaves 233'a, together with the fine holes 233, may be properly set according to the form of pattern formed by the apparatus 231 for fine pattern formation, the method for pattern formation and the like. The pitch of the concaves 233'a is preferably about 10 μm at the smallest. Further, in the embodiment shown in the drawing, as described above, two-staged openings of the opening 233a as the fine opening and the concave 233'a as the wide opening are adopted. Alternatively, three- or more staged openings may be adopted.

The fine holes 233 are cylindrical spaces which are circular in a transverse section perpendicular to the axial direction (a section parallel to the surface 232A of the silicon substrate 232) and are rectangular in a longitudinal section along the axial direction (a section perpendicular to the surface 232A of the silicon substrate 232). A silicon oxide layer 234 is provided on the wall surface of the fine holes 233 so as to be continued from the wall surface of the concaves 233'a. In the embodiment shown in the drawing, the opening diameter of the fine holes 233, the number of fine holes 233, the pitch of the fine holes 233 and the like are simplified for the explanation of the construction of the apparatus. The opening diameter of the fine holes 233 may be properly set in the range of about 1 to 100 μm, and the aspect ratio of the fine holes 233 may be properly set in the range of about 1 to 100. The number of the fine holes 233 and the pitch of the fine holes 233 may be properly set according to the form of pattern formed by the apparatus 231 for fine pattern formation, the method for pattern formation and the like. The pitch of the fine holes 233 is preferably about 10 μm at the smallest.

The transverse sectional form of the fine holes 233 may be, in addition to the above-described circular form, for example, an elliptical or polygonal form or a special form. Further, the fine holes 233 may be a combination of two or more fine holes which are different from each other in transverse sectional form. When the fine holes are elliptical or rectangular in transverse sectional form, the opening diameter in the longitudinal direction may be properly set in the range of 5 to 500 μm. Regarding the longitudinal sectional form of the fine holes 233, in addition to the above-described rectangle, a trapezoid, wherein the back surface 232B side of the silicon substrate 232 is narrowed (tapered), may be adopted.

The nozzles 235 are formed of silicon oxide, are provided integrally with the silicon oxide layer 234 provided on the wall surface of the fine holes 233, and are in communication with the fine holes 233. The thickness of the nozzles 235 may be properly set in the range of 5000 to 10000 angstroms, the opening diameter may be properly set in the range of 1 to 100 μm, and the protrusion level from the back surface 232B of the silicon substrate 232 may be properly set in the range of 1 to 150 μm. The provision of such nozzles 235 can prevent ink, ejected from the fine holes 233, from being deposited on the back surface 232B side of the silicon substrate 232.

The main electrode 236 has an opening and is provided so as to surround a plurality of multistaged concaves 233'a (five multistaged concaves in the embodiment shown in the drawing). The main electrode 236 is formed of a conductive thin film of aluminum, copper, chromium, gold, silver, silicon or the like and may generally be provided on the silicon substrate 232 side through an electrically insulating thin film of polyimide or the like.

The counter electrode 237 may be in an electrically grounded or floating state. The distance between the counter electrode 237 and the silicon substrate 232 may be set in the range of about 50 to 500 μm. The counter electrode 237 may be formed of a conductive material, such as SUS 304, copper, or aluminum. Alternatively, the counter electrode 237 may have a construction such that a conductive thin film has been formed on a nonconductive material such as glass or a resin material.

The main electrode 236 may also be provided on the back surface 232B side of the silicon substrate 232. In this case, the distance between the main electrode 236 and the counter electrode 237 may be set in the range of about 50 to 500 μm.

The support member 238, the ink passage 239, and the ink supplying device 240 are the same as the support member 208, the ink passage 209, and the ink supplying device 210 in the apparatus 201 for fine pattern formation, and the explanation thereof will be omitted.

In this apparatus 231 for fine pattern formation according to the present invention, by virtue of the provision of multistaged concaves 233'a, the passage resistance of ink can be reduced, and an ink having higher viscosity can be ejected through the plurality of nozzles 235 on the back surface of the silicon substrate 232 in a very small amount with high accuracy, and, at the same time, the deposition of ink onto the back surface of the silicon substrate 232 can be prevented. Further, when a combination of an electric field formed between the main electrode 236 and the counter electrode 237 with the supply pressure of ink from the ink supplying device 240 is used as ink ejection means, ink can be ejected in a very small amount with high accuracy without increasing the ink supply pressure. This can prevent the damage of the nozzles 235.

Also in the apparatus 231 for fine pattern formation, a reinforcing layer may be provided on the nozzles 235. Further, as with the apparatus 201 for fine pattern formation, the nozzles may not be in a protruded form.

(Fifth Embodiment)

Figure 55:
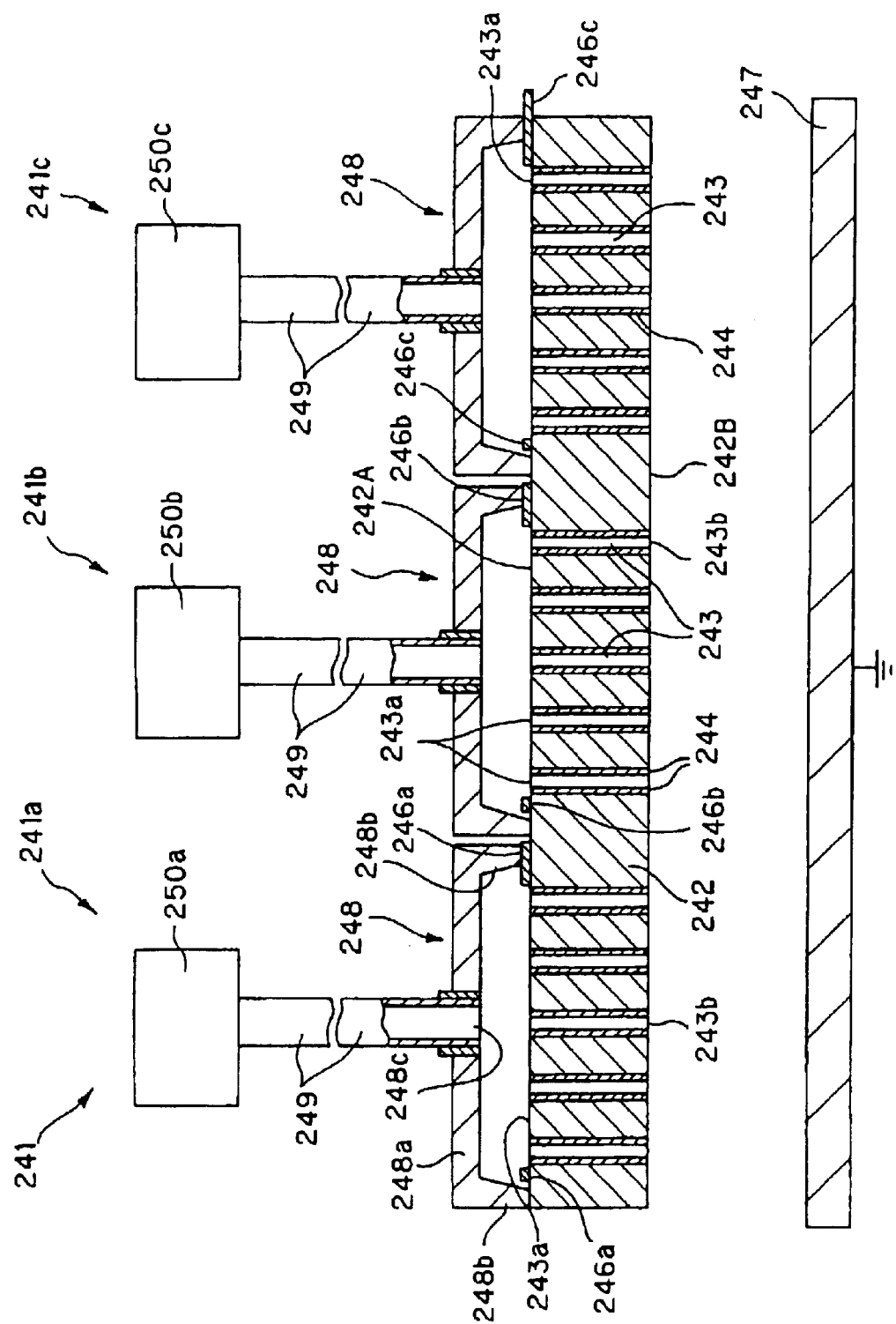
FIG. 55 is a schematic cross-sectional view showing another embodiment of the apparatus for fine pattern formation according to the present invention.
Figure 56:
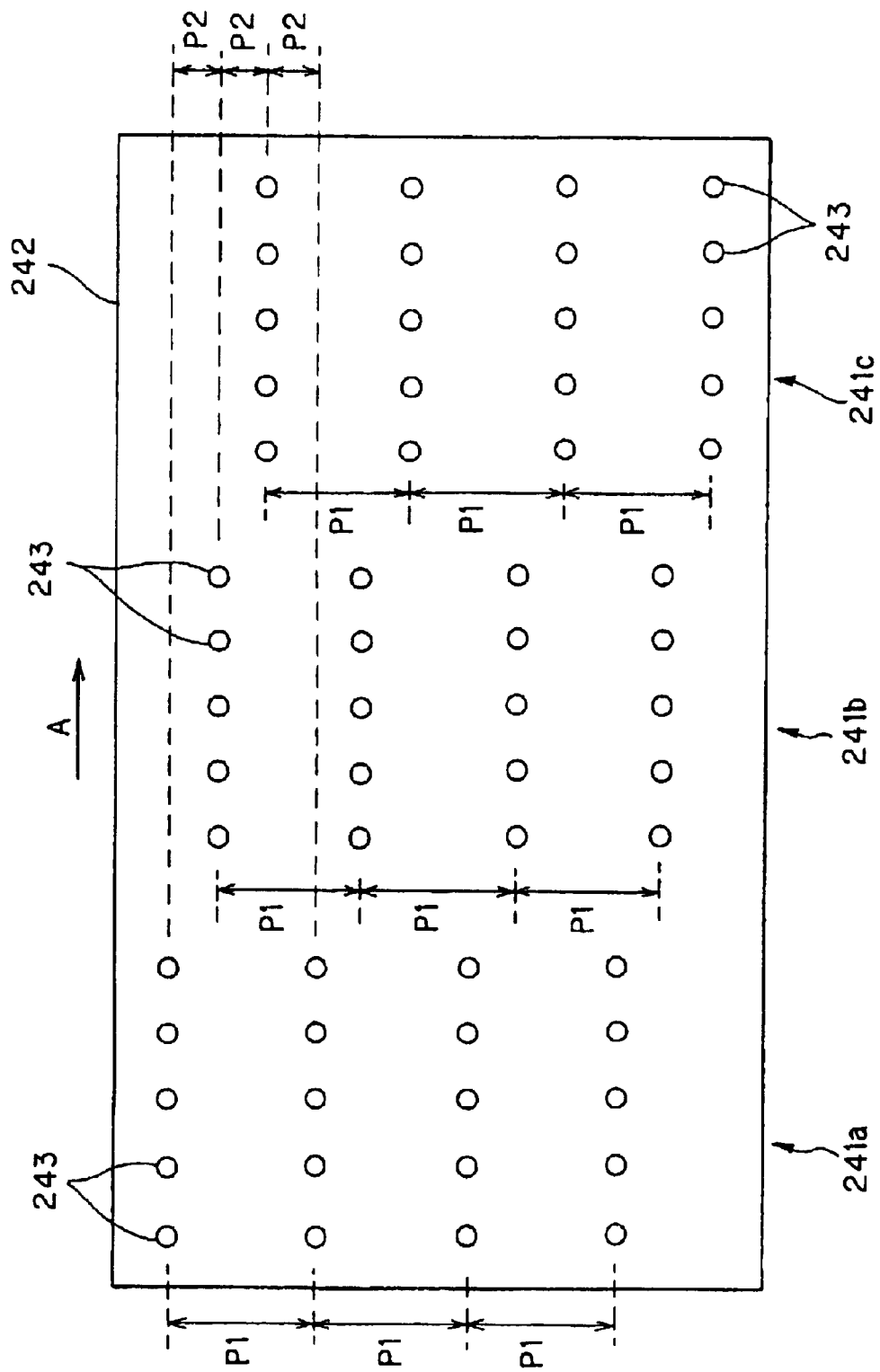
FIG. 56 is a bottom view of the apparatus for fine pattern formation shown in FIG. 55.

FIG. 55 is a schematic cross-sectional view showing still another embodiment of the apparatus for fine pattern formation according to the present invention, and FIG. 56 is a bottom view of an apparatus for fine pattern formation shown in FIG. 55. In FIGS. 55 and 56, the apparatus 241 for fine pattern formation comprises three continuous apparatus units 241a, 241b, 241c, that is, comprises: a common silicon substrate 242; thee main electrodes 246a, 246b, 246c provided on the surface 242A side of the silicon substrate 242; three support members 248; a counter electrode 247 provided on the back surface 242B side of the silicon substrate 242 while leaving a predetermined space between the main electrodes and the counter electrode 247; three ink passages 249 for supplying ink to a space between the silicon substrate 242 and each of the support members 248; and ink supplying devices 250a, 250b, 250c connected to the ink passages 249.

For each of the apparatus units 241a, 241b, 241c, the silicon substrate 242 has a plurality of fine holes 243 extending through the silicon substrate 242 from the surface 242A side of the silicon substrate 242 to the back surface 242B side of the silicon substrate 22, and the openings 243a on the surface 242A side of the fine holes 243 are exposed to the spaces defined by the silicon substrate 242 and the support members 248. The silicon substrate 242 may be formed of the same material as the above-described silicon substrate 202, and the thickness of the silicon substrate 242 also may be set in the same range as in the silicon substrate 202.

For each of the apparatus units 241a, 241b, 241c, the fine holes 243 are provided in a pattern such that a plurality of fine holes are arranged along a predetermined direction (in a direction indicated by an arrow A in FIG. 56) on an identical line. Specifically, in the apparatus unit 241a, a plurality of lines of fine holes 243 arranged along the direction indicated by the arrow A are provided at pitch P1. Likewise, also in the apparatus unit 241b, the apparatus unit 241c, a plurality of lines of fine holes 243 are provided at pitch P1. The lines of the fine holes 243 in the apparatus unit 241a, the lines of the fine holes 243 in the apparatus unit 241b, 241c are deviated from one another at pitch P2 (P1=3×P2). Therefore, in the whole apparatus 241 for fine pattern formation, lines of fine holes in the apparatus units 241a, 241b, 241c are repeatedly arranged at pitch P2. The transverse sectional form, the longitudinal sectional form, the inner diameter, and the pitch of the fine holes 243 may be properly set in the same manner as in the fine holes 203. The silicon oxide layer 244 provided on the wall surface of the fine holes 243 may also be the same as the silicon oxide layer 204. In the embodiment shown in the drawing, for example, the opening diameter, the number, and the pitch of the fine holes 243 provided with the silicon oxide layer 244 have been simplified for facilitating the explanation of the construction of the apparatus.

The main electrodes 246a, 246b, 246c are provided respectively for the apparatus units 241a, 241b, 241c. As with the main electrode 206, each main electrode is provided so as to surround the plurality of fine holes 243 (five fine holes in the embodiment shown in the drawing). The main electrodes 246a, 246b, 246c are formed of a conductive thin film of aluminum, copper, chromium, gold, silver, silicon or the like and may be generally provided on the silicon substrate 242 side through an electrically insulating thin film of polyimide or the like.

The counter electrode 247 may be in an electrically grounded or floating state. In order to write finer lines, the grounded state is preferred. In the embodiment shown in the drawing, the counter electrode 247 is in an electrically grounded state and, when a predetermined voltage has been applied to the main electrode 246, functions to apply an electric field to the fine holes 243. As with the counter electrode 207 in the apparatus 201 for fine pattern formation, the counter electrode 247 may be in various forms according to need.

The support member 248 is provided on the surface 242A side of the silicon substrate 242, for supporting the silicon substrate 242. In the embodiment shown in the drawing, as with the support member 208 described above, the support member 248 comprises: a base 248a, which, as with the silicon substrate 242, is flat; a flange portion 248b provided on the periphery of the base 248a; and an opening 248c provided at the center of the base 248a. The support member 248 is fixed to the surface 242A side of the silicon substrate 242 by the flange portion 248b. This can provide a space for supplying ink to a portion between the silicon substrate 242 and each of the support members 248 (ink supply space). The fixation of the support member 248 to the silicon substrate 242 through heat-resistant glass (not shown), can improve the working efficiency of later steps in the production of the apparatus for fine pattern formation. As with the support member 208 described above, this support member 248 is preferably formed of a material having a coefficient of linear expansion in the range of one-tenth of the coefficient of linear expansion of the silicon substrate 242 to 10 times the coefficient of linear expansion of the silicon substrate 242.

The ink passages 249 are connected to the openings 248c of the respective support members 248, and the other ends of the ink passages 249 are connected respectively to ink supplying devices 250a, 250b, 250c. The ink supplying devices 250a, 250b, 250c may be properly selected from a continuous supply pump, a constant rate supply pump and the like according to applications of the apparatus 241 for fine pattern formation. In the embodiment shown in the drawing, only one ink passage 249 is provided in each support member 248. In this case, a construction may also be adopted wherein a plurality of openings 248c, the number of which is determined by taking into consideration, for example, the evenness of ink flow pressure, are provided for one support member 248, and the ink passage 249 is connected to each opening 248c. The ink passage may be provided within the support member 248.

In the above apparatus 241 for fine pattern formation according to the present invention, since a combination of an electric field, formed between the main electrodes 246a, 246b, 246c and the counter electrode 247, with the pressure of ink for supply from the ink supplying devices 250a, 250b, 250c is used as ink ejection means, ink can be ejected in a very small amount at low ink supply pressure with high accuracy through the fine holes 243 of the silicon substrate 242. When ink is present in the ink supply space, the formation of the electric field suffices for the ejection of the ink and, in this case, ink supply pressure is not required. When different inks are supplied respectively from the ink supplying devices 250a, 250b, 250c, a pattern may be directly written with a desired ink for each of the apparatus units 241a, 241b, 241c. This is particularly advantageous for the formation of a stripe pattern by the method for pattern formation according to the present invention which will be described later. The width and amount of ink ejected from the fine holes 243 can be regulated by varying the strength of field formed between the main electrodes 246a, 246b, 246c and the counter electrode 247. Therefore, ink can be ejected through the fine holes 243 having a predetermined opening diameter in desired ejection width and ejection amount. Further, the amount of ink ejected can be set as desired by varying the amount of ink supplied. The width and amount of ink ejected through the fine holes 243 can be regulated by varying both the field strength and the ink supply pressure. Furthermore, in the apparatus 241 for fine pattern formation, since the apparatus units 241a, 241b, 241c are provided integrally with one another, there is no need to join a plurality of apparatuses to one another and, in addition, the positional accuracy of the apparatuses is very high. Furthermore, the amount of ink ejected may be set as desired by controlling the ink supplying devices 250a, 250b, 250c to vary the amount of ink supplied.

Also in the apparatus 241 for fine pattern formation, the nozzles as shown in FIG. 50 may be provided so as to be protruded from the openings 243b of the fine holes 243 on the back surface 242B side of the silicon substrate 242. In this case, a reinforcing layer like the reinforcing layer 215' may be formed on the nozzles.

Further, also in the apparatus 241 for fine pattern formation, the openings 243a on the surface 242A side of the fine holes 243 may be in a tapered concave form or a multistaged concave form as described above. This can reduce the passage resistance of ink and can realize the ejection of a higher-viscosity ink through the plurality of fine holes 243 in a very small amount with high accuracy.

(Sixth Embodiment)

Figure 57A:
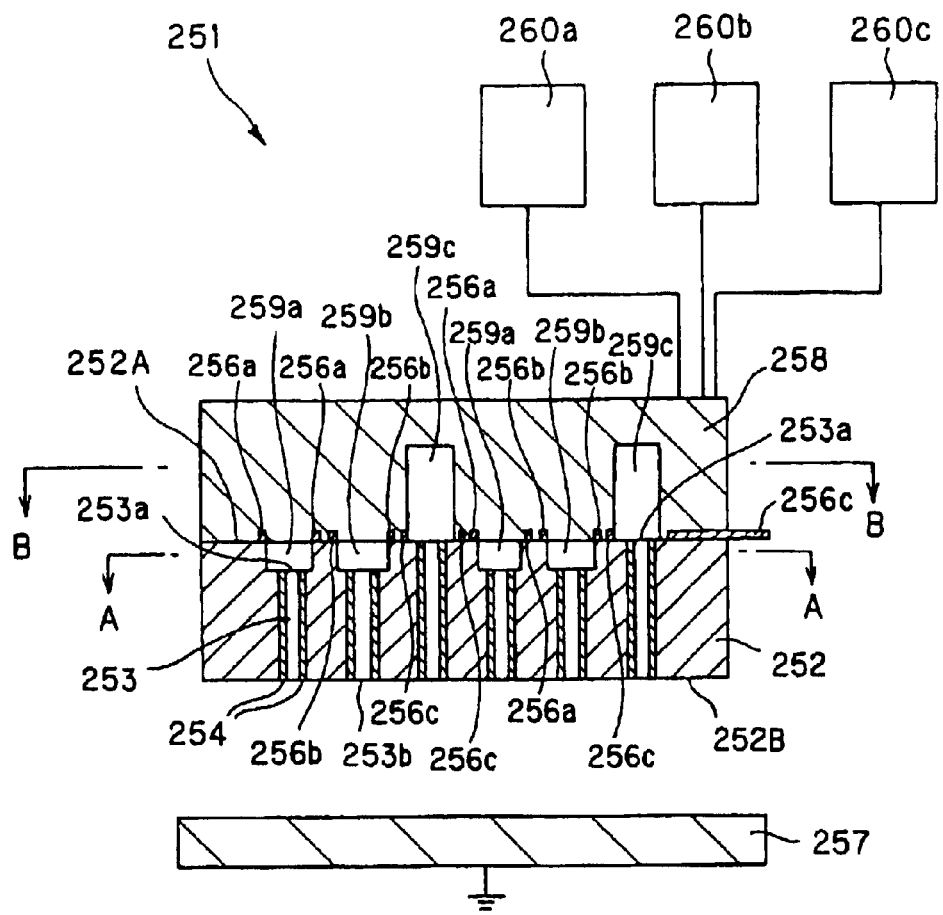
FIG. 57(A) is a schematic cross-sectional view and FIG. 57(B) a bottom view.
Figure 57B:
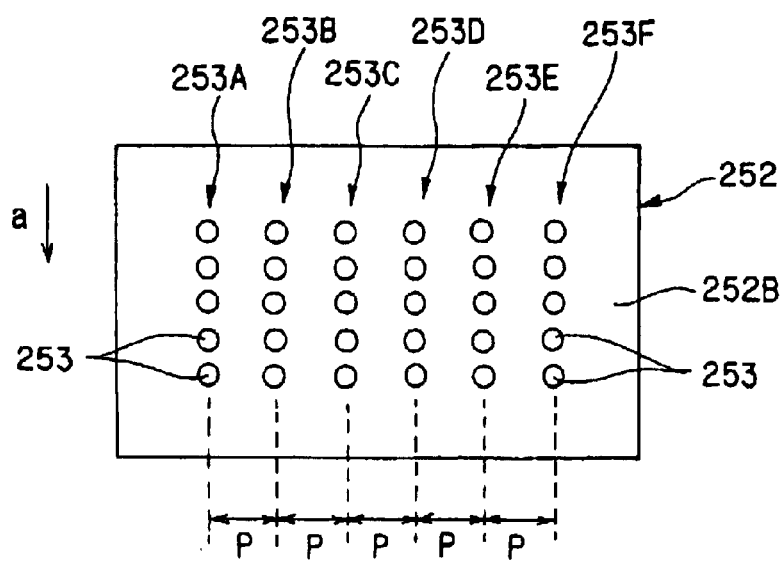

FIG. 57 is a diagram showing a further embodiment of the apparatus for fine pattern formation according to the present invention, wherein FIG. 57(A) is a schematic cross-sectional view and FIG. 57(B) a bottom view. In FIG. 57, an apparatus 251 for fine pattern formation comprises: a silicon substrate 252; three main electrodes 256a, 256b, 246c which are electrically independently of one another and are provided on the surface 252A side of the silicon substrate 252; a support member 258; a counter electrode 257 provided on the back surface 252B side of the silicon substrate 252 while leaving a predetermined space between the main electrodes and the counter electrode; three ink passages 259a, 259b, 259c provided within the silicon substrate 252 and within the support member 258; and ink supplying devices 260a, 260b, 260c connected respectively to the ink passages.

The silicon substrate 252 is provided with a plurality of fine holes 253 which extend through the silicon substrate 252 from the surface 252A side of the silicon substrate 252 to the back surface 252B side of the silicon substrate 252, and openings 253a on the surface 252A side of the fine holes 253 each are exposed within any one of the three ink passages 259a, 259b, 259c provided in a groove form on the surface 252A side. The silicon substrate 252 may be formed of the same material as the silicon substrate 202, and the thickness of the silicon substrate 252 may also be set in the same range as the silicon substrate 202.

A plurality of fine holes 253 are arranged on an identical line along a predetermined direction (a direction indicated by an arrow a in FIG. 57(B)). A plurality of these lines are provided at pitch P. In the embodiment shown in the drawing, six fine hole lines 253A, 253B, 253C, 253D, 253E, 253F, in each of which a plurality of fine holes are arranged along a direction indicated by the arrow a, are provided at pitch P. The transverse sectional form, the longitudinal sectional form, the opening diameter, and the pitch of the fine holes 253 may be properly set in the same manner as in the fine holes 203. The silicon oxide layer 254 provided on the wall surface of the fine holes 253 may also be the same as the silicon oxide layer 204. In the embodiment shown in the drawing, for example, the opening diameter, the number, and the pitch of the fine holes 253 provided with the silicon oxide layer 254 have been simplified for facilitating the explanation of the construction of the apparatus.

The main electrodes 256a, 256b, 256c are provided so as to surround the fine hole lines 253A, 253B, 253C, 253D, 253E, 253F. Specifically, the main electrode 256a surrounds the fine hole lines 253A and 253D, the main electrode 256b surrounds the fine hole lines 253B and 253E, and the main electrode 256c surrounds the fine hole lines 253C and 253F. These three main electrodes 256a, 256b, 256c are electrically independent of one another. These main electrodes 256a, 256b, 256c are formed of a conductive thin film of aluminum, copper, chromium, gold, silver, silicon or the like and may generally be provided on the silicon substrate 252 side through an electrically insulating thin film of polyimide or the like. The main electrodes may not be electrically independent of one another, and a common electrode may be adopted.

The counter electrode 257 may be in an electrically grounded or floating state. In order to write finer lines, the grounded state is preferred. In the embodiment shown in the drawing, the counter electrode 257 is in an electrically grounded state and, when a predetermined voltage has been applied to the main electrodes 256a, 256b, 256c, a electric field occurs between the counter electrode 257 and the main electrodes 256a, 256b, 256c. As with the counter electrode 207 in the apparatus 201 for fine pattern formation, the counter electrode 257 may be in various forms according to need.

The support member 258 is a plate member which is provided on the surface 252A side of the silicon substrate 252 to hold the silicon substrate 252, and ink passages 259c are provided in a groove form in the support member 258 on its silicon substrate 252 side.

Figure 58:
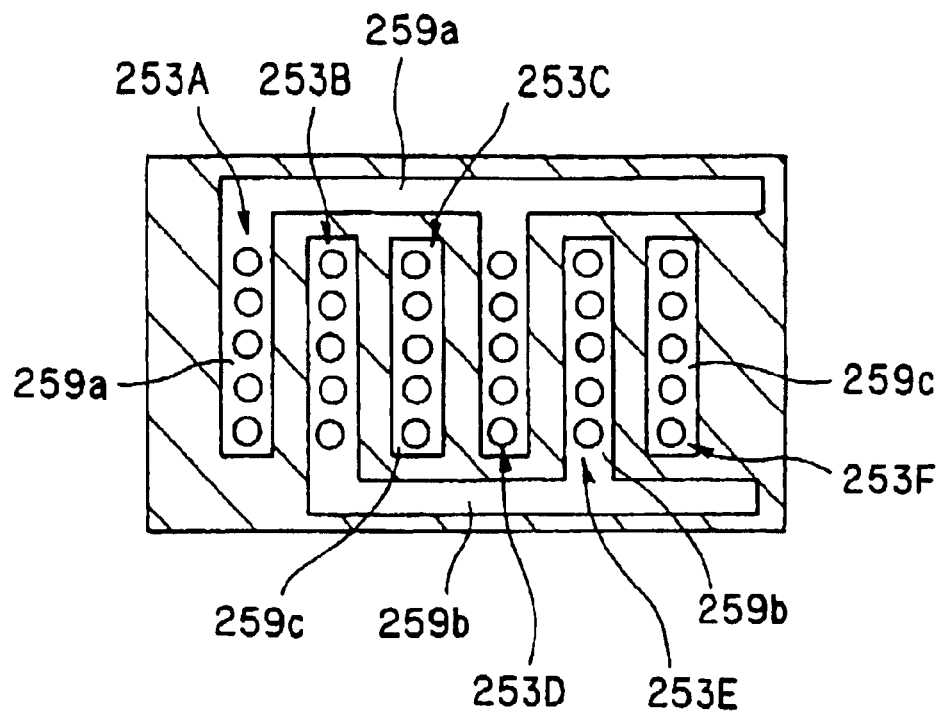
FIG. 58 is a transverse sectional view taken on line A—A of a support member in the apparatus for fine pattern formation shown in FIG. 57.
Figure 59:
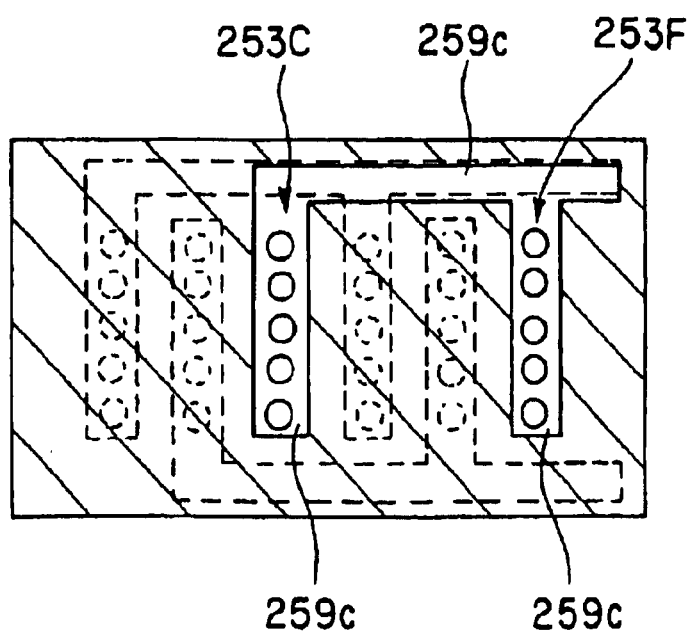
FIG. 59 is a transverse sectional view taken on line B—B of a support member in the apparatus for fine pattern formation shown in FIG. 57.

FIG. 58 is a transverse sectional view taken on line A—A of the silicon substrate 252 shown in FIG. 57(A), and FIG. 59 a transverse sectional view taken on line B—B of the support member 258 shown in FIG. 57(A).

As shown in FIG. 57(A) and FIG. 58, in the silicon substrate 252, an ink passage 259a in a groove form is provided so as to connect each of openings in fine hole lines 253A, 253D to the ink supplying device 260a, and an ink passage 259b in a groove form is provided so as to connect each of the openings in fine hole lines 253B, 253E to the ink supplying device 260b. Further, an ink passage 259c in a groove form is provided on each of the openings in fine hole lines 253C, 253F. Further, as shown in FIG. 57(A) and FIG. 59, in the support member 258, the ink passage 259c in a groove form is provided so as to connect each of the openings in the fine hole lines 253C, 253F to the ink supplying device 260c.

Figure 60:
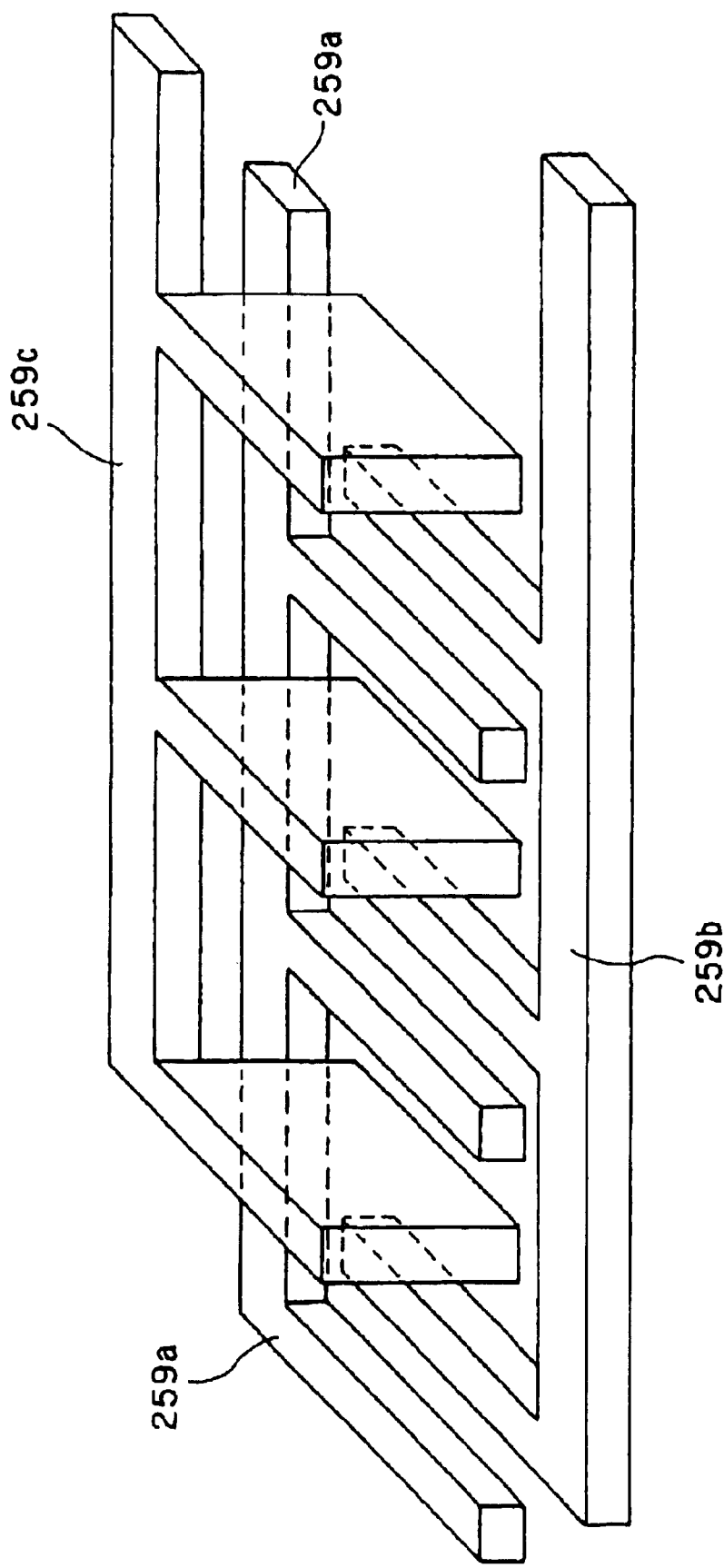
FIG. 60 is a perspective view showing ink passages in the apparatus for fine pattern formation shown in FIG. 7.

As shown in FIG. 60, three ink passages 259a, 259b, 259c provided between the support member 258 and the silicon substrate 252 are independent of one another. As with the support member 208, the support member 258 is preferably formed of a material having a coefficient of linear expansion in the range of one-tenth of the coefficient of linear expansion of the silicon substrate 252 to 10 times the coefficient of linear expansion of the silicon substrate 252.

The ends of the ink passages 259a, 259b, 259c are connected respectively to the ink supplying devices 260a, 260b, 260c. The ink supplying devices 260a, 260b, 260c are not particularly limited, and any of a continuous supply pump, a constant rate supply pump and the like may be used as the ink supplying device and may be properly selected according to the application of the apparatus 251 for fine pattern formation.

In the above apparatus 251 for fine pattern formation according to the present invention, since a combination of an electric field, formed between the main electrodes 256a, 256b, 256c and the counter electrode 257, with the pressure of ink for supply from the ink supplying devices 260a, 260b, 260c is used as ink ejection means, ink can be ejected through the fine holes 253 in the silicon substrate 252 in a very small amount at low ink supply pressure with high accuracy.

When ink is present in the ink supply space, the formation of the electric field suffices for the ejection of the ink and, in this case, ink supply pressure is not required. The supply of different inks respectively from the ink supplying devices 260a, 260b, 260c permits a pattern to be formed by direct writing with a desired ink for each fine hole line grouped according to the ink passages 259a, 259b, 259c (a group consisting of fine hole lines 253A and 253D, a group consisting of fine hole lines 253B and 253E, and a group consisting of fine hole lines 253C and 253F), and is particularly advantageous for the formation of a stripe pattern by the method for pattern formation according to the present invention which will be described later. The width and amount of ink ejected through the fine holes 253 can be regulated by varying the strength of field formed between the main electrodes 256a, 256b, 256c and the counter electrode 257. Therefore, ink can be ejected through the fine holes 253 having a predetermined opening diameter in desired ink ejection width and amount.

Further, the amount of ink ejected can be set as desired by controlling the ink supplying devices 260a, 260b, 260c to vary the amount of ink supplied. Furthermore, the width and amount of ink ejected through the fine holes 253 can be regulated by varying both the strength of field and the ink supply pressure. Furthermore, the apparatus 253 for fine pattern formation does not comprise a plurality of apparatuses for respective inks which have been joined to each other or one another. Therefore, the positional accuracy of each of the fine hole lines is very high.

Also in the apparatus 253 for fine pattern formation, the nozzles as shown in FIG. 50 may be provided so as to be protruded from the openings 253b of the fine holes 253 on the back surface 252B side of the silicon substrate 252. In this case, a reinforcing layer like the reinforcing layer 215' may be formed on the nozzles.

Further, also in the apparatus 253 for fine pattern formation, the openings 253a on the surface 252A side of the fine holes 253 may be in a tapered concave form or a multistaged concave form as described above. This can reduce the passage resistance of ink and can realize the ejection of a higher-viscosity ink through the plurality of fine holes 253 in a very small amount with high accuracy.

(Seventh Embodiment)

Figure 61:
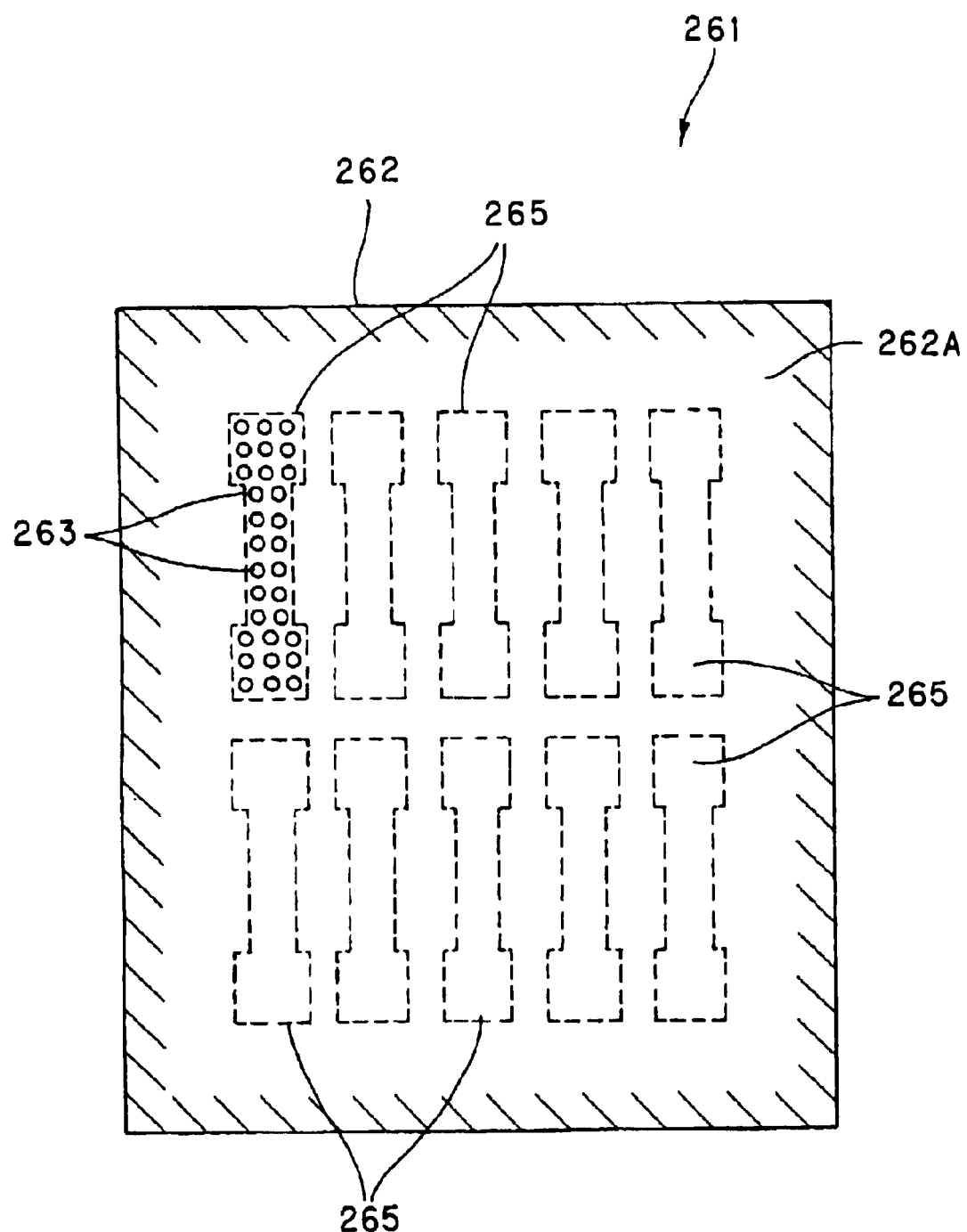
FIG. 61 is a plan view showing a still further embodiment of the apparatus for fine pattern formation according to the present invention.

FIG. 61 is a plan view showing a further embodiment of the apparatus for fine pattern formation according to the present invention. In FIG. 61, an apparatus 261 for fine pattern formation comprises: a silicon substrate 262; a main electrode provided on the surface 262A side of the silicon substrate 262; a support member; a counter electrode provided on the back surface side of the silicon substrate 262 while leaving a predetermined space between the main electrode and the counter electrode; an ink passage for supplying ink to a space between the silicon substrate 262 and the support member; and an ink supplying device connected to the ink passage. In FIG. 61, however, only the silicon substrate 262 is shown, and the main electrode, the counter electrode, the support member, the ink passage, and the ink supplying device are not shown.

The silicon substrate 262 has a plurality of fine holes 263 which extend through the silicon substrate 262 from the surface 262A side of the silicon substrate 262 to the back surface side of the silicon substrate 262. The fine holes 263 are provided at positions such that the fine holes 263 constitute one pattern 265, and a plurality of patterns 265 (10 patterns in the embodiment shown in the drawing) are provided on the silicon substrate 262. In the drawing, the fine holes 263 are shown in only one pattern 265, and, for the other patterns 265, only the outline is indicated by a chain line.

The silicon substrate 262 may be formed of the same material as used in the silicon substrate 202, and the thickness of the silicon substrate 262 also may be set in the same range as in the silicon substrate 202. The transverse sectional form, the longitudinal sectional form, the opening diameter, and the pitch of the fine holes 263 may be properly set in the same manner as in the fine holes 203. The fine holes 263 may have a silicon oxide layer on their wall surface, and this silicon oxide layer also may be the same as the silicon oxide layer 204.

The main electrode is provided on the surface 262A side of the silicon substrate 262 so as to surround each pattern 265. In this case, the main electrode surrounding the patterns 265 may be electrically independent for each pattern, or alternatively a common electrode may be adopted. The main electrode is formed of a conductive thin film of aluminum, copper, chromium, gold, silver, silicon or the like and may generally be provided on the silicon substrate 262 side through an electrically insulating thin film of polyimide or the like.

The counter electrode is in an electrically grounded state and functions to apply an electric field to the fine holes 263 upon the application of a predetermined voltage to the main electrode. The counter electrode may be the same as that adopted in the apparatus 201 for fine pattern formation.

Further, in the silicon substrate 262, a support member having, on its periphery, a flange portion as described above in connection with the support member 208 may be provided, and the flange portion in the support member may be fixed to the peripheral portion (a shaded region in FIG. 61). The ink supply passage may be connected to the opening of the support member, and the ink supplying device may be connected to the other end of the ink supply passage.

In the above apparatus 261 for fine pattern formation, since a combination of an electric field, formed between the main electrode and the counter electrode, with an ink supply pressure from the ink supplying device is used as ink ejection means, ink can be ejected in a very small amount with high accuracy at a low ink supply pressure through the fine holes 263 in the silicon substrate 262. When ink is present in the ink supply space, the formation of the electric field suffices for the ejection of the ink and, in this case, ink supply pressure is not required. A pattern in a form corresponding to the pattern 265 can be stably formed on a pattern object with high accuracy by ejecting ink from the fine holes 263 in the silicon substrate 262 in a suitable amount such that inks ejected from mutually adjacent fine nozzles 263 come into contact with each other on the pattern object to directly write a pattern. The amount of the ink ejected can be regulated by controlling the ink supplying device.

In the above embodiment, all the plurality of patterns 265 are in an identical form. However, the present invention is not limited to this only. For example, the pattern may be in a desired form, such as a conductor pattern for a printed wiring board.

Also in the apparatus 261 for fine pattern formation, nozzles as shown in FIG. 50 may be provided in a protruded form on the openings in the fine holes 263 on the back surface side of the silicon substrate 262. In this case, a reinforcing layer like the reinforcing layer 215' may be formed on the nozzles.

Further, also in the apparatus 261 for fine pattern formation, the openings on the surface 262A side of the fine holes 263 may be tapered or multistaged concaves as described above. This can reduce the passage resistance of ink, and, consequently, an ink having higher viscosity can be ejected through the plurality of fine holes 263 in a very small amount with high accuracy.

The above-described apparatus for fine pattern formation according to the present invention can be applied, for example, to the formation of a black matrix pattern or a color pattern for liquid crystal displays, the formation of a phosphor layer for plasma displays, and the formation of a pattern in electroluminescence, as well as to conductor pattern formation of printed wiring boards.

The ink used may be selected by taking into consideration properties such as electric conductivity and viscosity. For example, the ink preferably has an electric conductivity in the range of $1\times10^{-12}$ S/cm to $1\times10^{-4}$ S/Ω·cm and a viscosity of 0.3 to 50000 mpa.s (cps).

III-2 Embodiments of Production of Apparatus for Fine Pattern Formation

Next, an embodiment of the production of the apparatus for fine pattern formation according to the present invention will be described by taking the apparatus 211 for fine pattern formation shown in FIG. 50 as an example with reference to FIGS. 62 and 63.

At the outset, a silicon substrate 212 having a cleaned surface is oxidized in a thermal oxidation furnace to form an about 1 to 2 μm-thick silicon oxide film 212' on the whole area of the silicon substrate 212 (FIG. 62(A)). The silicon oxide film 212' may be formed by wet oxidation.

Next, a photosensitive resist is coated on one surface of the silicon substrate 212, and exposure through a predetermined photomask and development are carried out to form a resist pattern R (FIG. 62 (B)). Next, the silicon oxide film 212' is patterned, for example, with BHF 16 (a 22% aqueous ammonium monohydrodifluoride solution) using this resist pattern R as a mask (FIG. 62(C)). This patterning may also be carried out by dry etching using RIE (reactive ion etching) (process gas: $CHF_3$). In this patterning, the silicon oxide film 212' in its site, on which the resist pattern R has not been provided, is removed.

Next, fine holes 213 are formed in the silicon substrate 212 to a desired depth using the patterned silicon oxide film 212' as a mask (FIG. 62(D)). The fine holes 213 may be formed, for example, by high aspect etching, such as dry deep etching, for example, by ICP-RIE (inductively coupled plasma-reactive ion etching), or wet etching, FIB processing, laser processing, or electric discharge machining. The fine holes 213 are formed to a predetermined depth such that the holes do not yet completely pass through the silicon substrate 212.

Next, the resist pattern R and the silicon oxide film 212' are removed, and oxidation is again carried out in a thermal oxidation furnace to form an about 5000 to 10000 angstrom-thick silicon oxide layer 214 on the whole area of the silicon substrate 212 (FIG. 62(E)).

Next, a main electrode 216 is formed on the surface 212A side of the silicon substrate 212 so as to surround the fine holes 213. The main electrode may be formed, for example, by a method a metallic foil having a predetermined shape is fixed through a polyimide resin, by a method wherein a multilayered film of an insulating thin film/metallic thin film is formed by a vacuum process, such as sputtering and then patterned by photolithography, or a method wherein a multilayered film is formed by a vacuum process through a metallic mask, a silicon mask or the like having a desired opening pattern. Thereafter, the support member 218 in its flange portion 218b is fixed onto the peripheral portion on the surface side (on the fine hole formed side) of the silicon substrate 212 (FIG. 63(A)). This fixation may be carried out, for example, by anodic bonding or epoxy adhesive.

Next, only the outer surface side of the silicon substrate 212 is immersed in BHF 16 to remove the silicon oxide layer 214 in this site and thus to expose the back surface of the silicon substrate 212. Thereafter, etching is carried out with TMAH (tetramethylammonium hydroxide) from the back surface side of the silicon substrate 212 (FIG. 63 (B)). In this etching, since the silicon oxide layer 214 provided on the inner wall of the fine holes 213 is resistant to TMAH, fine tubes formed of the silicon oxide layer 214 are protruded on the silicon substrate 212 side.

Next, the front end of the fine tubes formed of the silicon oxide layer 214 is dissolved and removed with BHF 16 to form openings (FIG. 63(C)). Thereafter, the back surface side of the silicon substrate 212 is again etched with TMAH. When nozzles 215 formed of the silicon oxide layer 214 having a predetermined length have been formed, etching with TMAH is completed (FIG. 63(D)). An ink supplying device is then connected to the opening 218c of the support member 218 through the ink passage, and a counter electrode 217 is then disposed on the back surface side of the silicon substrate 212 while leaving a predetermined space between the main electrode and the counter electrode. Thus, the apparatus 211 for fine pattern formation according to the present invention as shown in FIG. 50 can be prepared.

Besides etching with TMAH, dry process by RIE (reactive ion etching) may also be used for the etching of the back surface side of the silicon substrate 212.

Further, in the above embodiment, a silicon oxide film 212' is formed. Instead of the silicon oxide film, a thin film of aluminum may be formed by sputtering or the like for the preparation of the apparatus for fine pattern formation. In this case, in the above step of patterning (FIG. 62(C)), an aluminum etchant (mixed acid aluminum) may be used.

The apparatus 201 for fine pattern formation as shown in FIG. 48 may be produced by forming fine holes 213 so as to pass through the silicon substrate 212 by a process corresponding to FIG. 62(D), or by dissolving and removing protruded fine tubes formed of a silicon oxide layer 214 with hydrofluoric acid by a process corresponding to FIG. 63(C).

Figure 64:
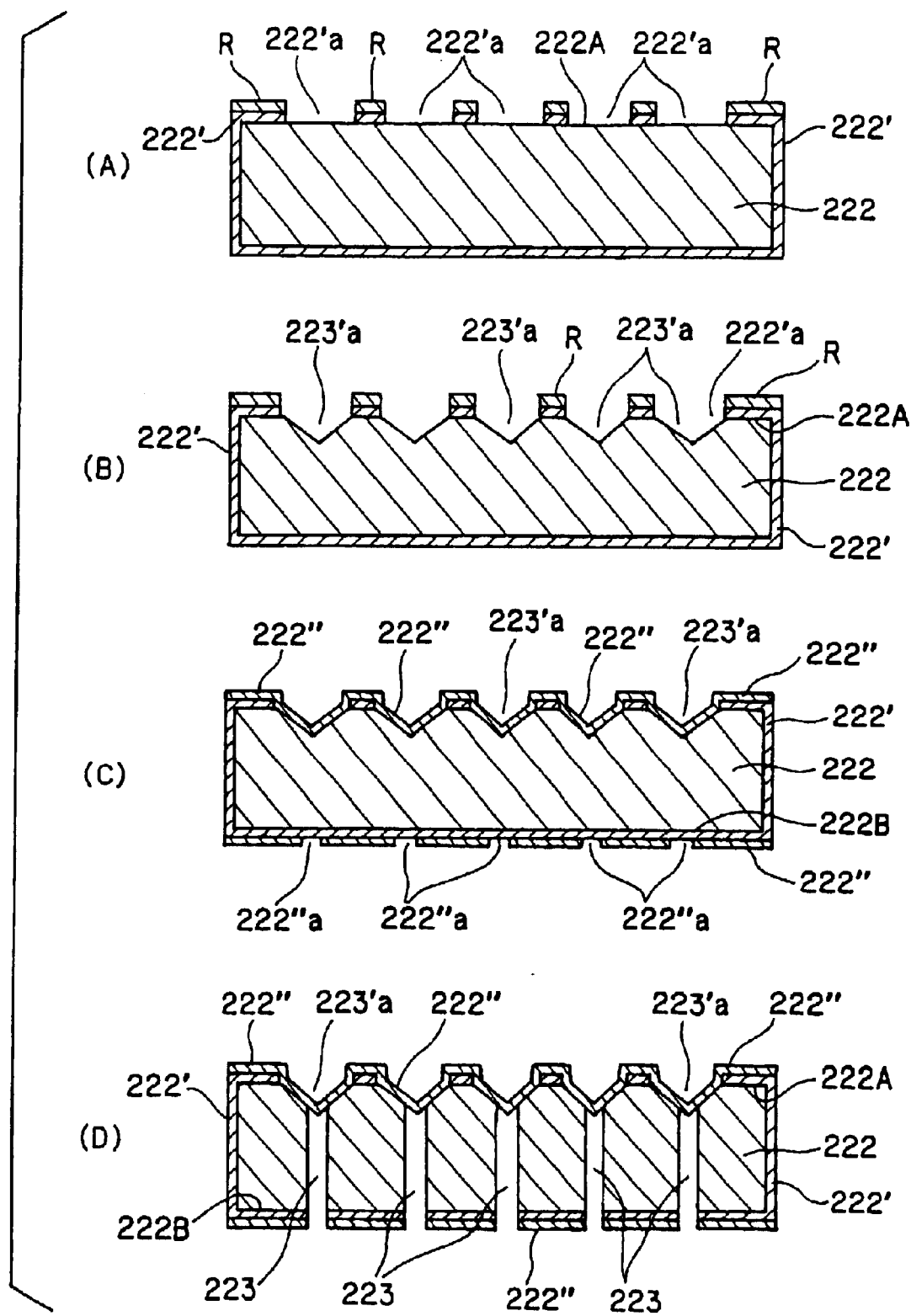
FIG. 64 is a process diagram showing another embodiment of the production of the apparatus for fine pattern formation according to the present invention.
Figure 65:
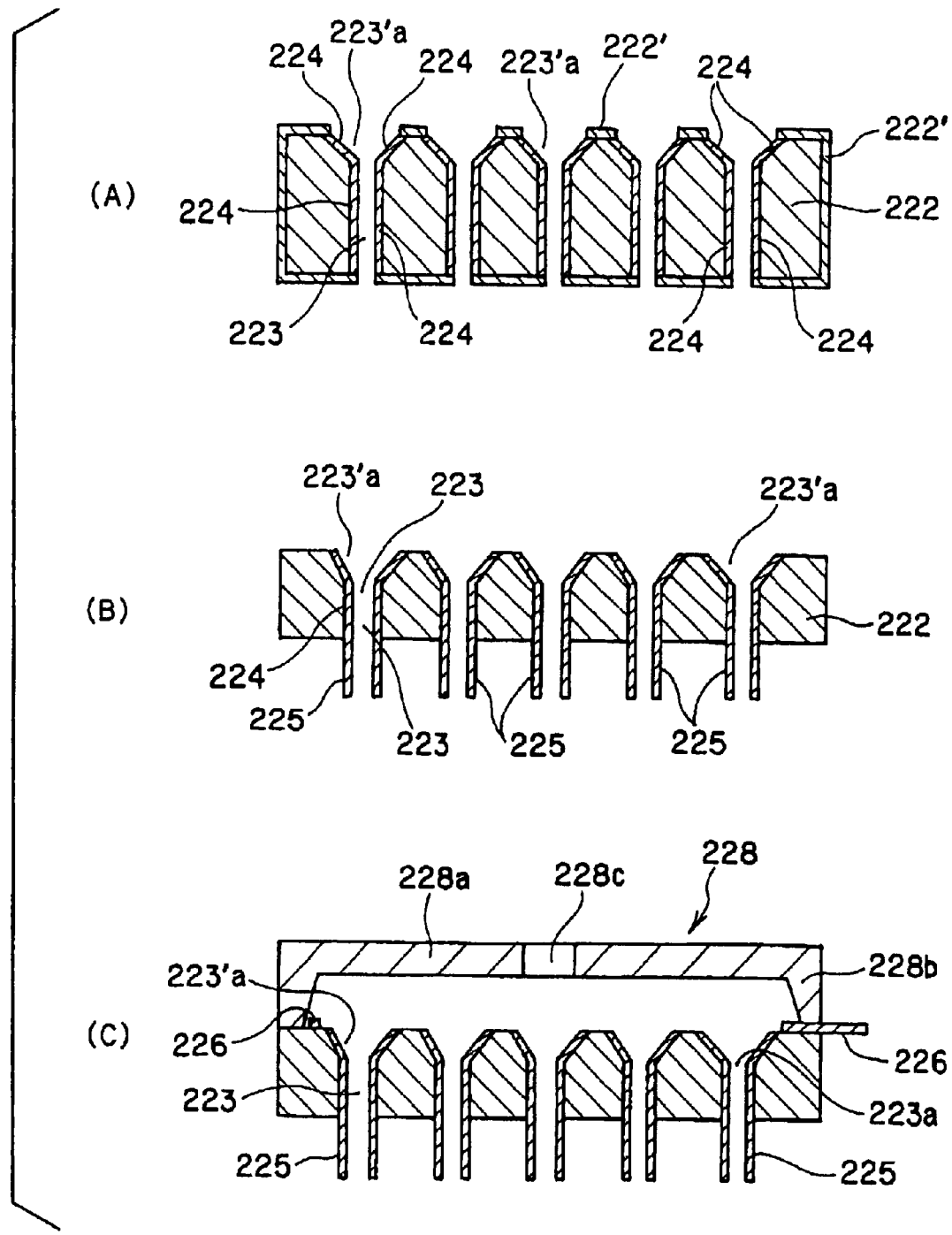
FIG. 65 is a process diagram showing still another embodiment of the production of the apparatus for fine pattern formation according to the present invention.

Another embodiment of the production of the apparatus for fine pattern formation according to the present invention will be described by taking the apparatus 221 for fine pattern formation shown in FIG. 53 as an example with reference to FIGS. 64 and 65.

At the outset, the surface of a silicon substrate 222 having <100> crystallographic orientation is cleaned, and an about 200 to 3000 angstrom-thick silicon nitride ($Si_3N_4$) layer 222' is formed on the whole area of the silicon substrate 222.

A photosensitive resist is then coated on the silicon nitride layer 222' in its portion located on the surface 222A side of the silicon substrate 222, and exposure through a predetermined photomask and development are carried out to form a resist pattern R. Subsequently, the silicon nitride layer 222' is etched by RIE (reactive ion etching (process gas: $CF_4$ or $SF_6$)) using the resist pattern R as a mask to form a pattern having openings 222'a for taper (FIG. 64(A)). The silicon nitride layer 222' may be formed, for example, by low pressure CVD. The depth, opening diameter, and shape of tapered concaves 223'a, which will be described later, are determined by the size and shape of the openings 222'a for taper in the silicon nitride layer 222'. In general, the size of the opening for taper is preferably set in the range of 10 to 200 μm. The shape of the opening for taper may be properly selected from square, circle and the like.

Next, the silicon substrate 222 is subjected to crystallographically anisotropic etching with an aqueous potassium hydroxide solution using the silicon nitride layer 222' as a mask. In this etching, the silicon substrate 222 in its portions exposed to the openings 222'a for taper is etched in the direction of depth so that <111> crystallographic orientation appears. This etching is preferably carried out, for example, until the apex of inverted quadrangular pyramid tapered openings is closed (i.e., until inverted quadrangular pyramid concaves are completely formed). As a result, tapered concaves 223'a are formed on the surface 222A side of the silicon substrate 222 (FIG. 64(B)).

Next, the resist pattern R is removed, and a mask thin film 222" is formed on the surface 222A side and the back surface 222B side of the silicon substrate 222. The mask thin film 222" on the back surface 222B side of the silicon substrate 222 remote from the tapered concaves 223'a is then patterned to form fine openings 222"a (FIG. 64(C)). This fine opening 222"a is formed so that the center of the opening substantially conforms to the center (apex) of the tapered concave 223'a through the silicon substrate 222. The diameter of openings in fine holes 223 and fine nozzles 225, which will be described later, is determined by the size of the fine openings 222"a. In general, the size of the fine openings 222"a is preferably set in the range of 1 to 100 μm.

In addition to a metallic thin film, a resist, a thin film of silicon oxide or a combination of both the materials (resist/thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Next, through fine holes 223 are formed in the silicon substrate 222 by deep etching using the mask thin film 222" as a mask from the back surface 222B side of the silicon substrate 222 (FIG. 64(D)). The formation of the through fine holes 223 may be carried out, for example, by a high aspect etching technique, such as dry etching or deep etching, for example, by an ICP-RIE (inductively coupled plasma-reactive ion etching). In this deep etching, as soon as the through fine holes 223 extended to the interior of the tapered concaves 223'a, the mask thin film 222" (mask thin film 222" within the tapered concaves 223'a) formed on the surface 222A side of the silicon substrate 222 functions as a stopping layer. This can eliminate the need to control the depth of the fine holes 223 formed and can render the process simple. Further, in particular, dry etching by ICP-RIE can significantly shorten the time necessary for the formation of the through fine holes 223.

Next, the mask thin film 222" is removed, and oxidation is carried out in a thermal oxidation furnace to form an about 5000 to 10000 angstrom-thick silicon oxide layer 224 on the wall surface of the through fine holes 223 and on the wall surface of the tapered concaves 223'a (FIG. 65(A)).

Next, the silicon nitride layer 222' is removed, and dry etching is carried out from the back surface 222B side of the silicon substrate 222 remote from the tapered concaves 223'a. In this dry etching, a part of the silicon substrate 222 is etched to expose the silicon oxide layer 224 formed on the inner wall of the through fine holes 223. When this silicon oxide layer 224 has been exposed by a desired length, the dry etching is stopped to prepare nozzles 225 formed of silicon oxide protruded on the etching side of the silicon substrate 222 (FIG. 65(B)).

Although the Bosch process utilizing an ICP-RIE device has been used in the above high aspect etching, the etching method is not limited to this only.

Next, a main electrode 226 is formed on the surface 222A side of the silicon substrate 222 so as to surround the tapered concaves 223'a. The main electrode may be formed, for example, by a method wherein a metallic foil having a predetermined shape is fixed through a polyimide resin, by a method wherein a multilayered film of an insulating thin film/metallic thin film is formed by a vacuum process, such as sputtering and then patterned by photolithography, or a method wherein a multilayered film is formed by a vacuum process through a metallic mask, a silicon mask or the like having a desired opening pattern.

Subsequently, the support member 228 in its flange portion 228b is fixed onto the peripheral portion on the surface side (on the fine hole formed side) of the silicon substrate 222 (FIG. 65(C)). This fixation may be carried out, for example, by anodic bonding or epoxy adhesive. Thereafter, an ink supplying device is connected to the opening 228c of the support member 228 through the ink passage, and a counter electrode 227 is then disposed on the back surface side of the silicon substrate 222 while leaving a predetermined space between the main electrode and the counter electrode. Thus, the apparatus 221 for fine pattern formation according to the present invention as shown in FIG. 53 can be prepared.

Figure 66:
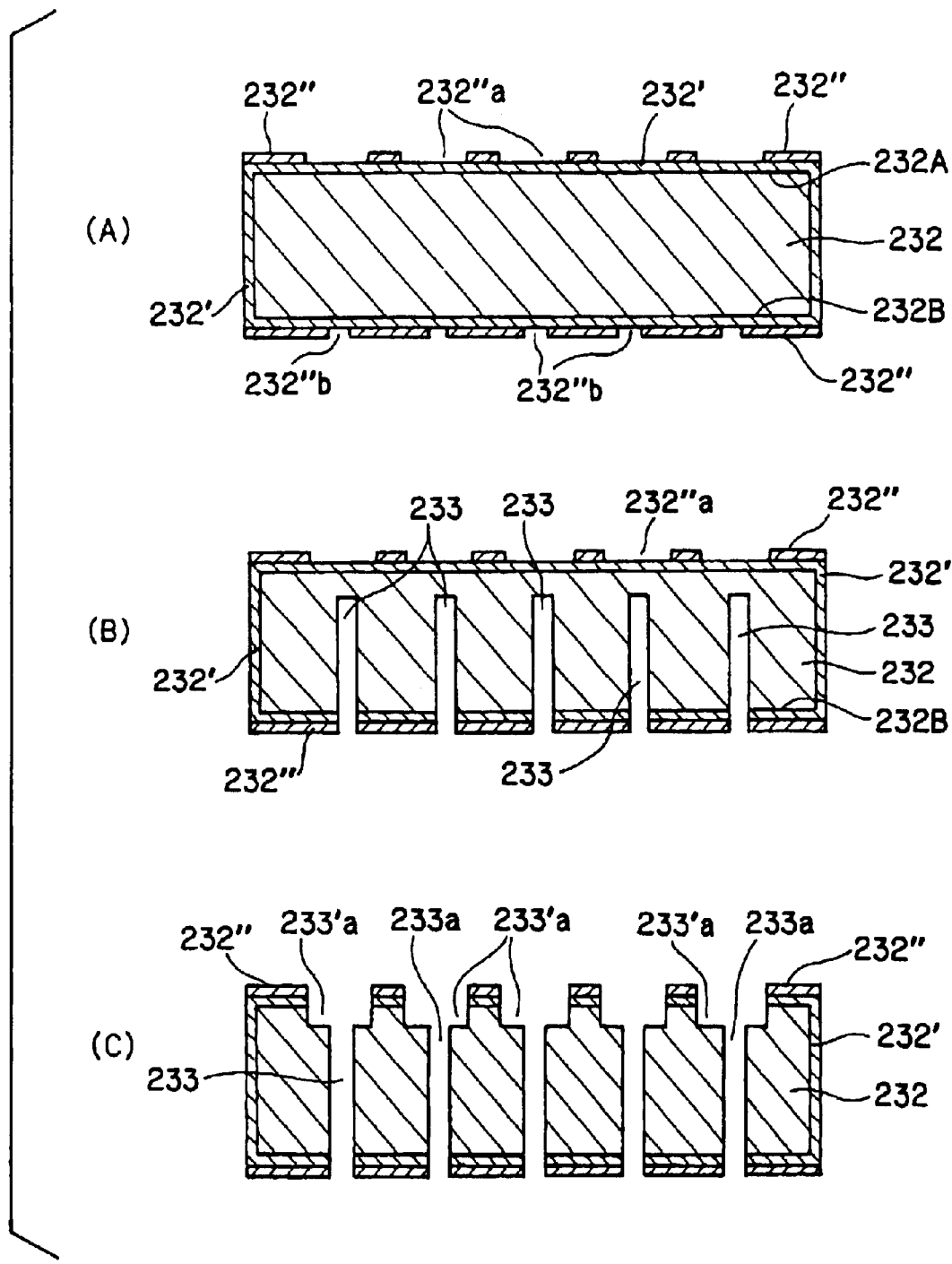
FIG. 66 is a process diagram showing a further embodiment of the production of the apparatus for fine pattern formation according to the present invention.

A further embodiment of the production of the apparatus for fine pattern formation according to the present invention will be described by taking the apparatus 231 for fine pattern formation shown in FIG. 54 as an example with reference to FIGS. 66 and 67.

At the outset, an about 200 to 3000 angstrom-thick silicon nitride ($Si_3N_4$) layer 232' is formed on the whole area of the silicon substrate 232 having a cleaned surface. Next, a mask thin film 232" is formed on both surfaces of the silicon nitride layer 232', and the mask thin film 232" in its portion located on the surface 232A side of the silicon substrate 232 is patterned to form a mask pattern having wide openings 232"a. The mask thin film 232" in its portion located on the back surface 232B side of the silicon substrate 232 is patterned to form a mask pattern having fine openings 232"b (FIG. 66(A)). The center of the wide opening 232"a is set so as to substantially conform to the center of the fine opening 232"b through the silicon substrate 232.

The opening diameter of multistaged wide concaves 233'a, which will be described later, is determined by the size and shape of the wide opening 232"a. In general, the size of the wide opening is preferably set in the range of 5 to 200 μm. Further, the diameter of openings in fine holes 233 and fine nozzles 235, which will be described later, is determined by the size of the fine openings 232"b. In general, the size of the fine openings is preferably set in the range of 1 to 100 μm.

The silicon nitride layer 232' may be formed in the same manner as used in the formation of the silicon nitride layer 222'.

In addition to a metallic thin film, a resist, a thin film of silicon oxide or a combination of both the materials (resist/thin film of silicon oxide) may be used as the mask thin film. Metallic thin films include thin films of aluminum, nickel, chromium and the like, and, preferably, the metallic thin film is formed to a thickness of about 1000 to 2000 angstroms, for example, by sputtering or vacuum vapor deposition. For example, when aluminum is used as the metallic thin film, an aluminum etchant (mixed acid aluminum) may be used in the etching. Further, when the resist is formed as the mask thin film, spin coating may be used. In the case of silicon oxide, the thin film can be formed by sputtering or low pressure CVD.

Fine holes 233 are then formed by deep etching using the mask pattern having the fine openings 232"b as a mask from the back surface 232B side of the silicon substrate 232 (FIG. 66(B)). The fine holes 233 may be formed, for example, by a high aspect etching technique, such as a Bosch process using an ICP-RIE (inductively coupled plasma-reactive ion etching) device. The formation of the fine holes 233 is continued until the depth reaches a predetermined level such that the fine holes 233 do not yet completely pass through the silicon substrate 232. In the present invention, in order to facilitate the regulation of the depth of the fine holes 233, an SOI (silicon on insulator) wafer may be used as the silicon substrate 232. The SOI wafer has a multilayer structure comprising a silicon oxide thin film sandwiched between single crystal silicons. The silicon oxide thin film functions as a stopping layer in the deep etching. This can eliminate the need to control the depth in the formation of the fine holes 233. When an SOI wafer having a multilayer structure, in which two silicon oxide thin films are sandwiched between single crystal silicons, is used, multistaged openings, of which the number of stages is larger, can be formed.

Next, wide concaves 233'a are formed from the surface 232A side of the silicon substrate 232 by deep etching using the mask pattern having wide openings 232"a as a mask (FIG. 66(C)). The wide concaves 233'a can be formed, for example, by a high aspect etching technique, such as a Bosch process using an ICP-RIE (inductively coupled plasma-reactive ion etching) device. The formation of the wide concaves 233'a is continued until the openings of the fine holes 233 appear within the wide concaves 233'a.

Next, the mask thin film 232" is removed, and oxidation is carried out in a thermal oxidation furnace to form an about 5000 to 10000 angstrom-thick silicon oxide layer 234 on the wall surface of the fine holes 233 and on the wall surface of the wide concaves 233'a (FIG. 67(A)).

Next, the silicon nitride layer 232' is removed, and dry etching is carried out from the back surface 232B side of the silicon substrate 232 remote from the wide concaves 233'. In this dry etching, a part of the silicon substrate 232 is etched to expose the silicon oxide layer 234 formed on the inner wall of the through fine holes 233. When this silicon oxide layer 234 has been exposed by a desired length, the dry etching is stopped to prepare nozzles 235 formed of silicon oxide protruded on the etching side of the silicon substrate 232 (FIG. 67(B)).

Although the Bosch process utilizing an ICP-RIE device has been used in the above high aspect etching, the etching method is not limited to this only.

Next, a main electrode 236 is formed on the surface 232A side of the silicon substrate 232 so as to surround the concaves 233'a. The main electrode may be formed, for example, by a method wherein a metallic foil having a predetermined shape is fixed through a polyimide resin, by a method wherein a multilayered film of an insulating thin film/metallic thin film is formed by a vacuum process, such as sputtering and then patterned by photolithography, or a method wherein a multilayered film is formed by a vacuum process through a metallic mask, a silicon mask or the like having a desired opening pattern.

Thereafter, the support member 238 in its flange portion 238b is fixed onto the peripheral portion on the surface side (on the fine hole formed side) of the silicon substrate 232 (FIG. 67(C)). This fixation may be carried out, for example, by anodic bonding or epoxy adhesive. Thereafter, an ink supplying device is then connected to the opening 238c of the support member 238 through the ink passage, and a counter electrode 237 is then disposed on the back surface side of the silicon substrate 232 while leaving a predetermined space between the main electrode and the counter electrode. Thus, the apparatus 231 for fine pattern formation according to the present invention as shown in FIG. 54 can be prepared.

III-3 Method for Fine Pattern Formation
(First Embodiment)

Figure 68:
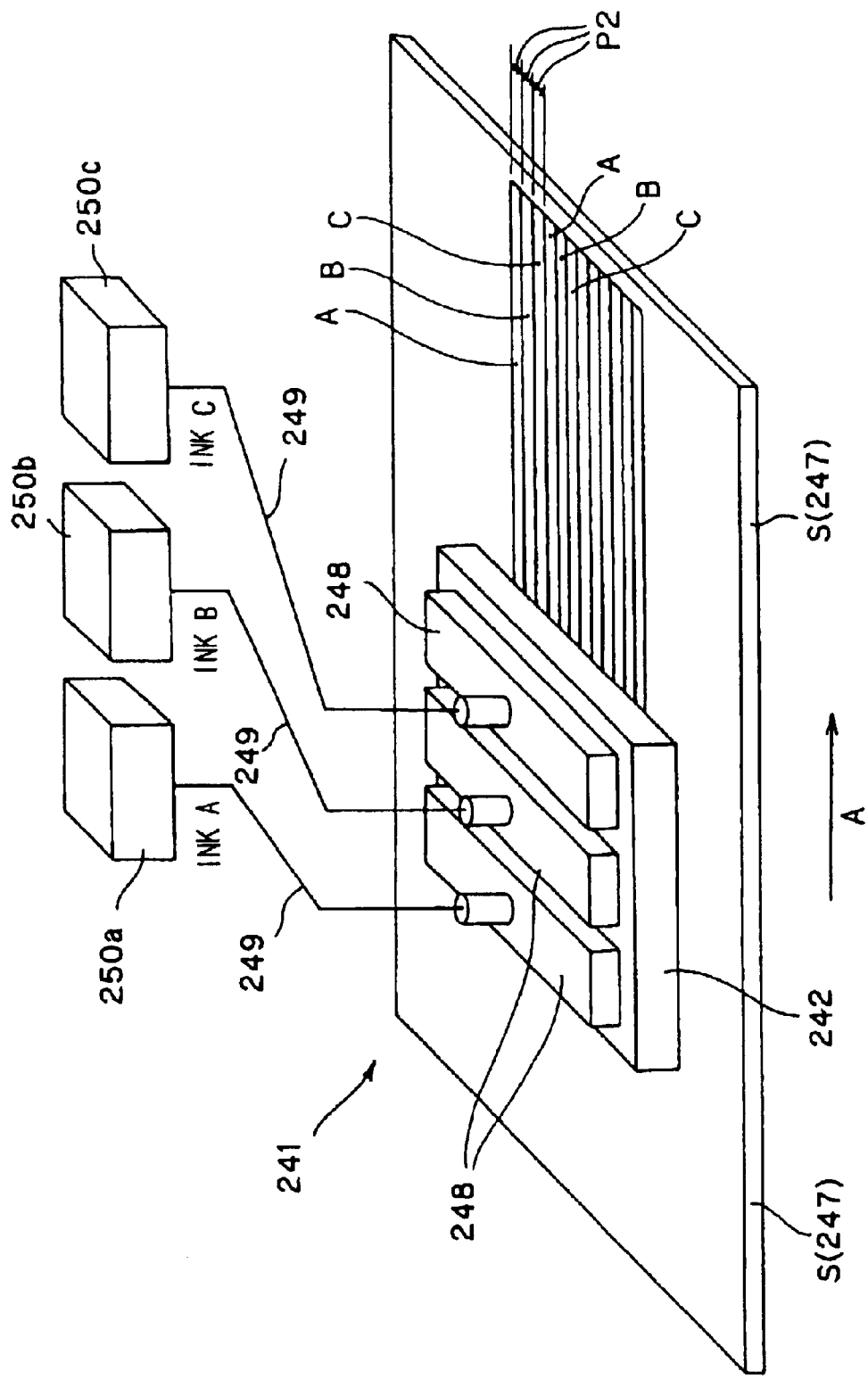
FIG. 68 is a perspective view showing one embodiment of the method for fine pattern formation according to the present invention.

FIG. 68 is a diagram illustrating one embodiment of the method for fine pattern formation according to the present invention using the apparatus 241 for fine pattern formation according to the present invention. In FIG. 68, while supplying ink A, ink B, and ink C respectively from the ink supplying devices 250a, 250b, 250c through the ink passages 249, in such as state that a predetermined voltage has been applied to the main electrodes 246a, 246b, 246c in the apparatus 241 for fine pattern formation according to the present invention, a pattern object S is scanned relative to the apparatus 241 for fine pattern formation in a predetermined direction (a direction indicated by an arrow A). The scanning direction A is identical to the arrangement direction A (see FIG. 56) of the fine holes in the apparatus 241 for fine pattern formation. In this case, the space between the silicon substrate 242 in the apparatus 241 for fine pattern formation and the pattern object S may be set in the range of about 50 to 500 μm.

In the embodiment shown in the drawing, the pattern object S at least in its surface is electrically conductive and serves also as a grounded counter electrode 247. A thin electrical insulator, such as paper or films, may also be used as a pattern object. In this case, for example, a substrate for mounting thereon the thin electrical insulator is used as a grounded counter electrode 247. The counter electrode 247 may be in an electrically grounded or floating state. In order to write finer lines, however, the grounded state is preferred.

According to this construction, inks ejected from the fine holes 243 in the silicon substrate 242 form, by direct writing, a stripe pattern comprising ink A, ink B, and ink C which have been repeatedly sequenced in that order on the pattern object S. In this case, the pitch of the stripes is P2. In this stripe pattern, since one stripe is formed of ink ejected from the plurality of fine holes on an identical line, even when the amount of ink ejected from the individual fine holes is small, the scanning speed of the pattern object S can be increased to increase the pattern formation speed. This stripe pattern is formed with very high accuracy by varying the diameter of the fine holes 243 or varying the strength of field formed between the main electrodes 246a, 246b 246c and the counter electrode 247 to regulate the ejection width of ink ejected through the fine holes 243, and the process is simpler than the conventional photolithography.

When the pattern object S is flexible, preferably, a back-up roller is disposed on the back surface of the pattern object S so as to face the apparatus 241 for fine pattern formation. In this case, the pattern object S is carried while applying tension to the pattern object S by the back-up roller to directly write a pattern on the pattern object S.

Further, in the method for fine pattern formation according to the present invention, a fine pattern may be formed by transferring a pattern, written on the counter electrode 247 by the above method, onto another pattern object.

(Second Embodiment)

Figure 69:
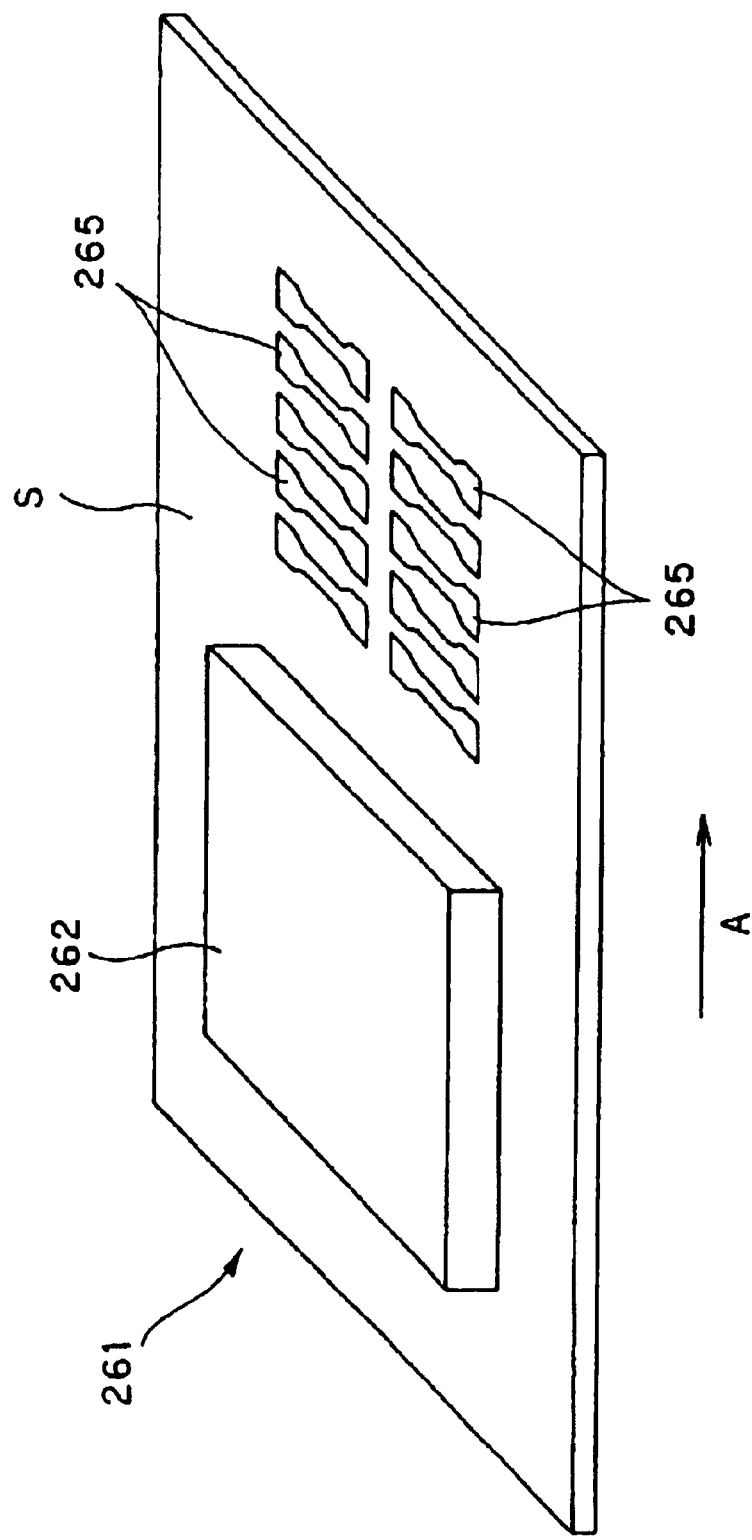
FIG. 69 is a perspective view showing another embodiment of the method for fine pattern formation according to the present invention.

FIG. 69 is a diagram illustrating a further embodiment of the method for fine pattern formation according to the present invention, wherein the apparatus 261 for fine pattern formation according to the present invention has been used. In FIG. 69, an apparatus 261 for fine pattern formation (in the embodiment shown in the drawing, only the silicon substrate 262 is shown) is disposed on a predetermined position of the pattern object S, and, while applying a predetermined voltage to the main electrode, a given amount of ink supplied from the ink passage is ejected through the fine holes 263 onto the pattern object to form a pattern. In the embodiment shown in the drawing, the pattern object S at least in its surface is electrically conductive and serves also as a grounded counter electrode. A thin electrical insulator, such as paper or films, may also be used as a pattern object S. In this case, for example, a substrate for mounting thereon the thin electrical insulator is used as a grounded counter electrode. The counter electrode may be in an electrically grounded or floating state. In order to write finer lines, however, the grounded state is preferred.

Thereafter, the pattern object S is carried by a predetermined distance in a direction indicated by an arrow A, and the same pattern formation as described above is carried out. A desired pattern 265 can be formed on the pattern object S by repeating the above procedure. The space between the silicon substrate 262 in the apparatus 261 for fine pattern formation and the pattern object S may be set in the range of about 50 to 500 μm.

Further, a printed wiring board can be simply produced without replying on photolithography, for example, by forming the pattern 265, formed of the plurality of fine holes 263 in the apparatus 261 for fine pattern formation, as a conductor pattern of a printed wiring board, and using a conductor paste as ink. In this case, a method may be adopted wherein an electrode in the frame form shown in FIGS. 49 and 51 is used as the main electrode and a printed wiring board is placed below the counter electrode followed by pattern formation.

In the method for fine pattern formation according to the present invention, a fine pattern may be formed by transferring a pattern, written on the counter electrode by the above method, onto another pattern object.

EXAMPLES

Next, the following examples further illustrate the present invention.

Example I-1

Production of Fine Nozzles

A silicon substrate having an RCA cleaned surface (diameter 3 in., thickness 200 μm, one side polished, crystallographic orientation <100>, coefficient of linear expansion=$2.6 \times 10^{-6}$/K) was provided. A silicon nitride layer was formed on the whole area of this silicon substrate by low pressure CVD to a thickness of 0.1 μm. Thereafter, a 0.2 μm-thick thin film of aluminum was sputtered on the silicon nitride layer located on one side of the silicon substrate.

Next, a photosensitive resist (Micro Posit S 1818, manufactured by Shipley) was coated on the thin film of aluminum, followed by exposure through a predetermined photomask and development to form a resist pattern. Thereafter, the thin film of aluminum was etched with an aluminum etchant (mixed acid aluminum) using the resist pattern as a mask, and the resist pattern was then removed to form a metal pattern in which 42 fine openings (circular openings having a diameter of 20 μm) are formed on an identical straight line at a pitch of 120 μm (first step).

Next, the silicon substrate was deeply etched by ICP-RIE (inductively coupled plasma-reactive ion etching) using the metal pattern as a mask to form through fine holes (diameter 20 μm) in the silicon substrate (second step).

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the through fine holes (third step).

(Conditions for Thermal Oxidation)

Heating temperature: 1050° C.

Hydrogen gas feed rate: 1 slm

Oxygen gas feed rate: 1 slm

Heating time: about 15 hr

Next, dry etching by ICP-RIE (inductively coupled plasma-reactive ion etching) was carried out from the silicon substrate on its surface where the metal pattern had been provided, thereby removing the silicon nitride layer. Further, the silicon substrate was etched, and the dry etching was stopped when the silicon oxide layer provided on the inner wall of the through fine holes was exposed by a length of 100 μm (fourth step).

Thus, fine nozzles formed of silicon oxide in communication with the fine holes of the silicon substrate were formed by the above steps on the etching side of the silicon substrate. The fine nozzles had an opening diameter of the front end portion of 19 μm in a variation within ±1 μm and were formed at a pitch of 120 μm with very high accuracy.

Measurement of Strength of Fine Nozzles

The silicon substrate was placed horizontally so that the axial direction of the fine nozzles was vertical. A universal bond tester PC-2400 manufactured by Dage was provided, and a shear testing load cell was disposed while keeping a distance of about 5 μm between the front end of the cell and the surface of the silicon substrate and was collided against three fine nozzles at the same time in the horizontal direction at a speed of 6 mm/min to break the fine nozzles. The strength at that time was measured and was found to be 0.16 g per nozzle.

Production of Apparatus for Fine Pattern Formation

Next, a support member of a polyether ether ketone resin, in which a flange portion and an opening had been formed, was fixed with the aid of an epoxy adhesive onto the silicon nitride layer on the peripheral portion of the surface of the silicon substrate (surface remote from the fine nozzles).

Next, an ink passage formed of a resin pipe was connected to the opening of the support member, and the other end of the resin pipe was connected to an ink supplying device (1500 XL, manufactured by EFD). Thus, an apparatus for fine pattern formation according to the present invention was prepared.

Formation of Fine Pattern

The ink supplying device was loaded with ink (Color Mosaic CR-7001, manufactured by Fuji Film Olin Co., Ltd.). This ink had a viscosity of 20 mpa.s. Further, a glass substrate (100 mm×100 mm) was provided as a pattern object.

Next, while scanning the glass substrate at a constant speed of 50 mm/sec in a direction in which the fine nozzles of the apparatus for fine pattern formation were arranged, ink was supplied from the ink supplying device to the silicon substrate, and ink was ejected through the fine nozzles to write a stripe pattern which was then dried. The stripes constituting the pattern had a line width of 25±1 μm and a line pitch of 25±1 μm, that is, were formed with very high accuracy.

Example I-2

Production of Fine Nozzles

A silicon substrate having an RCA cleaned surface (diameter 3 in., thickness 200 μm, one side polished, crystallographic orientation <100>, coefficient of linear expansion=$2.6 \times 10^{-6}$/K) was provided. A silicon nitride layer was formed on the whole area of this silicon substrate by low pressure CVD to a thickness of 0.1 μm.

Next, a photosensitive resist (Micro Posit S 1818, manufactured by Shipley) was coated on the silicon nitride layer, followed by exposure through a predetermined photomask and development to form a resist pattern. Thereafter, dry etching by RIE (reactive ion etching) was carried out using this resist pattern as a mask to form a pattern in which 42 small openings (circular openings having a diameter of 30 μm) were formed on an identical straight line at a pitch of 120 μm (first step).

Next, a 0.2 μm-thick thin film of aluminum was sputtered on the silicon nitride layer pattern. A photosensitive resist (Micro Posit S 1818, manufactured by Shipley) was coated on the thin film of aluminum, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern in which fine openings (circular openings having a diameter of 20 μm) are located in the center of the respective small openings (second step).

Next, the silicon substrate was deeply etched by ICP-RIE (inductively coupled plasma-reactive ion etching) using the metal pattern as a mask to form through fine holes (diameter 20 μm) in the silicon substrate (third step).

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the through fine holes and on the silicon substrate in its portions exposed within the small openings of the silicon nitride layer pattern (fourth step).

(Conditions for Thermal Oxidation)

Heating temperature: 1100° C.

Oxygen gas feed rate: 1 L/min

Heating time: about 5 hr

Next, dry etching by ICP-RIE (inductively coupled plasma-reactive ion etching) was carried out from the silicon substrate on its surface where the small openings of the silicon nitride layer pattern had been formed. In this dry etching, the silicon oxide layer functioned as a mask to form nozzle bases integrally with the silicon substrate, and the dry etching was stopped when the length of the nozzle bases reached 100 μm (fifth step).

Thus, fine nozzles comprising nozzle bases, an inner surface layer of silicon oxide in communication with the fine holes in the silicon substrate, and an end face layer of silicon oxide formed on the front end face of the nozzle bases were prepared by the above steps on the etching side of the silicon substrate. The fine nozzles had an opening diameter of the front end portion of 20 μm in a variation within ±1 μm and were formed at a pitch of 120 μm with very high accuracy. The wall thickness (5 μm) of the nozzle bases was provided as a difference in radius between the small openings and the fine openings.

Measurement of Strength of Fine Nozzles

The strength of the fine nozzles was measured in the same manner as in Example 1 and was found to be 0.68 g per nozzle. From this result and the result obtained in Example 1, it was confirmed that the provision of nozzle bases in the fine nozzles could contributed to a significant improvement in strength (about 4.3 times).

Production of Apparatus for Fine Pattern Formation

Next, a support member of a polyether ether ketone resin, in which a flange portion and an opening had been formed, was fixed with the aid of an epoxy adhesive on the peripheral portion of the surface of the silicon substrate (surface remote from the fine nozzles).

Next, an ink passage formed of a resin pipe was connected to the opening of the support member, and the other end of the resin pipe was connected to an ink supplying device (1500 XL, manufactured by EFD). Thus, an apparatus for fine pattern formation according to the present invention was prepared.

Formation of Fine Pattern

The ink supplying device was loaded with ink (Color Mosaic CR-7001, manufactured by Fuji Film Olin Co., Ltd.). This ink had a viscosity of 20 mpa.s. Further, a glass substrate (100 mm×100 mm) was provided as a pattern object.

Next, while scanning the glass substrate at a constant speed of 50 mm/sec in a direction in which the fine nozzles of the apparatus for fine pattern formation were arranged, ink was supplied from the ink supplying device to the silicon substrate, and ink was ejected through the fine nozzles to write a stripe pattern which was then dried. The stripes constituting the pattern had a line width of 25±1 μm and a line pitch of 25±1 μm, that is, were formed with very high accuracy.

Example I-3
Production of Fine Nozzles

A silicon substrate having an RCA cleaned surface (diameter 3 in., thickness 200 μm, one side polished, crystallographic orientation <100>, coefficient of linear expansion=$2.6 \times 10^{-6}$/K) was provided. A silicon nitride layer was formed on the whole area of this silicon substrate by low pressure CVD to a thickness of 0.1 μm.

Next, a photosensitive resist (Micro Posit S 1818, manufactured by Shipley) was coated on the silicon nitride layer, followed by exposure through a predetermined photomask and development to form a resist pattern. Thereafter, dry etching by RIE (reactive ion etching) was carried out using this resist pattern as a mask to form a pattern in which 42 openings for taper (square openings having a one side length of 70 μm) were formed on an identical straight line at a pitch of 120 μm. Further, a photosensitive resist was coated on the silicon nitride layer located on the back surface of the silicon substrate, for use as a mask for subsequent crystal anisotropic etching (first step).

Next, the surface of the silicon substrate was subjected to crystal anisotropic etching using the silicon nitride layer as a mask. This etching was carried out by immersing the substrate in a 33 vol % aqueous potassium hydroxide solution kept at 70 to 80° C. for about 50 min. As a result, inverted quadrangular pyramid concaves, which had a depth of 50 μm and had an angle of one side to the surface of the silicon substrate of 55 degrees, were formed in the silicon substrate in its portions exposed to openings for taper (second step).

Next, a 0.2 μm-thick thin film of aluminum was sputtered on both surfaces of the silicon substrate. A photosensitive resist (Micro Posit S 1818, manufactured by Shipley) was then coated on the thin film of aluminum in its portion located on the surface remote from the inverted quadrangular pyramid concaves, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern in which 42 fine openings (circular openings having a diameter of 20 μm) were formed on an identical straight line at a pitch of 120 μm. In this case, the metal pattern was formed in such a manner that the center of the fine opening conformed to the center of the opening in the inverted quadrangular pyramid concave (the apex of the taper) through the silicon substrate (third step).

Next, the silicon substrate was deeply etched by ICP-RIE (inductively coupled plasma-reactive ion etching) using the metal pattern as a mask to form through fine holes (diameter 20 μm) in the silicon substrate. In this deep etching, the thin film of aluminum formed within the inverted quadrangular pyramid concaves functioned as a stopping layer (fourth step).

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the inverted quadrangular pyramid concaves and on the wall surface of the through fine holes (fifth step).

(Conditions for Thermal Oxidation)
Heating temperature: 1100° C.
Oxygen gas feed rate: 1 L/min
Heating time: about 5 hr Next, dry etching by ICP-RIE (inductively coupled plasma-reactive ion etching) was carried out from the silicon substrate on its surface side remote from the inverted quadrangular pyramid (tapered) concaves, thereby removing the silicon nitride layer. Further, the silicon substrate was etched, and the dry etching was stopped when the silicon oxide layer provided on the inner wall of the through fine holes was exposed by a length of 100 μm (sixth step).

Thus, fine nozzles formed of silicon oxide in communication with the fine holes of the silicon substrate were formed by the above steps on the etching side of the silicon substrate. The fine nozzles had an opening diameter of the front end portion of 19 μm in a variation within ±1 μm and were formed at a pitch of 120 μm with very high accuracy.

Production of Apparatus for Fine Pattern Formation

Next, a support member of a polyether ether ketone resin, in which a flange portion and an opening had been formed, was fixed with the aid of an epoxy adhesive onto the silicon nitride layer on the peripheral portion of the surface of the silicon substrate (surface in which inverted quadrangular pyramid tapered concaves were formed).

Next, an ink passage formed of a resin pipe was connected to the opening of the support member, and the other end of the resin pipe was connected to an ink supplying device (1500 XL, manufactured by EFD). Thus, an apparatus for fine pattern formation according to the present invention was prepared.

Formation of Fine Pattern

The ink supplying device was loaded with ink (Color Mosaic CR-7001, manufactured by Fuji Film Olin Co., Ltd.). This ink had a viscosity of 20 mpa.s. Further, a glass substrate (100 mm×100 mm) was provided as a pattern object.

Next, while scanning the glass substrate at a constant speed of 50 mm/sec in a direction in which the fine nozzles of the apparatus for fine pattern formation were arranged, ink was supplied from the ink supplying device to the silicon substrate, and ink was ejected through the fine nozzles to write a stripe pattern which was then dried. The stripes constituting the pattern had a line width of 25±1 μm and a line pitch of 25±1 μm, that is, were formed with very high accuracy.

Further, the ink supplying device was loaded with high-viscosity ink. This ink had a viscosity of 100 mpa.s. A strip pattern was written and dried in the same manner as described above. The stripes constituting the pattern had a line width of 30±2 μm and a line pitch of 120±1 μm, that is, were formed with very high accuracy.

Example I-4
Production of Fine Nozzles

A silicon substrate having an RCA cleaned surface (diameter 3 in., thickness 200 μm, one side polished, crystallographic orientation <100>, coefficient of linear expansion=$2.6 \times 10^{-6}$/K) was provided. A silicon nitride layer was formed on the whole area of this silicon substrate by low pressure CVD to a thickness of 0.1 μm.

Next, a photosensitive resist (Micro Posit S 1818, manufactured by Shipley) was coated on the silicon nitride layer, followed by exposure through a predetermined photomask and development to form a resist pattern. Thereafter, dry etching by RIE (reactive ion etching) was carried out using this resist pattern as a mask to form a pattern in which 42 small openings (circular openings having a diameter of 30 μm) were formed on an identical straight line at a pitch of 120 μm (first step).

Next, a 0.2 μm-thick thin film of aluminum was sputtered on both surfaces of the silicon substrate so as to cover the silicon nitride layer pattern. A photosensitive resist (Micro Posit S 1818, manufactured by Shipley) was then coated on the thin film of aluminum located on the small opening formed surface, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern in which fine openings (circular openings having a diameter of 20 µm) were located in the center of the respective small openings. Further, a photosensitive resist (Micro Posit S 1818, manufactured by Shipley) was coated on the thin film of aluminum located on the surface remote from the small openings, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form wide openings (circular openings having a diameter of 50 µm). In this case, the wide openings were formed in such a manner that the center of the wide opening conformed to the center of the small opening through the silicon substrate (second step).

Next, the silicon substrate was deeply etched by ICP-RIE (inductively coupled plasma-reactive ion etching) using the metal pattern having fine openings as a mask to form fine holes having a depth of 150 µm (diameter 20 µm) in the silicon substrate (third step).

The silicon substrate was then deeply etched by ICP-RIE (inductively coupled plasma-reactive ion etching) using the metal pattern having wide openings as a mask until the fine holes appeared, that is, to a depth of about 50 µm. As a result, circular wide concaves having a diameter of 50 µm were formed. In these wide concaves, the openings of the fine holes were located in the center of the bottom of the wide concaves (fourth step).

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the wide concaves, on the wall surface of the fine holes, and on the silicon substrate in its portions exposed within the small openings of the silicon nitride layer pattern (fifth step).

(Conditions for Thermal Oxidation)
Heating temperature: 1100° C.
Oxygen gas feed rate: 1 L/min
Heating time: about 5 hr Next, dry etching by ICP-RIE (inductively coupled plasma-reactive ion etching) was carried out from the surface side of the silicon substrate remote from the wide concaves. In this dry etching, the silicon oxide layer functioned as a mask to form nozzle bases integrally with the silicon substrate, and the dry etching was stopped when the length of the nozzle bases reached 100 µm (sixth step).

Thus, fine nozzles comprising nozzle bases, an inner surface layer of silicon oxide in communication with the fine holes in the silicon substrate, and an end face layer of silicon oxide formed on the front end face of the nozzle bases were prepared by the above steps on the etching side of the silicon substrate. The fine nozzles had an opening diameter of the front end portion of 20 µm in a variation within ±1 µm and were formed at a pitch of 120 µm with very high accuracy. The wall thickness (5 µm) of the nozzle bases was provided as a difference in radius between the small openings and the fine openings.

Production of Apparatus for Fine Pattern Formation

Next, a support member of a polyether ether ketone resin, in which a flange portion and an opening had been formed, was fixed with the aid of an epoxy adhesive on the peripheral portion of the surface of the silicon substrate (surface remote from the fine nozzles).

Next, an ink passage formed of a resin pipe was connected to the opening of the support member, and the other end of the resin pipe was connected to an ink supplying device (1500 XL, manufactured by EFD). Thus, an apparatus for fine pattern formation according to the present invention was prepared.

Formation of Fine Pattern

The ink supplying device was loaded with ink (Color Mosaic CR-7001, manufactured by Fuji Film Olin Co., Ltd.). This ink had a viscosity of 50 mpa.s. Further, a glass substrate (100 mm×100 mm) was provided as a pattern object.

Next, while scanning the glass substrate at a constant speed of 50 mm/sec in a direction in which the fine nozzles of the apparatus for fine pattern formation were arranged, ink was supplied from the ink supplying device to the silicon substrate, and ink was ejected through the fine nozzles to write a stripe pattern which was then dried. The stripes constituting the pattern had a line width of 25±1 µm and a line pitch of 25±1 µm, that is, were formed with very high accuracy.

Further, the ink supplying device was loaded with high-viscosity ink. This ink had a viscosity of 100 mpa.s. A strip pattern was written and dried in the same manner as described above. The stripes constituting the pattern had a line width of 40±1 µm and a line pitch of 120±1 µm, that is, were formed with very high accuracy.

Example II-1

Formation of Fine Nozzles

A silicon substrate having an RCA cleaned surface (diameter 3 in., thickness 200 µm, one side polished, crystallographic orientation <100>, coefficient of linear expansion=$2.6 \times 10^{-6}$/K) was first provided. A silicon nitride layer was formed on the whole area of this silicon substrate by low pressure CVD to a thickness of 0.1 µm. Thereafter, a 0.2 µm-thick thin film of aluminum was sputtered on the silicon nitride layer located on one surface of the silicon substrate.

Next, a photosensitive resist (Micro Posit S 1818, manufactured by Shipley) was coated on the thin film of aluminum, followed by exposure through a predetermined photomask and development to form a resist pattern. Thereafter, the thin film of aluminum was etched with an aluminum etchant (mixed acid aluminum) using the resist pattern as a mask, and the resist pattern was then removed to form a metal pattern in which 23 fine openings (circular openings having a diameter of 20 µm) are formed on an identical straight line at a pitch of 200 µm.

Next, the silicon substrate was deeply etched by ICP-RIE (inductively coupled plasma-reactive ion etching) using the metal pattern as a mask to form through fine holes (diameter 20 µm) in the silicon substrate.

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the through fine holes.

(Conditions for Thermal Oxidation)
Heating temperature: 1100° C.
Oxygen gas feed rate: 1 L/min
Heating time: about 5 hr Next, dry etching by ICP-RIE (inductively coupled plasma-reactive ion etching) was carried out from the silicon substrate on its surface where the metal pattern had been provided, thereby removing the silicon nitride layer. Further, the silicon substrate was etched, and the dry etching was stopped when the silicon oxide layer provided on the inner wall of the through fine holes was exposed by a length of 136 µm.

Thus, fine nozzles formed of silicon oxide in communication with the fine holes of the silicon substrate were formed by the above steps on the etching side of the silicon substrate. The fine nozzles had an opening diameter of the front end portion of 23 µm, an outer diameter of 24 µm, a wall thickness around the front end portion of 0.5 µm and were formed at a pitch of 200 µm.

Formation of Reinforcing Layer

A reinforcing layer was formed by plasma CVD under the following conditions from the fine nozzle-formed surface side of the silicon substrate with the fine nozzles formed thereon.

(Conditions for Formation of Reinforcing Layer)
Plasma CVD device: PED-401, manufactured by Anelva
Power: 150 kW
Frequency: 90 kHz
Pressure in process: $2.9 \times 10^{-1}$ Torr (38.6 Pa)
Gas flow rate:
  Oxygen flow rate=30 sccm
  Helium flow rate=30 sccm
  Hexamethyldisiloxane flow rate=0.1 sccm (liquid)
Film formation time: 6 min The fine nozzles after the formation of the reinforcing layer of silicon oxide by the above method had an opening diameter of the front end portion of 20 µm, an outer diameter of 26 µm, and a wall thickness around the front end portion of 3.0 µm.

Measurement of Strength of Fine Nozzles

A comparison of the strength between the fine nozzles before the formation of the reinforcing layer and the fine nozzles after the formation of the reinforcing layer was done by the following method. Specifically, the silicon substrate was placed horizontally so that the axial direction of the fine nozzles was vertical. A universal bond tester PC-2400 manufactured by Dage was provided, and a shear testing load cell was disposed while keeping a distance of about 5 µm between the front end of the cell and the surface of the silicon substrate and was collided against three fine nozzles at the same time in the horizontal direction at a speed of 6 mm/min to break the fine nozzles. The strength at that time was measured. As a result, the strength of the fine nozzles before the formation of the reinforcing layer was 0.16 g per nozzle, and the strength of the fine nozzles after the formation of the reinforcing layer was 0.68 g per nozzle. From this result, it was confirmed that the formation of a reinforcing layer significantly improved the strength of the fine nozzles (4.3 times).

Formation of Water-Repellent Layer

A water-repellent layer was formed by plasma CVD under the following conditions from the fine nozzle formed surface side of the silicon substrate with the reinforcing layer formed thereon.

(Conditions for Formation of Water-Repellent Layer)
Plasma CVD device: PED-401, manufactured by Anelva
Power: 50 W
Frequency: 13.56 MHz
Base pressure: $4.0 \times 10^{-5}$ Torr ($5.3 \times 10^{-3}$ Pa)
Pressure in process: $1.1 \times 10^{-1}$ Torr (14.6 Pa)
Process gas: $CHF_3$
Gas flow rate: 100 sccm
Film formation time: 10 min The water-repellent layer thus formed was analyzed by the following ESCA (electron spectroscopy for chemical analysis) and FT-IR (fourier transform infrared spectroscopy). As a result, it was confirmed that, in the water-repellent layer, most of carbon elements were in the form of a fluorinated alkyl chain and the ratio of the number of carbon elements to the number of fluorine elements was 1:1.05. The thickness of the water-repellent layer was 37 nm. Further, the contact angle of the water-repellent layer with water was measured and was found to be about 95 degrees. This contact angle was much larger than the contact angle of the reinforcing layer with water measured in the same manner as used in the water-repellent layer, i.e., 60 degrees, indicating that the water-repellent layer had excellent water repellency.

(ESCA)
Apparatus: ESCALAB 220i-XL, manufactured by VG Scientific
X-ray source: Monochromated Al Kα
Output of X-ray: 10 kV·15 mA (150 W)
Lens: Large Area XL
Substrate: Silicon wafer (FT-IR)
Apparatus: FT/IR-610, manufactured by Japan Spectroscopic Co., Ltd.
Measurement mode: Macro-TRS transmission measurement
Resolution: 4 cm$^{-1}$
Integrated number: 128 times
Substrate: Silicon wafer Production of Apparatus for Fine Pattern Formation Next, a support member of a polyether ether ketone resin, in which a flange portion and an opening had been formed, was fixed with the aid of an epoxy adhesive onto the silicon nitride layer on the peripheral portion of the surface of the silicon substrate (surface remote from the fine nozzles).

Next, an ink passage formed of a resin pipe was connected to the opening of the support member, and the other end of the resin pipe was connected to an ink supplying device (1500 XL, manufactured by EFD). Thus, an apparatus for fine pattern formation according to the present invention was prepared.

Formation of Fine Pattern

The ink supplying device was loaded with ink (Color Mosaic CR-7001, manufactured by Fuji Film Olin Co., Ltd.). Further, a glass substrate (100 mm×100 mm) was provided as a pattern object.

Next, while scanning the glass substrate at a constant speed of 50 mm/sec in a direction in which the fine nozzles of the apparatus for fine pattern formation were arranged, ink was supplied from the ink supplying device to the silicon substrate, and ink was ejected through the fine nozzles to write a stripe pattern which was then dried. The stripes constituting the pattern had a line width of 25±1 µm and a line pitch of 25±1 µm, that is, were formed with very high accuracy.

Further, substantially no deposition of ink onto the back surface of the silicon substrate in the apparatus for fine pattern formation was found.

Example II-2

Production of Fine Nozzles

A silicon substrate having an RCA cleaned surface (diameter 3 in., thickness 200 μm, one side polished, crystallographic orientation <100>, coefficient of linear expansion=$2.6 \times 10^{-6}$/K) was provided. A silicon nitride layer was formed on the whole area of this silicon substrate by low pressure CVD to a thickness of 0.1 μm.

Next, a photosensitive resist (Micro Posit S 1818, manufactured by Shipley) was coated on the silicon nitride layer, followed by exposure through a predetermined photomask and development to form a resist pattern. Thereafter, dry etching by RIE (reactive ion etching) was carried out using this resist pattern as a mask to form a pattern in which 23 openings for taper (square openings having a one side length of 70 μm) were formed on an identical straight line at a pitch of 220 μm. Further, a photosensitive resist was coated on the silicon nitride layer in its portion located on the back surface of the silicon substrate, for use as a mask for subsequent crystallographically anisotropic etching.

Next, the surface of the silicon substrate was subjected to crystallographically anisotropic etching using the silicon nitride layer as a mask. This etching was carried out by immersing the substrate in a 33 vol % aqueous potassium hydroxide solution kept at 70 to 80° C. for about 50 min. As a result, inverted quadrangular pyramid concaves, which had a depth of 50 μm and had an angle of one side to the surface of the silicon substrate of 55 degrees, were formed in the silicon substrate in its portions exposed to openings for taper.

Next, the resist pattern was removed, and a 0.2 μm-thick thin film of aluminum was sputtered on both surfaces of the silicon substrate. A photosensitive resist (Micro Posit S 1818, manufactured by Shipley) was then coated on the thin film of aluminum in its portion located on the surface remote from the inverted quadrangular pyramid concaves, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern in which 23 fine openings (circular openings having a diameter of 20 μm) were formed on an identical straight line at a pitch of 220 μm. In this case, the metal pattern was formed in such a manner that the center of the fine opening conformed to the center of the opening in the inverted quadrangular pyramid concave (the apex of the taper) through the silicon substrate.

Next, the silicon substrate was deeply etched by ICP-RIE (inductively coupled plasma-reactive ion etching) using the metal pattern as a mask to form fine holes (diameter 20 μm) in the silicon substrate. In this deep etching, the thin film of aluminum formed within the inverted quadrangular pyramid concaves functioned as a stopping layer.

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the inverted quadrangular pyramid concaves and on the wall surface of the through fine holes.

(Conditions for Thermal Oxidation)

Heating temperature: 1100° C.

Oxygen gas feed rate: 1 L/min

Heating time: about 5 hr

Next, the silicon nitride layer was removed, and dry etching by ICP-RIE (inductively coupled plasma-reactive ion etching) was then carried out from the silicon substrate on its surface side remote from the inverted quadrangular pyramid (tapered) concaves. Further, the silicon substrate was etched, and the dry etching was stopped when the silicon oxide layer provided on the inner wall of the through fine holes was exposed by a length of 100 μm.

Thus, fine nozzles formed of silicon oxide in communication with the fine holes of the silicon substrate were formed by the above steps on the etching side of the silicon substrate. The fine nozzles had an opening diameter of the front end portion of 23 μm, an outer diameter of 24 μm, and a wall thickness around the front end portion of 0.5 μm and were formed at a pitch of 220 μm.

Formation of Reinforcing Layer

A reinforcing layer was formed by plasma CVD under the following conditions from the fine nozzle formed surface side of the silicon substrate with the fine nozzles formed thereon.

(Conditions for Formation of Reinforcing Layer)

Plasma CVD device: PED-401, manufactured by Anelva

Power: 150 kW

Frequency: 90 kHz

Pressure in process: $2.9 \times 10^{-1}$ Torr (38.6 Pa)

Gas flow rate:

Oxygen flow rate=30 sccm

Helium flow rate=30 sccm

Hexamethyldisiloxane flow rate=0.1 sccm (liquid)

Film formation time: 6 min

The fine nozzles after the formation of the reinforcing layer of silicon oxide had an opening diameter of the front end portion of 20 μm, an outer diameter of 26 μm, and a wall thickness around the front end portion of 3.0 μm.

Formation of Water-Repellent Layer

In the same manner as in Example 1, a water-repellent layer was formed by plasma CVD from the fine nozzle formed surface side of the silicon substrate with the reinforcing layer formed thereon.

The water-repellent layer thus formed was analyzed by ESCA and FT-IR in the same manner as in Example 1. As a result, it was confirmed that, in the water-repellent layer, most of carbon elements were in the form of a fluorinated alkyl chain and the ratio of the number of carbon elements to the number of fluorine elements was 1:1.05. The thickness of the water-repellent layer was 37 nm. Further, the contact angle of the water-repellent layer with water was measured and was found to be about 95 degrees. This contact angle was much larger than the contact angle of the reinforcing layer with water measured in the same manner as used in the water-repellent layer, i.e., 60 degrees, indicating that the water-repellent layer had excellent water repellency.

Production of Apparatus for Fine Pattern Formation

Next, a support member of a polyether ether ketone resin, in which a flange portion and an opening had been formed, was fixed with the aid of an epoxy adhesive on the peripheral portion of the surface of the silicon substrate (surface in which inverted quadrangular pyramid tapered concaves were formed).

Next, an ink passage formed of a resin pipe was connected to the opening of the support member, and the other end of the resin pipe was connected to an ink supplying device (1500 XL, manufactured by EFD). Thus, an apparatus for fine pattern formation according to the present invention was prepared.

Formation of Fine Pattern

The ink supplying device was loaded with ink (Color Mosaic CR-7001, manufactured by Fuji Film Olin Co., Ltd.). This ink had a viscosity of 20 mpa.s. Further, a glass substrate (100 mm×100 mm) was provided as a pattern object.

Next, while scanning the glass substrate at a constant speed of 50 mm/sec in a direction in which the fine nozzles of the apparatus for fine pattern formation were arranged, ink was supplied from the ink supplying device to the silicon substrate, and ink was ejected through the fine nozzles to write a stripe pattern which was then dried. The stripes constituting the pattern had a line width of 25±1 μm and a line pitch of 25±1 μm, that is, were formed with very high accuracy.

Further, the ink supplying device was loaded with high-viscosity ink. This ink had a viscosity of 100 mpa.s. A stripe pattern was written and dried in the same manner as described above. The stripes constituting the pattern had a line width of 30±2 μm and a line pitch of 220±1 μm, that is, were formed with very high accuracy.

Example II-3

Production of Fine Nozzles

A silicon substrate having an RCA cleaned surface (diameter 3 in., thickness 200 μm, one side polished, crystallographic orientation <100>, coefficient of linear expansion=$2.6 \times 10^{-6}$/K) was provided. A silicon nitride layer was formed on the whole area of this silicon substrate by low pressure CVD to a thickness of 0.1 μm. A thin film of aluminum was then sputtered on the silicon nitride layer on both surfaces of the silicon substrate to a thickness of 0.2 μm.

Next, a photosensitive resist (Micro Posit S 1818, manufactured by Shipley) was coated on the thin film of aluminum in its portion located on one surface of the silicon substrate, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern having wide openings (circular openings having a diameter of 50 μm). Further, a photosensitive resist (Micro Posit S 1818, manufactured by Shipley) was coated on the thin film of aluminum located on the surface remote from the wide openings, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern having fine openings (circular openings having a diameter of 20 μm). In this case, the metal pattern was formed in such a manner that the center of the fine opening conformed to the center of the wide opening through the silicon substrate.

Next, the silicon substrate was deeply etched by ICP-RIE (inductively coupled plasma-reactive ion etching) using the metal pattern having fine openings as a mask to form fine holes having a depth of 150 μm (diameter 20 μm) in the silicon substrate.

The silicon substrate was then deeply etched by ICP-RIE (inductively coupled plasma-reactive ion etching) using the metal pattern having wide openings as a mask until the fine holes appeared, that is, to a depth of about 50 μm. As a result, circular wide concaves having a diameter of 50 μm were formed. In these wide concaves, the opening of the fine hole was located in the center of the bottom of the wide concave.

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the wide concaves and on the silicon substrate in its portions exposed to the wall surface of the fine holes.

(Conditions for Thermal Oxidation)

Heating temperature: 1100° C.

Oxygen gas feed rate: 1 L/min

Heating time: about 5 hr

Next, the silicon nitride layer was removed, and dry etching by ICP-RIE (inductively coupled plasma-reactive ion etching) was then carried out from the silicon substrate on its surface side remote from the wide concaves. Further, the silicon substrate was etched, and the dry etching was stopped when the silicon oxide layer provided on the inner wall of the through fine holes was exposed by a length of 100 μm.

Thus, fine nozzles formed of silicon oxide in communication with the fine holes of the silicon substrate were formed by the above steps on the etching side of the silicon substrate. The fine nozzles had an opening diameter of the front end portion of 23 μm, an outer diameter of 24 μm, and a wall thickness around the front end portion of 0.5 μm and were formed at a pitch of 120 μm.

Formation of Reinforcing Layer

A reinforcing layer was formed by plasma CVD under the following conditions from the fine nozzle formed surface side of the silicon substrate with the fine nozzles formed thereon.

(Conditions for Formation of Reinforcing Layer)

Plasma CVD device: PED-401, manufactured by Anelva

Power: 150 kW

Frequency: 90 kHz

Pressure in process: $2.9 \times 10^{-1}$ Torr (38.6 Pa)

Gas flow rate:

Oxygen flow rate=30 sccm

Helium flow rate=30 sccm

Hexamethyldisiloxane flow rate=0.1 sccm (liquid)

Film formation time: 6 min

The fine nozzles after the formation of the reinforcing layer of silicon oxide had an opening diameter of the front end portion of 20 μm, an outer diameter of 26 μm, and a wall thickness around the front end portion of 3.0 μm.

Formation of Water-Repellent Layer

In the same manner as in Example 1, a water-repellent layer was formed by plasma CVD from the fine nozzle formed surface side of the silicon substrate with the reinforcing layer formed thereon.

The water-repellent layer thus formed was analyzed by ESCA and FT-IR in the same manner as in Example 1. As a result, it was confirmed that, in the water-repellent layer, most of carbon elements were in the form of a fluorinated alkyl chain and the ratio of the number of carbon elements to the number of fluorine elements was 1:1.05. The thickness of the water-repellent layer was 37 nm. Further, the contact angle of the water-repellent layer with water was measured and was found to be about 95 degrees. This contact angle was much larger than the contact angle of the reinforcing layer with water measured in the same manner as used in the water-repellent layer, i.e., 60 degrees, indicating that the water-repellent layer had excellent water repellency.

Production of Apparatus for Fine Pattern Formation

Next, a support member of a polyether ether ketone resin, in which a flange portion and an opening had been formed, was fixed with the aid of an epoxy adhesive on the peripheral portion of the surface of the silicon substrate (surface in which multistaged concave openings were formed).

Next, an ink passage formed of a resin pipe was connected to the opening of the support member, and the other end of the resin pipe was connected to an ink supplying device (1500 XL, manufactured by EFD). Thus, an apparatus for fine pattern formation according to the present invention was prepared.

Formation of Fine Pattern

The ink supplying device was loaded with ink (Color Mosaic CR-7001, manufactured by Fuji Film Olin Co., Ltd.). This ink had a viscosity of 20 mpa.s. Further, a glass substrate (100 mm×100 mm) was provided as a pattern object.

Next, while scanning the glass substrate at a constant speed of 50 mm/sec in a direction in which the fine nozzles of the apparatus for fine pattern formation were arranged, ink was supplied from the ink supplying device to the silicon substrate, and ink was ejected through the fine nozzles to write a stripe pattern which was then dried. The stripes constituting the pattern had a line width of 25±1 $\mu$m and a line pitch of 25±1 $\mu$m, that is, were formed with very high accuracy.

Further, the ink supplying device was loaded with high-viscosity ink. This ink had a viscosity of 100 mpa.s. A stripe pattern was written and dried in the same manner as described above. The stripes constituting the pattern had a line width of 28±2 $\mu$m and a line pitch of 120±1 $\mu$m, that is, were formed with very high accuracy.

Example III-1

Preparation of Apparatus for Fine Pattern Formation

A silicon substrate having a cleaned surface (diameter 3 in., thickness 200 $\mu$m, one side polished, crystallographic orientation <100>, coefficient of linear expansion=$2.6 \times 10^{-6}$/K) was provided. This silicon substrate was oxidized within a thermal oxidation furnace under the following conditions to form an about 2 $\mu$m-thick silicon oxide film on the whole surface of the silicon substrate.

(Conditions for Thermal Oxidation)

Heating temperature: 1050° C.

Hydrogen gas feed rate: 1 slm

Oxygen gas feed rate: 1 slm

Heating time: about 15 hr

Next, a photosensitive resist (Micro Posit 1400-31, manufactured by Shipley) was spin coated on the polished surface side of the silicon substrate, and the coating was then dried. Thereafter, exposure through a predetermined photomask and development were carried out to form a resist pattern. This resist pattern had 23 circular openings (diameter 20 $\mu$m) formed in X-axis direction on an identical line at a pitch of 200 $\mu$m. BHF 16 (a 22% aqueous solution of ammonium monohydrodifluoride) was then used to pattern the silicon oxide film using the resist pattern as a mask and to dissolve and remove the silicon oxide film at sites where no resist pattern was provided.

High aspect etching by ICP-RIE (inductively coupled plasma-reactive ion etching) was then carried out using the patterned resist pattern and the silicon oxide film as a mask to form fine holes having a diameter of 20 $\mu$m and a depth of 190 $\mu$m. Thereafter, the resist pattern was removed with a mixed solution composed of sulfuric acid and hydrogen peroxide, and, further, the mask of silicon oxide film was removed with hydrofluoric acid.

Next, the silicon substrate with fine holes formed therein was oxidized within a thermal oxidation furnace in the same manner as described above, except that the heating time was about 3 hr, whereby an about 5000 to 10000 angstrom-thick silicon oxide layer was formed on the whole area of the silicon substrate. The silicon oxide layer was also formed on the wall surface of the fine holes by this oxidation treatment.

Next, only the back surface side of the silicon substrate was immersed in BHF 16 to remove the silicon oxide layer, thereby exposing the back surface of the silicon substrate. Thereafter, the back surface side of the silicon substrate was immersed in TMAH (tetramethylammonium hydroxide) to perform etching. As a result, fine tubes formed of the silicon oxide layer produced on the wall surface of the fine holes by the oxidation treatment was protruded in the back surface of the silicon substrate.

The front end of the fine tubes formed of the silicon oxide layer was then immersed in BHF 16 to dissolve and remove the silicon oxide layer, thereby forming openings. Thereafter, the back surface side of the silicon substrate was etched with TMAH to form nozzles having a length of 100 $\mu$m.

A reinforcing layer was then formed by plasma CVD under the following conditions from the nozzle formed surface side of the silicon substrate with the nozzles formed thereon.

(Conditions for Formation of Reinforcing Layer)

Plasma CVD device: PED-401, manufactured by Anelva

Power: 150 kW

Frequency: 90 kHz

Pressure in process: $2.9 \times 10^{-1}$ Torr (38.6 Pa)

Gas flow rate:
  Oxygen flow rate=30 sccm
  Helium flow rate=30 sccm
  Hexamethyldisiloxane flow rate=0.1 sccm (liquid)

Film formation time: 6 min

The nozzles after the formation of the reinforcing layer of silicon oxide had an opening diameter of the front end portion of 20 $\mu$m, an outer diameter of 30 $\mu$m, and a wall thickness around the front end portion of 5.0 $\mu$m.

A comparison of the strength between the nozzles before the formation of the reinforcing layer and the nozzles after the formation of the reinforcing layer was done by the following method. Specifically, the silicon substrate was placed horizontally so that the axial direction of the nozzles was vertical. A universal bond tester PC-2400 manufactured by Dage was provided, and a shear testing load cell was disposed while keeping a distance of about 5 $\mu$m between the front end of the cell and the surface of the silicon substrate and was collided against three nozzles at the same time in the horizontal direction at a speed of 6 mm/min to break the nozzles. The strength at that time was measured. As a result, the strength of the nozzles before the formation of the reinforcing layer was 0.15 g per nozzle, and the strength of the nozzles after the formation of the reinforcing layer was 0.6 g per nozzle. From this result, it was confirmed that the formation of a reinforcing layer significantly improved the strength of the nozzles (4 times).

Next, a main electrode fabricated from an aluminum foil was provided on the surface of the silicon substrate so as to surround the 23 fine holes formed on an identical line at a pitch of 200 $\mu$m. In this case, a polyimide layer (thickness 70 $\mu$m) for insulation was provided between the main electrode and the silicon substrate.

Next, a support member of a polyether ether ketone resin, in which a flange portion and an opening had been formed, was fixed with the aid of an epoxy adhesive on the peripheral portion of the surface side of the silicon substrate (fine hole formed side).

Next, an ink passage formed of a resin pipe was connected to the opening of the support member, and the other end of the resin pipe was connected to an ink supplying device (1500 XL, manufactured by EFD).

On the other hand, a drum (diameter 10 cm) serving both as a pattern object and a counter electrode was rotatably provided so that the drum faced the back surface of the silicon substrate and the direction of the shaft conformed to the arrangement direction of the 23 fine holes formed at a pitch of 200 $\mu$m. Further, the drum was grounded. The distance from the surface of the drum to the front end of the nozzles was 150 $\mu$m. As a result, an apparatus for fine pattern formation (apparatus 1) according to the present invention was prepared. This apparatus for fine pattern formation was used for the observation of ejection which will be described later.

Further, a glass substrate (a pattern object serving also as a counter electrode) having indium tin oxide (ITO) on its surface was provided and was grounded. The distance from the surface of the ITO electrode in the glass substrate to the front end of the nozzles in the silicon substrate was 250 $\mu$m, and a construction was adopted wherein the silicon substrate could be scanned parallel to the glass substrate. As a result, an apparatus for fine pattern formation (apparatus 2) according to the present invention was prepared. This apparatus for fine pattern formation was used for direct writing experiments which will be described later.

Formation of Fine Pattern

A resin (KC 7000, manufactured by Kyoeisha Chemical Co., Ltd.) (6 levels of 0% by weight, 6% by weight, 8% by weight, 12% by weight, 15% by weight, and 17% by weight) was first mixed with butyl carbitol (electric conductivity= $1.3 \times 10^{-7}$ S/cm) as a solvent, and the mixtures were supersonically stirred to prepare solvents. To the solvents were added 1% by weight of a red dye (C.I. Disperse Red 60). Thus, six inks were prepared. The content of resin in the inks, the viscosity of the inks, and the electric conductivity of the inks were as shown in Table 1 below.

TABLE 1

| Ink | Resin content, wt % | Viscosity of ink, mPa.s | Electric conductivity, S/cm |
| --- | --- | --- | --- |
| Sample 1 | 0 | 7 | $1.3 \times 10^{-7}$ |
| Sample 2 | 6 | 70 | $4.2 \times 10^{-7}$ |
| Sample 3 | 8 | 130 | $4.5 \times 10^{-7}$ |
| Sample 4 | 12 | 450 | $5.4 \times 10^{-7}$ |
| Sample 5 | 15 | 1800 | $5.4 \times 10^{-7}$ |
| Sample 6 | 17 | 2800 | $5.3 \times 10^{-7}$ |

Next, the ink supplying device was loaded with each ink prepared above, and the observation of the ejection of the ink and a direct writing test were carried out.

(Observation of Ejection)

Next, a voltage (direct current 1 kV) was applied from a power source (comprising a function generator, an amplifier (×1000), and an oscilloscope) to the main electrode in the apparatus for fine pattern formation (apparatus 1), and the counter electrode was rotated (peripheral speed 23.6 mm/sec). Each ink was then supplied from the ink supplying device to the silicon substrate at a pressure of 1.5 psi, and the ejection of ink from the nozzles was observed through a microscope. As a result, in the ink having the lowest viscosity (sample 1), a meniscus was formed at the front end of the nozzles. On the other hand, in the inks, the viscosity of which had been increased by incorporating a resin (samples 2 to 6), any meniscus was not formed at the front end of the nozzles. This is considered attributable to the fact that high-viscosity inks were sensitive to an electric field.

(Direct Writing Experiment)

A voltage (direct current 1 kV) was applied from a power source (comprising a function generator, an amplifier (×1000), and an oscilloscope) to the main electrode in the apparatus for fine pattern formation (apparatus 2), and the silicon substrate was scanned (speed 200 mm/sec) relative to the counter electrode (glass substrate provided with ITO). Each ink was then supplied from the ink supplying device to the silicon substrate at a pressure of 1.5 psi and was ejected through the nozzles to directly write a stripe pattern. As a result, for ink samples 1 to 4 (low-viscosity inks having a viscosity of not more than 500 mpa.s), a fine stripe pattern having a line width of 10±1 $\mu$m could be formed, and, for high-viscosity inks (samples 5 and 6), a finer stripe pattern having a line width up to 2±0.5 $\mu$m could be formed.

Further, a pattern was formed in the same manner as described above, except that the voltage applied to the main electrode was 2 kV. As a result, for low-viscosity inks (ink samples 1 to 4), the width of ink ejected from the nozzles was wider. However, the stripe pattern was formed on the counter electrode (pattern object) in a line width of 12±1 $\mu$m, that is, was formed with very high accuracy. This demonstrates that the ink ejection width can be regulated by varying the strength of field formed between the main electrode and the counter electrode.

On the other hand, low-viscosity ink samples 1 and 2 were supplied from the ink supplying device to the silicon substrate at a pressure of 1.5 psi in the same manner as described above, except that no voltage was applied to the main electrode. As a result, the ink cannot be ejected through the nozzles. Therefore, the pressure for supplying the ink from the ink supplying device was increased to 12 psi. As a result, the ejection width of ink from the nozzles became not less than 20 $\mu$m, and lines overlapped with one another, making it impossible to form a stripe pattern.

Example III-2

Production of Apparatus for Fine Pattern Formation

A silicon substrate having an RCA cleaned surface (diameter 3 in., thickness 200 $\mu$m, one surface polished, crystallographic orientation <100>, coefficient of linear expansion=$2.6 \times 10^{-6}$/K) was provided. A silicon nitride layer was formed on the whole area of this silicon substrate by low pressure CVD to a thickness of 0.1 $\mu$m.

Next, a photosensitive resist (Micro Posit S 1818, manufactured by Shipley) was coated on the silicon nitride layer, followed by exposure through a predetermined photomask and development to form a resist pattern. Thereafter, dry etching by RIE (reactive ion etching) was carried out using this resist pattern as a mask to form a pattern in which 23 openings for taper (square openings having a one side length of 70 $\mu$m) were formed on an identical straight line at a pitch of 120 $\mu$m. Further, a photosensitive resist was coated on the silicon nitride layer located on the back surface of the silicon substrate, for use as a mask for subsequent crystallographically anisotropic etching.

Next, the surface of the silicon substrate was subjected to crystallographically anisotropic etching using the silicon nitride layer as a mask. This etching was carried out by immersing the substrate in a 33 vol % aqueous potassium hydroxide solution kept at 70 to 80° C. for about 50 min. As a result, inverted quadrangular pyramid concaves, which had a depth of 50 $\mu$m and had an angle of one side to the surface of the silicon substrate of 55 degrees, were formed in the silicon substrate in its portions exposed to openings for taper.

Next, the resist pattern was removed, and a 0.2 $\mu$m-thick thin film of aluminum was sputtered on both surfaces of the silicon substrate. A photosensitive resist (Micro Posit S 1818, manufactured by Shipley) was then coated on the thin film of aluminum in its portion located on the surface remote from the inverted quadrangular pyramid concaves, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern in which 23 fine openings (circular openings having a diameter of 20 µm) were formed on an identical straight line at a pitch of 120 µm. In this case, the metal pattern was formed in such a manner that the center of the fine opening conformed to the center of the opening in the inverted quadrangular pyramid concave (the apex of the taper) through the silicon substrate.

Next, the silicon substrate was deeply etched by ICP-RIE (inductively coupled plasma-reactive ion etching) using the metal pattern as a mask to form fine holes (diameter 20 µm) in the silicon substrate. In this deep etching, the thin film of aluminum formed within the inverted quadrangular pyramid concaves functioned as a stopping layer.

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the inverted quadrangular pyramid concaves and on the wall surface of the through fine holes.

(Conditions for Thermal Oxidation)

Heating temperature: 1100° C.

Oxygen gas feed rate: 1 L/min

Heating time: about 5 hr

Next, the silicon nitride layer was removed, and dry etching by ICP-RIE (inductively coupled plasma-reactive ion etching) was then carried out from the silicon substrate on its surface side remote from the inverted quadrangular pyramid (tapered) concaves. Further, the silicon substrate was etched, and the dry etching was stopped when the silicon oxide layer provided on the inner wall of the through fine holes was exposed by a length of 100 µm.

Thus, nozzles formed of silicon oxide in communication with the fine holes of the silicon substrate were formed by the above steps on the etching side of the silicon substrate.

A reinforcing layer was formed by plasma CVD from the nozzle formed surface side of the silicon substrate with the nozzles formed thereon in the same manner as in Example III-1.

The nozzles after the formation of the reinforcing layer of silicon oxide by the above method had an opening diameter of the front end portion of 20 µm, an outer diameter of 30 µm, a wall thickness around the front end portion of 5.0 µm, and a nozzle pitch of 120 µm.

Next, a main electrode fabricated from an aluminum foil was provided on the surface of the silicon substrate so as to surround the 23 fine holes formed on an identical line at a pitch of 200 µm. In this case, a polyimide layer (thickness 70 µm) for insulation was provided between the main electrode and the silicon substrate.

Next, a support member of a polyether ether ketone resin, in which a flange portion and an opening had been formed, was fixed with the aid of an epoxy adhesive on the peripheral portion of the surface side of the silicon substrate (fine hole formed side).

Next, an ink passage formed of a resin pipe was connected to the opening of the support member, and the other end of the resin pipe was connected to an ink supplying device (1500 XL, manufactured by EFD).

On the other hand, a glass substrate (a pattern object serving also as a counter electrode) having indium tin oxide (ITO) on its surface was provided and was grounded. The distance from the surface of the ITO electrode in the glass substrate to the front end of the nozzles in the silicon substrate was 250 µm, and a construction was adopted wherein the silicon substrate could be scanned parallel to the glass substrate. As a result, an apparatus for fine pattern formation according to the present invention was prepared.

Formation of Fine Pattern

Six inks were prepared in the same manner as in Example III-1. Next, the ink supplying device was loaded with each ink prepared above, and an experiment on direct writing was then carried out.

(Direct Writing Experiment)

A voltage (direct current 1 kV) was applied from a power source (comprising a function generator, an amplifier (×1000), and an oscilloscope) to the main electrode in the apparatus for fine pattern formation, and the silicon substrate was scanned (speed 200 mm/sec) relative to the counter electrode (glass substrate provided with ITO). Each ink was then supplied from the ink supplying device to the silicon substrate at a pressure of 1.5 psi and was ejected through the nozzles to directly write a stripe pattern. As a result, for each of ink samples 1 to 6, a fine stripe pattern having a line width of 3±1 µm could be formed.

Further, a pattern was formed in the same manner as described above, except that the voltage applied to the main electrode was 2 kV. As a result, the width of ink ejected from the nozzles was wider. However, the stripe pattern was formed on the counter electrode (pattern object) in a line width of 5±1 µm, that is, was formed with very high accuracy. This demonstrates that the ink ejection width can be regulated by varying the strength of field formed between the main electrode and the counter electrode.

Example III-3

Production of Apparatus for Fine Pattern Formation

A silicon substrate having an RCA cleaned surface (diameter 3 in., thickness 200 µm, one surface polished, crystallographic orientation <100>, coefficient of linear expansion=2.6×10$^{-6}$/K) was provided. A silicon nitride layer was formed on the whole area of this silicon substrate by low pressure CVD to a thickness of 0.1 µm. A thin film of aluminum was then sputtered on the silicon nitride layer on both surfaces of the silicon substrate to a thickness of 0.2 µm.

Next, a photosensitive resist (Micro Posit S 1818, manufactured by Shipley) was coated on the thin film of aluminum in its portion located on one surface of the silicon substrate, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern having wide openings (circular openings having a diameter of 50 µm). Further, a photosensitive resist (Micro Posit S 1818, manufactured by Shipley) was coated on the thin film of aluminum located on the surface remote from the wide openings, followed by exposure through a predetermined photomask and development to form a resist pattern. Thereafter, the thin film of aluminum was etched with an aluminum etchant (mixed acid aluminum) using this resist pattern as a mask, and the resist pattern was then removed to form a metal pattern having fine openings (circular openings having a diameter of 20 µm). In this case, the metal pattern was formed in such a manner that the center of the fine opening conformed to the center of the wide opening through the silicon substrate.

Next, the silicon substrate was deeply etched by ICP-RIE (inductively coupled plasma-reactive ion etching) using the metal pattern having fine openings as a mask to form fine holes having a depth of 150 μm (diameter 20 μm) in the silicon substrate.

The silicon substrate was then deeply etched by ICP-RIE (inductively coupled plasma-reactive ion etching) using the metal pattern having wide openings as a mask until the fine holes appeared, that is, to a depth of about 50 μm. As a result, circular wide concaves having a diameter of 50 μm were formed. In these wide concaves, the opening of the fine hole was located in the center of the bottom of the wide concave.

Next, the metal pattern was separated and removed with sulfuric acid-aqueous hydrogen peroxide (sulfuric acid:aqueous hydrogen peroxide=1:1), and the silicon substrate was oxidized within a thermal oxidation furnace under the following conditions to form an about 5000 to 10000 angstrom-thick silicon oxide layer on the wall surface of the wide concaves and on the silicon substrate in its portions exposed to the wall surface of the fine holes.

(Conditions for Thermal Oxidation)
Heating temperature: 1100° C.
Oxygen gas feed rate: 1 L/min
Heating time: about 5 hr Next, the silicon nitride layer was removed, and dry etching by ICP-RIE (inductively coupled plasma-reactive ion etching) was then carried out from the silicon substrate on its surface side remote from the wide concaves. Further, the silicon substrate was etched, and the dry etching was stopped when the silicon oxide layer provided on the inner wall of the through fine holes was exposed by a length of 100 μm.

Thus, nozzles formed of silicon oxide in communication with the fine holes of the silicon substrate were formed by the above steps on the etching side of the silicon substrate.

A reinforcing layer was formed by plasma CVD from the nozzle formed surface side of the silicon substrate with the nozzles formed thereon in the same manner as in Example III-1.

The nozzles after the formation of the reinforcing layer of silicon oxide by the above method had an opening diameter of the front end portion of 20 μm, an outer diameter of 30 μm, a wall thickness around the front end portion of 5.0 μm, and a nozzle pitch of 120 μm.

Next, a main electrode fabricated from an aluminum foil was provided on the surface of the silicon substrate so as to surround the 23 fine holes formed on an identical line at a pitch of 200 μm. In this case, a polyimide layer (thickness 70 μm) for insulation was provided between the main electrode and the silicon substrate.

Next, a support member of a polyether ether ketone resin, in which a flange portion and an opening had been formed, was fixed with the aid of an epoxy adhesive on the peripheral portion of the surface side of the silicon substrate (fine hole formed side).

Next, an ink passage formed of a resin pipe was connected to the opening of the support member, and the other end of the resin pipe was connected to an ink supplying device (1500 XL, manufactured by EFD).

On the other hand, a glass substrate (a pattern object serving also as a counter electrode) having indium tin oxide (ITO) on its surface was provided and was grounded. The distance from the surface of the ITO electrode in the glass substrate to the front end of the nozzles in the silicon substrate was 250 μm, and a construction was adopted wherein the silicon substrate could be scanned parallel to the glass substrate. As a result, an apparatus for fine pattern formation according to the present invention was prepared.

Formation of Fine Pattern

Six inks were prepared in the same manner as in Example III-1. Next, the ink supplying device was loaded with each ink prepared above, and an experiment on direct writing was then carried out.

(Direct Writing Experiment)

A voltage (direct current 1 kV) was applied from a power source (comprising a function generator, an amplifier (×1000), and an oscilloscope) to the main electrode in the apparatus for fine pattern formation, and the silicon substrate was scanned (speed 200 mm/sec) relative to the counter electrode (glass substrate provided with ITO). Each ink was then supplied from the ink supplying device to the silicon substrate at a pressure of 1.5 psi and was ejected through the nozzles to directly write a stripe pattern. As a result, for each of ink samples 1 to 6, a fine stripe pattern having a line width of 3±1 μm could be formed.

Further, a pattern was formed in the same manner as described above, except that the voltage applied to the main electrode was 2 kV. As a result, the width of ink ejected from the nozzles was wider. However, the stripe pattern was formed on the counter electrode (pattern object) in a line width of 5±1 μm, that is, was formed with very high accuracy. This demonstrates that the ink ejection width can be regulated by varying the strength of field formed between the main electrode and the counter electrode.

As described above in detail, the apparatus for fine pattern formation according to the present invention can eject ink through a plurality of fine nozzles on the back surface side of a silicon substrate at substantially even ejection width in a very small amount with high accuracy and, at the same time, can prevent the deposition of ink onto the back surface of the silicon substrate and permits the amount of ink ejected to be set as desired by varying the amount of ink supplied. Therefore, a pattern can be simply and stably formed with high accuracy by depositing ink onto a pattern object to directly write a pattern. The silicon nitride layer provided on the surface and side of the silicon substrate imparts a high level of electrically insulating properties to the silicon substrate. Further, when the fine nozzles have nozzle bases, the mechanical strength of the fine nozzles is high and the durability against external impact and ink supply pressure can be significantly improved. When the openings of the fine holes remote from fine nozzles are in the form of a tapered or multistaged concave, the passage resistance is lowered. This can realize the ejection of an ink having higher viscosity through a plurality of fine nozzles in a substantially even ejection width and in a very small amount with high accuracy.

In the production process of fine nozzles according to the present invention, through fine holes are formed in a silicon substrate, a silicon oxide layer is selectively formed only on an exposed surface including the inner wall surface of the through fine holes, and fine nozzles are formed by utilizing a difference in dry etching rate between the silicon oxide layer and the silicon substrate. Therefore, fine nozzles with high inner diameter accuracy can be easily formed. Further, in particular, the utilization of the mask side at the time of deep etching as the front end of nozzles can provide evener opening diameter of the plurality of fine nozzles.

As described above in detail, in the apparatus for fine pattern formation according to the present invention, the fine nozzles have high mechanical strength by virtue of the provision of the reinforcing layer and are satisfactorily durable against external impact and ink supply pressure, and ink can be ejected in a very small amount with high accuracy through the plurality of fine nozzles on the back surface side of the silicon substrate. The amount of ink ejected may be set as desired by varying the amount of ink supplied. Therefore, a pattern can be stably formed with high accuracy in a simple manner by depositing ink on a pattern object to directly write a pattern. Further, the provision of a water-repellent layer on the back surface side of the silicon substrate and the reinforcing layer can significantly improve the prevention of the deposition of ink. Furthermore, when the openings of the fine holes in their surface side are tapered or multistaged concaves, the passage resistance of ink is reduced and an ink having higher viscosity can be ejected in a very small amount with high accuracy through the plurality of fine nozzles.

Further, as described above in detail, in the apparatus for fine pattern formation according to the present invention, since an electric field formed between the main electrode and the counter electrode is used in combination with the ink supply pressure as ink ejection means, the ink supply pressure can be set at a low value and ink can be ejected in a very small amount with high accuracy through the fine holes of the silicon substrate. When ink is present in the ink supply space, ink can be ejected by utilizing only an electric field without the ink supply pressure. Further, the ink ejection width can be regulated by varying the strength of field formed between the main electrode and the counter electrode. Therefore, ink can be ejected in a very small amount with high accuracy without reducing the opening diameter of the fine holes and without increasing the ink supply pressure. When the nozzles are provided at the openings of the fine holes, the deposition of ink onto the back surface of the silicon substrate can be prevented. Further, when the openings of the fine holes on the surface side are tapered or multistaged concaves, the passage resistance of ink can be reduced and an ink having higher viscosity can be ejected in a very small amount with high accuracy through the plurality of fine holes or nozzles. The amount of ink ejected can be set as desired by varying the amount of ink supplied. Therefore, a pattern can be stably formed with high accuracy in a simple manner by depositing ink on a pattern object to directly write a pattern.

In the method for pattern formation wherein the apparatus for fine pattern formation according to the present invention and a pattern object are scanned relative to each other, a stripe pattern or a dot pattern can be formed with high accuracy. The ejection of ink through a plurality of fine holes arrayed on an identical line along the scanning direction can enhance the pattern formation speed even when the amount of ink ejected through one fine hole is small. Further, in the method for pattern formation wherein the apparatus for fine pattern formation according to the present invention is installed at and registered with a predetermined position of the pattern object and a given amount of ink is ejected from each fine hole, a desired pattern can be repeatedly formed with high accuracy in a simple manner. Therefore, this method is applicable, for example, to color filters in a matrix form or the formation of a conductor pattern in printed wiring boards. Further, the regulation of the ink ejection width can realize the formation of patterns in various forms with higher accuracy.

What is claimed is:

1. A process for producing a plurality of fine nozzles, formed of silicon oxide, protruded from one surface of a silicon substrate and in communication with fine holes which extend through the silicon substrate and have a silicon oxide layer on the wall surface thereof, said process comprising:

a first step of providing a silicon substrate having on its whole surface a silicon nitride layer and forming a mask pattern having a plurality of fine openings on the silicon nitride layer in its portion located on one surface of the silicon substrate;

a second step of forming through fine holes in the silicon substrate by deep etching using the mask pattern as a mask;

a third step of removing the mask pattern and oxidizing the inside of the through fine holes of the silicon substrate to form a silicon oxide layer; and a fourth step of removing a part of the silicon nitride layer and a part of the silicon substrate from one surface of the silicon substrate by dry etching to expose the silicon oxide layer by a predetermined length, thereby forming fine nozzles.

2. The process for producing fine nozzles according to claim 1, wherein, in the fourth step, etching is started with the surface from which the mask pattern has been removed.

3. A process for producing a plurality of fine nozzles protruded from one surface of a silicon substrate, said fine nozzles comprising a nozzle base, provided integrally with the silicon substrate, and a silicon oxide end face layer covering the front end face of the nozzle base, said nozzle base being in communication with fine holes, which extend through the silicon substrate and have a silicon oxide layer on the wall surface thereof, and having a silicon oxide inner surface layer on its inner wall surface, said process comprising:

a first step of providing a silicon substrate having on its whole surface a silicon nitride layer and patterning the silicon nitride layer in its portion located on one surface of the silicon substrate to form a pattern having a plurality of small openings;

a second step of forming a mask thin film so as to cover the pattern of the silicon nitride layer and patterning the mask thin film to form a mask pattern having fine openings located within the small openings;

a third step of forming through fine holes in the silicon substrate by deep etching using the mask pattern as a mask;

a fourth step of removing the mask pattern and oxidizing sites within the through fine holes in the silicone substrate and sites exposed within the small openings to form a silicon oxide layer;

a fifth step of removing the silicon nitride layer and removing a part of the silicon substrate by dry etching using the silicon oxide layer as a mask from the surface side, on which the silicon oxide layer has been formed, to form nozzle bases having a predetermined length, thereby forming fine nozzles.

4. A process for producing a plurality of fine nozzles, formed of silicon oxide, protruded from one surface of a silicon substrate and in communication with fine holes which extend through the silicon substrate and have a silicon oxide layer on the wall surface thereof, said process comprising:

a first step of providing a silicon substrate of <100> surface crystal orientation having on its whole surface a silicon nitride layer and patterning the silicon nitride layer in its portion located on one surface side of the silicon substrate to form a pattern having a plurality of openings for taper;

a second step of etching the surface of the silicon substrate by crystallographically anisotropic etching using the silicon nitride layer as a mask to form tapered concaves;

a third step of forming a mask thin film on both surfaces of the silicon substrate and patterning the mask thin film in its portion located on the surface of the silicon substrate remote from the tapered concaves to form a mask pattern having fine openings such that the center of each fine opening substantially conforms to the center of each tapered concave through the silicon substrate;

a fourth step of forming through fine holes in the silicon substrate by deep etching using, as a mask, the mask pattern and the mask thin film;

a fifth step of removing the mask pattern and the mask thin film and oxidizing sites within the through fine holes in the silicone substrate and sites exposed within the tapered concaves to form a silicon oxide layer; and a sixth step of removing a part of the silicon nitride layer and a part of the silicon substrate by dry etching from the surface side of the silicon substrate remote from the tapered concaves to expose the silicon oxide layer by a predetermined length, thereby forming fine nozzles.

5. A process for producing a plurality of fine nozzles protruded from one surface of a silicon substrate, said fine nozzles comprising a nozzle base, provided integrally with the silicon substrate, and a silicon oxide end face layer covering the front end face of the nozzle base, said nozzle base being in communication with fine holes, which extend through the silicon substrate and have a silicon oxide layer on the wall surface thereof, and having a silicon oxide inner surface layer on its inner wall surface, said process comprising:

a first step of providing a silicon substrate of <100> surface crystal orientation having on its whole surface a silicon nitride layer and patterning the silicon nitride layer in its portion located on one surface side of the silicon substrate to form a pattern having a plurality of openings for taper;

a second step of etching the surface of the silicon substrate by crystallographically anisotropic etching using the silicon nitride layer as a mask to form tapered concaves;

a third step of patterning the silicon nitride layer in its portion located on the surface side of the silicon substrate remote from the tapered concaves to form a pattern having small openings such that the center of each opening substantially conforms to the center of each tapered concave through the silicon substrate;

a fourth step of forming a mask thin film on both surfaces of the silicon substrate and patterning the mask thin film in its portion located on the surface side of the silicon substrate remote from tapered concaves to form a mask pattern having fine openings located within the small openings;

a fifth step of forming through fine holes in the silicon substrate by deep etching using, as a mask, the mask pattern and the mask thin film;

a sixth step of removing the mask pattern and the mask thin film and oxidizing sites within the through fine holes in the silicone substrate, sites exposed within the small openings, and sites exposed within the tapered concaves to form a silicon oxide layer; and a seventh step of removing the silicon nitride layer and removing a part of the silicon substrate by dry etching using the silicon oxide layer as a mask from the surface side of the silicon substrate remote from the tapered concaves to form nozzle bases having a predetermined length, thereby forming fine nozzles.

6. A process for producing a plurality of fine nozzles, formed of silicon oxide, protruded from one surface of a silicon substrate and in communication with fine holes which extend through the silicon substrate and have a silicon oxide layer on the wall surface thereof, said process comprising:

a first step of providing a silicon substrate having on its whole surface a silicon nitride layer, forming a mask pattern having a plurality of fine openings on the silicon nitride layer in its portion located on one surface of the silicon substrate, and forming, on the silicon nitride layer on the other surface of the silicon substrate, a mask pattern having wide openings such that the center of each wide opening substantially conforms to the center of each fine opening through the silicon substrate;

a second step of forming fine holes having predetermined depth in the silicon substrate by deep etching using the mask pattern having fine openings as a mask;

a third step of forming wide concaves in the silicon substrate by deep etching using the mask pattern having wide openings as a mask in such a manner that the openings of the fine holes are exposed within the wide concaves, thereby forming multistaged concaves;

a fourth step of removing the mask pattern and oxidizing sites within the fine holes of the silicon substrate and sites exposed within the wide concaves to form a silicon oxide layer; and a fifth step of removing a part of the silicon nitride layer and a part of the silicon substrate from the surface of the silicon substrate remote from the wide concaves by dry etching to expose the silicon oxide layer by a predetermined length, thereby forming fine nozzles.

7. A process for producing a plurality of fine nozzles protruded from one surface of a silicon substrate, said fine nozzles comprising a nozzle base, provided integrally with the silicon substrate, and a silicon oxide end face layer covering the front end face of the nozzle base, said nozzle base being in communication with fine holes, which extend through the silicon substrate and have a silicon oxide layer on the wall surface thereof, and having a silicon oxide inner surface layer on its inner wall surface, said process comprising:

a first step of providing a silicon substrate having on its whole surface a silicon nitride layer and patterning the silicon nitride layer in its portion located on one surface of the silicon substrate to form a pattern having a plurality of small openings;

a second step of forming a mask thin film so as to cover the pattern of the silicon nitride layer and then patterning the mask thin film to form a mask pattern having fine openings located within the small openings, and, in addition, patterning the mask thin film on the other surface to form a mask pattern having wide openings such that the center of each wide opening substantially conforms to the center of each fine opening through the silicon substrate;

a third step of forming fine holes having predetermined depth in the silicon substrate by deep etching using the mask pattern having fine openings as a mask;

a fourth step of forming wide concaves in the silicon substrate by deep etching using the mask pattern having wide openings as a mask in such a manner that the openings of the fine holes are exposed within the wide concaves, thereby forming multistaged concaves;

a fifth step of removing the mask pattern and oxidizing sites within the fine holes of the silicon substrate, sites exposed within the wide concaves, and sites exposed within the small openings to form a silicon oxide layer; and a sixth step of removing the silicon nitride layer and removing a part of the silicon substrate by dry etching using the silicon oxide layer as a mask from the surface of the silicon substrate remote from the wide concaves to form nozzle bases having a predetermined length, thereby forming fine nozzles.

* * * * *